(12) United States Patent
Akcasu

(10) Patent No.: US 12,712,113 B2
(45) Date of Patent: Aug. 18, 2026

(54) SPIRAL INDUCTORS, TRANSFORMERS AND BALUNS FORMED FROM FLEXIBLE DIELECTRIC SHEETS

(71) Applicant: nanoHenry, Inc., San Diego, CA (US)

(72) Inventor: Osman Ersed Akcasu, San Diego, CA (US)

(73) Assignee: nanoHenry, Inc., San Diego, CA (US)

( * ) Notice: Subject to any disclaimer, the term of this patent is extended or adjusted under 35 U.S.C. 154(b) by 0 days.

(21) Appl. No.: 18/542,182

(22) Filed: Dec. 15, 2023

(65) Prior Publication Data

US 2024/0242874 A1 Jul. 18, 2024

Related U.S. Application Data

(60) Continuation of application No. 17/978,783, filed on Nov. 1, 2022, now Pat. No. 11,990,266, which is a
(Continued)

(51) Int. Cl.
*H01F 5/00* (2006.01)
*H01F 27/28* (2006.01)
(Continued)

(52) U.S. Cl.
CPC ......... *H01F 27/2804* (2013.01); *H01F 27/29* (2013.01); *H01F 41/041* (2013.01);
(Continued)

(58) Field of Classification Search
CPC .................................................. H01F 27/2804
(Continued)

(56) References Cited

U.S. PATENT DOCUMENTS 2,856,577 A * 10/1958 Schmidt, Jr. .......... H02M 7/153 363/69
3,068,433 A * 12/1962 Wroblewski ........... H01B 3/002 336/83
(Continued)

FOREIGN PATENT DOCUMENTS

CN 101449362 A 6/2009
CN 103855158 A 6/2014
(Continued)

OTHER PUBLICATIONS

U.S. Appl. No. 15/285,310, Advisory Action, Mailed On Jun. 24, 2020, 3 pages.
(Continued)

*Primary Examiner* — Ronald Hinson
(74) *Attorney, Agent, or Firm* — Kilpatrick Townsend & Stockton LLP

(57) ABSTRACT

New types of circuit elements for integrated circuits include structures wherein a thickness dimension is much greater than a width dimension and is more closely spaced than the width dimension in order to attain a tight coupling condition. The structure is suitable to form inductors, capacitors, transmission lines and low impedance power distribution networks in integrated circuits. The width dimension is on the same order of magnitude as skin depth. Embodiments include a spiral winding disposed in a silicon substrate formed of a deep, narrow, conductor-covered spiral ridge separated by a narrow spiral trench. Other embodiments include a wide, thin conductor formed in or on a flexible insulative ribbon and wound with turns adjacent one another, or a conductor in or on a flexible insulative sheet folded into layers with windings adjacent one another Further, a method of manufacture includes directional etching
(Continued)

of the deep, narrow spiral trench to form a winding in silicon.

16 Claims, 125 Drawing Sheets

Related U.S. Application Data division of application No. 15/285,310, filed on Oct. 4, 2016, now Pat. No. 11,501,908.

(51) Int. Cl.

| | |
|---|---|
| ***H01F 27/29*** | (2006.01) |
| ***H01F 41/04*** | (2006.01) |
| ***H01G 4/005*** | (2006.01) |
| ***H01G 4/232*** | (2006.01) |
| ***H01G 4/236*** | (2006.01) |
| ***H01G 4/33*** | (2006.01) |
| ***H10D 1/20*** | (2025.01) |
| ***H10D 1/68*** | (2025.01) |
| *H01G 4/12* | (2006.01) |

(52) U.S. Cl.

CPC ............. *H01G 4/005* (2013.01); *H01G 4/232* (2013.01); *H01G 4/236* (2013.01); *H01G 4/33* (2013.01); *H10D 1/20* (2025.01); *H10D 1/692* (2025.01); *H01G 4/1245* (2013.01)

(58) Field of Classification Search

USPC .......................................................... 336/200

See application file for complete search history.

(56) References Cited

U.S. PATENT DOCUMENTS

| | | | | |
|---|---|---|---|---|
| 5,519,582 | A | 5/1996 | Matsuzaki | |
| 5,633,785 | A | 5/1997 | Parker et al. | |
| 6,114,937 | A | 9/2000 | Burghartz et al. | |
| 6,982,477 | B2 | 1/2006 | Adan | |
| 7,176,773 | B2 | 2/2007 | Shoji | |
| 7,579,553 | B2 | 8/2009 | Moriizumi | |
| 8,212,155 | B1 | 7/2012 | Wright et al. | |
| 8,749,337 | B2 | 6/2014 | Baram et al. | |
| 11,501,908 | B2 | 11/2022 | Akcasu | |
| 2002/0064923 | A1 | 5/2002 | Yamauchi et al. | |
| 2004/0056749 | A1* | 3/2004 | Kahlmann | H01L 27/08 336/200 |
| 2004/0217440 | A1 | 11/2004 | Ng et al. | |
| 2005/0275497 | A1 | 12/2005 | Ramadan et al. | |
| 2012/0068301 | A1* | 3/2012 | Sin | H01L 23/645 336/200 |
| 2013/0293337 | A1* | 11/2013 | Lo | H01F 41/041 336/200 |
| 2013/0321094 | A1* | 12/2013 | Sumida | H01L 28/10 333/24.2 |
| 2014/0145334 | A1 | 5/2014 | Boyd et al. | |
| 2015/0270237 | A1 | 9/2015 | Chi et al. | |
| 2016/0035477 | A1* | 2/2016 | Yeh | H01F 27/29 320/108 |
| 2016/0064354 | A1 | 3/2016 | Chadda et al. | |
| 2016/0163451 | A1 | 6/2016 | Wang | |
| 2016/0276269 | A1 | 9/2016 | Peng et al. | |
| 2017/0330930 | A1 | 11/2017 | Cook et al. | |
| 2018/0096777 | A1 | 4/2018 | Akcasu | |

FOREIGN PATENT DOCUMENTS

| | | | |
|---|---|---|---|
| CN | 205104335 | U | 3/2016 |
| JP | 09145386 | A | 6/1997 |
| JP | 2005217419 | A | 8/2005 |
| JP | 2014522561 | A | 9/2014 |
| WO | 2018067594 | A1 | 4/2018 |

OTHER PUBLICATIONS

U.S. Appl. No. 15/285,310, Final Office Action, Mailed On Mar. 3, 2020, 10 pages.

U.S. Appl. No. 15/285,310, Final Office Action, Mailed On Nov. 27, 2020, 18 pages.

U.S. Appl. No. 15/285,310, Non-Final Office Action, Mailed On Aug. 21, 2019, 13 pages.

U.S. Appl. No. 15/285,310, Non-Final Office Action, Mailed On Aug. 5, 2020, 16 pages.

U.S. Appl. No. 15/285,310, Non-Final Office Action, Mailed on Sep. 29, 2021, 30 pages.

U.S. Appl. No. 15/285,310, Notice of Allowance, Mailed on Jul. 13, 2022, 8 pages.

U.S. Appl. No. 17/978,783, Non-Final Office Action, Mailed on Jun. 2, 2023, 13 pages.

U.S. Appl. No. 17/978,783, Notice of Allowance, Mailed on Sep. 14, 2023, 10 pages.

Ahn et al., "A 50-MHz Fully Integrated Low-Swing Buck Converter Using Packaging Inductors", IEEE Transaction on Power Electronics, vol. 27, No. 10, Oct. 2012, pp. 4347-4356.

Akcasu , "PG-PLANE", The Three-Dimensional Inductance Simulator for Ground Bounce and Simultaneous Switching Noise for Complex Package Power and Ground Plane Structures, IEEE IEPS, Austin, TX, 1992.

Akcasu et al., "Net-An" a Full Three-Dimensional Parasitic Interconnect Distributed RLC Extractor for Large Full Chip Applications, IEEE IEDM 1995, Washington D.C., 1995, pp. 495-498.

Akcasu , "Net-An" a full 3D Parasitic Interconnect Distributed RLC Extractor for Large Full Chip Applications, Invited, FSA Modeling Workshop, San Jose, CA, Nov. 8, 1996, 4 pages.

Akcasu , "60nm and 90nm Interconnect Modeling Challenges", Invited, FSA Technical Conference, Oct. 4-7, 2004, 73 pages.

Akcasu et al., "A General and Comparative Study of RC(0), RC, RCL and RCLK Modeling of Interconnects and their Impact on the Design of Multi-Giga Hertz Processors", Invited, IEEE Isqed 2002, Santa Clara, CA, Mar. 2002, 79 pages.

Akcasu et al., "A Practical Approach to Preventing Simultaneous Switching Noise and Ground Bounce Problems in IO Rings", DesignCon 2003, Jan. 27-30, 2003, 7 pages.

Akcasu , "Case Study of On-Chip Inductance Effects (Extraction and Analysis)", SEMATECH Technical Report, 1998.

Akcasu , "Case Study of On-Chip Inductance Effects (Extraction and Analysis)", Invited, FSA Modeling Workshop, San Jose, CA, May 24, 1999.

Akcasu , "Complete Three-Dimensional Simulation of RF IC Blocks for Synthesis, Design and Optimization", Invited, 12th Annual International Interconnect Technology Conference Short Course IITC 2009, Sapporo, Hokkaido, Japan, May 31, 2009.

Akcasu et al., "Impact of the On-Chip Inductive Effects on the Power Distribution Networks for Simultaneous Switching Noise and Ground Bounce Analysis for High Speed Processor Design", Invited, IMAPS Next Generation IC & Package Design, Solvang, CA, Jul. 15-17, 1999.

Akcasu , "Interconnect Parasitic RLC and Delay Variability Below 90nm, Physical Origins and its Impact on the Feature Geometry Scaling", Invited, IDV 2007, Bangalore, India, Dec. 13-14, 2007, 1 page.

Akcasu , "OEA International, Inc. Parasitic Inductance Impact Study Final Report", SEMATECH, Dec. 27, 1999, 43 pages.

Akcasu et al., "SPIRAL and RF-PASS Three Dimensional Design and Analysis Tools for RF Integrated Circuits", Invited, FSA Workshop, Sep. 8, 2002.

Akcasu , "Very Large Scale 3-D Modeling of Interconnect Structures for VLSI Applications", Invited, 1996 ST CAD, Taiwan, May 1996, pp. 4.2.1-4.2.16.

Application No. BR112019006928-3 , Office Action, Mailed On Jul. 19, 2022, 4 pages.

Burton et al., "FIVR-Fully Integrated Voltage Regulators on 4th Generation Intel Core SoCs", Advanced Power Electronics Conference, Fort Worth, TX, Mar. 2014, 8 pages.

Cho et al., "Impact of Copper Through-Package Vias on Thermal Performance of Glass Interposers", IEEE Transactions on Compo-

(56) References Cited

OTHER PUBLICATIONS nents, Packaging and Manufacturing Technology, vol. 5, No. 8, Aug. 2015, pp. 1075-1084.
Application No. CN201780074950.0 , Office Action, Mailed On Jun. 23, 2021, 7 pages.
Application No. CN201780074950.0 , Office Action, Mailed On Nov. 3, 2020, 8 pages.
Application No. EP17859039.4 , Extended European Search Report, Mailed On May 15, 2020, 7 pages.
Application No. EP17859039.4 , Notice of Decision to Grant, Mailed On Dec. 16, 2021, 2 pages.
IN 201917017400 , "First Examination Report", Feb. 2, 2021, 7 pages.
Application No. JP2019-539730 , Notice of Allowance, Mailed On Feb. 25, 2022, 3 pages.
Application No. JP2019-539730 , Office Action, Mailed On Aug. 12, 2021, 8 pages.
Application No. KR10-2019-7012946 , Notice of Decision to Grant, Mailed On Dec. 15, 2022, 7 pages.
Application No. KR10-2019-7012946 , Office Action, Mailed On Mar. 2, 2022, 10 pages.
Kumar et al., "Ultra-High I/O Density Glass/Silicon Interposers for High Bandwidth Smart Mobile Applications", 2011 Electronic Components and Technology Conference, 2011, pp. 217-223.
Kurd et al., "Haswell: A Family of IA 22nm Processors", ISSCC 2014, San Francisco, CA, Nov. 2014, pp. 112-114.
Lai et al., "300mm Size Ultra-thin Glass Interposer Technology and High-Q Embeded Helical Inductor for Mobile Application", International Electron Device Meeting, Dec. 2013, pp. 13.4.1-13.4.4.
Lambert et al., "Package Embedded Inductors for Integrated Voltage Regulators", 2014, pp. 528-534.
Application No. PCT/US2017/054976 , International Preliminary Report on Patentability, Mailed On Apr. 18, 2019, 10 pages.
Application No. PCT/US2017/054976 , International Search Report and Written Opinion, Mailed On Mar. 12, 2018, 13 pages.
PCT/US2017/054976 , "Invitation to Pay Additional Fees and Partial Search Report", Jan. 8, 2018, 2 pages.
Application No. PID201903542 , Office Action, Mailed On Jun. 16, 2023, 4 pages.
Rojas-Gonzales et al., "Design of a Fully-Integrated Buck Voltage Regulator Using Standard CMOS Technology", 2012, 4 pages.
Sturcken et al., "A Switched-Inductor Integrated Voltage Regulator With Nonlinear Feedback and Network-on-Chip Load in 45 nm SOI", IEEE Journal of Solid-State Circuits, vol. 47, No. 8, Aug. 2012, pp. 1935-1945.
Sukumaran et al., "Design, Fabrication, and Characterization of Ultrathin 3-D Glass Interposers With Through-Package-Vias at Same Pitch as TSVs in Silicon", IEEE Transactions on Components, Packaging and Manufacturing Technology, vol. 4, No. 5, May 2014, pp. 786-795.
Yarman et al., "Performance Assessment of Active and Passive Components Manufactured Employing 0.18 micron Silicon CMOS Processing Technology up to 22GHz", IEEJ International Workshop on AVLSI 2008, Istanbul, Turkey, 2008.

* cited by examiner

Folded flex sample

Table [3]Grover, p.22, Ref.[1]

REPLACEMENT SHEET $$M = \int_{P_{u1}}^{P_{u2}} \int_{P_{v1}}^{P_{v2}} \frac{\vec{u} \cdot \vec{v}}{r} ds_u ds_v$$

Neumann Formulation of Mutual Inductance

REPLACEMENT SHEET

Inductance $L$ versus length for given $S$ and $t$.

$L(l,t,S)$

Skin Depth δ As a Function of Frequency for Al($2.\times10^{-6}$ Ω.cm), Cu($1.725\times10^{-6}$ Ω.cm), 1 and 10 ohm.cm Si $$B(u) = \frac{u}{1 - e^{-u}}$$

*(Bernoulli Function)*

$$B(u) = \frac{u}{1 - e^{-u}}$$

Single Sided Solution $B(u)$ $y = u$ (Linear Equation with a Slope = 1)

$$u_1(\rho,\omega,t)=\frac{\left[1-(1+v)\cdot e^{-v}\right]}{v}$$

FIG. 24

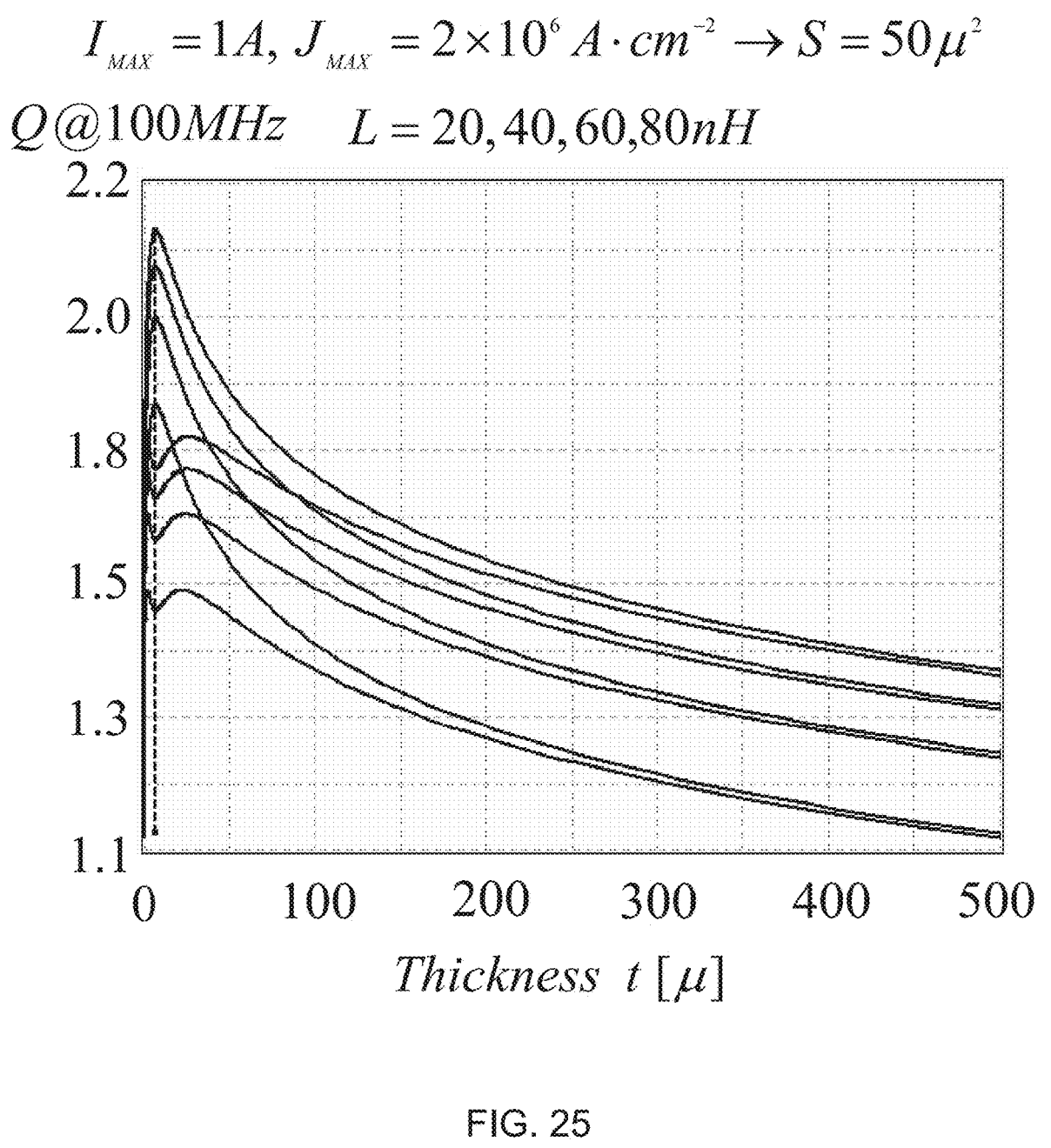

$I_{MAX} = 1A,\ J_{MAX} = 2\times10^{6}\ A\cdot cm^{-2} \rightarrow S = 50\mu^{2}$ $Q@100MHz \quad L = 20, 40, 60, 80nH$ 2.2
2.0
1.8
1.5
1.3
1.1
0
100
200
300
400
500

$Thickness\ \ t\ [\mu]$

FIG. 25

$$I_{MAX} = 5A,\ J_{MAX} = 2\times10^{6}\ A\cdot cm^{-2} \rightarrow S = 250\mu^{2}$$

$$L = 20, 40, 60 \text{ and } 80nH$$

$$I_{MAX} = 5A,\ J_{MAX} = 2\times10^{6}\,A\cdot cm^{-2} \rightarrow S = 250\mu^{2}$$

$$L = 20, 40, 60 \text{ and } 80nH$$

$$I_{MAX} = 10A,\ J_{MAX} = 2\times10^{6}\ A\cdot cm^{-2} \rightarrow S = 500\mu^{2}$$
$$L = 20, 40, 60 \text{ and } 80nH$$
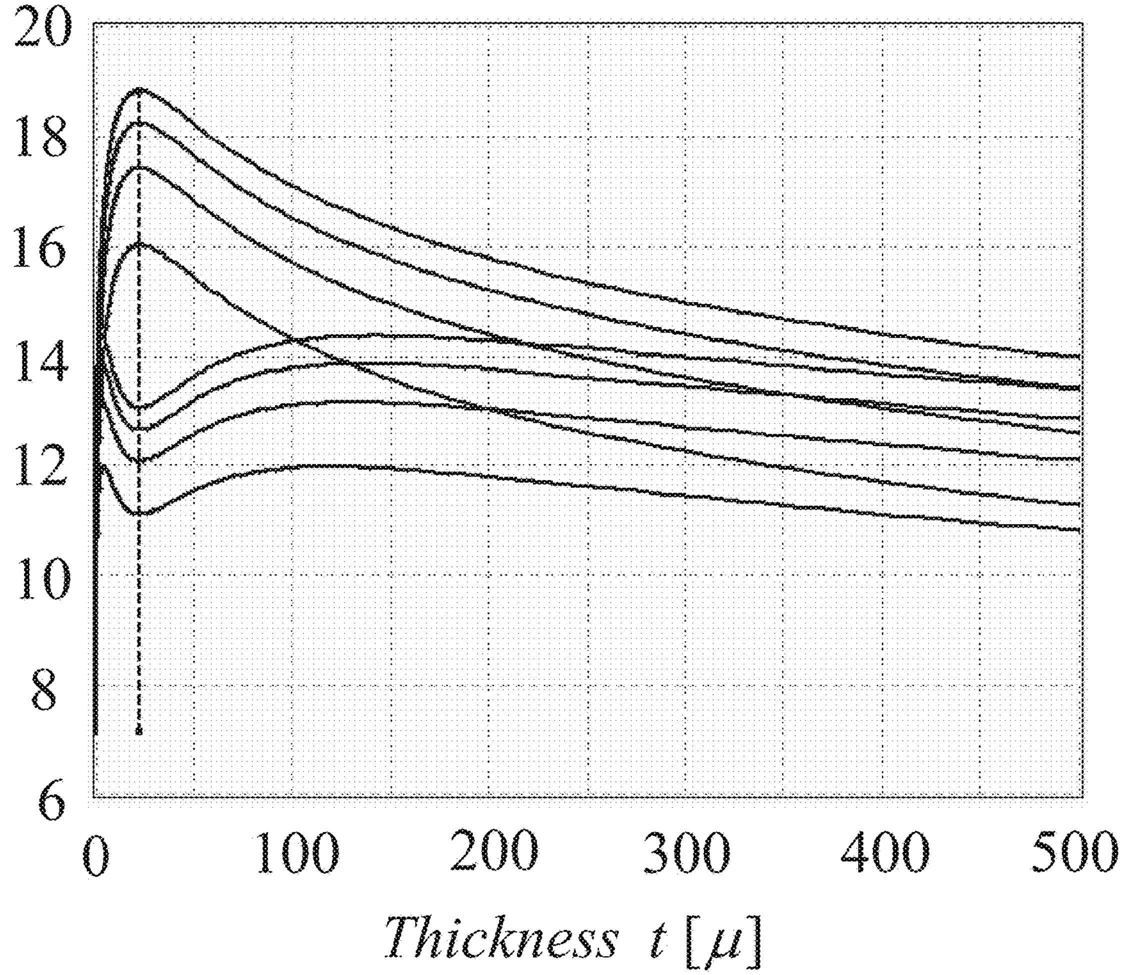
FIG. 29

$$I_{MAX} = 10A,\ J_{MAX} = 2\times10^{6}\ A\cdot cm^{-2} \rightarrow S = 500\mu^{2}$$

$$L = 20, 40, 60 \text{ and } 80nH$$

$$I_{MAX} = 10A,\ J_{MAX} = 2\times10^{6}\,A\cdot cm^{-2} \rightarrow S = 500\mu^{2}$$

$$L = 20, 40, 60 \text{ and } 80nH$$

$$I_{MAX} = 10A,\ J_{MAX} = 2\times10^{6}\,A\cdot cm^{-2} \rightarrow S = 500\mu^{2}$$

$$L = 20, 40, 60 \text{ and } 80nH$$

$$I_{MAX} = 10A,\ J_{MAX} = 2\times10^{6}\ A\cdot cm^{-2} \rightarrow S = 500\mu^{2}$$

$$L = 20, 40, 60 \text{ and } 80nH$$

$Q@100, 200MHz$

Relative Magnetic Field in 4 Cu Spiral Windings. A Measure Of Skin, Proximity and Eddy Current Effects. Winding Widths are 0.5, 1, 2, 3, 4, 5 and 10δ. All windings Carrying the Same Current I.

$$w = 2\mu, S = 50, 250, 500\ and\ 1{,}000\mu^2$$

FIG. 40

$$Metal\ Aspect\ Ratio \rightarrow\ \Delta_M = \frac{t}{w} >> 5$$

$$Space\ Aspect\ Ratio \rightarrow\ \Delta_S = \frac{t}{s} >> 5$$

$$
\left[\begin{array}{ccc|ccc}
L_{11} & L_{12} & L_{13} & L_{14} & L_{15} & L_{16} \\
L_{21} & L_{22} & L_{23} & L_{24} & L_{25} & L_{26} \\
L_{31} & L_{32} & L_{33} & L_{34} & L_{35} & L_{36} \\
\hline
L_{41} & L_{42} & L_{43} & L_{44} & L_{45} & L_{46} \\
L_{51} & L_{52} & L_{53} & L_{54} & L_{55} & L_{56} \\
L_{61} & L_{62} & L_{63} & L_{64} & L_{65} & L_{66}
\end{array}\right]
\left[\begin{array}{cccccc}
+ & + & + & - & - & - \\
+ & + & + & - & - & - \\
+ & + & + & - & - & - \\
- & - & - & + & + & + \\
- & - & - & + & + & + \\
- & - & - & + & + & +
\end{array}\right]
$$

Table[1]Grover, p.19, Ref.[1]

Based on Table[2], "*Concluded*" Grover, p.21, Ref.[1]

Tight Coupling Aspect Ratio Relations $$\Delta_s(n)=\frac{t}{(n-1)\cdot w+n\cdot s}\quad for\ n=1,2,3,\ldots$$

$$Metal\ Spacing\ Ratio\ \Delta_S = \left(\frac{t}{s}\right)$$

$n$[Number of Turns]

$\Delta_S(n) = 2$ $\Delta_S = 15$ $\Delta_S = 10$ $\Delta_S = 5$ 6
5
4
3
2
1

0 10 20 30 40 50

$$Metal\ Aspect\ Ratio\ \Delta_M = \left(\frac{t}{w}\right)$$

FIG. 54

$$l_{i+1} = l_i + 2 \cdot s$$

STEP 1 : Starting Material SOI Wafer

1. $Si\ Substrate\ (t_1 = 200 - 500\mu)$

2. $SiO_2\ (t_{SiO_2} < 2\mu)$

3. $Si\ (t_{3Si} = 50 - 300\mu)$ $Example\ (t_{3Si} = 50, 100, 200\ and\ 300\mu)$ $t_{3Si}$ 4. $Tantalum\ (Ta)\ Deposition = \delta_{Ta1} \approx 0.5\mu$

STEP 2 : Silicon Deep Reactive Etching Barrier Material Deposition

5. $PR$ (Photo – Resist)

STEP 3 : Photo Lithography Step
Photo Resist (PR) Deposition and Patterning for Ta Masking

STEP 4 : Ta Etch

*Si* Deep Reactive Ion Etching

STEP 5 : Si Deep Reactive Ion Etch $$w_{Si}(\min) = 2\mu \;\; and \;\; \frac{t_{3Si}}{w_{Si}} \geq 25$$

More Realistic In - Scale Cross – Section after PR Removal 64

*Example*:

$$For \quad t_{3Si} = 50, 100, 200 \, and \; 300\mu$$

$$w_{Si} = 2, 4, 8 \, and \; 12\mu$$

$$s_{Si} > 2, 4, 8 \, and \, 12\mu$$

(*Function of Desired Metalization*)

STEP 6 :PR Removal

$$s_{Ta} = s_{Si} - 2\delta_{Ta2} \qquad w_{Ta} = w_{Si} + 2\delta_{Ta2}$$

$$d_{INTa} = d_{INSi} - 2\delta_{Ta2}$$

$$t_{Ta} = t_{3Si} + \delta_{Ta1} + \delta_{Ta2}$$

$$\rho_{Ta} = 1.31 \times 10^{-5}\ \Omega \cdot cm$$

$$6.\ Second\ Tantalum\ \ (Ta)\ \ Deposition = \delta_{Ta2} \approx 0.5\,\mu$$

STEP 7 : Ta Deposition

$$t_{TaE} = t_{3Si} + \delta_{Ta1} \qquad w_{Ta} = w_{Si} + 2\delta_{Ta2}$$

STEP 8 : Dry Ta Etching

$$s = s_{Si} - 2\delta_{Ta2} - 2\delta_{EP} \qquad w = w_{Si} + 2\delta_{Ta2} + 2\delta_{EP}$$

$$t = t_{3Si} + \delta_{Ta1} + \delta_{EP} \qquad d_{IN} = d_{INSi} - 2\delta_{Ta2} - 2\delta_{EP}$$

$$7.\ Electro - Plating\,(EP) = \delta_{EP} \approx 1 - 20\,\mu$$

$$\delta_{EP} < k \cdot \sqrt{\frac{2\rho_{EP}}{\omega\mu\mu_r}}$$

$$k = 1.6 - 3.85\ for\ R_{AC} < 2 \cdot R_{DC}\ @\ \omega$$

STEP 9 : Electro-Plating

$$w_{PAD} \approx 75-100\mu \neq f(w)$$

STEP 10 : Dielectric Fill Showing Issues with $t_{DIEL}$<t! t<$t_{DIEL}$ is needed followed by planarization!

$$w_{PAD} \approx 75-100\mu \neq f(w)$$

STEP 11: Lithography Step PR for a Single Large Si Column C4 Bump Pad Etch After Dielectric Planarization

(Polyamide or Parylene Deposition/Planarization)

$$w_{PAD} \approx 75-100\mu \neq f(w)$$

$$s_{Ta} = s_{Si} - 2\delta_{Ta2} < 2\delta_{EP}$$

STEP 11.1 : Lithography Step PR for Closely Separated "Si Column Array Pad" for C4 Bump Pad Etch After Dielectric Planarization

STEP 12 : Bump Pad Etch

STEP 13 : Top C4 Solder Ball/Bumping

Wafer Scale Electro-Plating Grid

Back Side Ta Deposition, PR, Lithography, Back Side Ta Pad Etch ($\delta_{Ta3}$≈0.5μ)

Si Etch, Deep Reactive Ion Etching $SiO_2$ Etch

Tantalum (Ta) Deposition $= \delta_{Ta4} \approx 0.5\mu$

Electro - Plating (2 - 20$\mu$)

STEP 12 : Bottom C4 Solder Ball/Bumping PROBLEM!!

Full Integration Eliminating the Interposer For Standard IC Processes with

Buried Oxide $(1-2\mu)$ $1 < t_{ACTIVE} < 3\mu(Si)$

Top Oxidation and Pad Area Oxide Etch (Standard Processing Step)

Silicon Etch (Standard Device Processing Step)

Buried Oxide $(1-2\mu)$ $$1 < t_{ACTIVE} < 3\mu(Si)$$

Trench Wall Oxidation
(Standard Device Processing Step)

Burried Oxide $(1-2\mu)$
$1 < t_{ACTIVE} < 3\mu(Si)$

First Layer Metal Deposition/Etch (Standard Device Processing Step)

Buried Oxide $(1-2\mu)$ $$1 < t_{ACTIVE} < 3\mu(Si)$$

$$t_{Si-SUBSTRATE} \approx 200-500\mu(Si)$$

$$t_{ACTIVE} > 3\mu(Si)\ typical[10-300\mu]$$

Buried Oxide $(1-2\mu)$

Example of 6 Active Side and 3 Back Side Si Column STV Cross-section

$$\delta_{Ta1} \approx 0.5\mu$$

$$t_{Si-SUBSTRATE} \approx 200-500\mu(Si)$$

$$t_{ACTIVE} > 3\mu(Si)\ typical[10-300\mu]$$

$$\text{Buried Oxide}(1-2\mu)$$

Example of 6 Active Side and 3 Back Side Si Columns STV Cross-section

$$\delta_{Ta1} \approx 0.5\mu$$

$$t_{Si-SUBSTRATE} \approx 200-500\mu(Si)$$

$$t_{ACTIVE} > 3\mu(Si)\ typical[10-300\mu]$$

$\text{Buried Oxide}(1-2\mu)$

Example of 6 Active Side and 3 Back Side Si Columns STV Cross-section after buried oxide etch

$$\delta_{Ta1} \approx 0.5\mu$$

$$t_{Si-SUBSTRATE} \approx 200-500\mu(Si)$$

$$t_{ACTIVE} > 3\mu(Si)\ typical[10-300\mu]$$

$$\text{Buried Oxide}(1-2\mu)$$

Example of 6 Active Side and 3 Back Side Si Columns STV Cross-section after Tantalum deposition

$$t_{Si-SUBSTRATE} \approx 200-500\mu(Si)$$

$$t_{ACTIVE} > 3\mu(Si)\ typical[10-300\mu]$$

$$\text{Buried Oxide}(1-2\mu)$$

Example of 6 Active Side and 3 Back Side Si Columns STV Cross-section after backside electroplating

$$t_{Si-SUBSTRATE} \approx 200-500\mu(Si)$$

$$t_{ACTIVE} > 3\mu(Si)\ typical[10-300\mu]$$

$$\text{Buried Oxide}(1-2\mu)$$

Active and Back Side Electro-Plated Dark Shaded of the STV Cross-Section

$$t_{Si-SUBSTRATE} \approx 200 - 500\mu(Si)$$

$$t_{ACTIVE} > 3\mu(Si)\ typical[10 - 300\mu]$$

$$\text{Buried Oxide}\,(1 - 2\mu)$$

Full Conductive Area of the STV Cross-Section

$t_{Si-SUBSTRATE} \approx 200-500\mu(Si)$ $t_{ACTIVE} < 2\mu(Si)$ Typical $[200nm \pm 2nm]$ Buried Oxide $(20nm)$ [*SIMOX*]

$$t_{Si-SUBSTRATE} \approx 200-500\mu(Si)$$

$$t_{ACTIVE} < 2\mu(Si)\ Typical[200nm \pm 2nm]$$

Buried Oxide $(20nm)$ [*SIMOX*]

$$t_{Si-SUBSTRATE} \approx 200-500\mu(Si)$$

$$t_{ACTIVE} < 2\mu(Si)\ Typical[200nm \pm 2nm]$$

$$\text{Burried Oxide}(20nm)[SIMOX]$$

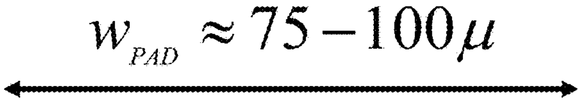
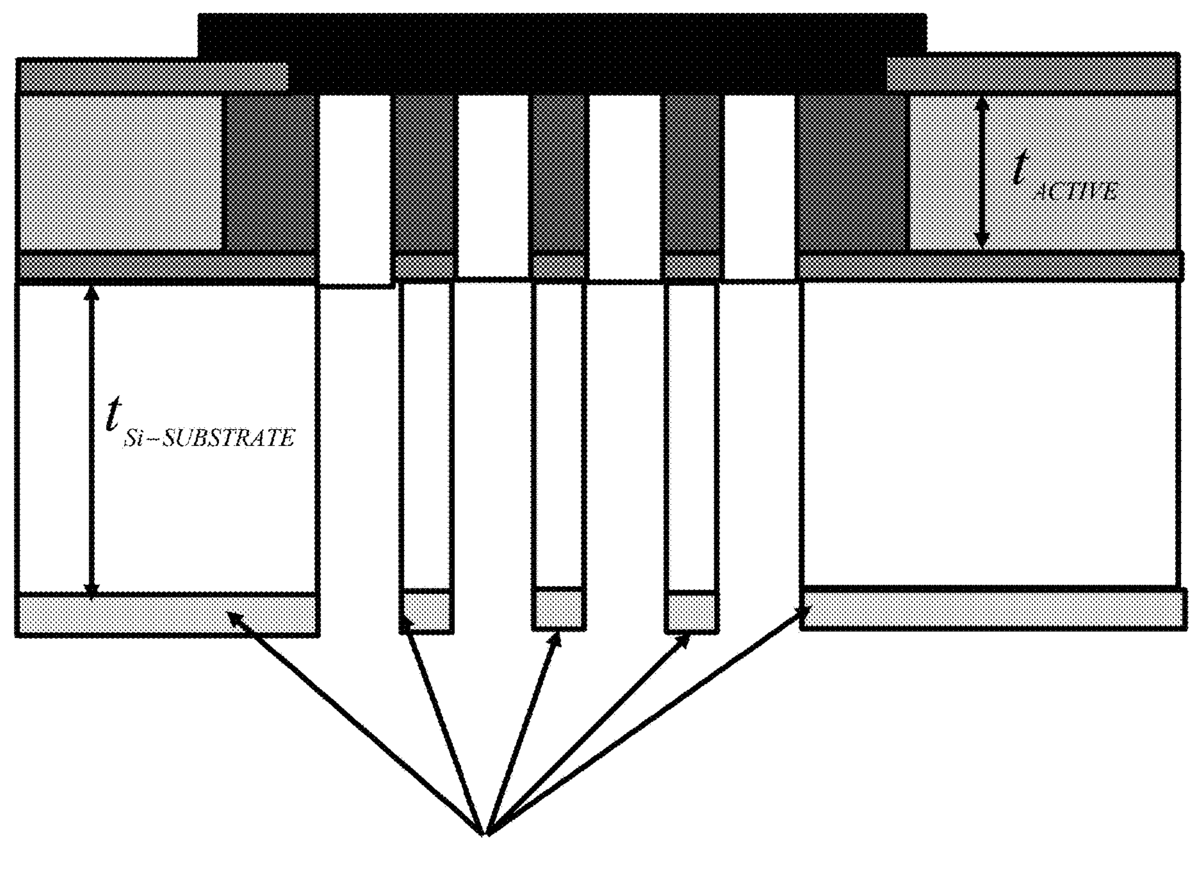
$\delta_{Ta1} \approx 0.5\mu$
$$t_{Si-SUBSTRATE} \approx 200 - 500\mu(Si)$$
$$t_{ACTIVE} < 2\mu(Si)\ Typical[200nm \pm 2nm]$$
Buried Oxide (20nm)[SIMOX]
Plasma or RIE Oxide Etch
FIG. 107

$w_{PAD} \approx 75-100\mu$ $t_{ACTIVE}$ $t_{Si-SUBSTRATE}$ $t_{Si-SUBSTRATE} \approx 200-500\mu(Si)$ $t_{ACTIVE} < 2\mu(Si)\ Typical[200nm \pm 2nm]$ Buried Oxide $(20nm)[SIMOX]$

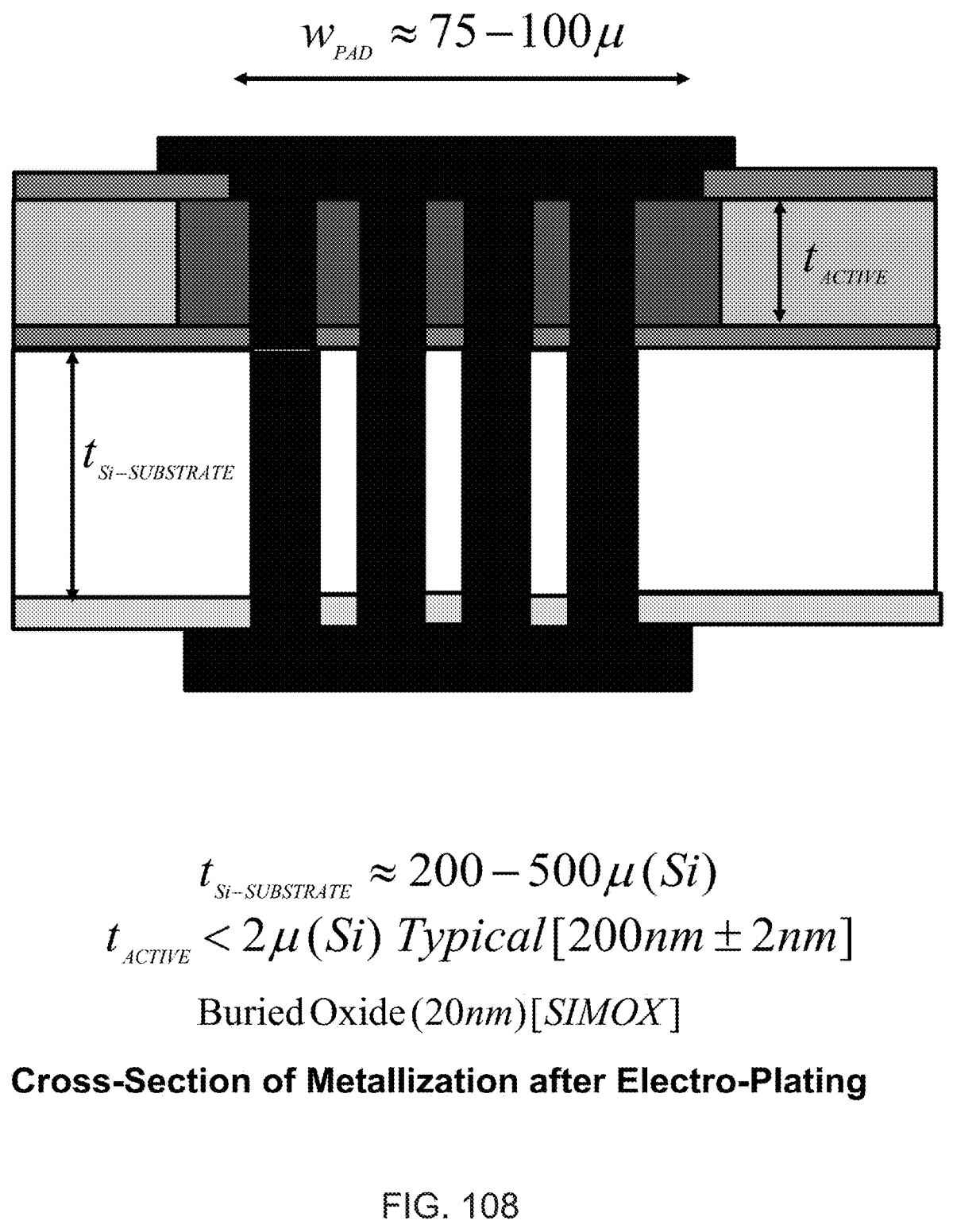

Cross-Section of Metallization after Electro-Plating

FIG. 108

Interposer Metallization Rule for $t_{3Si}$=47.5μ, $\delta_{Ta}$=0.5μ, $\delta_{EP}$=2μ $S_{\delta EP}$=255μ$^2$ .Giving $I_{MAX}$=5.1A with "Tight Coupling" Condition $$\delta_{TOT} = \delta_{EP} + \delta_{Ta} = 2.5\mu$$

$$Metal\ Aspect\ Ratio \rightarrow\ \Delta_M = \frac{50}{7} = 7.14$$

$$Space\ Aspect\ Ratio \rightarrow\ \Delta_S = \frac{50}{10} = 5$$

Interposer Metallization Rule for $t_{3Si}$=47.5μ, $\delta_{Ta}$=0.5μ, $\delta_{EP}$=8μ

$S_{\delta EP}$=5,199μ² .Giving $I_{MAX}$=103A with "Tight Coupling"

$$\delta_{TOT} = \delta_{EP} + \delta_{Ta} = 8.5\mu$$

$$Metal\ Aspect\ Ratio \rightarrow \ \Delta_M = \frac{300}{28.66} = 10.47$$

$$Space\ Aspect\ Ratio \rightarrow \ \Delta_S = \frac{300}{60} = 5$$

Si Core Width ($w_{Si}$) and Total Winding Width (w) for $\delta_{Ta}$=0.5μ and for $\delta_{EP}$=2, 4, 6 and 8μ as a Function of Si Core Thickness ($w_{Si}$>2μ and $t_{3Si}/w_{Si}$=25)

$$w_{Si} = \frac{t_{3Si}}{25} \; and \; w_{Si} > 2\mu$$

$$w = w_{Si} + 2 \cdot (\delta_{Ta} + \delta_{EP})$$

$(w_{Si}, w)[\mu]$ 40
35
30
25
20
15
10
5
0

$w(\delta_{EP} = 8\mu)$
$w(\delta_{EP} = 6\mu)$
$w(\delta_{EP} = 4\mu)$
$w(\delta_{EP} = 2\mu)$
$w_{Si}$ 0
100
200
300
400
500

$Si\,Core\,Thickness\; t_{3Si}[\mu]$

FIG. 111

Si Core to Si Core Spacing ($s_{Si\text{-}Si}$)for $\Delta_S$=5 and 10 for $\delta_{Ta}$=0.5μ and for $\delta_{EP}$=2, 4, 6 and 8μ as a Function of Si Core Thickness ($w_{Si}$>2μ and $t_{3Si}/w_{Si}$=25)

FIG. 113

$$w_{Si}(\min) = 2\mu,\ \ \Delta_{SiW} = \frac{t_{3Si}}{w_{Si}} = 25\ and\ \delta_{Ta} = 0.5\mu$$

FIG. 114

$$w_{Si}(\min) = 2\mu,\ \ \Delta_{SiW} = \frac{t_{3Si}}{w_{Si}} = 25\ and\ \ \delta_{Ta} = 0.5\mu$$

$$w_{Si}(\min) = 2\mu, \quad \Delta_{SiW} = \frac{t_{3Si}}{w_{Si}} = 25 \ and \ \delta_{Ta} = 0.5\mu$$

Bottom C4 Solder Ball/Bumping Using Si Wafer with a thickness of 300μ instead of SiO wafer

Maximum Inductor Resistance $R_{IND}$ vs. Current for a DC/DC Converter having 1V output for desired maximum efficiency numbers η=95,90,85 and 80% (Theoretical Maximum)

$Pad\ Size(100 \times 100)\mu\ \ and\ \ \delta_{Ta} = 0.5\mu$ $$s = 30\mu,\ t = 300\mu, w = 30\mu, \varepsilon_r = 3{,}900 \rightarrow 0.65nF$$

$$f \approx 196MHz$$

$$s = 30\mu,\ t = 300\mu, w = 30\mu, \varepsilon_r = 10{,}000 \rightarrow 1.66nF$$

$$f = \frac{1}{2\pi\sqrt{LC}} \approx 123MHz$$

Single Layer Flex Technology 0.35 mil = 0.25 ounce Copper 1.4 mil = 1 ounce minimum radius of curvature 32 mil $$\rho_{Cu}(T @ 20^0 C) = 1.68 \times 10^{-8}[\Omega.m] \;\; \sigma = 5.96 \times 10^7 \left[\frac{S}{m}\right]$$

$$\alpha = 0.003862 \rightarrow \rho(T) = \rho_0[1 + \alpha(T - T_0)]$$

$$1 \text{ mil} = 25.4\ \mu$$

| Copper Weight (Ounce) | Thickness (mils) | Thickness (µ) |
|---|---|---|
| 0.25 | 0.35 | 8.89 |
| 0.375 | 0.525 | 13.335 |
| 0.5 | 0.7 | 17.78 |
| 1 | 1.4 | 35.56 |
| 2 | 2.8 | 71.12 |

$$\text{Height of the flex} = (2 \times d) + (w_1 + w_2 + w_3) + 2 \times s$$

*where*

$$d = 10mil\,(the\ spacings\ from\ the\ top\ and\ Bottom),$$

$$w_1, w_2, w_2 = Widths\ of\ the\ lines\ (3, 4, 5\,mils)$$

$$s = Spacing\ between\ lines\,(5\,mils)$$

$$Giving\ 20 + 12 + 10 = 52\,mils$$

5 Turns, 19 Legs $500 \times 19 \approx \textit{Flex Length}\ 9{,}500\,\text{mil}$ PCB Cutout Rectangular Cutouts For Flex to PCB Connection Extensions Flex to PCB Connectors (Mounted Under the PCB)

Two - Layer Flex Technology for Transformer/Balun Structures

Single Layer Via 'less Flex Alternating Folding Method for Stacked Spiral Structures or Via 'less Coils

SPIRAL INDUCTORS, TRANSFORMERS AND BALUNS FORMED FROM FLEXIBLE DIELECTRIC SHEETS

CROSS-REFERENCES TO RELATED APPLICATIONS

This application is a Continuation of U.S. application Ser. No. 17/978,783, filed Nov. 1, 2022, which is a Divisional of U.S. application Ser. No. 15/285,310, filed Oct. 4, 2016, now U.S. Pat. No. 11,501,908, issued Nov. 15, 2022, the contents of which are incorporated herein by reference in their entirety for all purposes.

BACKGROUND OF THE INVENTION

Introduction

This invention relates to miniature circuit components for application in connection with integrated circuits and certain types of miniature discrete circuits and methods for manufacturing such devices. The invention is related to improvements upon and replacement of conventional miniature spiral inductors for example. Other embodiments include transmission lines, capacitors, and low impedance power distribution networks in integrated circuits. More particularly, design techniques and structures are disclosed with mathematical proofs that permit realization of small, very high current, and high inductance components with good quality factor Q in one embodiment and also in applications where high current distribution problems are found in miniature structures such as integrated circuit chips and power supplies.

A class of devices called spiral inductors is known for use with semiconductor devices, and they represent an example of the types of devices that can be made according to the invention. Spiral inductors are defined as planar structures having a characteristic inductance, and they are known to some degree for realizing inductors in integrated circuit and packaging technologies. They are extensively used in RFIC (Radio Frequency Integrated Circuits) in LNA (Low Noise Amplifier), VCO (Voltage Controlled Oscillators), PLL (Phase Locked Loops) designs. Recently, spiral inductors have been considered for DC/DC converter architectures, mainly for buck converter designs for supplying on-chip, high current, low voltage requirements for processor designs. [3-9][Reference numbers refer to listed reference items below.]

Accurate analysis in preparation for suitable designs requires a good understanding of complex electromagnetics and suggests a need for sophisticated and accurate analysis software. Designing a spiral inductor with a desired inductance value and AC performance in a smallest possible area is a more difficult optimization problem than analyzing a given structure. Extending the concept of a small area spiral inductor for use in power space as in DC/DC converter architectures puts even more difficult constraints on the design for a given process technology, due to the high current specifications (1 A-130 A) and much larger needed inductance values (10 nH-80 nH) within a reasonably small area, such as regions not exceeding several hundred microns on a side for applications operating below 200 MHz with good quality (Q>10 (Quality Factor). This is a nearly impossible problem to solve with current process technologies related to integrated circuit architectures [3-24]. Therefore, the only presently known option is use of off-chip inductors. Such inductors suffer from undesirable issues in design [3-24] and are not inherently small relative to the dimensions of elements in a semiconductor device, resulting in a large area penalty on the overall system dimension.

The electromagnetics of any inductor is complex. Even a distributed circuit model is highly complex compared to capacitor and resistors. The distributed circuit model requires many mutual coupled inductors, resistors and capacitors that need to be calculated from the physical geometry. However a distributed circuit model is still is a simpler way of understanding the circuit behavior of a spiral inductor compared to complex electromagnetics associated with it. To understand the invention explained it is useful to start from inductor basics. In this work both complex electromagnetic simulations and circuit models derived from the simplified solution of the three-dimensional simulation results are used. Thus, this disclosure is a fundamental tutorial for realizing miniature inductance devices.

The inventor would like to acknowledge the assistance of Prof. Dr. Yusuf Leblebici and Dr. Seniz E. Kucuk Eroglu of the Microelectronic Systems Laboratory Swiss Federal Institute of Technology, Lausanne, Switzerland for providing technical assistance in manufacturing structures as herein disclosed and Michael Brunolli of San Diego, California, for introducing this very challenging problem, circuit level discussions and his constant encouragements throughout the work.

REFERENCES

The following references, many of which are herein cited, provide supplemental and background information for this invention and are incorporated herein by reference for all purposes. No representation is made as to the extent of relevance to the present invention.

1. "Inductance Calculations", Frederick W. Grover, Copyright Frederick W. Grover, 1946, 1973, ISBN 0-87664-557-0, Reprinted by permission of Dover Publications, Inc. 10 Varick Street, New York, N.Y. 100114 by Instrument Society of America, PO Box 12277, Research Triangle Park, N.C. 27709.
2. "Product Integration with Applications to Differential Equations," John D. Dollard and Charles N. Friedman, Copyright 1979 Addison-Wesley, Reading M A 01867, Cambridge University Press 1984, ISBN 978-0-521-30230-2.
3. "FIVR-Fully Integrated Voltage Regulators on 4$^{th}$ Generation Intel Core SoCs", Edward A. Burton, Gerhard Schrom, Fabrice Paillet, William J. Lambert, Kaladhar Radhakrishnan and Michael J. Hill, Advanced Power Electronics Conference, Fort Worth, TX, 2014.
4. "Package Embedded Inductors for Integrated Voltage Regulators," William J. Lambert, Kaladhar Radhakrishnan, Leigh Wojewoda and Anne E. Augustine,
5. "Haswell: A Family of IA 22 nm Processors", N. Kurd, et al., ISSCC 2014, San Francisco, 2014.
6. "Design of a Fully-Integrated Buck Voltage Regulator Using Standard CMOS Technology," Miguel A. Rojas-Gonzales, Joselyn Torres and Edgar Sanchez-Sinencio.
7. "A Switched-Inductor Integrated Voltage Regulator with Nonlinear Feedback and Network-on-Chip Load in 45 nm SOI," IEEE Journal of Solid-State Circuits, Vol. 47, No 8, August 2012, pp. 1935-1945.
8. "A 50-MHz Fully Integrated Low-Swing Buck Converter Using Packaging Inductors," Youngkook Ahn, Hyunseok Nam and Jeongjin Roh, IEEE Transaction on Power Electronics, Vol. 27, No 10, October 2012, pp. 4347-4356.

9. "Voltage Regulators for Next Generation Microprocessors," Toni Lopez, Reinhold Elferich and Eduard Alarcon, ISBN 978-1-4419-7559-1.
10. "PG-PLANE", The Three-Dimensional Inductance Simulator for Ground Bounce and Simultaneous Switching Noise for Complex Package Power and Ground Plane Structures, Osman E. Akcasu, IEEE IEPS 1992, Austin, TX.
11. ""Net-An" a Full Three-Dimensional Parasitic Interconnect Distributed RLC Extractor for Large Full Chip Applications," Osman E. Akcasu, J. Lu, A. Dalal, S. Mitra, L. Lev, N. Vasseghi, A. Pance, H. Hingarh and H. Basit, IEEE IEDM 1995, Washington D.C., pp. 495-498.
12. "Very Large Scale 3-D Modeling of Interconnect Structures for VLSI Applications," Osman E. Akcasu, Invited, 1996 ST CAD, Taiwan May 1996, pp. 4.2.1-4.2.16.
13. "Net-An" a full 3D Parasitic Interconnect Distributed RLC Extractor for Large Full Chip Applications," Osman E. Akcasu, Invited, FSA Modeling Workshop, Nov. 8, 1996, San Jose, CA.
14. "Case Study of On-Chip Inductance Effects (Extraction and Analysis)," O. E. Akcasu, SEMATECH Technical Report 1998.
15. "Case Study of On-Chip Inductance Effects (Extraction and Analysis)," Osman E. Akcasu, Invited, FSA Modeling Workshop, May 24, 1999, San Jose, CA.
16. "Impact of the On-Chip Inductive Effects on the Power Distribution Networks for Simultaneous Switching Noise and Ground Bounce Analysis for High Speed Processor Design," Osman E. Akcasu, Mehmet Tepedelenlioglu, Kerem Akcasu, Invited, *IMAPS Next Generation IC & Package Design*, Jul. 15-17, 1999, Solvang, CA
17. "A General and Comparative Study of $RC^{(0)}$, RC, RCL and RCLK Modeling of Interconnects and their Impact on the Design of Multi-Giga Hertz Processors," Osman E. Akcasu, Onur Uslu, Nagaraj N S, Tufan Colak, Stephen Hale and Edmund Soo, Invited, March 2002, IEEE ISQED 2002, Santa Clara, CA.
18. "Spiral and RF-Pass Three Dimensional Design and Analysis Tools for RF Integrated Circuits," Osman E. Akcasu, Haris Basit, Kerem Akcasu, Tufan Colak and Ibrahim Akcay Invited, FSA Workshop, Sep. 8, 2002.
19. "A Practical Approach to Prevent Simultaneous Switching Noise and Ground Bounce Problems in IO Rings," Osman E. Akcasu, Jerry Tallinger and Kerem Akcasu, DesignCon 2003, Jan. 27-30, 2003.
20. "60 nm and 90 nm Interconnect Modeling Challenges," Osman E. Akcasu, Invited, FSA Technical Conference, Oct. 4-7, 2004.
21. "Interconnect Parasitic RLC and Delay Variability Below 90 nm, Physical Origins and its Impact on the Feature Geometry Scaling," Osman E. Akcasu Invited, IDV 2007, Dec. 13-14, Bangalore, India.
22. "Performance Assessment of Active and Passive Components Manufactured Employing 0.18 micron Silicon CMOS Processing Technology up to 22 GHz," B. Siddik Yarman, Kemal Ozanoglu, Onur Uslu, Fusun Selcuk, O. Ersed Akcasu, *IEEJ International Workshop on AVLSI* 2008, Istanbul, Turkey.
23. "Complete Three-Dimensional Simulation of RF IC Blocks for Synthesis, Design and Optimization," Osman E. Akcasu Invited, $12^{th}$ Annual International Interconnect Technology Conference Short Course IITC 2009, May 31, 2009, Sapporo, Hokkaido, Japan.
24. "Engineering Electromagnetic Fields and Waves," Carl T. A. Johnk, John Willey & Sons, Copyright 1975, ISBN 0-471-44289-5.
25. "Elements of Electromagnetics," Matthew N. O. Sadiku, Oxford University Press, Copyright 2001 Third Edition, 2001, ISBN 0-19-513477-X.
26. "Mathematical Handbook of Formulas and Tables," Murray R. Spiegel, Schaum's Outline Series, Copyright 1952 by McGraw-Hill, Inc.
27. "Handbook of Mathematical Functions," Edited by Milton Abramowitz and Irene A. Stegun, Dover Publications, Inc., New York, 1972, Library of Congress Catalog Card Number: 65-12253.
28. "Applied Numerical Analysis," C. F. Gerald, Addison-Wesley Publishing Co., 1980, ISBN 0-201-02696-1.
29. "Handbook of Chemistry and Physics," 66th Edition, 1985-1986, Copyright Chemical Rubber Publishing Company, ISBN-0-8493-0466-0.
30. "Power Electronics," N. Mohan, Tore M. Undeland and William P. Robbins, Third Edition, Copyright 2003, John Willey and Sons, Inc., ISBN 978-0-471-22693-2.
31. "The Design of CMOS Radio-Frequency Integrated Circuits," Thomas H. Lee, Copyright 1998, Cambridge University Press, ISBN 0-521-63061-4.
32. *Micro Electronics Packaging Handbook*, edited by Rao R. Tummala and Eugene J. Rymaszewski, Van Nostrand Reinhold, New York, Copyright 1989, ISBN 0-442-20578-3
33. "Method of Anisotropically Etching Silicon", Franz Laermer, Andrea Schilp, U.S. Pat. No. 5,501,893, Mar. 26, 1996.
34. "Maximum Achievable Aspect Ratio in Deep Reactive Ion Etching of Silicon due to Aspect Ratio Dependent Transport and Microloading Effect", Junghoon Yeom, Yan Wu, John C. Selby and Mark A. Shannon, Journal of Vacuum Sci. Technol. B 23(6), November/December 2005, pp. 2319-2329.
35. "Very High Aspect Ratio Deep Reactive Ion Etching of Sub-micrometer Trenches in Silicon", Jayalakshmi Parasurman, Anand Summanwar, Frederic Marty, Philippe Basset, Dan E. Angelescu and Tarik Bourouina, IEEE Journal of Micromechanical Systems, 2012-0181
36. "Solder Cap Application Process on Copper Bump Using Solder Power Film", U.S. Pat. No. 7,790,597 B2, Sep. 7, 2010.
37. "Design and Assembly of Double-Sided 3D Package with a Controller and a DRAM Stack", Xi Liu, Ming Li, Don Mullen, *Julia* Cline and Suresh K. Sitaraman, 2012 IEEE 62nd Electronic Components and Technology Conference.
38. "Ultra-High I/O Density Glass/Silicon Interposers for High Bandwidth Smart Mobile Applications", Gomul Kumar, Tapobrata Bandyopadhyay, Vijay Sukumaran, Venky Sundaram, Sung Kyu Lim and Rao R. Tummala. 2011 Electronic Components and Technology Conference.
39. "Impact of Copper Through-Package Vias on Thermal Performance of Glass Interposers", Sangbeom Cho, Venky Sundaram, Rao R. Tummala and Yogendra K. Joshi. *IEEE Transactions on Components, Packaging and Manufacturing Technology*, Vol. 5, No 8, August 2015.
40. "Design, Fabrication, and Characterization of Ultrathin 3-D Glass Interposers With Through-Package-Vias at Same Pitch as TSVs in Silicon", Vijay Sukumaran, Gokul Kumar, Koushik Ramachandran, Yuya Suzuki, Kaya Demir, Yoichiro Sato, Toshikate Seki, Venky Sundaram and Rao R. Tummala. *IEEE Transactions on Components, Packaging and Manufacturing Technology*, Vol. 4, No 5, May 2014.

41. "300 mm Size Ultra-thin Glass Interposer Technology and High-Q Embedded Helical Inductor for Mobile Application", W C Lai, H H Chuang, C H Tsai, E H Yeh, C H Lin, T H Peng, L J Yen, W S Liao, J N Hung, C C Sheu, C H Yu, C T Wang, K C Yee and Doug Yu, International Electron Device Meeting, December 2013.

SUMMARY OF THE INVENTION

According to the invention, miniature circuit components of various disclosed manufacturing techniques are provided that are suitable for forming or embedding in semiconductor structures or coupling to miniature circuitry and suitable as inductors, capacitors, transmission lines and power distribution networks based on a principle of tight coupling among conductive segments. In a specific embodiment, a miniature inductor is provided for integrated circuit applications that comprises a rectangular-cross-section metal conductive element formed in various configurations as a multiple-turn winding formed of adjacent segments and disposed such that the thickness dimension is much greater than the width dimension and windings are closely spaced in the width dimension on a scale comparable to the width dimension to attain tight coupling across multiple turns. Further embodiments include a spiral winding disposed in a silicon substrate formed of a deep, narrow, conductor-covered spiral ridge separated by a narrow spiral channel trough or valley. Other embodiments, useful especially for experimental verification, comprise wide, thin conductors (corresponding to conventional windings) that are formed on a thin, flexible insulative substrate sheet (Flex Technology) wherein the sheet is wound into a roll with the conductor-formed windings adjacent one another. Alternatively conductors are formed on thin insulative sheets and folded or stacked into layers with the conductor-formed windings adjacent one another. The conductors of the alternative-embodiment devices may be fabricated using flex-film processing techniques. The conductors may be disposed in a continuous spiral or a rectangular spiral configuration and attached to a conventional semiconductor chip via interposers. The conductors are of sufficient surface area to support intended or design currents at intended or design frequencies in both cases substantially greater than is heretofore known due to achievement of very tight coupling across multiple windings. Further according to the invention, a method of manufacture of inductors comprises forming a narrow spiral ridge of substantial depth by etching into an insulative substrate that is typically of silicon, then the substrate is electroplated with a conductor, and finally the valley between the ridges is directionally etched to remove conductor to establish continuous, closely spaced windings of a width substantially greater than conductor thickness or the ridge depth. The manufacturing techniques are adaptable to transmission lines, and capacitors.

The disclosed design parameters allow realization of very small area, large value and high Q inductors when operated at lower frequency ranges suited to power applications, as well as realization of relatively high-Q, small-area inductors at any frequency range for a given process technology. Sizes of such devices make them compatible with many semiconductor chip designs. Inductors constructed according to the invention can achieve inductance values heretofore not achievable in miniature inductors.

The invention will be better understood upon reference to the following detailed description in connection with the accompanying drawing and embedded tables. The written descriptions in the drawings and the tables form an integral part of this disclosure.

BRIEF DESCRIPTION OF THE DRAWINGS

FIG. 9 is a diagram for defining length and spacing.

FIG. 22 is a graph illustrating a detail of the Bernoulli Function.

FIG. 24 is a graph illustrating a solution for optimal thickness in an inductor according to the invention.

FIG. 25 is a graph illustrating a range of solutions for optimal thickness in an inductor according to the invention.

FIG. 29 is a graph illustrating a range of solutions for optimal thickness.

FIG. 40 is a graph showing a relationship between Q and length.

FIG. 54 is a graph illustrating the relation between number of tightly coupled turns and metal aspect ratio and spacing aspect ratio to determine coupling to non-adjacent turns beyond 2.

FIG. 104 through FIG. 108 are illustrations of the result of processing steps involved in making fully integrated structures according to the invention for a buried oxide thickness of about 20 nm according to the SIMOX process and an active layer of less than about 200 nm, thus eliminating the interposer structure.

FIG. 111 is a graph illustrating silicon core and total winding width for different silicon core thicknesses.

FIG. 113 is a graph illustration needed Si Core thickness $t_{3Si}$, to achieve a desired $\Delta_w$ values for $\delta_{EM}$=2, 4, 6 and 8μ.

FIG. 114 is a graph illustrating the cross-sectional area of electro-plated metal area that determines the resistance of a spiral inductor.

DETAILED DESCRIPTION OF THE INVENTION

Figure 1:
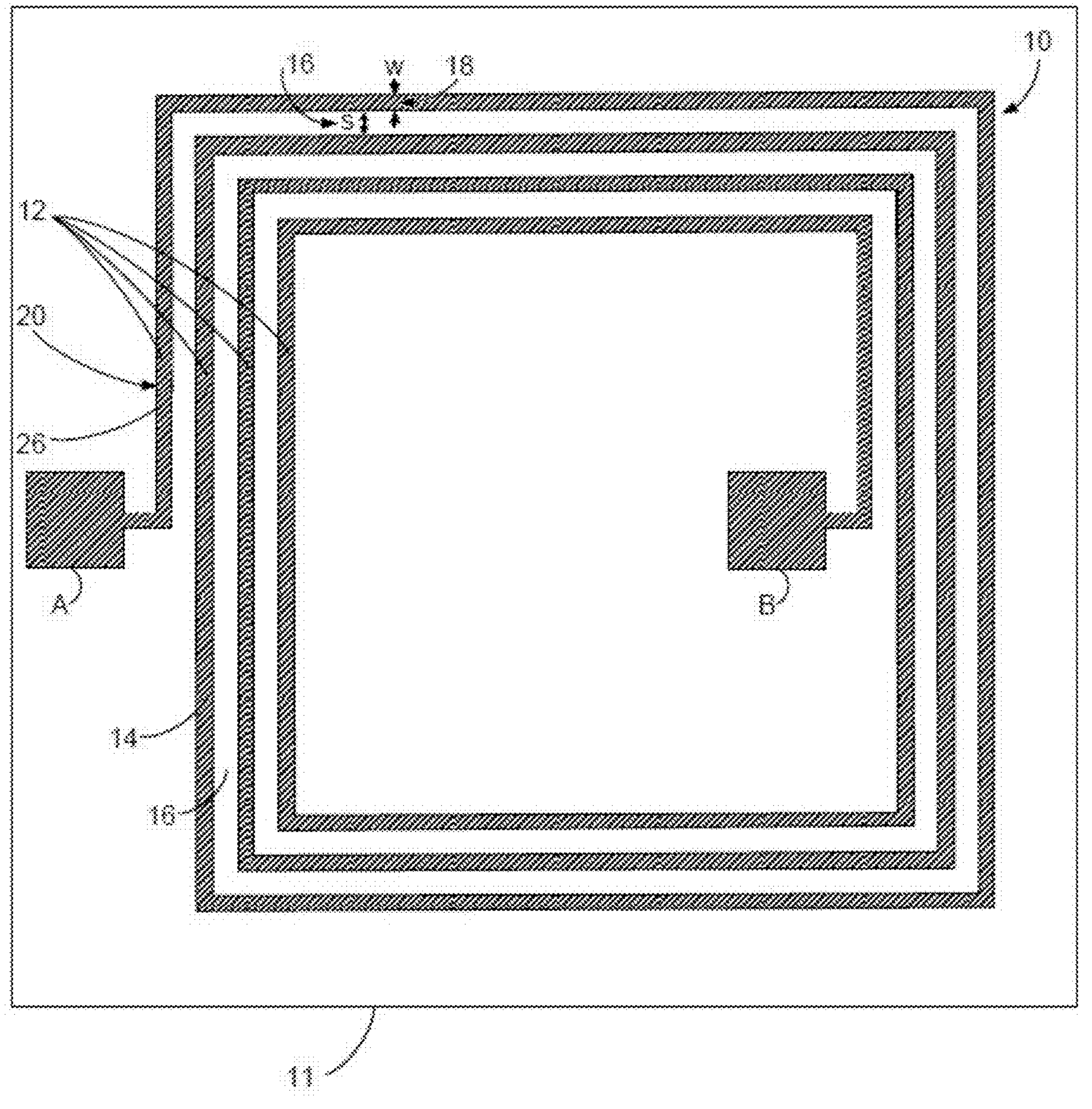
FIG. 1 is a top view of a spiral winding inductor according to a first embodiment of the invention.
Figure 2:
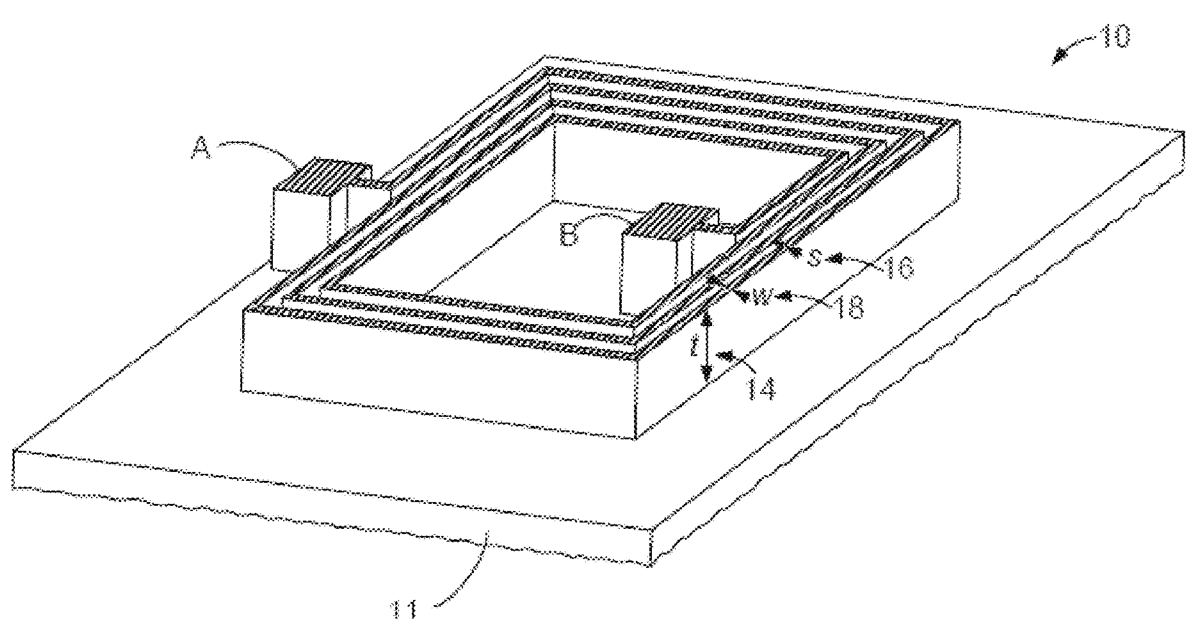
FIG. 2 is a perspective view of a spiral winding inductor of FIG. 1.

Referring to FIG. 1, there is shown a top view of a spiral inductor 10 embedded in a silicon substrate 11 according to a first embodiment of the invention, wherein the winding 12 is laid out in a rectangular pattern, width w 18 being comparable to the spacing s 16 between segments of the winding, and the depth or thickness t 14 of the winding 12, not shown in FIG. 1 but as shown in the perspective view of FIG. 2, being substantially greater than the width w 14, in accordance with the invention. The ratio of thickness to width may be on the order of 5, 10, 15 or even 20 to 1, all within the contemplation of the invention based on specific design criteria for inductance, current-carrying capacity and maximum operational frequency. Terminals 20, 22 connect via interposers 24, 26. Dimensions of this structure for an 80 nH inductor are typically less than one mm across and in certain applications are capable of inductance in excess of 100 nH while sustaining high currents (in excess of several Amperes) and/or high frequencies (in excess of 100 MHz) with good Q (in excess of 10), all depending upon certain design considerations, such as winding cross-sectional area (w×t), inter-winding spacing, conductor thickness, conductor width and material resistivity, as well as winding length, as hereinafter defined and shown by way of example. The element 10 may be fabricated in a silicon substrate and mounted on a silicon circuit (not shown) within a restricted pad area. (This disclosure does not teach how to form an inductor of this design in a semiconductor circuit, as that is beyond the scope of this disclosure.)

FIG. 2 illustrates the device 10 of FIG. 1 showing that the thickness t 14 to be substantially greater than either width w 18 or spacing s 16. A novel manufacturing process is disclosed hereinafter.

Figure 3:
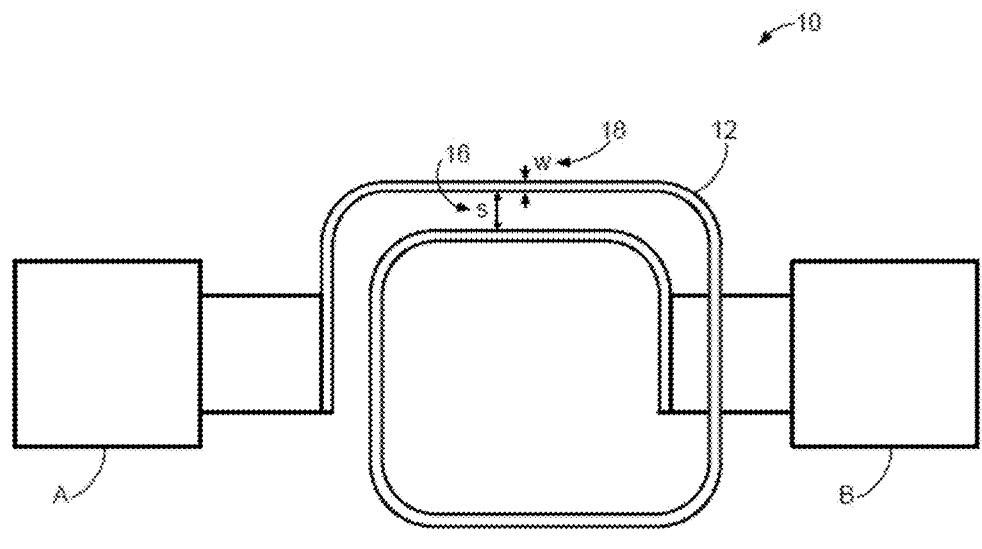
FIG. 3 is a top view of a flex spiral winding inductor according to a second embodiment of the invention.
Figure 4:
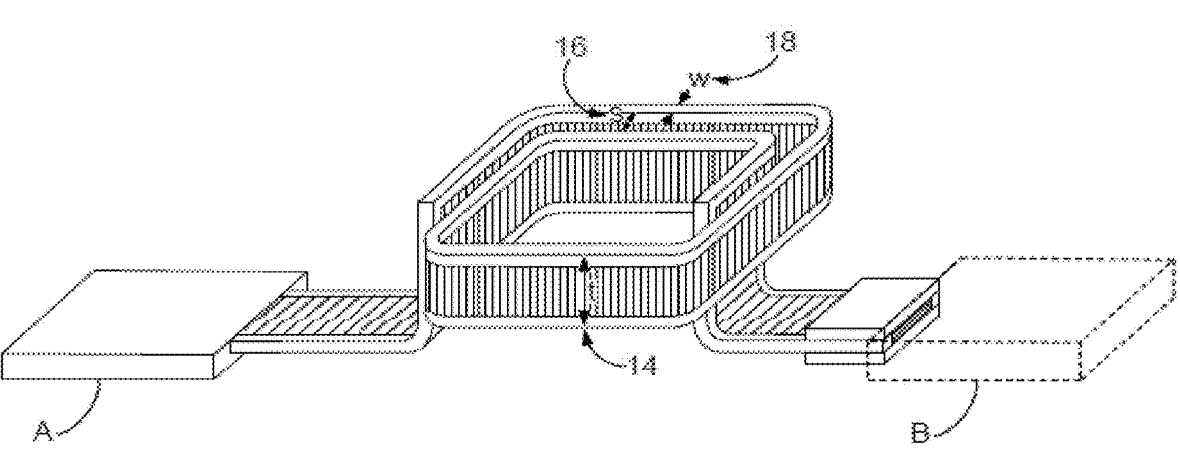
FIG. 4 is a perspective view of the inductor of FIG. 3.
Figure 5:
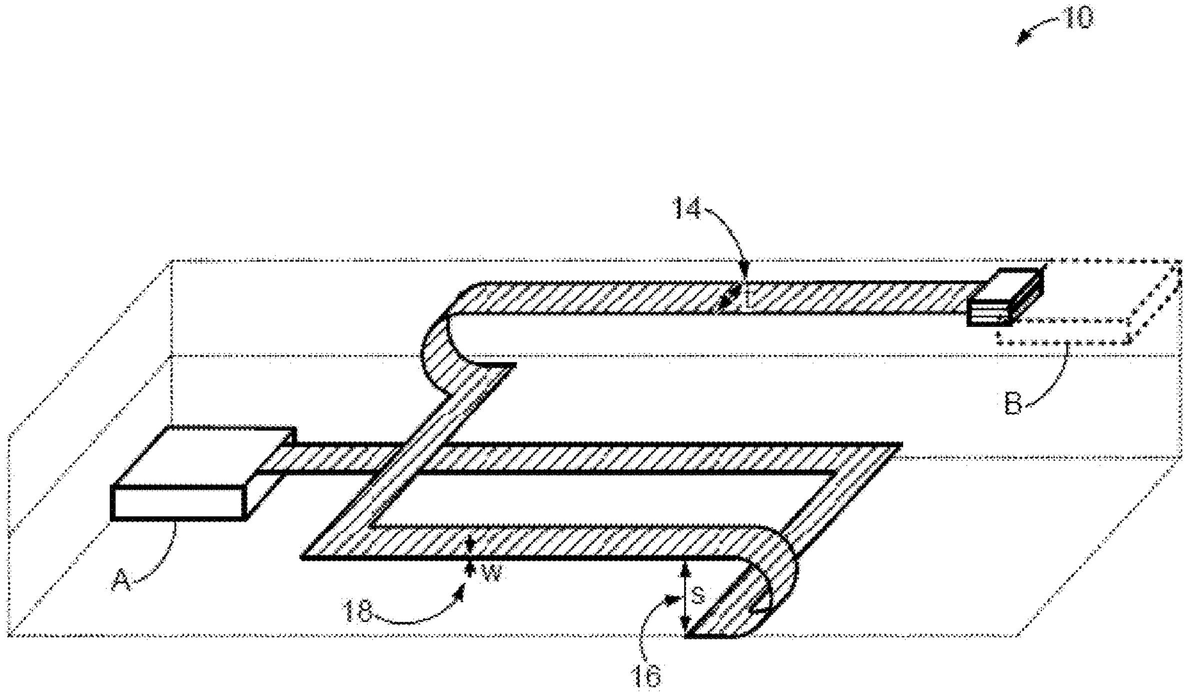
FIG. 5 is a perspective view of a third embodiment of the invention illustrating a flex-formed folded coil.

Alternative designs, are shown in FIG. 3, FIG. 4 and FIG. 5. As hereinafter explained, is fabricated of a conductive winding in a ribbon manufactured according to Flex PCB Technology adapted to miniaturized application. It is wound tightly around a central air core forming a web. The core may be circular or rectangular. Accordingly the thickness dimension is on a curved plane or series of flat planes and the width dimensions of the winding are juxtaposed and spaced apart only by minimal space and the thickness of the ribbon.

Device 310 of FIG. 5 may likewise be formed according to Flex PCB technology. However, the winding is embedded in a ribbon laid out in a serpentine pattern and the ribbon is folded against itself in a zip-zag pattern so as to separate winding segments by the substrate. The winding segments are arranged to be at least partially juxtaposed and separated only by the thickness of the substrate and any air gap.

Only a few windings are shown for illustrative purposes, but there are normally four or more, up to about ten windings. Various patterns of serpentine traces embedded in ribbon may be realized, differing from layer to layer, although a circular or rectangular spiral is likely simpler to design, to fabricate, to analyze and to test. The embodiment of FIG. 5 may be mounted either horizontally (flat) on a semiconductor substrate, or vertically, with terminals A and B. The Flex PCB embodiments are specifically useful for circuit verification purposes. Due to the manufacturing processes, air gaps, winding tightness and alignment may be inconsistent, but the devices are useful as inexpensive proof-of-concept and breadboard components.

More precise tolerances may be achieved where the devices are manufactured in a semiconductor substrate, particularly as herein disclosed. The steps are explained in more detail hereinbelow with respect to actual structures.

The basic steps are as follows:

Step A, a semiconductor substrate of silicon over silicon oxide of suitable thickness is provided. If an interposer design is contemplated, then the substrate is stock material. If the inductor is to be integrated into the same chip with a semiconductor circuit, the circuit is formed first and is usually in the silicon layer the surface of the chip or wafer opposite from the inductor.

Step B, a spiral channel 602 is etched into the silicon substrate that is of sufficient width to leave a spiral ridge of width less than winding width w and of sufficient separation for a winding spacing s to yield a continuous ridge in a spiral surface pattern of a design length, wherein height of the ridge is sufficient to establish winding thickness t. Thus the channel is of a depth corresponding to the design thickness t and spacing s+w in the substrate to yield a continuous ridge in a spiral surface pattern (cf. FIG. 1 or FIG. 2) and of a design length. The height of the ridge 604 is less than or equal to thickness t as hereinafter explained in connection with the design parameters.

Step C, a binding material 606 is applied to the surface of the ridged semiconductor material, for example titanium nitride, tantalum or like common semiconductor-to-metal adhesive. Application is by means of conventional processing, and it should at least cover the length, width and depth of the ridge 604.

Step D, a conductor 608, such as copper, aluminum or gold metal, is plated onto the entire ridge 604, including all tops and sidewalls, and bound to the ridge 604 by the binder. For this purpose, electroplating is suitable, since it is capable of adhering to sidewalls. The build-up depth of the plating process is determined by the intended spacing s between plated facing walls of the ridge 604. The width of the ridge plus the combined thickness of the plating corresponds to the intended width of the winding w.

Step E, the bottom 610 of the channel 602 is etched away, thus forming an air gap between walls of the ridge 604 along its length and forming the winding of thickness t, width w separated by spacing s between windings. Both conductive faces of the ridge 602 are conductively couple across the top. This selective etching process is realized by the technique of directional etching 612. Directional etching includes for example deep silicon reactive etching (the Bosch process), plasma etching or possibly ion beam etching, along a spiral path tracing the bottom 620 of the channel 602. To the extent that side walls may be etched in the process, the electroplating step may include adding sufficient material to the side walls to compensate for residual etching.

Alternative etching techniques, such as use of photoresist patterns are also within the contemplation of the invention. Moreover, the technology to perform the semiconductor fabrication process may be an older, larger-spacing processing technology than is used for fabrication of the associated semiconductor chip. It can now be seen how a high inductance, high current capability, high frequency, high Q, and closely spaced, high-aspect-ratio-winding inductor can be realized that is suitable for embedding on (and eventually in) a semiconductor chip.

The following is a design tutorial leading to an understanding of the parameters employed according to the present invention, plus a description of specific embodiments of the invention made according to these design criteria.

Self and Mutual Inductance Calculations

An excellent source of inductance and mutual inductance calculations can be found in the classic book Inductance Calculations by Frederick Grover, first published in 1946 [1]. Due to demand by those working in the field it has been re-printed many times and remains a valuable source. In that work, numerical calculations of any arbitrary cross-sections for self inductance and mutual inductance of their arbitrary arrangements in spatial coordinates are used. What follows here is a practical guide for design with respect to self-inductance and mutual inductance considerations.

The general formula of the DC self inductance (internal inductance for uniform current density distribution) of a prism geometry with any given cross-section can be given as the general inductance formula [1]:

$$L_{GENERAL} = 0.002 \cdot 10^{-6} l \cdot \left[\ln\left(\frac{2l}{r}\right) - 1 + \frac{\delta_1}{l}\right] \tag{1.1}$$

where l, r, $\delta_1$ are in cm and (1.1) gives $L_{GENERAL}$ in Henry units, r and $\delta_1$ being geometric- and arithmetic-mean-distance-related quantities, which are related to the cross-sectional geometry of the prism, which is assumed to have a uniform current distribution flowing through its cross-section. Geometric Mean Distance (g.m.d) and Arithmetic Mean Distance (a.m.d) are important concepts in inductance and mutual inductance calculations [1,2]. The "geometric mean distance" (g.m.d.) between any pair of n points can be expressed as, $$g.m.d. = \left(\prod_{i=1}^{n} r_i\right)^{\frac{1}{n}} = \exp\left[\frac{1}{n}\sum_{i=1}^{n} \ln(r_i)\right] \tag{1.2}$$

Figure 6:
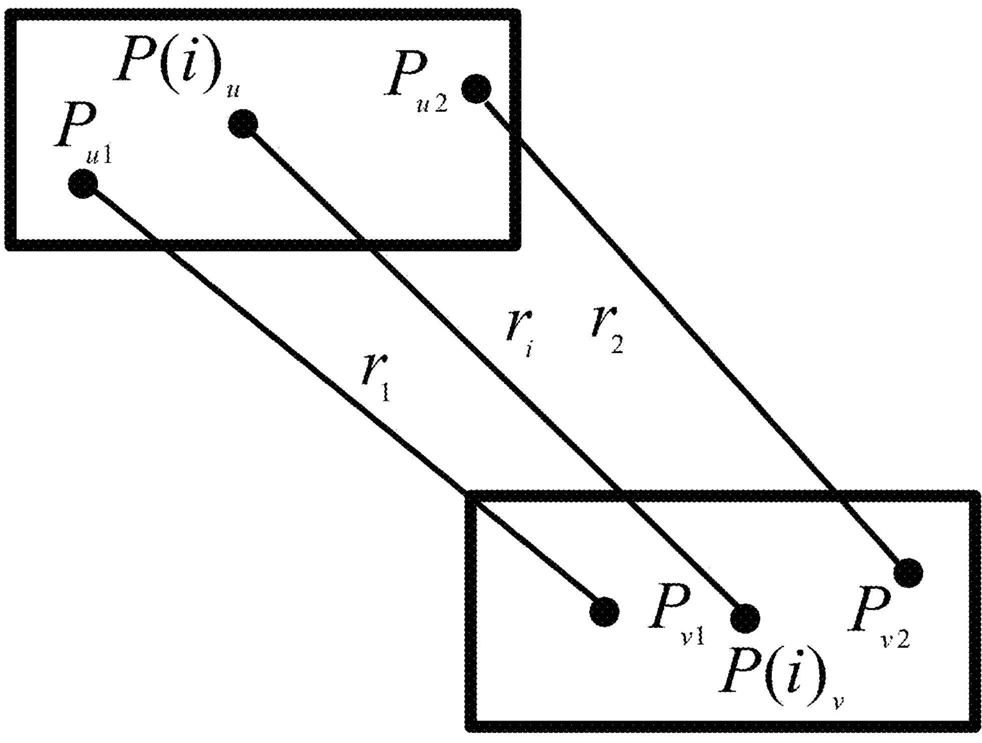
FIG. 6 is a diagram for illustrating parameters for analyzing an inductor.

Similarly, "arithmetic mean distance" (a.m.d.) can be expressed as, $$a.m.d. = \frac{1}{n}\sum_{i=1}^{n} d_i \tag{1.3}$$

where $r_i$ and $d_i$ are distances between pairs of points in selected regions as can be shown in FIG. 6, where $P(i)_u$, and $P(i)_v$ represent cross sections of two adjacent conductive structures through which current may flow, commonly corresponding with the cross section of windings of an inductor, which are generally NOT rectangular in cross section. As will be explained hereinafter, rectangular cross sections are an important design feature of the invention hereafter explained. The summations (1.2) and (1.3) for very large n can be generalized using multiple integrals performed in closed areas which have very interesting applications in many partial differential equation problems encountered in electromagnetics and quantum mechanics [2]. These integrals take on the form of quadruple integrals, which also can be calculated by numerical integration with some care in Cartesian coordinates.

The general inductance formula (1.1) can be written explicitly for specific cross-sectional geometries. For rectangular cross-sections, of the type upon which this invention is focused, Equation (1.1) becomes, $$L_{RECT} = 0.002 \cdot 10^{-6} l \cdot \left[ \ln\left(\frac{2l}{w+t}\right) + 0.5 - f_1(w, t) \right] \tag{1.4}$$

$$\text{where } 0 \leq f_1(w, t) \leq 0.00249$$

$$l, w, t \to \text{cm} \to L_{RECT}[H]$$

where, l, w, and t are the length, width and thickness, respectively.

For a circular cross-section the general formula Equation (1.1) becomes, $$L_{CIRC} = 0.002 \cdot 10^{-6} l \cdot \left[ \ln\left(\frac{2l}{r}\right) - 0.75 \right] \tag{1.5}$$

$$l, r \to \text{cm} \to L_{CIRC}[H]$$

where, r is the radius of the circular cross-section.

For a coaxial or ring cross-section which is also named as a "hollow cylinder" Equation (1.1) becomes, $$L_{RING} = 0.002 \cdot 10^{-6} l \cdot \left[ \ln\left(\frac{2l}{r_1}\right) + f_2(r_1, r_2) - 1 \right] \tag{1.6}$$

$$\text{where } 0 \leq f_2(r_1, r_2) \leq 0.25$$

$$l, r_1, r_2 \to \text{cm} \to L_{RING}[H]$$

where, $r_1$ and $r_2$ are the outer and inner radiuses of the coax, ring or the hollow cylinder.

For elliptical cross-section where a and b are the major and minor axes of the ellipse, (1.1) becomes, $$L_{ELLIPS} = 0.002 \cdot 10^{-6} l \cdot \left[ \ln\left(\frac{2l}{a+b}\right) - 0.75 \right] \tag{1.7}$$

$$l, a, b \to \text{cm} \to L_{ELLIPS}[H]$$

A closer look at relations (1.4-1.7) shows that there is a minimum length $l_{MIN}$ as a function of the cross-sectional dimensions where these formulas apply. For the rectangular cross-section, which is the main focus in this invention, $l_{MIN}$ can be expressed as a function of w and t by solving, $$\ln\left(\frac{2l_{MIN}}{w+t}\right) + 0.5 - f_1(w, t) = 0 \tag{1.8}$$

Figure 7:
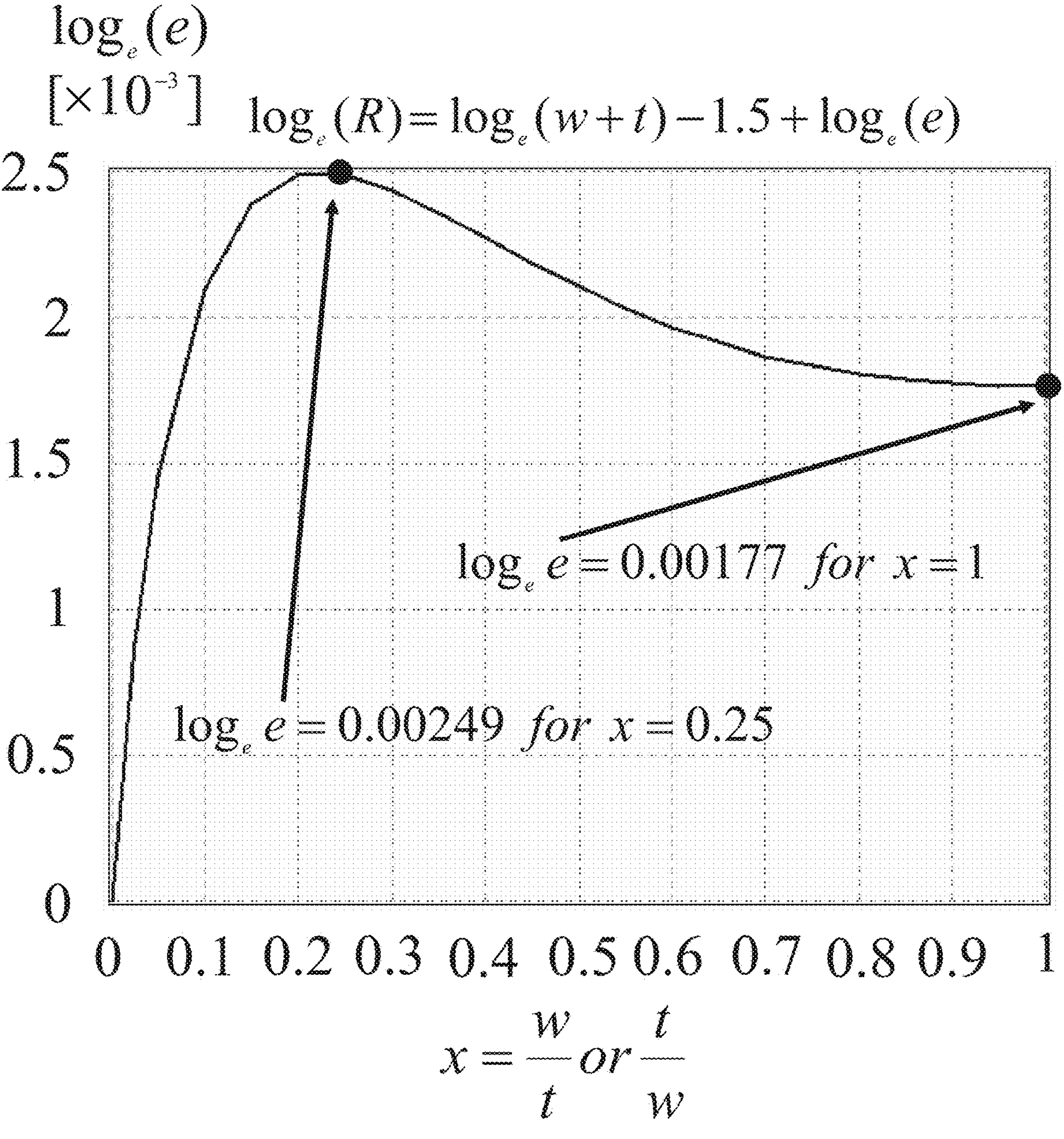
FIG. 7 is a graph for illustrating how width and thickness of a conductive winding relate.

The function $f_1$(w,t) is plotted in FIG. 7 using the same notation as given in Grover [1]. Being an older work, the notation used is no longer conventional. The reason for using Grover's notation is to retain the expressions as original as possible. As can be seen the maximum value for $f_1$(w,t) is 0.00249, so we can write, $$\ln\left(\frac{2l_{MIN}}{w+t}\right) = 0.00249 - 0.5 = -0.49751 \tag{1.9}$$

$$e^{-0.49751} = 0.608$$

$$e^{-0.5} = 0.60653$$

A solution of (1.9) for $l_{MIN}$ will give the minimum value for l for which (1.4) will be valid. Below this $l_{MIN}$ value Equation (1.4) will give a negative inductance value, which is not physical. Therefore (1.4) is valid only for $l > l_{MIN}$. The value of $l_{MIN}$ depends on the sum of width w and the thickness t and can be given as, $$l_{MIN} = \frac{w+t}{2} e^{f_1(w,t) - 0.5} \cong \frac{w+t}{2} e^{-0.5} = 0.30326 \cdot (w+t). \tag{1.10}$$

Similar calculations can be done to obtain $l_{MIN}$ for other cross-section geometries.

Figure 8:
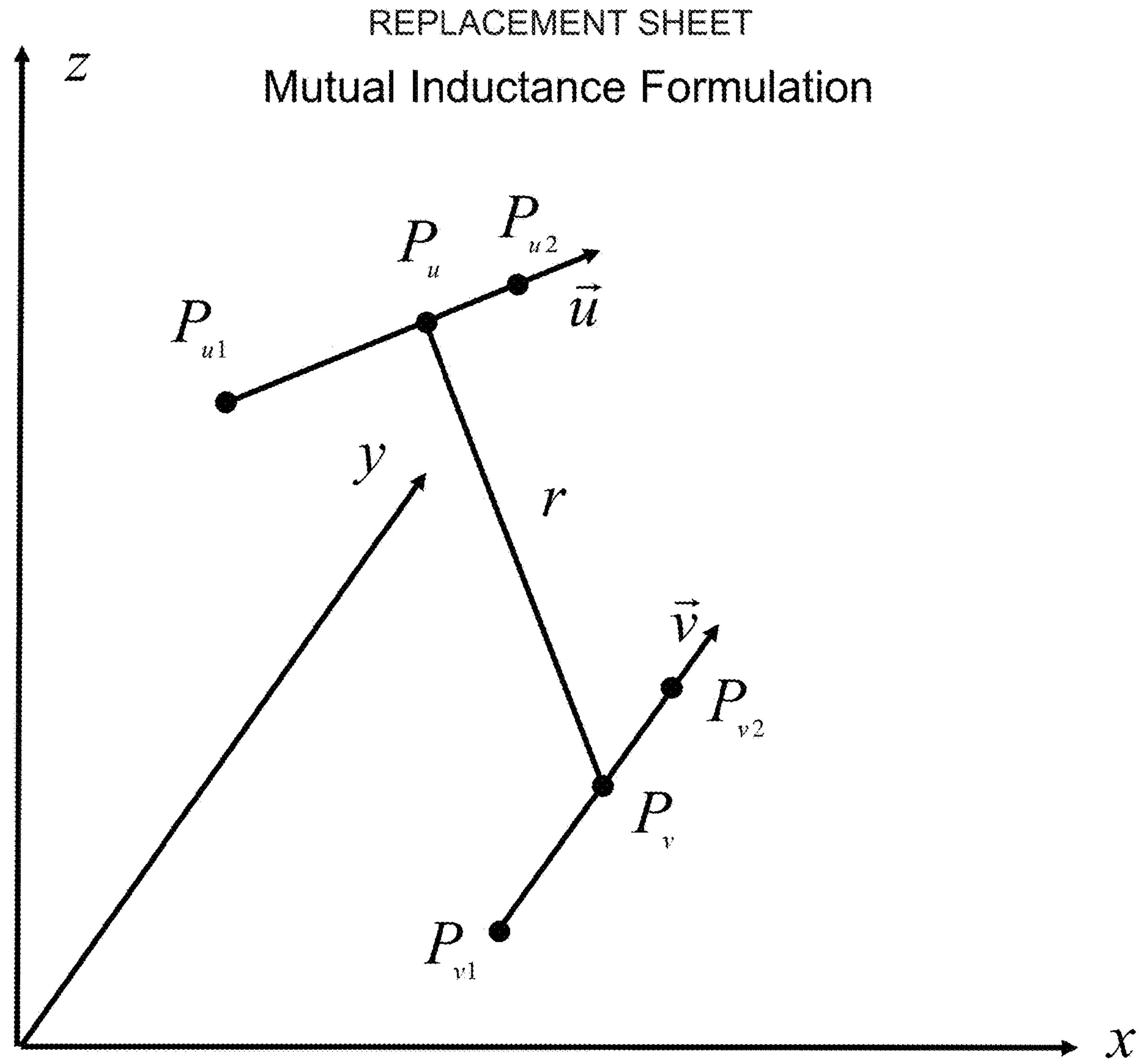
FIG. 8 is a first diagram for defining the relationship of mutual inductance.

The Neumann integral formulation of mutual inductance for straight infinitely thin filaments (the "Filament Method") as shown in FIG. 8 is, $$M = \int_{P_{u1}}^{P_{u2}} \int_{P_{v1}}^{P_{v2}} \frac{\vec{u} \cdot \vec{v}}{r} ds_u ds_v \tag{1.11}$$

where, u and v are unit vectors on each filament.

Performing the integral (1.11) for two parallel lines with a length of l and spacing d as shown in FIG. 9 leads to, $$M = 0.002 \cdot 10^{-6} \cdot l \cdot \left[ \ln\left(\frac{l}{d} + \sqrt{1 + \frac{l^2}{d^2}}\right) - \sqrt{1 + \frac{d^2}{l^2}} + \frac{d}{l} \right]. \tag{1.12}$$

$$l, d \to \text{cm} \to M[H]$$

To calculate the mutual inductance between any parallel two arbitrary cross-sectional geometries with the same length l—under the assumption of uniform current density distribution—one calculates the (g.m.d) between the two cross-sectional geometries and substitutes the g.m.d. value as the variable d in the filament formula in (1.12).

Figure 10:
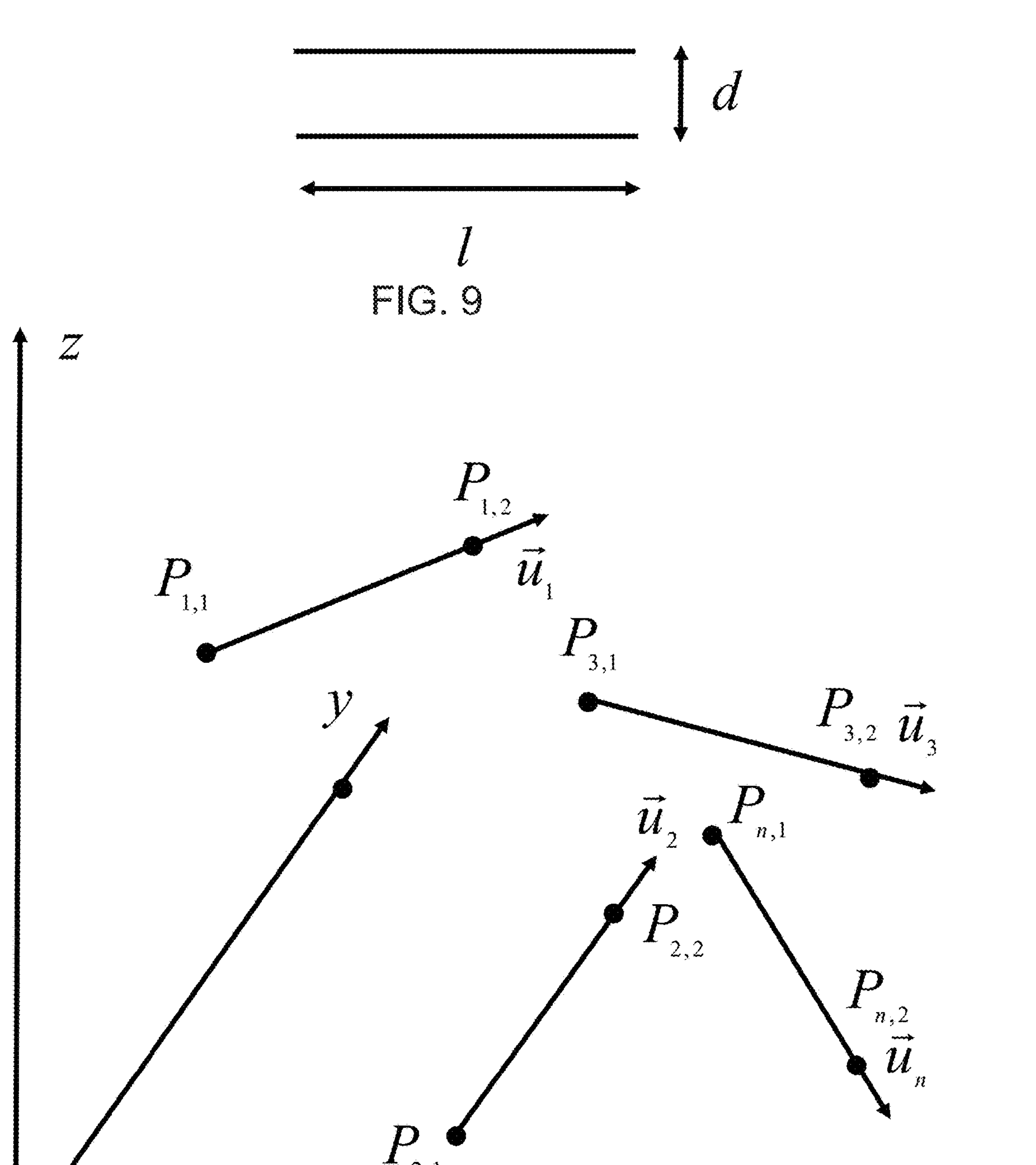
FIG. 10 is a second diagram for defining the relationship of mutual inductance.

The "Filament Method" can be generalized for any filament arrangement and placement in three-dimensional space by double integrals in the Neumann integral formulation given by (1.11), again under the assumption of constant current density distribution. For n coupled inductors, where n>1, given as a multi-inductor system shown in FIG. 10, one can define an (n×n) "Inductance Matrix" L as, $$L(nxn) = \begin{bmatrix} L_{1,1} L_{1,2} L_{1,3} & \cdots & L_{.,.} L_{1,n-1} L_{1,n} \\ L_{2,1} L_{2,2} L_{2,3} & \cdots & L_{.,.} L_{2,n-1} L_{2,n} \\ L_{3,1} L_{3,2} L_{3,3} & \cdots & L_{.,.} L_{3,n-1} L_{3,n} \\ \cdots & & \\ \cdots & & \\ L_{n-1,1} L_{n-1,2} L_{n-1,3} & \cdots & L_{.,.} L_{n-1,n-1} L_{n-1,n} \\ L_{n,1} L_{n,2} L_{n,3} & \cdots & L_{.,.} L_{n,n-1} \quad L_{n,n} \end{bmatrix} \tag{1.13}$$

$$L_{i,j} = L_{j,i} \text{ and } L_{i,i} > 0$$

The diagonal matrix entries of (1.13) are self-inductance values, which are always positive. The off-diagonal entries can be positive, negative or zero. The Inductance Matrix Lis ALWAYS symmetric as shown.

A quantity that is very important in a mutual inductance matrix for satisfying the passivity requirement of the system is the coupling ratio K, which is expressed as, $$K_{i,j} = \frac{L_{i,j}}{\sqrt{L_{i,i} \cdot L_{j,j}}} \text{ and } |K_{i,j}| < 1 \tag{1.14}$$

where $K_{i,j}$, $L_{i,j}$, $L_{i,i}$ and $L_{j,j}$ are the coupling ratio, self inductances of elements i and j, the mutual inductances between inductances i and j respectively.

For an inductance matrix L resulting from same cross-sectional geometry and lengths will give equal self inductances at the diagonals. Having the same values in the diagonal of the inductance matrix (1.14) states that, $$|K_{i,j}| < 1 \rightarrow L_{i,j} \leq L_{i,i}. \tag{1.15}$$

In other words, for this case the mutual inductances in the inductance matrix can never exceed the self-inductance values! This is a very important concept that allows for the derivation and realization of the invention herein disclosed.

Inductance for a Rectangular Cross-Section Having a Constant Area S and Under Constant Current Density $J_{MAX}$ Across its Cross-Section As will be explained hereinafter, embodiments of the invention employ a rectangular cross-section. One must always comply with minimum cross-section requirements when designing an inductor for any application. Sources for this minimum cross-sectional area can be many and are listed below, depending on the application;

i) For on-chip power converter applications [3-9], a large DC current must flow through the inductor, at least in the order of several Amperes (1-50 A) [3-9]. This imposes a minimum cross-sectional area Swix requirement on the inductor design due to the electro-migration current density limit that cannot be exceeded. This electro-migration current density limit $J_{EM}$ is a function of the chip metallization process. As an example, for a typical Aluminum/Si alloy metallization, $J_{EM}$ is in the order of $10^5$ to $2.10^6$ A/cm$^2$. For a given maximum DC current specification, one cannot exceed the current density imposed by the electro-migration current density limit, therefore one cannot make the inductor cross-sectional area smaller than $S_{MIN}$. $S_{MIN}$ can be calculated as, $$S_{MIN} = \frac{I_{DCMAX}}{J_{EM}} \tag{1.16}$$

where $I_{DCMAX}$ is the maximum DC current determined by the design specification.

Table [1] shows the typical cross-sectional areas that need to be satisfied for some practical $I_{DCMAX}$ values common in today's power management and FIVR work.

TABLE 1

Inductor Current Determined Cross-Sectional Area, $t_{OPT0}$ and $t_{OPT}$ for 100 MHz and 200 MHz for Inductor Values of 20, 40, 60 and 80 nH.

Figure 118:
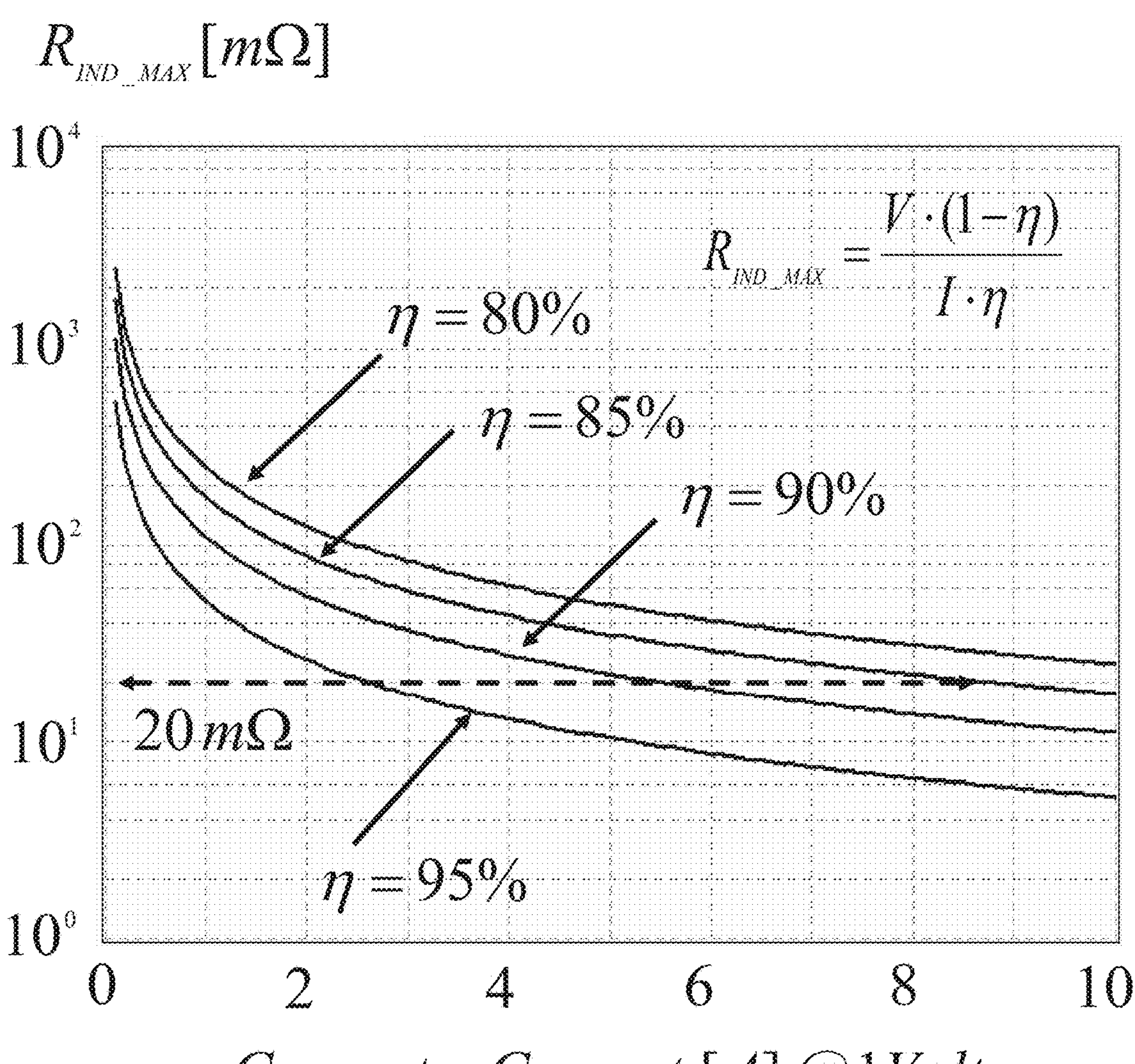
FIG. 118 is a graph illustrating maximum allowable DC resistances for DC/DC converter inductors.

| I, Current (A) $J_{max} = 2.10^6$ A/cm$^2$ | Cross-Section Area S ($\mu^2$), $t_{OPT0}$ ($\mu$) | $t_{OPT}$ ($\mu$) L = 20 nH f = 100 MHz | $t_{OPT}$ ($\mu$) L = 40 nH f = 100 MHz | $t_{OPT}$ ($\mu$) L = 60 nH f = 100 MHz | $t_{OPT}$ ($\mu$) L = 80 nH f = 100 MHz |
|---|---|---|---|---|---|
| 1 | 50, 7.07 | 27.63 | 28.83 | 30.08 | 30.08 |
| 5 | 250, 15.81 | 107.9 | 117.5 | 122.6 | 122.6 |
| 10 | 500, 22.36 | 195.9 | 213.3 | 222.6 | 222.6 |
| 20 | 1,000, 31.62 | 355.6 | 387.3 | 404.1 | 421.7 |

ii) When designing an inductor, one always has a resistance $R_{IND}$ in series with the inductor. Again, in power converter applications, the efficiency of a step-down or buck converter is closely related to the DC resistance of the inductor $R_{IND}$ and cannot exceed an $R_{IND}$ MAX value that is a small load-dependent quantity which can be given as, $$R_{IND\_MAX} = \frac{V \cdot (1 - \eta)}{I \cdot \eta} \tag{1.17}$$

where V, $\eta$ and I are the DC voltage output, power conversion efficiency and load current, respectively. As an example, a 1V DC supply with a 1 A load is equivalent to 1Ω load resistance. For a 90% efficiency goal in a buck converter design with no switching losses, one has to keep the DC resistance $R_{IND\_MAX}$ of the inductor less than 0.11Ω. A typical "conservative" FIVR on-chip buck converter specification is 10 A at 1V. As can be seen for this case the DC resistance of the inductor $R_{IND\_MAX}$ has to be less than $0.011\Omega$ regardless of the inductor value. This can be a major challenge. FIG. 118 shows a graph of (1.17) illustrating the allowable maximum DC resistance $R_{IND\_MAX}$ as a function of output DC current for 1 VDC output for 95, 90, 85 and 80% theoretical maximum efficiencies in any type of DC/DC converter topology regardless of the inductor values.

iii) The circuit topology of LNA (Low Noise Amplifier) IC designs can employ several on-chip inductors, transformers or Baluns (Balanced-un-Balanced). Since the thermal noise voltage generated in a resistor is proportional to the square root of its resistance at the operating frequency, the resistance value is an important contributor to the overall noise figure of the LNA [31]. Therefore one needs to keep the resistance of these passive elements less than an $R_{MAX}$ value at the operating frequency. The $R_{MAX}$ value at a given frequency for this case is not straight-forward to calculate, but it is related to its DC resistance, and the "smaller the better" principal always applies. The AC-resistance-to-DC-resistance relation is given for rectangular cross-sections hereinafter.

iv) For VCO/PLL (Voltage Controlled Oscillators/Phase Lock Loop) applications the phase noise is inversely proportional to the square of the Q value of the inductor. Q of an inductor. It is a complex quantity to calculate as a function of frequency, but it is very closely related to the AC resistance of the inductor. AC resistance is related to the DC resistance $R_{DC}$, so again the "smaller the better" rule applies for $R_{MAX}$!

v) The power consumption limit on the inductor is another design factor in determining the $R_{MAX}$ value at the frequency of operation. It is given by relation, $$R_{MAX} = \frac{P_{MAX}}{I_{MAX}^2} \tag{1.18}$$

where $P_{MAX}$ is the maximum power consumption specification at a given operating frequency on the inductor, where $R_{MAX}$ is the frequency dependent resistance of the inductor. Again $R_{MAX}$ is related to $R_{DC}$.

As can be seen, there is one factor that directly defines the $S_{MIN}$ of the inductor design and there are an additional four factors that are indirectly related to it through the DC resistance formula of a prism, given as, $$R_{DC} = \rho\frac{l}{S} = \rho\frac{l}{w \cdot t} \tag{1.19}$$

where l, ρ, S, w and t are the length, resistivity, cross-sectional area, width and thickness for a rectangular cross-section straight conductor.

In any kind of inductor design one starts with a straight wire and generates geometries that give mutual inductances such that their presence increases the inductance compared to its straight conductor inductance value. Therefore, there is a need to formulate a geometrical configuration that provides for high mutual couplings with the proper sign in the designed structure, such as in coils and spiral inductors. Calculating even $R_{DC}$ for any kind of inductor design such as spiral or coil inductors is not straightforward, but it is straightforward to calculate it for a straight conductor. That is a good point to start the analysis.

Optimum Width/Thickness Relation for a Desired Inductor Value L for a Given Cross-Sectional Area S for a Rectangular Cross-Section Straight Conductor Giving Highest Possible Q for Uniform Current Distribution Assumption Across its Cross-Section The "exact" result of the starting analysis under this model is incorrect, but it is a suitable starting point for the optimization of an inductor, and it conveys the key points and the thought process of the invention very quickly and clearly, as hereinafter shown.

The problem at this stage is to find out if one can design an inductor with a desired value L with minimum resistance R for a given cross-sectional area S. If there is such a width/thickness combination, using this combination will give the highest Q possible for a straight inductor. Ignoring capacitive and high frequency effects on the quality factor Q, the simple case is given as, $$Q_{LRDC} = \frac{L\omega}{R} \tag{1.20}$$

As can be seen, the Q formulation (1.20) assumes that both the resistance and the inductance of the straight wire is frequency independent. Therefore the subscript DC in (1.20) indicates the low frequency Q, where L and R are not taken as functions of frequency and where there are no capacitance effects. These effects will be brought in to the analysis later.

First, inductor relation for a rectangular cross-section, as given in (1.4) as a function of given area S is, $$L_{RECT} = 0.002 \cdot 10^{-6} l \cdot \left[\ln\left(\frac{2l}{\frac{S}{t}+t}\right) + 0.5 - f_1(w, t)\right]. \tag{1.21}$$

As can be seen in (1.21) the width w, in (1.4) is just replaced by S/t. Close examination of (1.21) suggest that one can expect a thickness t, which gives the shortest length l for a desired inductance value L for any given cross-sectional area S. Ideally one needs to differentiate (1.21) with respect to t, equate it to zero and solve t to perform this task. This requires several intermediate differentiation steps in the process. It can be done with simpler and shorter intermediate math and will be more conclusive, as well as get the point across more quickly and clearly. (We will have to take the longer approach for Q optimization later, so no need to complicate the matter at this very first stage!)

Let the u(t,S) function, which is the denominator term in the log function given in (1.21) be defined as, $$u(t, S) = w + t = \frac{S}{t} + t. \tag{1.22}$$

The t value, which gives the minimum for u(t,S), will satisfy this "minimum length for a given inductance value of L for any given S" condition by differentiating it with respect to t as, $$\frac{du}{dt} = 1 - \frac{S}{t^2} \tag{1.23}$$

and equating (1.23) to zero and solving gives, $$\frac{du}{dt} = 0 \rightarrow t = \sqrt{S}. \tag{1.24}$$

As can be seen in (1.24), there is an optimal thickness t, for a given S and moreover the width w and thickness t are equal, which is directly the result of area relation, giving, $$w = t = \sqrt{S}. \tag{1.25}$$

The advances in the art that form the basis of the present invention can now be identified. One conclusion is this: To minimize the length of a conductor for a desired inductor value of L for a given cross-sectional area S in a rectangular cross-sectional geometry, one would need a square cross-section with sides given as (1.25)!

Figure 11:
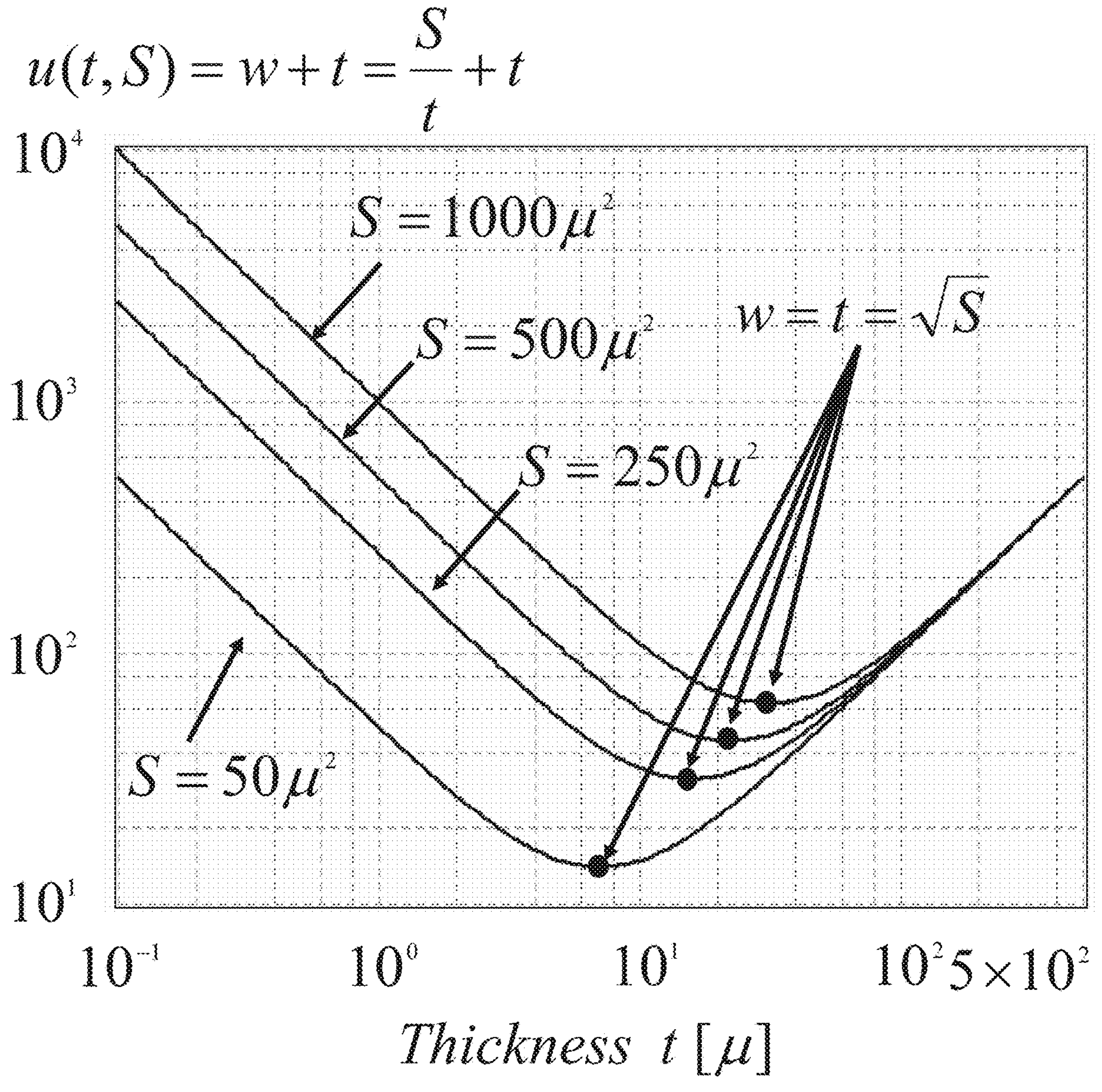
FIG. 11 is a graph showing the relationship of thickness to cross-sectional area of a conductive winding.
Figure 12:
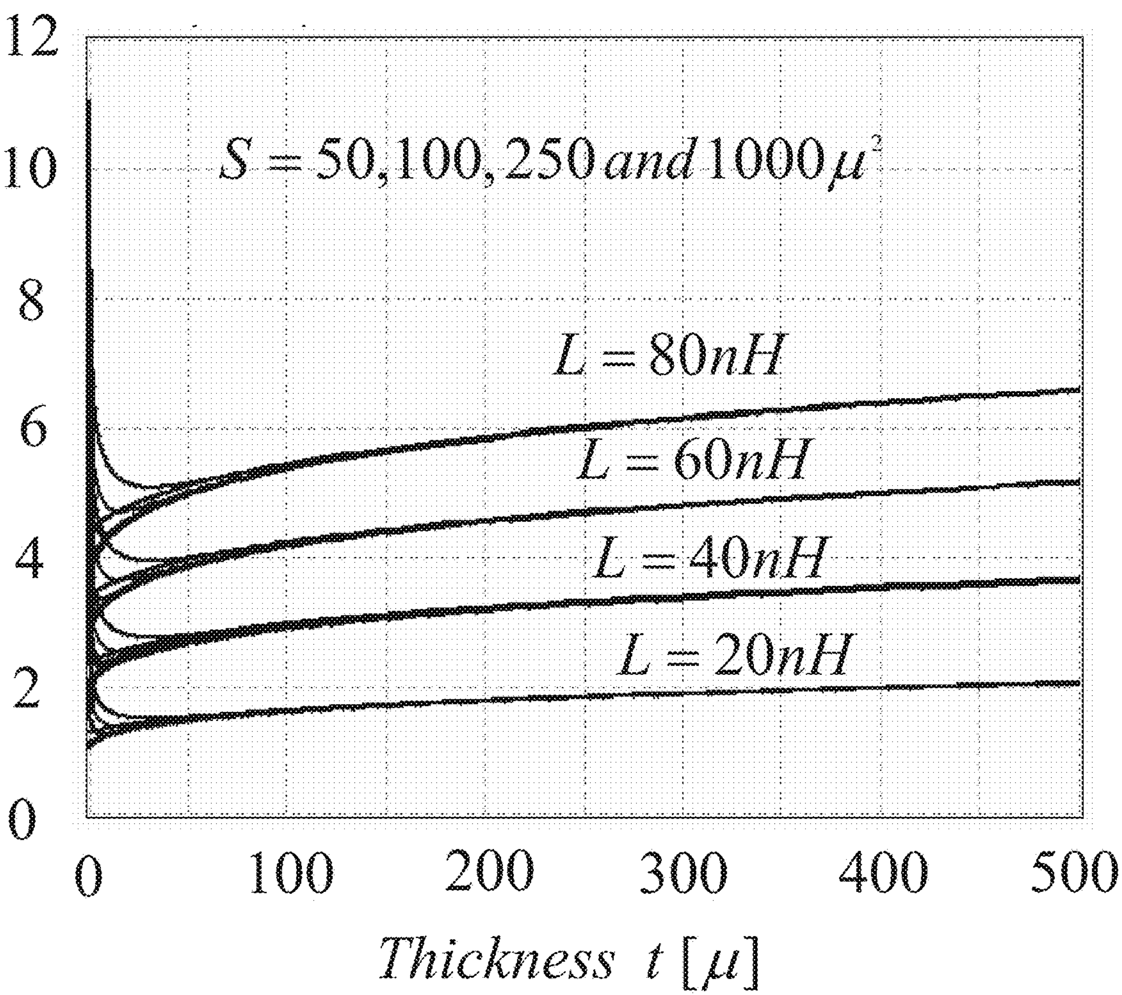
FIG. 12 is a graph relating inductance to length of an inductor to cross-sectional area and thickness.

FIG. 11 shows the u(t,S) for several cross-sectional areas where S=50, 250, 500 and 1000$\mu^2$, which are calculated from $I_{MAX}$=1, 5, 10 and 20. A design specification is contemplated using $J_{EM}$=2.10$^6$ A/cm$^2$ to have some "real" cases related to FIVR (Fully Integrated Voltage Regulator) cases in the analysis. As can be seen in FIG. 11 the u(t,S) function has an asymptote at t=0 and starts from infinity, goes through a minimum as calculated in (1.25) and approaches the u=t function, again asymptotically, with increasing t from zero to infinity. With the uniform current density distribution approximation, designing the inductor with a square cross-section and sides given as (1.25) will give the highest possible (because it will have the shortest length giving minimum resistance R given by (1.18) for the desired L and given S! This "minimum length" result is shown in FIG. 12 which are plots of straight conductor inductor length versus thickness having constant cross-sectional areas S=50, 250, 500 and 1000$\mu^2$. The target inductance values in the FIG. 12 are 20,40,60 and 80 nH, which are considered "very large" value inductors for any on-chip inductor designs. For high frequency LNA/VCO designs, with operating frequencies greater than 900 MHz, the typical targeted on-chip inductor values are between 1 to 5 nH. On the other hand, in studies of the current hot topic of integrating the buck converter on a processor, or FIVR (Fully Integrated Voltage Regulator), the investigated low DC resistance and high Q inductor values are in 10-60 nH range, operating at 20-200 MHz [3-9]. As can be seen, in the simplest Q relation given in (1.20), designing high (inductors for operating frequencies in the order of 20-200 MHz, along with DC resistances in the order of 0.020 ohms, such as in FIVR work, makes the challenge much greater than for higher frequency RFIC inductor designs.

The typical metal thickness in IC (Integrated Circuit) technology is less than a micron. Very few IC processes provide higher than about 3μ to 4μ metal thickness and only at the top metal layer (M5) with 2.8μ width and spacing. As can be seen, the thicknesses obtainable from this very first simplified analysis are much larger than any metal thicknesses provided in any known IC process technology, which are shown in Table [1] as $t_{OPT0}$.

Combining the resistance formulation given by (1.19) for uniform current density distribution, one can plot the Q) versus thickness for given L and S values as well and see the peak Q being at the calculated thicknesses. As noted above, the simplified analysis shown here is very important in showing that there is an optimal w and t as a function of a given cross-sectional area S for maximizing Q and it is also independent from the targeted inductance value. Closer examination however demonstrates that this "qualitative" result is misleading. It is misleading in that the resulting cross-sectional geometry, which is said to be a square and is dependent on the given area S, is given as in (1.25). The misleading result comes from the "constant current density" assumption given by (1.19) for the resistance which cannot be satisfied at operating frequencies of the inductors under consideration due to skin and proximity effects. The following section includes an explanation of the non-uniform current density distribution effects in a rectangular cross-section with some detail, taking the skin effect into consideration.

Optimum Width/Thickness Relation for a Desired Inductor Value L for a Given Cross-Sectional Area S for a Rectangular Cross-Section Straight Conductor Giving Highest Possible Q for Non-Uniform Current Distribution Assumption Across its Cross-Section The general analysis of this problem can be tackled by solving Maxwell's equations for a sinusoidal wave assumption which can be reduced to the solution of the Helmholtz's equation in non-uniform media. Just for the electric field E, Helmholtz wave equation in complex form can be written as [24, 25], $$\nabla^2 E + \omega^2 \mu\varepsilon\left(1 - j\frac{\sigma}{\omega\varepsilon}\right)E = 0 \tag{1.26}$$

where $$j = \sqrt{-1}$$

and $$\omega = 2\pi f$$

where μ, ε, σ, ω and $f$ are the magnetic permeability, dielectric constant, conductivity, angular frequency and frequency, respectively. A similar equation can be written for the magnetic fields H and it can be shown that they are related [24,25]. A complete spiral inductor analysis can be done by solving (1.26) for the three dimensional spiral geometry (which is possible only numerically). Employing Maxwell's equation which leads to Helmholtz wave equation (1.26) in three dimensions, one can calculate electric and magnetic fields and the non-uniform current density distribution in any point of any of the winding regions [10-23]. This is a complex analysis, but looking at the results of the complex simulations and using some common electromagnetic sense, the analysis can be simplified. Here we will first focus on the principles and the important analytical results of the solution of the simplified Helmholtz wave equation for plane waves, which is applicable to the spiral inductor regions in the interior of its winding as shown in a very simple spiral inductor geometry shown in FIG. 13. There are several choices of forcing the current I in and getting it out of the spiral inductor. Several of many choices are shown with pad locations at $IN_{CENTER}$, $OUT_{CENTER}$, $IN_{SIDE}$ and $OUT_{SIDE}$ locations in FIG. 13.

Figure 13:
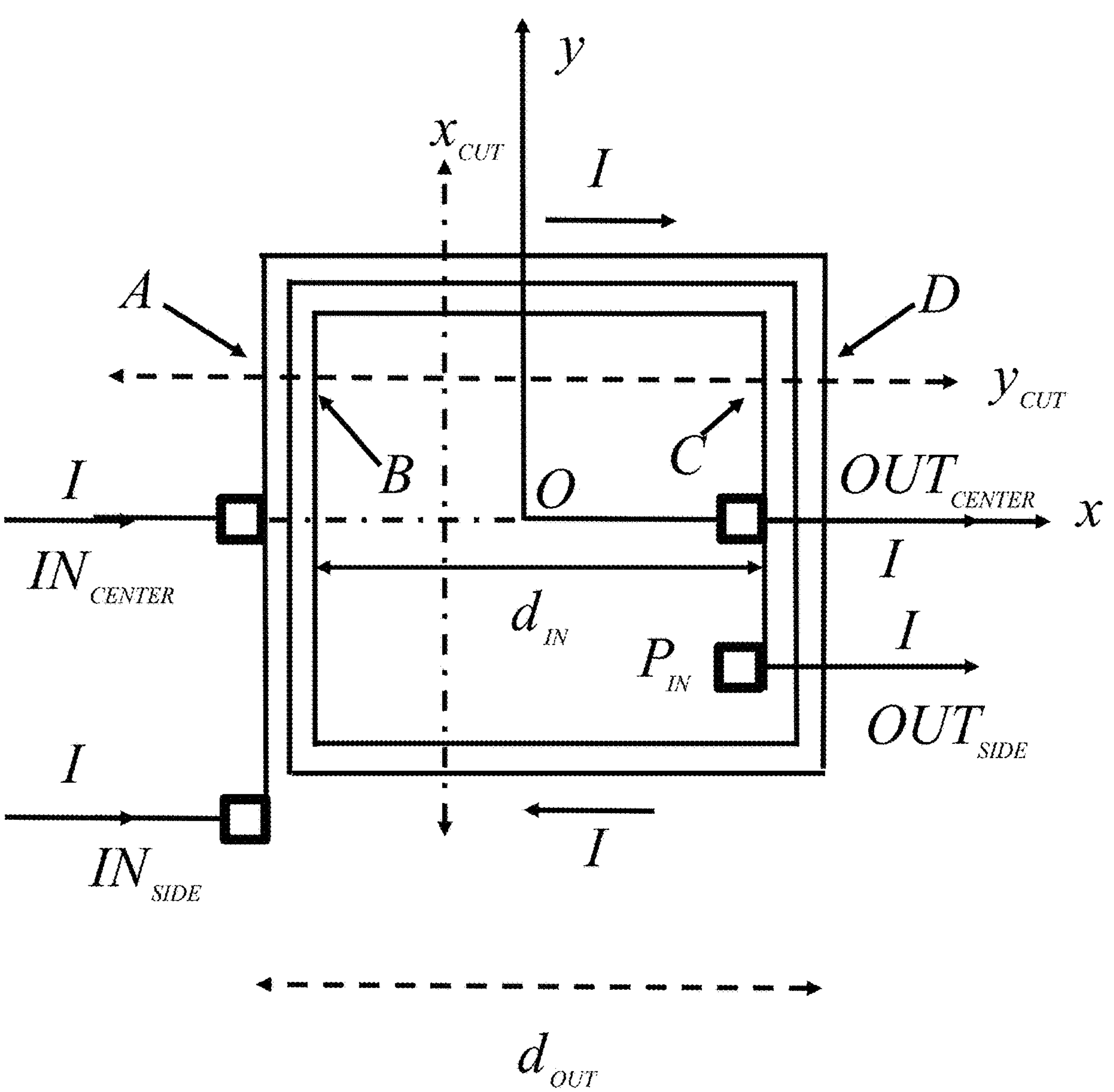
FIG. 13 is a top view of a square spiral-type inductor according to the invention to be built into an interposer structure illustrating analysis parameters according to the invention.
Figure 14:
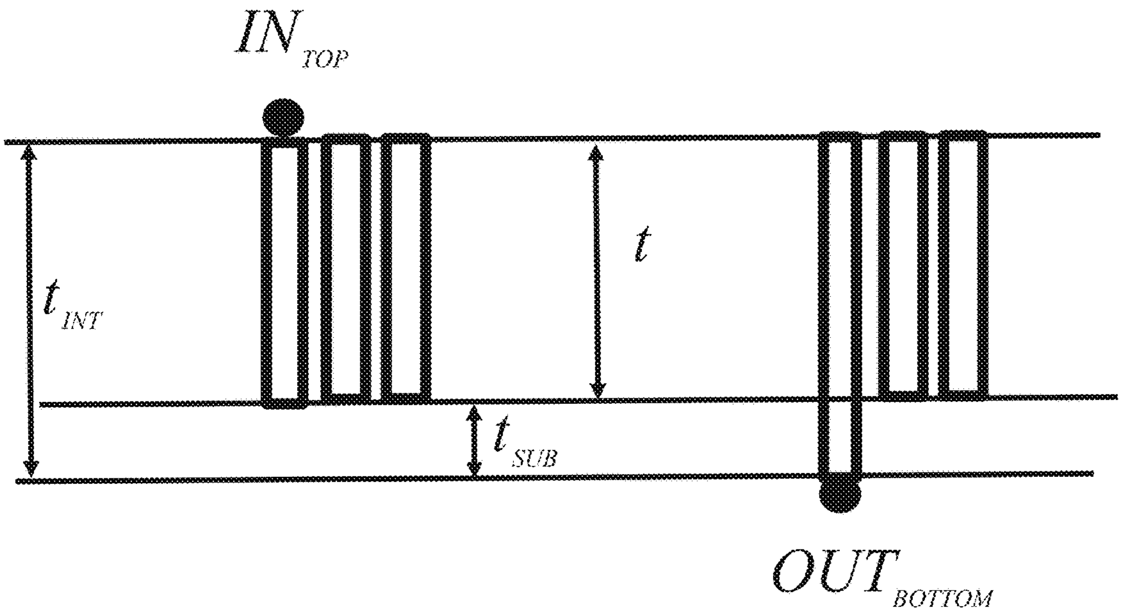
FIG. 14 is a cross-sectional side view of a first interposer structure-built spiral inductor showing C4 bump terminals on top and bottom of the interposer for external connection and IC connection.
Figures 18, 19:
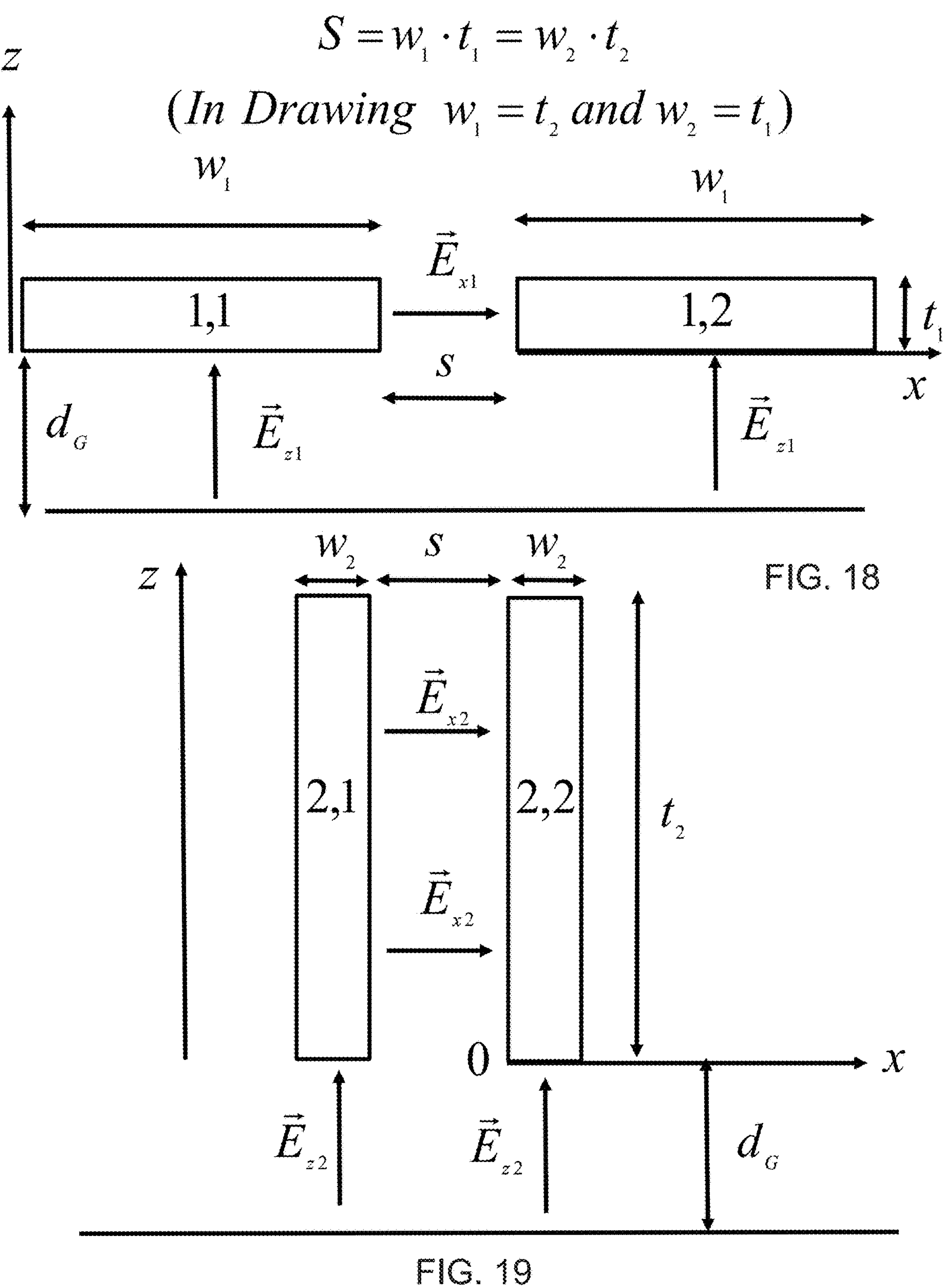
FIG. 18 is a cross-sectional side view with parameters for analyzing an interposer structure inductor.
FIG. 19 is a cross-sectional side view with parameters for analyzing a further interposer structure inductor in accordance with the invention.

The cross-sectional geometry of the spiral inductor structure shown in FIG. 13 is given in FIG. 14. The cross-section geometry is obtained by having cut planes passing from $x=x_{CUT}$ or $y=y_{CUT}$ lines perpendicular to the (x,y) plane as shown in FIG. 13. For simplicity the shown spiral structure has a square inner space with a dimension of $d_{IN}$ and has its windings have a constant width w and spacing s. Since this invention defines a spiral inductor with a large aspect ratio metal and metal spacing, the FIG. 14 points to this feature of the invention as is shown very clearly. Known spiral inductor structures have metal winding widths much larger than their thicknesses as shown in FIG. 18 due to the metallization achievable in any IC, PCB or ceramic processes. If one can build an interposer structure with metallization rules based on what is required for these inductors and place it on top of the IC or under it with the shortest connections possible to the IC, this will give a very practical solution to the problem.

Figure 15:
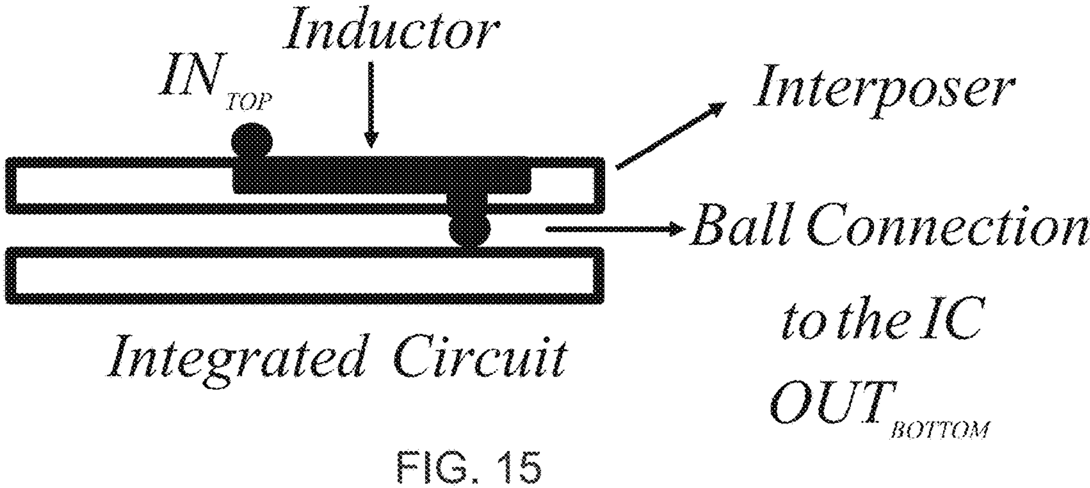
FIG. 15 is a cross-sectional side view of a first coupling between an interposer structure and an integrated circuit.

FIG. 14 also shows another key aspect of the invention in the interposer structure having very thick metal along with very high aspect ratios for metal lines and spacing, which has its connections to the outside circuit from both sides of the structure. FIG. 14 shows this very preferable capability for power management IC applications. In these circuits, as in Buck converters, the inductor is placed between the supply and the switching network [3-9,30]. The switching network is built into the IC and the inductor is placed between the switch and the supply pin [3-9, 30. According to this invention, however, the inductor is built on the interposer structure and is connected to the IC from the bottom of the interposer as shown in FIG. 15 with a ball, a standard technique used in ball grid arrays, and it will connect to the supply pin from the top. As can be seen having the interposer right on top of the IC with connections available on both sides of the interposer saves very valuable space. On the other hand if the interposer access were only possible from one side, a very valuable area will be lost in packaging. In fact for this case, placing the interposer right on top of the chip will not even give any area saving advantage for any power management IC applications.

Figure 16:
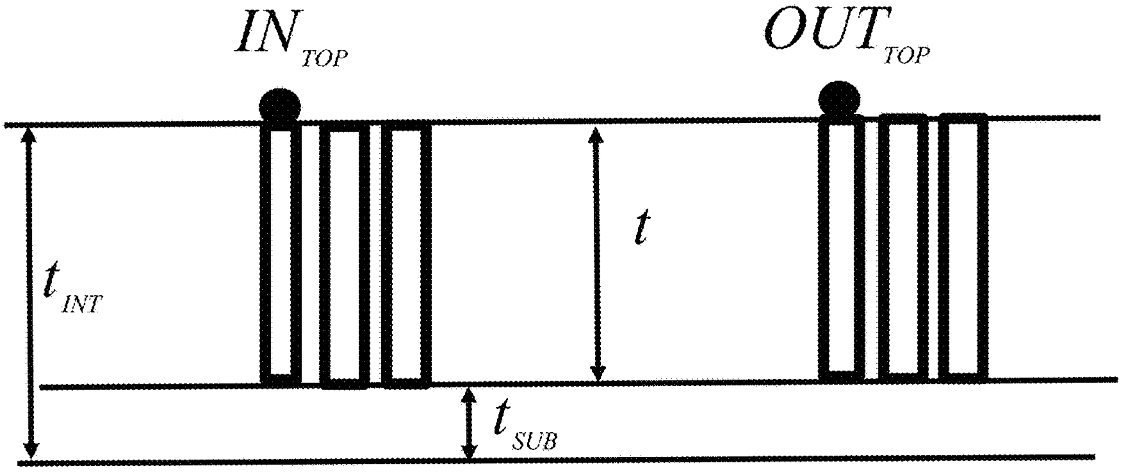
FIG. 16 is a cross-sectional side view of a second interposer structure-built spiral inductor with C4 bump terminals connected on one side of the device.
Figure 17:
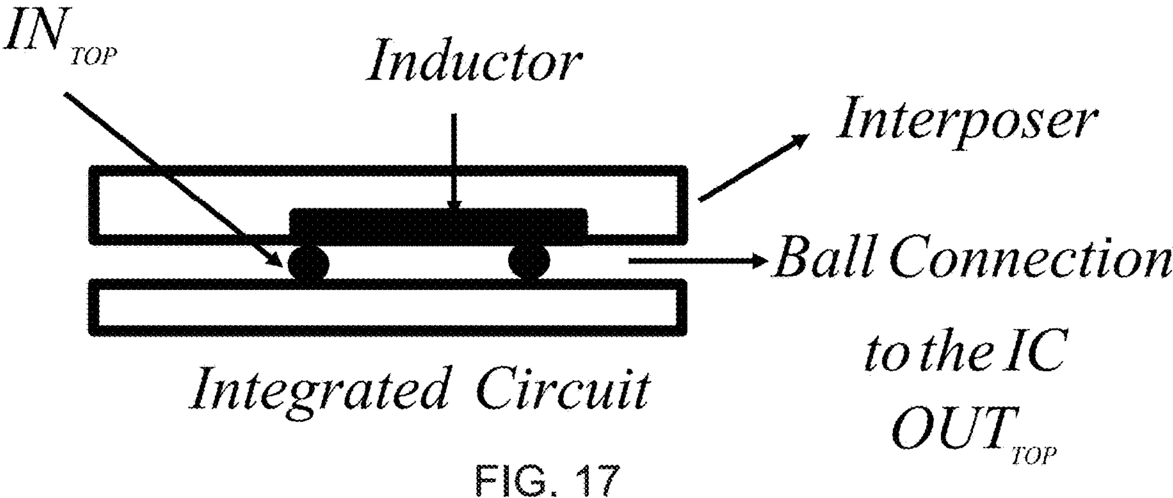
FIG. 17 is a cross-sectional side view of a second coupling between an interposer structure (inverted as compared to FIG. 16) and an integrated circuit.

In some other applications, such as in RFIC, PLL and VCO's, both of the pins of the inductor have to be connected to the IC. This is illustrated in FIGS. 16 and 17 In this case the high value, high Q inductor is built on the interposer and, through the two balls on the bottom of the interposer, it is connected to the desired pads in the IC. Since there can be multiple inductors built on the interposer for both types of circuits, both sides of the interposer can be used to connect the IC through the interposer to the outside world with additional passive circuits on the interposer with improvements in performance and packing density without having any area penalty.

FIG. 18 and FIG. 19 show, according to the invention, two kinds of rectangular cross-section spiral winding arrangements, both having the same cross-sectional areas S, but placed differently. The top arrangement shown in FIG. 18, which is noted as subscript 1, represents the typical arrangement in prior art spiral inductor designs having width w larger than thickness t or w>>t. This choice is dictated by the need for a small $R_{DC}$ for a given thin metal thickness t, so it is something one cannot avoid for a practical design specification. The bottom arrangement, shown in FIG. 19, noted with the subscript 2, and made according to this invention, shows conductors having thickness t larger than the width w, written as t>>w. To be able to realize this structure, one must employ a process with metal thicknesses fairly large compared to what is available today as shown in Table [1]. As can be seen in this arrangement the conductors are intentionally placed with longer dimensions facing each other and shorter dimension facing toward the ground plane or the substrate. Width w and the thickness t are dimensions defined along x and z directions of the coordinate system. The electromagnetic field propagation in the region is assumed to be along y direction, coming out of the plane of FIG. 18 and FIG. 19 and with no electromagnetic field components along the propagation direction, which is known as TEM mode. As a result the electric and magnetic waves only have x and z components as shown in FIG. 18 and FIG. 19 which converts the problem into a two-dimensional problem.

When an electromagnetic wave enters a conductive region, such as into the windings of the spiral cross-section shown in FIG. 18 and FIG. 19 from the lossless dielectric region between the windings and between the conductors and the ground plane, it will attenuate exponentially with an attenuation constant α along its propagation direction into the conductor as a result of the solution of the Helmholtz wave equation (1.26). Solving (1.26) for plane waves, this attenuation constant α for electric and magnetic fields into the conductors will be [24, 25], $$\alpha = \omega\sqrt{\frac{\varepsilon\mu}{2}\left(\sqrt{1+\left(\frac{\sigma}{\omega\varepsilon}\right)^2}-1\right)} \tag{1.27}$$

under a "good conductor" approximation which is defined as, $$\frac{\sigma}{\omega\varepsilon} \gg 1. \tag{1.28}$$

Equation (1.27) simplifies to the well-known "skin depth" [24, 25] given as, $$\delta = \frac{1}{\alpha} = \sqrt{\frac{2}{\omega\sigma\mu}} = \sqrt{\frac{\rho}{\pi\sigma\mu f}}. \tag{1.29}$$

Figure 20:
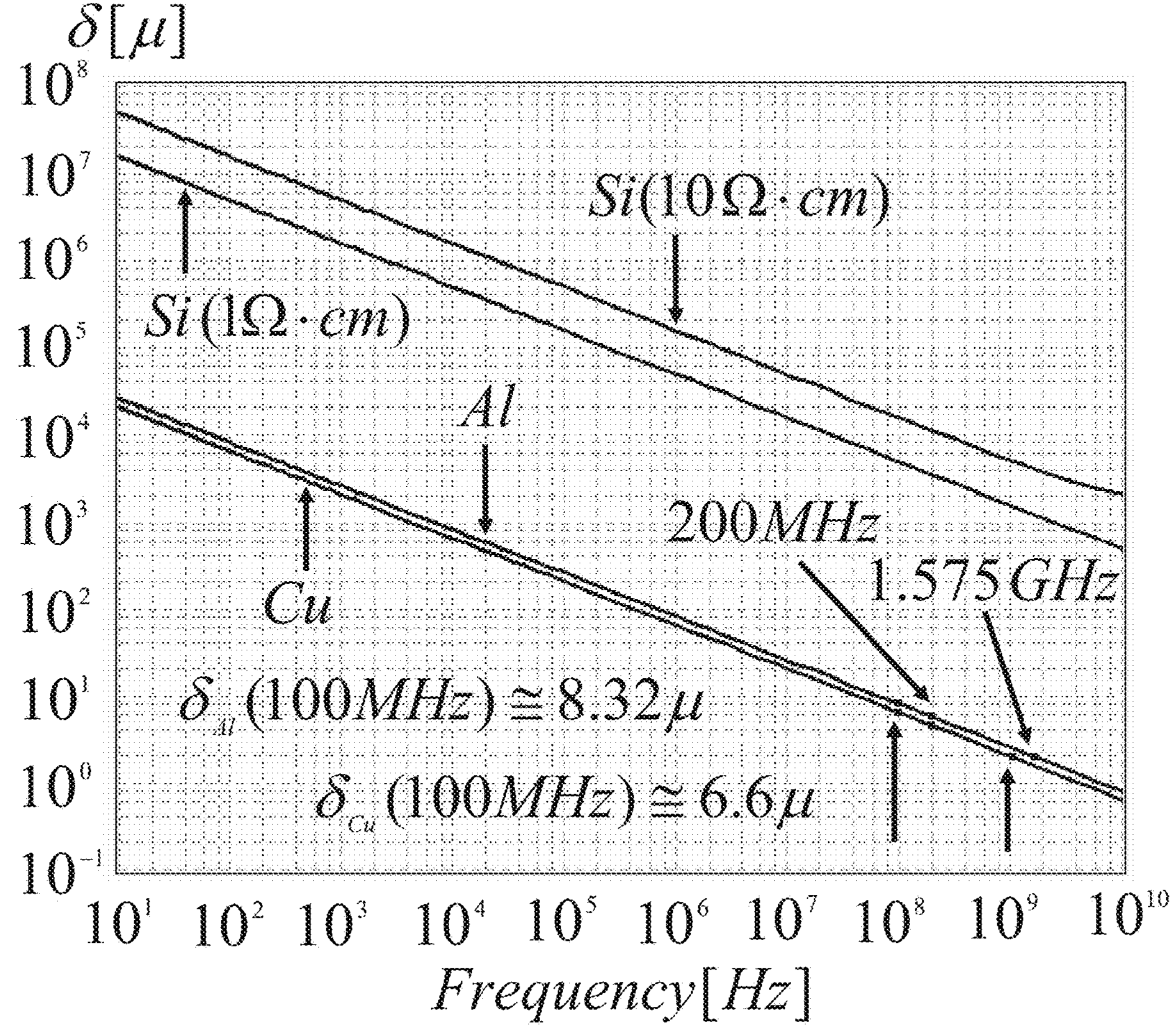
FIG. 20 is a graph illustrating skin depth as a function of frequency.

FIG. 20 show the skin depth as a function of frequency between 10 Hz-10 GHz for Cu, Al and Si having 1 and 10 ohm-cm resistivity. Since the trend and the desire is to integrate inductors on a silicon base material as the substrate, FIG. 20 includes the skin depth in typical Si substrate resistivity ranges of silicon. In all cases, relative magnetic permeability is taken as $\mu_r$=1 giving $\mu=1.25663\cdot10^{-8}$ H/cm in (1.29). In (1.29) the resistivity of Cu and Al is taken as $1.75\cdot10^{-6}$ and $2.73\cdot10^{-6}$ ohm-cm respectively, and the skin depth as a function of frequency is plotted and shown in FIG. 20. As can be seen, the lower three curves (Cu, Al, 1 ohm-cm Si) skin depth varies inversely proportional with the square root of the frequency in the log scale linearly at the entire frequency range, which tells us that the "good conductor" approximation (1.28) is valid for these cases. On the other hand, at frequencies higher than 2 GHZ the 10 ohm-cm resistivity Si material shows some small amounts of flattening. This can be seen at much lower frequencies for higher resistivity Si. In other words the "good conductor" approximation holds very well for Cu, Al and for 1 ohm-cm resistivity Si in the entire frequency range, but not as good for 10 ohm-cm and higher resistivity Si above 2 GHz. Therefore it is always a good practice to check if the "good conductor" approximation holds in the frequency range of interest.

From the calculated electric and magnetic field distributions in the conductor regions of FIG. 18 and FIG. 19 one approximates the non-uniform current density distributions in the spiral windings, which will result in the y direction current flow as observed in spiral inductor structures.

One can speculate on three possible forms of solutions for the non-uniform current density distribution in the spiral windings:

i) Current Density Distribution is Uniform at the Surface of the Conductors.

This solution cannot apply to the majority of the known spirals which have w>>t. If the width and thicknesses (w,t) are not in the same order and if the distance $d_G$ between the ground plane and winding is not on the same order of magnitude as the spacing s, the external field distribution on the conductor surface will be far from uniform and therefore cannot support this boundary condition. Therefore it only has its merit for square cross-sections in conductors having similar s and $d_G$. This mode has an analytical solution for circular cross-sections using Bessel functions (Ber, Bei), but for a rectangular cross-section, one needs a numerical solution of the Helmholtz wave equation where an analytical solution does not exist.

Figure 23:
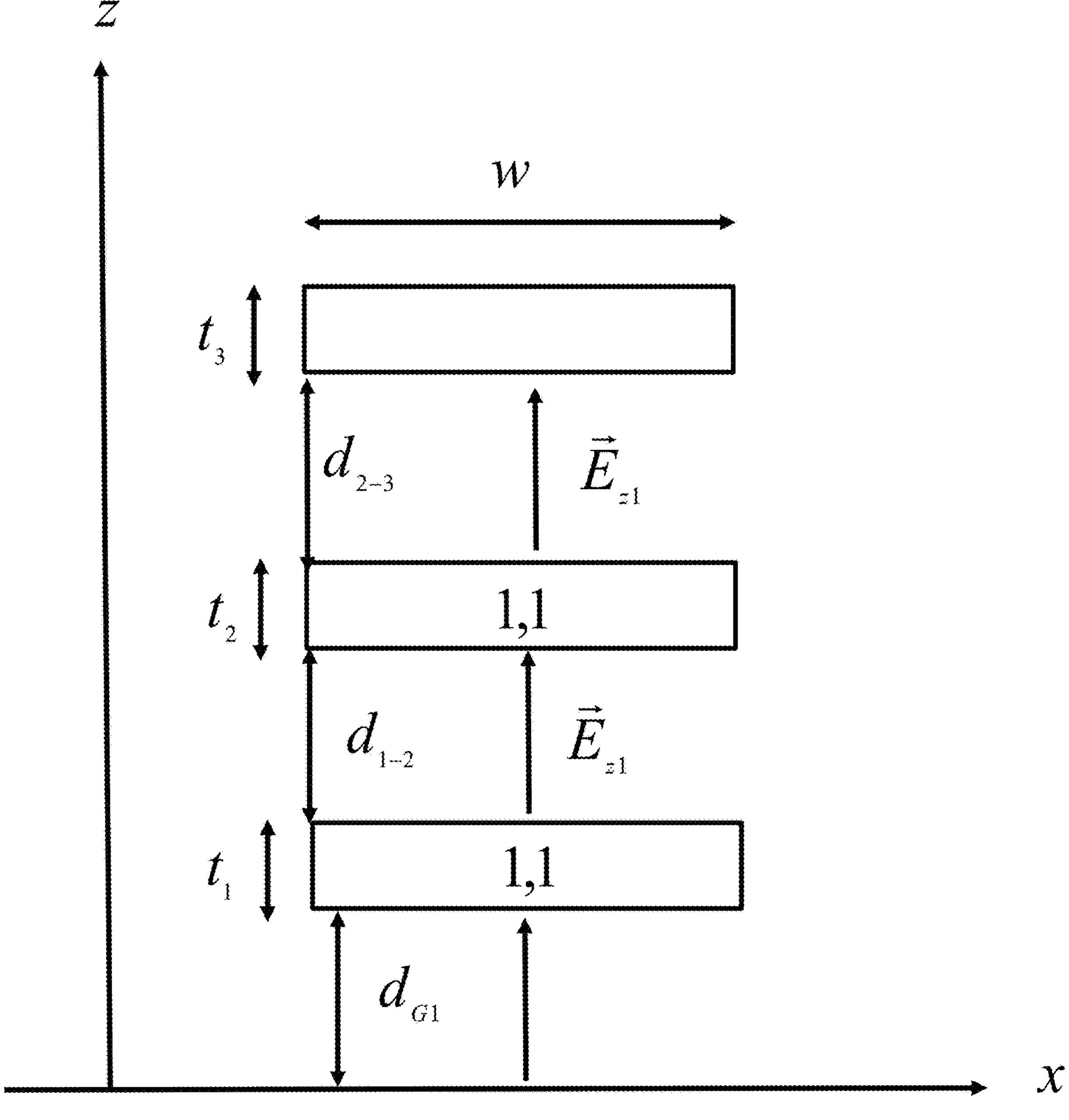
FIG. 23 is a diagram in side cross-sectional view of a multi-layer inductor with parameters marked as used for analysis.
Figure 26:
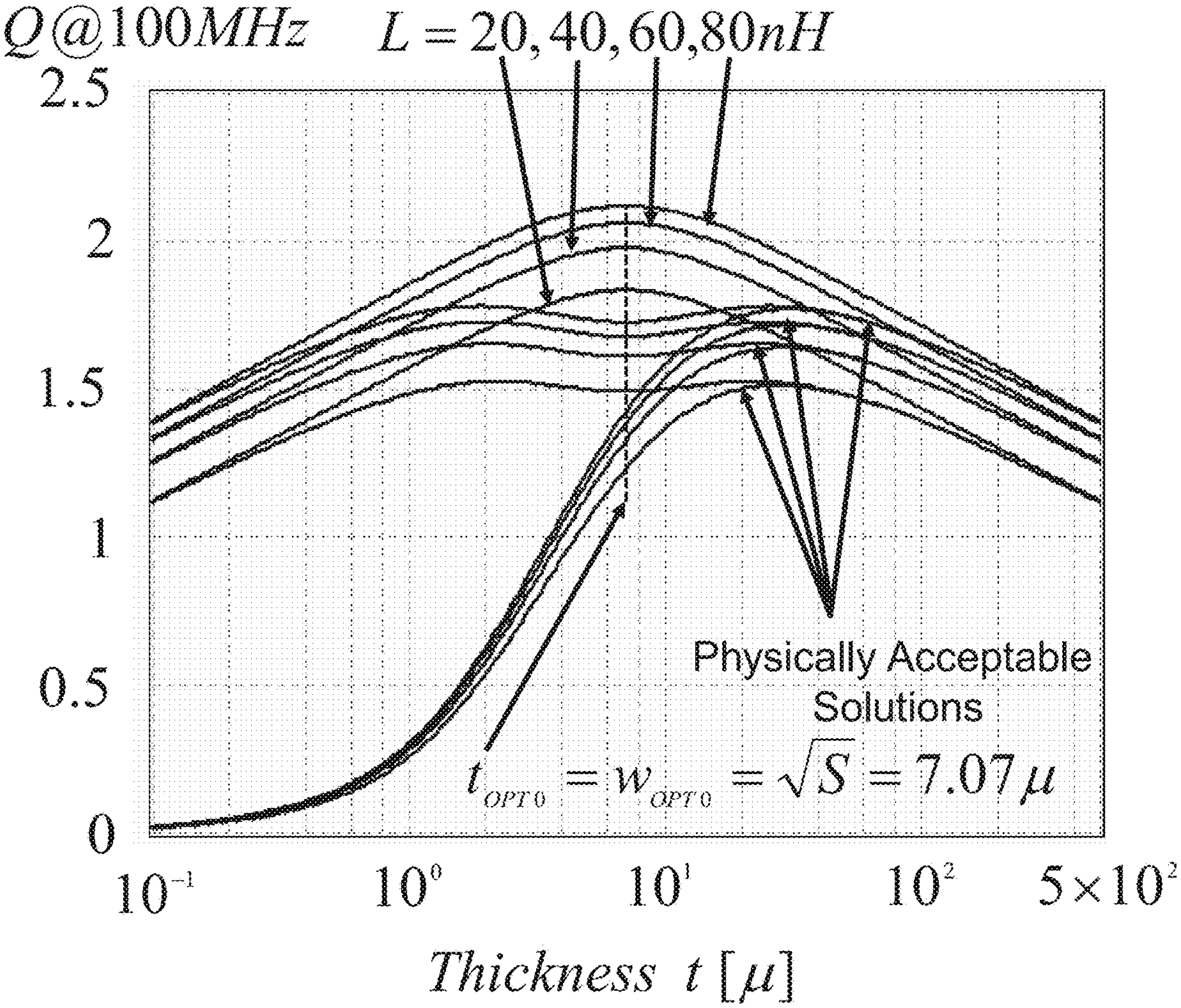
FIG. 26 is a graph illustrating a detail of FIG. 25.
Figure 27:
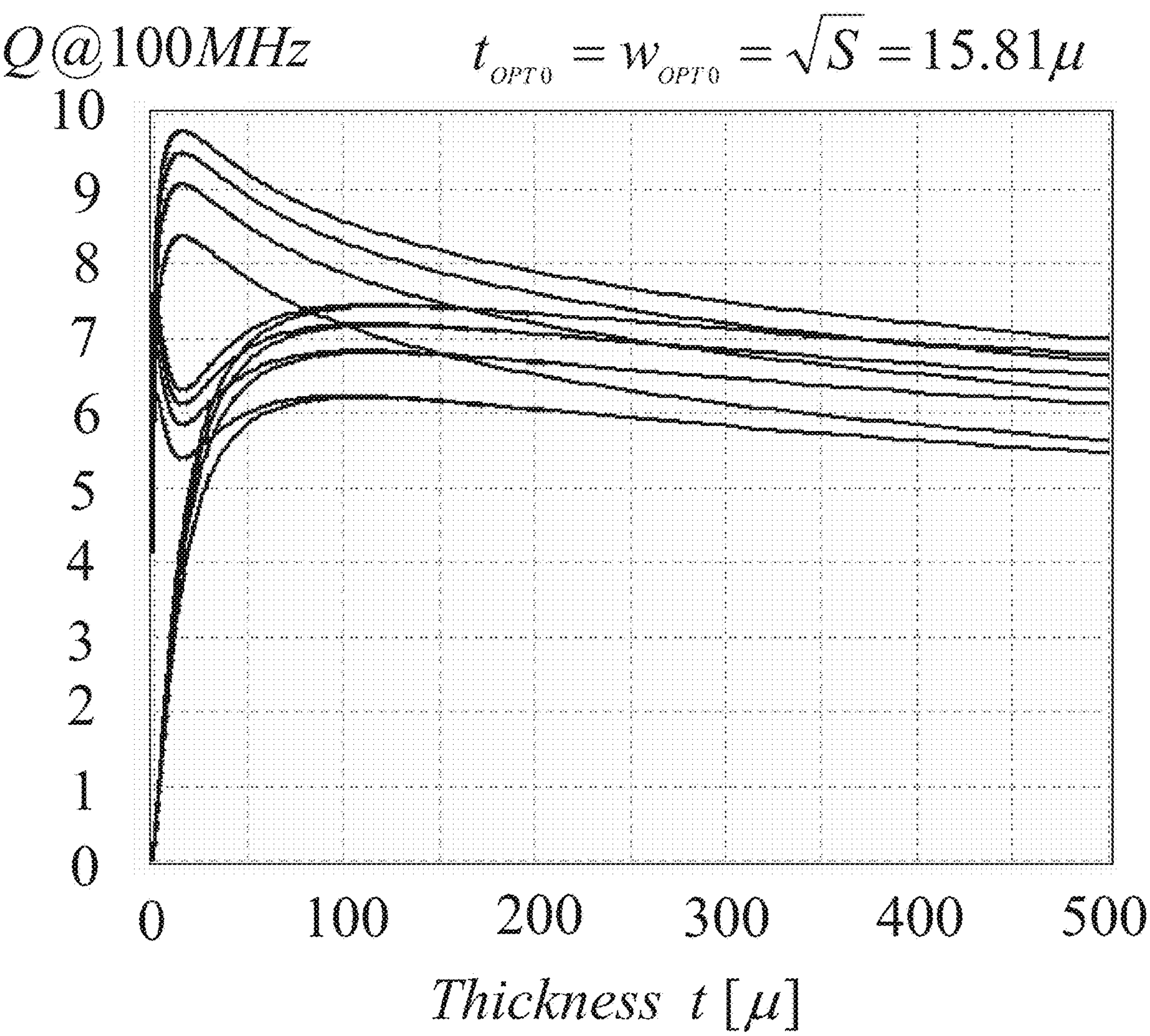
FIG. 27 is a graph illustrating a range of solutions for optimal thickness.
Figure 28:
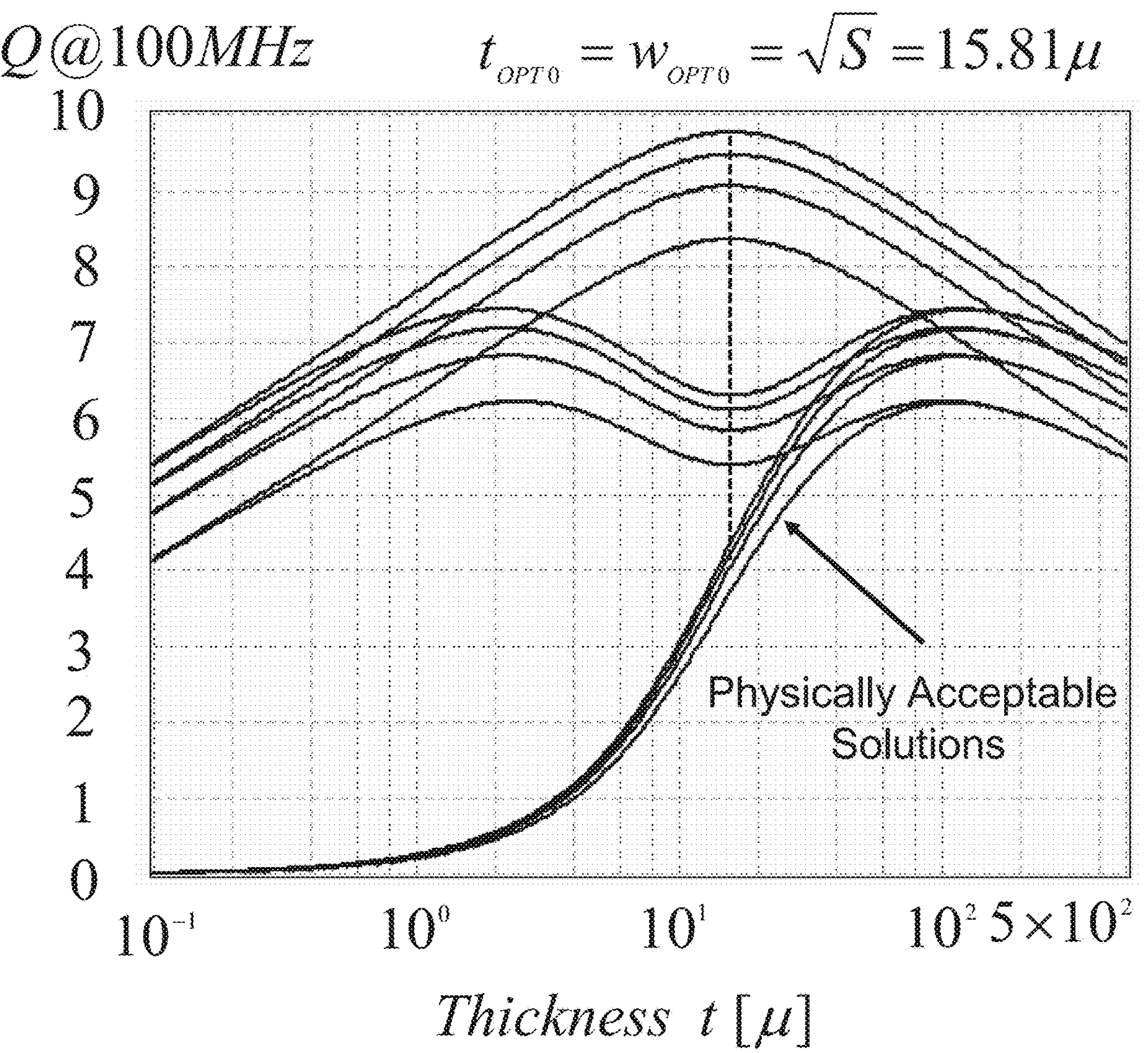
FIG. 28 is a graph illustrating a detail of FIG. 27.
Figure 30:
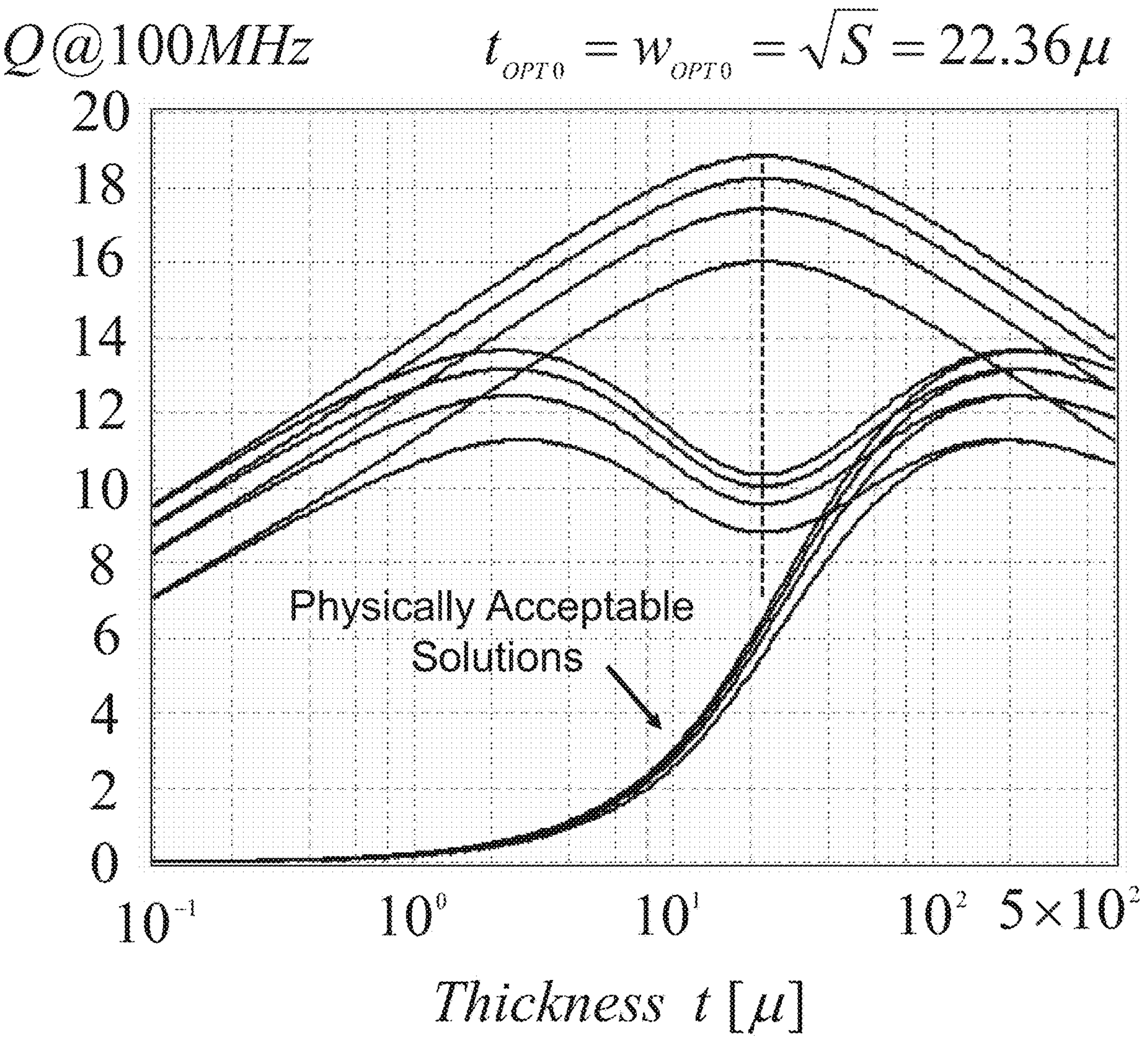
FIG. 30 is a graph illustrating a detail of FIG. 29.
Figure 31:
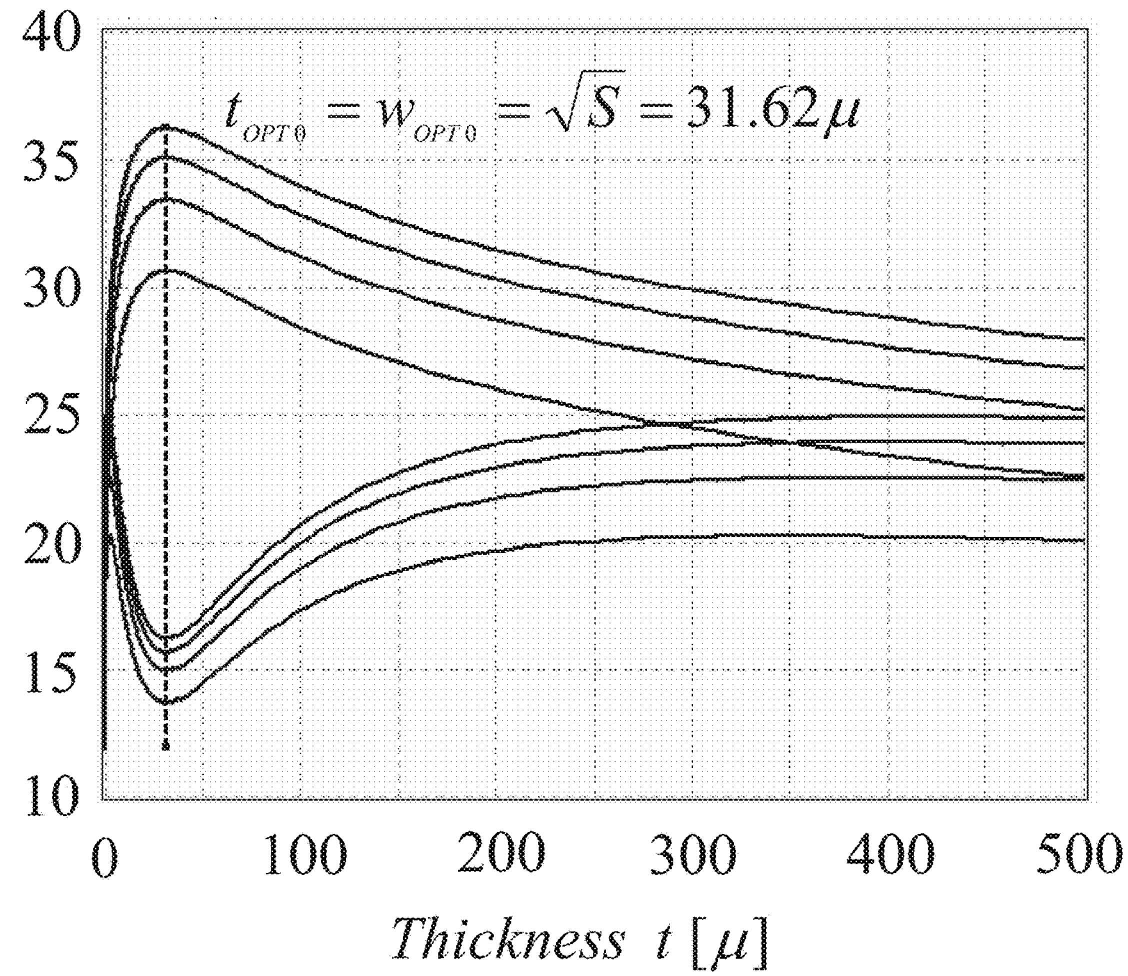
FIG. 31 is a graph illustrating a range of solutions for optimal thickness.
Figure 32:
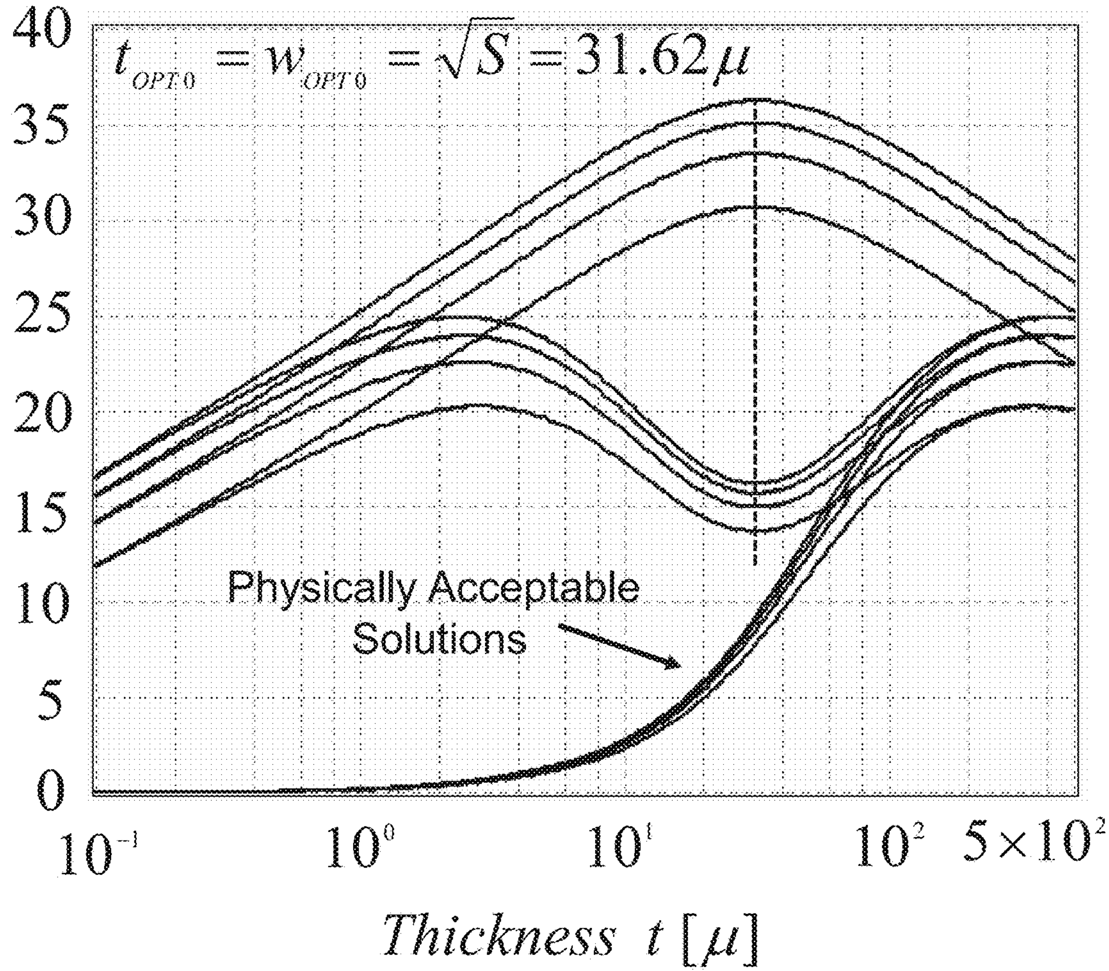
FIG. 32 is a graph illustrating a detail of FIG. 31.

On the other hand, if t>>w and s<<d, and there are vertically stacked inductor winding structures which have w>>t, d (as shown for illustrative purposes in FIG. 23), in a structure formed according to the invention, then numerical simulations suggest that this boundary condition—namely, uniform surface current density distribution—becomes a fairly good approximation of the actual current density distribution. FIG. 23 only shows one side of the vertically stacked inductor winding structures where the layers are connected through vias upward and downward, which is basically a structure of coils made in a planar process with a large number of metal layers.

ii) Majority of the Fields are Confined Between the Bottom of the Conductors and the Ground Plane.

This solution applies fairly well for PCB (Printed Circuit Boards), ribbons and the majority of the on-chip spiral inductors where w>>t and $s>d_G$. For this case a fairly good analytical derivation of the current density distribution can be given, which is once again in line with the solution of the Helmholtz wave equation for the exact structures. This type of current density distribution in the windings is referred as the "single sided solution" in this disclosure. Therefore the straightforward analytical analysis will be given once and for the case related to the invention below.

iii) Majority of the External Fields are Between the Windings.

The solution in this case is applicable to one of the embodiments of the invention explained in this work given as, t>>w, $d_G$<<s. This approximation also applies to the structure where longer sides of the windings are along the x axis, but are stacked as shown in FIG. 23, a complete 90° flip of the structure of a preferred embodiment of the invention.

Single Sided Current Density Distribution Assumption and its Impact on $R_{AC}/R_{DC}$ Consider an analytical derivation for the conductor cross-section shown on the right of FIG. 19, which is referred as "single sided solution". For now assume the metal width of the windings shown in FIG. 19 is infinite, in other words $w_2 \rightarrow \infty$ and the current density at x=0 is $J_0$. For the given current density $J_0$ at the conductor surface (x=0) the solution will give [26-29], $$J_{AC}(x) = J_0 e^{-\frac{x}{\delta}} \tag{1.30}$$

where $$\delta = \sqrt{\frac{2}{\sigma\omega\mu}}.$$

In reality the electric and magnetic fields can enter from both sides of the spiral windings. For this case the problem becomes more complex for spiral inductor current density calculations in its windings and it is referred as the "complete solution" and will be discussed herein below.

Integrating the current density relation (1.30) from 0 to the width w gives the total current flowing in the conductor and is formulated as, $$I_{AC} = \int_0^w J_0 e^{-\frac{x}{\delta}} dx = J_0 \delta\left(1 - e^{-\frac{w}{\delta}}\right). \tag{1.31}$$

On the other hand the DC current, where the current density is uniform, is given as, $$I_{DC} = J_0 w. \tag{1.32}$$

If the windings were infinitely wide, then the total AC current as a result of (1.31) becomes, $$\lim_{w\rightarrow\infty}(I_{AC}) = J_0\delta. \tag{1.33}$$

As can be seen in (1.33), the AC current does not go to infinity as it would in the DC current case! We can ratio the AC current expression (1.31) to the DC current relation (1.32) and get the frequency-dependent AC resistance as, $$\frac{R_{AC}}{R_{DC}} = \frac{I_{DC}}{I_{AC}} = \frac{w}{\delta \cdot \left(1 - e^{-\frac{w}{\delta}}\right)}. \tag{1.34}$$

Rearranging variables in (1.34) gives, $$\frac{R_{AC}}{R_{DC}} = \frac{u}{(1 - e^{-u})} \tag{1.35}$$

where $$u = \frac{w}{\delta}.$$

The expression (1.35) is the Bernoulli Generation Function for n=1 defined as, $$n = 1 \rightarrow \frac{t}{(1 - e^{-t})} = \sum_{m=0}^{\infty} B_m \frac{(-t)^m}{m!}. \tag{1.36}$$

Figure 21:
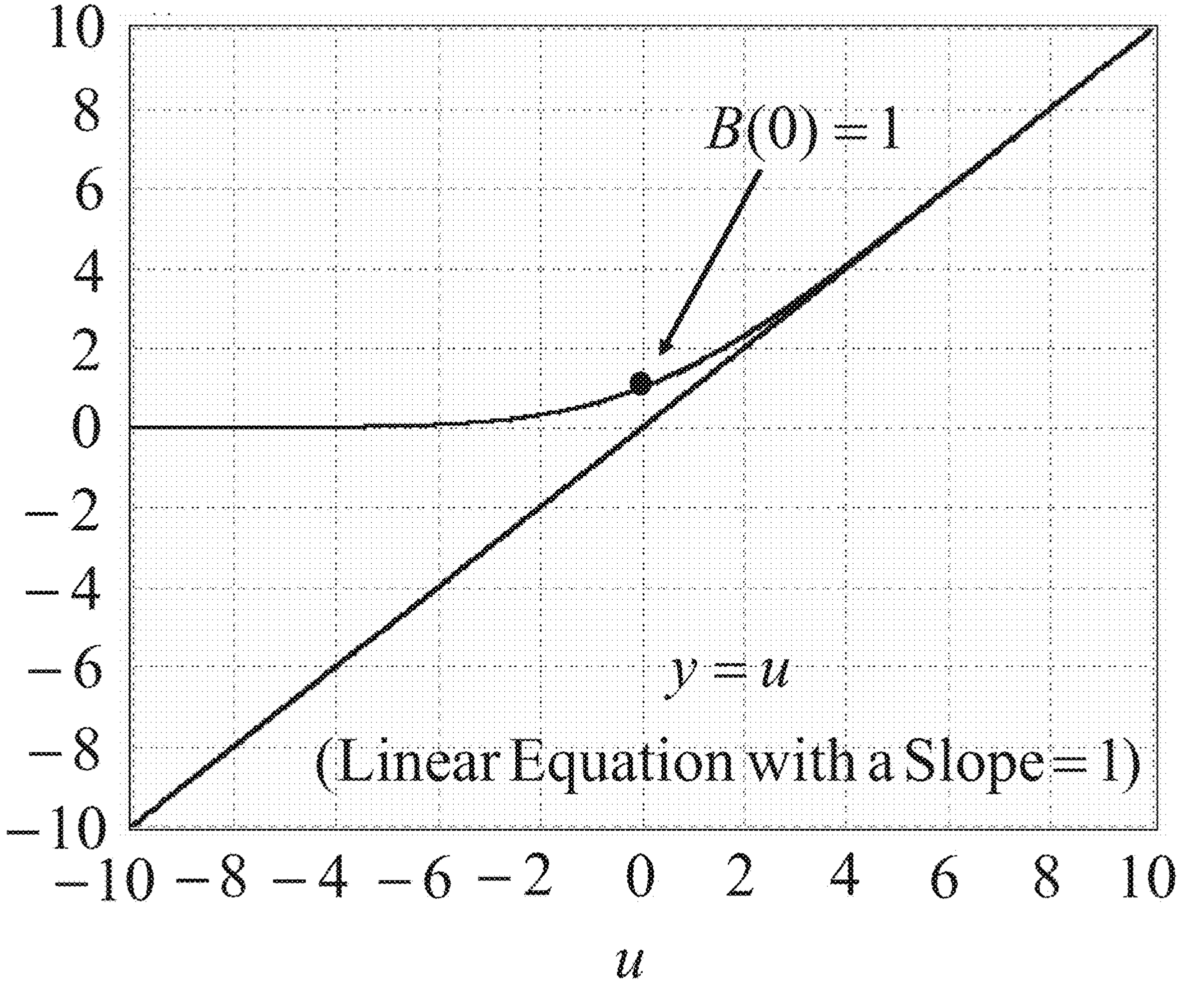
FIG. 21 is a graph illustrating the Bernoulli Function.

In shorthand, we refer to (1.36) as B(u). B(u) is a Bernoulli function that will give only positive values for $-\infty<u<\infty$ and 1 at u=0 as shown in FIG. 21. The region of interest according to this invention is the u>0 region and as can be seen, (1.35) becomes linearly dependent on the w/δ ratio after w/δ>5, giving, $$u = \frac{w}{\delta} > 5 \rightarrow R_{AC} \approx R_{DC}\frac{w}{\delta}. \tag{1.37}$$

As an example for u=w/δ=10, one can right away say $R_{AC}/R_{DC}$ will be very close to 10 without any calculations. If the w/o ratio is small, by solving the nonlinear equation (1.35) for a desired acceptable $R_{AC}/R_{DC}$ value at a given frequency one can determine the width w as a function of δ. FIG. 22 shows this process graphically very clearly. FIG. 22 shows that to have $R_{AC}/R_{DC}$=2 the width w has to be 1.6×δ. If the width is set equal to δ, the $R_{AC}/R_{DC}$ will be 1.6 at that frequency, which is very suitable for an inductor design.

Figure 38:
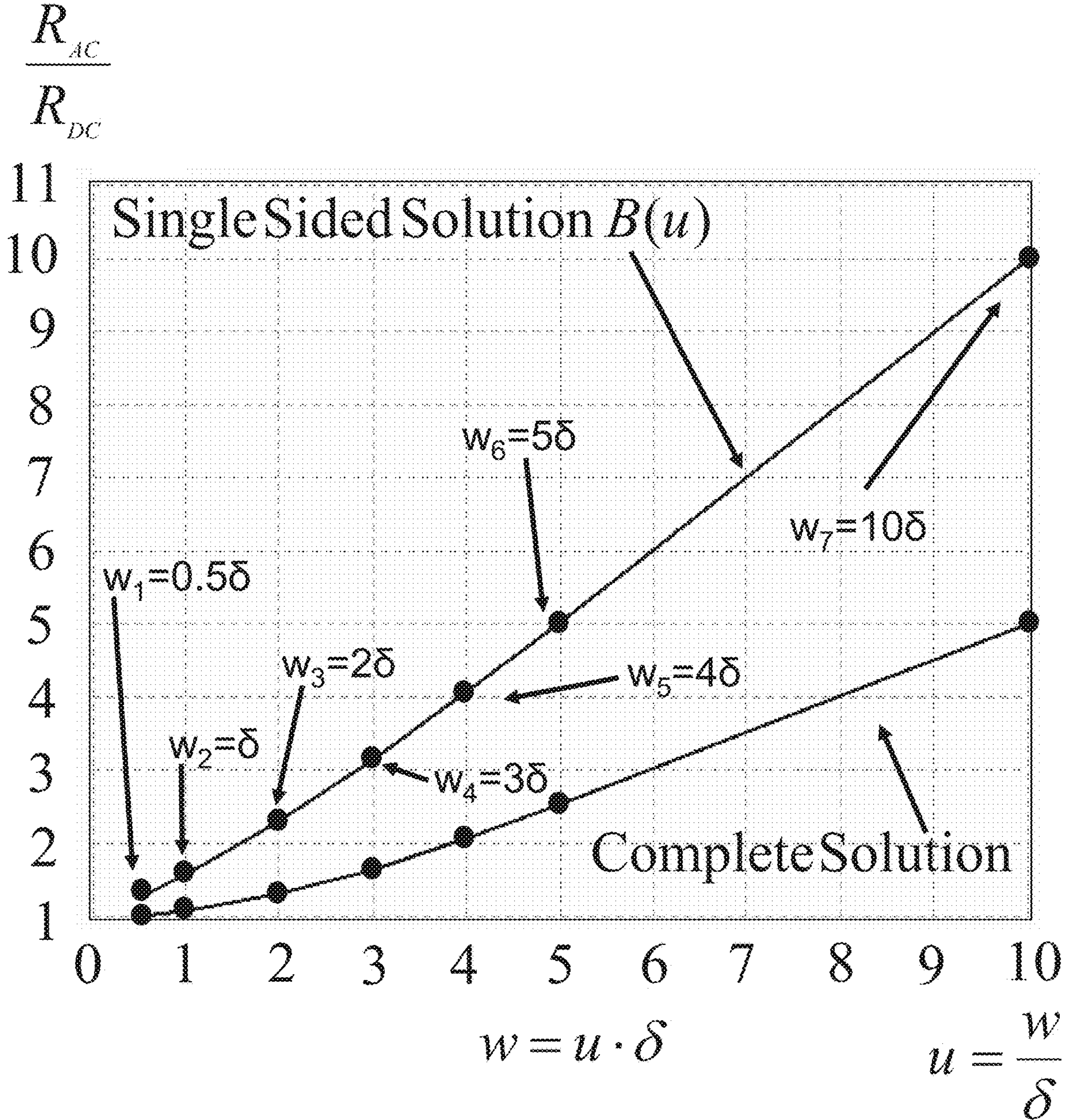
FIG. 38 is a graph illustrating a single sided solution vs. a complete solution for various widths.
Figure 39:
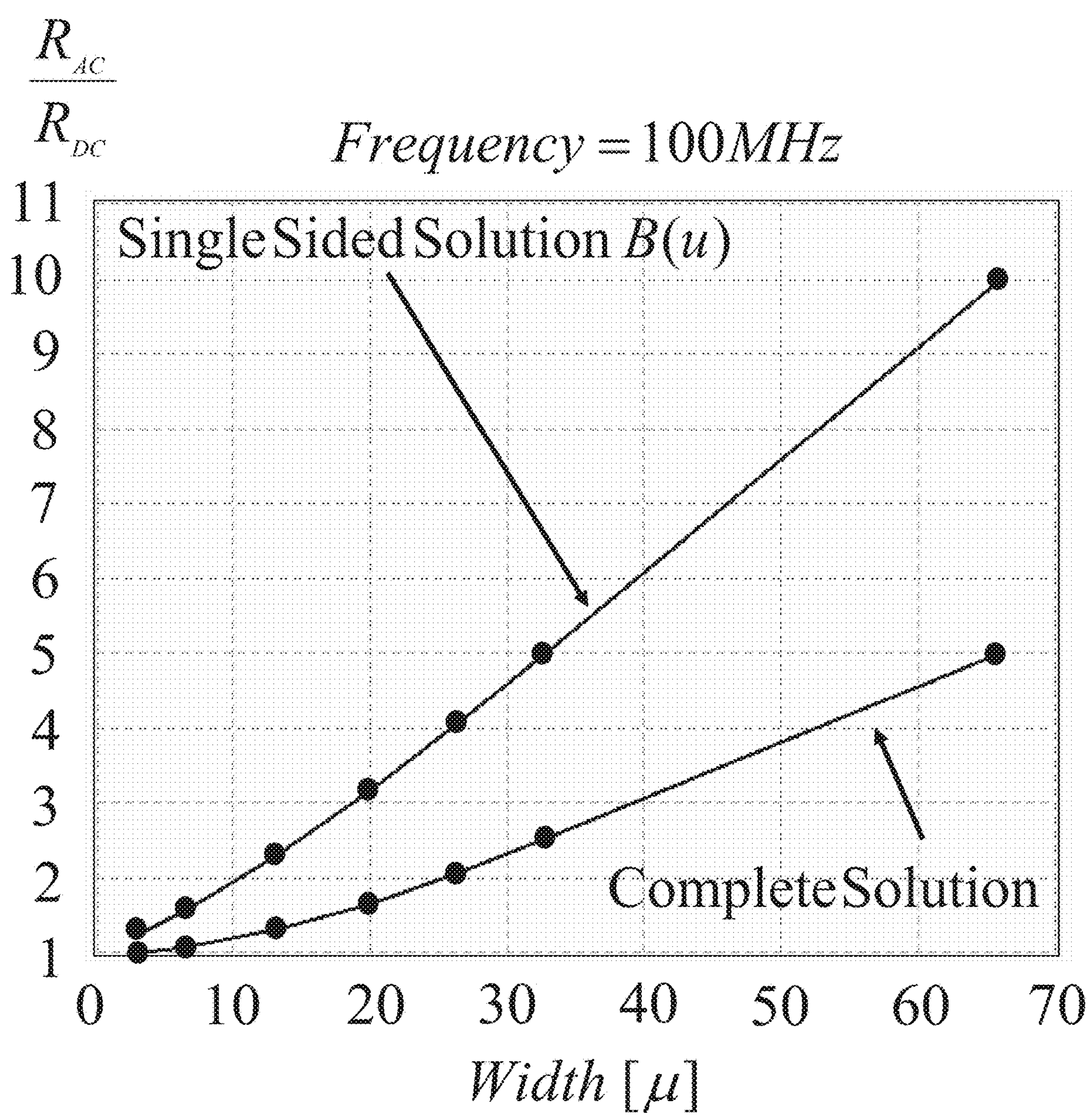
FIG. 39 is a graph showing a detail of FIG. 38.

The top curve in FIG. 38 shows $R_{AC}/R_{DC}$ as a function of u, which is the w/δ ratio. FIG. 39 shows $R_{AC}/R_{DC}$ as a function of width at 100 MHz the for Cu. As can be seen from a skin-depth-versus-frequency curve shown in FIG. 20 and its relation to $R_{AC}/R_{DC}$ as shown in FIG. 38 and FIG. 39, one has to keep the width of the windings not much larger than the skin depth. These correspond to fairly small widths for the vertical metal arrangement shown in FIG. 19. The same is true for the thickness for a horizontal metal arrangement as shown in FIG. 18. In this case having a thick metal compared to skin depth at that frequency will not improve the $R_{AC}/R_{DC}$ significantly but will only help to reduce the DC resistance. Since we need to maintain a given cross-sectional area S, the only solution is to increase the thickness t of the vertical metal arrangement as shown in FIG. 19.

Table [2.0] shows skin depth as a function of typical frequencies for copper and aluminum. As will be noted the skin depth is on the same order of magnitude as the width dimension of the inductor.

TABLE 2

Skin Depth (δ) as a Function of Selected Typical Frequencies for Copper ($1.75 \cdot 10^{-6}\ \Omega \cdot$ cm) and Aluminum ($2.73 \cdot 10^{-6}\ \Omega \cdot$ cm) and Critical Width or Thicknesses to Maintain $R_{AC}(f)/R_{DC} = 2$.

| f [MHz] | δ(Al) [μ] | δ(Al) × 1.6 [μ] $R_{AC}/R_{DC} = 2$ "Single Sided" Solution | δ(Al) × 3.85 [μ] $R_{AC}/R_{DC} = 2$ "Complete" Solution | δ(Cu) [μ] | δ(Cu) × 1.6 [μ] $R_{AC}/R_{DC} = 2$ "Single Sided" Solution | δ(Cu) × 3.85 [μ] $R_{AC}/R_{DC} = 2$ "Complete" Solution |
|---|---|---|---|---|---|---|
| 25 | 16.63 | 26.608 | 64.025 | 13.22 | 21.152 | 50.897 |
| 50 | 11.76 | 18.816 | 45.276 | 9.348 | 14.957 | 35.989 |
| 100 | 8.316 | 13.306 | 32.017 | 6.610 | 10.576 | 25.449 |
| 200 | 5.880 | 9.408 | 22.638 | 4.674 | 7.479 | 17.995 |
| 900 | 2.772 | 4.435 | 10.672 | 2.203 | 3.525 | 8.483 |
| 1,200 | 2.401 | 3.841 | 9.242 | 1.908 | 3.053 | 7.347 |
| 1,575 | 2.095 | 3.353 | 8.067 | 1.666 | 2.665 | 6.414 |
| 2,400 | 1.697 | 2.716 | 6.533 | 1.349 | 2.159 | 5.195 |
| 5,200 | 1.153 | 1.845 | 4.439 | 0.916 | 1.467 | 3.529 |

Single Sided Current Density Distribution Assumption and its Impact on Q

In designing a high Q inductor, it is important to calculate the $R_{AC}$ besides the $R_{AC}/R_{DC}$. The AC resistance can be calculated as, $$R_{AC} = R_{DC}\frac{u}{(1-e^{-u})} \tag{1.38}$$

-continued where $$u = \frac{w}{\delta}.$$

For a given length l, substituting the DC resistance relation (1.18) in (1.38) the AC resistance becomes, $$R_{AC} = \rho\frac{l}{w \cdot t}\frac{u}{(1-e^{-u})} \tag{1.39}$$

where $$u = \frac{w}{\delta} = w\sqrt{\frac{\mu\omega}{2\rho}}.$$

With some arithmetic manipulation, (1.39) gives, $$R_{AC} = \frac{l}{t}\sqrt{\frac{\rho\mu\omega}{2}}\frac{1}{(1-e^{-u})} \tag{1.40}$$

where $$u = \frac{w}{\delta} = w\sqrt{\frac{\mu\omega}{2\rho}}.$$

As can be seen in (1.40) the width dependency AC resistance is very weak compared to the DC resistance for large values of u!

Another interesting result is that the $R_{AC}$ is no longer directly proportional to resistivity ρ as in $R_{DC}$. It becomes linearly proportional to the square root of the resistivity and frequency.

Rearranging (1.40) gives, $$R_{AC}(\omega, l, t, w, \rho, \mu) = \frac{l}{t}\sqrt{\frac{\rho\mu\omega}{2}}\frac{1}{(1-e^{-u})} \tag{1.41}$$

where $$u = \frac{w}{\delta} = w\sqrt{\frac{\mu\omega}{2\rho}}.$$

As can be seen, making width w much wider than the skin depth δ increases the $R_{AC}/R_{DC}$ ratio, but still helps to reduce the $R_{AC}$.

Thus, making the width w wider does not give much reduction in the AC resistance. Rather it just wastes area and adds more capacitance to the inductor if not carefully calculated (as shown herein below)! It is a better practice to increase the thickness rather than to increase the width for maintaining the same cross-sectional area S!

Ultimately we are interested in a width w of a conductor giving highest possible Q at a given frequency while maintaining the same cross-sectional area S for a desired inductance value of L.

First one calculates the Q of a straight inductor, ignoring all the capacitance effects, under the uniform current density distribution and names it $Q_{LRDC}$, which actually represents a very low frequency case. Applying Q relation given at (1.20) gives, $$Q_{LRDC} = \frac{0.002 \cdot 10^{-6} l \cdot \left[\ln\left(\frac{2l}{w+t}\right) + 0.5 - f_1(w, t)\right]}{\rho \frac{l}{w \cdot t}} \cdot \omega. \tag{1.42}$$

Doing some arithmetic manipulation gives, $$Q_{LRDC} = \frac{0.002 \cdot 10^{-6} \cdot w \cdot t}{\rho} \cdot \left[\ln\left(\frac{2l}{w+t}\right) + 0.5 - f_1(w, t)\right] \cdot \omega. \tag{1.43}$$

As can be seen, the length l in the front of (1.42) cancels and (1.43) can be written in terms of S as, $$Q_{LRDC} = \frac{0.002 \cdot 10^{-6} \cdot S}{\rho} \cdot \left[\ln\left(\frac{2l}{w+t}\right) + 0.5 - f_1(w, t)\right] \cdot \omega. \tag{1.44}$$

Forcing the constant S condition to (1.44) as done earlier allows (1.44) to be written as, $$Q_{LRDC} = \frac{0.002 \cdot 10^{-6} \cdot S}{\rho} \cdot \left[\ln\left(\frac{2l}{\frac{S}{t}+t}\right) + 0.5 - f_1(w, t)\right] \cdot \omega. \tag{1.45}$$

Doing some arithmetic manipulation in the log expression as done earlier gives, $$Q_{LRDC} = \frac{0.002 \cdot 10^{-6} \cdot S}{\rho} \cdot \left[\ln\left(\frac{2 \cdot l \cdot t}{S+t^2}\right) + 0.5 - f_1(w, t)\right] \cdot \omega. \tag{1.46}$$

Ignoring the terms after the natural log expression in the bracket approximates (1.46) as, $$Q_{LRDC} \cong \frac{0.002 \cdot 10^{-6} \cdot S}{\rho} \cdot \left[\ln\left(\frac{2 \cdot l \cdot t}{S+t^2}\right)\right] \cdot \omega. \tag{1.47}$$

Finding the maximum or minimum of (1.47) with respect to t requires differentiation of (1.47) as before. With the help of the following variable transformation, $$u = \ln\left(\frac{2 \cdot l \cdot t}{S+t^2}\right) = \ln(v) \tag{1.48}$$

and using the basic differentiation rule [26-29], $$\frac{du}{dt} = \frac{1}{v} \cdot \frac{dv}{dt} \tag{1.49}$$

where $$v = \frac{2 \cdot l \cdot t}{S+t^2}$$

gives, $$\frac{\partial Q_{LRDC}}{\partial t} \cong \frac{0.002 \cdot 10^{-6} \cdot S}{\rho} \cdot \omega \cdot \left[\left(\frac{S+t^2}{2 \cdot l \cdot t}\right) \cdot \frac{dv}{dt}\right] \tag{1.50}$$

where, $$\frac{dv}{dt} = \frac{2 \cdot l \cdot (S+t^2) - (2 \cdot t \cdot l) \cdot (2 \cdot t)}{(S+t^2)^2}. \tag{1.51}$$

With further arithmetic manipulation, $$\frac{dv}{dt} = \frac{2 \cdot l \cdot (S+t^2) - 4 \cdot l \cdot t^2}{(S+t^2)^2} = \frac{2 \cdot l \cdot S - 2 \cdot l \cdot t^2}{(S+t^2)^2}. \tag{1.52}$$

Simplification of (1.52) gives, $$\frac{dv}{dt} = \frac{2 \cdot l \cdot (S-t^2)}{(S+t^2)^2}. \tag{1.53}$$

Substituting (1.53) in (1.50) gives, $$\frac{\partial Q_{LRDC}}{\partial t} \cong \frac{0.002 \cdot 10^{-6} \cdot S}{\rho} \cdot \omega \cdot \left[\left(\frac{S+t^2}{2 \cdot l \cdot t}\right) \cdot \frac{2 \cdot l \cdot (S-t^2)}{(S+t^2)^2}\right]. \tag{1.54}$$

Straight forward arithmetic manipulation on (1.54) results in, $$\frac{\partial Q_{LRDC}}{\partial t} \cong \frac{0.002 \cdot 10^{-6} \cdot S}{\rho} \cdot \omega \cdot \frac{1}{(S+t^2) \cdot t} \cdot (S-t^2). \tag{1.55}$$

Equating (1.55) to zero and solving it, $$\frac{\partial Q_{LRDC}}{\partial t} \cong \frac{0.002 \cdot 10^{6} \cdot S}{\rho} \cdot \omega \cdot \frac{1}{(S+t^2) \cdot t} \cdot (S-t^2) = 0 \tag{1.56}$$

which gives the same result for t as done before with much shorter intermediate math giving, $$t = \sqrt{S} \tag{1.57}$$

$$w = t = \sqrt{S}.$$

Let us denote the optimal thickness given in (1.57) as $t_{OPT0}$. The advantage of taking this approach is to be sure of the result, as well as finding the peak Q at (1.57), giving, $$Q_{LRDC}(\text{MAX}) \cong \frac{0.002 \cdot 10^{-6} \cdot S}{\rho} \cdot \left[\ln\left(\frac{2 \cdot l \cdot \sqrt{S}}{S + S}\right)\right] \cdot \omega. \tag{1.58}$$

Doing the arithmetic in the natural log expression gives this very interesting result, $$Q_{LRDC}(\text{MAX}) \cong \frac{0.002 \cdot 10^{-6} \cdot S}{\rho} \cdot \left[\ln\left(\frac{l}{\sqrt{S}}\right)\right] \cdot \omega. \tag{1.59}$$

Table [1] above shows $t_{OPT0}$ for cross-sectional areas determined by desired current values I without violating Al electro-migration current density rules for various large value inductors at 100 MHz. As can be seen, even with the uniform current density assumption, which it will be shown to be incorrect, the required metal thickness values are very large compared to IC process metal thicknesses!

Applying the "Single Sided Current Density Distribution Assumption" in the analysis done earlier by substituting the $R_{AC}$ term (1.41) in (1.42) gives, $$Q_{LRAC} = \frac{0.002 \cdot 10^{-6} l \cdot \left[\ln\left(\frac{2l}{w+t}\right) + 0.5 - f_1(w, t)\right]}{\frac{l}{t}\sqrt{\frac{\rho\mu\omega}{2}}\left(\frac{1}{1 - e^{-u}}\right)} \cdot \omega. \tag{1.60}$$

Similar arithmetic gives, $$Q_{LRAC} = 0.002 \cdot 10^{-6} \cdot t \cdot (1 - e^{-u}) \cdot \sqrt{\frac{2}{\rho\mu\omega}} \cdot \left[\ln\left(\frac{2l}{w+t}\right) + 0.5 - f_1(w, t)\right] \cdot \omega. \tag{1.61}$$

Applying the same approximation to (1.61) gives, $$Q_{LRAC} = 0.002 \cdot 10^{-6} \cdot \sqrt{\frac{2}{\rho\mu\omega}} \cdot t \cdot (1 - e^{-v}) \cdot \left[\ln\left(\frac{2l}{\frac{S}{t} + t}\right)\right] \cdot \omega \tag{1.62}$$

where v that appears on the exponent as a function of S becomes, $$v = \frac{w}{\delta} = \frac{S}{t}\sqrt{\frac{\mu\omega}{2\rho}}. \tag{1.63}$$

Differentiation of (1.62) requires longer work, but it will not yield the result as earlier. To apply the chain rule [26-29] for differentiation easily let the following functions be defined as, $$g_1(t) = (1 - e^{-v}) \tag{1.64}$$

and $$g_2(t) = \ln\left(\frac{2l}{\frac{S}{t} + t}\right).$$

Substituting the $g_1(t)$ and $g_2(t)$ in (1.62) gives, $$Q_{LRAC} = a \cdot t \cdot g_1(t) \cdot g_2(t) \tag{1.65}$$

$$a = 0.002 \cdot 10^{-6} \cdot \omega \cdot \sqrt{\frac{2}{\rho\mu\omega}} = 0.002 \cdot 10^{-6}\sqrt{\frac{2\omega}{\rho\mu}}. \tag{1.66}$$

The derivatives of $g_1(t)$ and $g_2(t)$ functions with respect to t are, $$\frac{\partial g_1}{\partial t} = e^{-v}\frac{\partial v}{\partial t} = e^{-v}\left(-\frac{S}{t^2}\sqrt{\frac{\mu\omega}{2\rho}}\right) \tag{1.67}$$

and, $$\frac{\partial g_2}{\partial t} = \frac{1}{(S + t^2) \cdot t} \cdot (S - t^2). \tag{1.68}$$

The chain rule applied to (1.65) gives, $$\frac{\partial Q_{LRAC}}{\partial t} = a \cdot \left[g_1(t) \cdot g_2(t) + t \cdot \left(\frac{\partial g_1}{\partial t} g_2(t) + g_1(t)\frac{\partial g_2}{\partial t}\right)\right]. \tag{1.69}$$

To shorten Equation (1.69) to a manageable representation to perform the analysis more clearly, (1.69) can be written as the sum of y(t) and z(t) functions given as, $$\frac{\partial Q_{LRAC}}{\partial t} = a \cdot [z(t) + y(t)] \tag{1.70}$$

where, $$y(t) = t \cdot \left(\frac{\partial g_1}{\partial t} g_2(t) + g_1(t)\frac{\partial g_2}{\partial t}\right). \tag{1.71}$$

The first function y(t) can be written explicitly as, $$y(t) = t \cdot \left\{e^{-v}\left(-\frac{S}{t^2}\sqrt{\frac{\mu\omega}{2\rho}}\right) \cdot \ln\left(\frac{2lt}{S + t^2}\right) + \frac{(S - t^2)}{(S + t^2) \cdot t}\left(\frac{S}{t}\sqrt{\frac{\mu\omega}{2\rho}}\right)\right\}. \tag{1.72}$$

With some arithmetic manipulation, (1.70) becomes, $$y(t) = \frac{S}{t}\sqrt{\frac{\mu\omega}{2\rho}}\left[-e^{-v} \cdot \ln\left(\frac{2lt}{S + t^2}\right) + \frac{(S - t^2)}{(S + t^2)}\right] \tag{1.73}$$

and, $$z(t) = (1 - e^{-v}) \cdot \ln\left(\frac{2lt}{S + t^2}\right). \quad (1.74)$$

After some simple and straightforward arithmetic manipulations, (1.72) becomes simpler. Equating it to zero gives, $$\left[1 - \left(1 + \frac{b}{t}\right) \cdot e^{-v}\right] \ln\left(\frac{2lt}{S + t^2}\right) + \frac{b}{t} \frac{(S - t^2)}{(S + t^2)} = 0 \quad (1.75)$$

where, $$b = S\sqrt{\frac{\mu\omega}{2\rho}} = v \cdot t. \quad (1.76)$$

By using the relation (1.63) for v, (1.75) can be rewritten using "only" the variable v instead of variables of v and b as, $$[1 - (1 + v) \cdot e^{-v}] \ln\left(\frac{2lt}{S + t^2}\right) + v \frac{(S - t^2)}{(S + t^2)} = 0. \quad (1.77)$$

As can be seen, (1.77) is a nonlinear equation in t and can be solved "only" numerically. Before going into the solution of (1.77) it is useful to see the functional behavior of v, which is an important argument of (1.77) as a function of frequency $f$. This analytical investigation will also lead to very important results which are the basis of claims of this application without even solving (1.77).

The first thing to note is that v will be "always" a positive number. In addition to that for any material when the signal in the medium is at zero frequency ($\omega$=0), v will become zero (v= 0). If we substitute some real values into the v expression given in (1.63), such as for copper (Cu) resistivity, along with the numerical value of $\mu$, v becomes, $$v_{Cu} = \frac{S}{t}\sqrt{\frac{1.25 \cdot 10^{-8} \cdot \omega}{2 \cdot 1.68 \cdot 10^{-6}}} = \frac{S}{t} \cdot 0.6099 \cdot 10^{-1}\sqrt{\omega}. \quad (1.78)$$

It can be shown that (1.78) for Cu, frequencies above 42.7 Hz, the square root term exceeds 1 and increases with the square root of the frequency. Now let's investigate the properties of the solution of (1.77) without solving it. It will show that the uniform current distribution solution is incorrect for frequencies $f$>0!

i) The Optimal Thickness $t_{OPT}$ Satisfying the Solution of (1.80) is Greater Than $S^{0.5}$, Giving High Aspect Ratio Conductor Cross-Section!

As can be seen, equation (1.77) is a summation of two terms. If we divide both sides of (1.77) by v we get, $$\frac{[1 - (1 + v) \cdot e^{-v}]}{v} \ln\left(\frac{2lt}{S + t^2}\right) + \frac{(S - t^2)}{(S + t^2)} = 0. \quad (1.79)$$

As can be seen, the second term in (1.79) is, $$\frac{(S - t^2)}{(S + t^2)}. \quad (1.80)$$

Equating (1.80) to zero and solving t will give the uniform current expression derived earlier, which will give the $t_{OPT0}=S^{0.5}$ solution. It should be noted that (1.80) will be negative for $t>S^{0.5}$ and positive for $t<S^{0.5}$. Moreover (1.80) is zero for $t=S^{0.5}$. The first term in (1.79) is product of two functions, $$\frac{[1 - (1 + v) \cdot e^{-v}]}{v} \ln\left(\frac{2lt}{S + t^2}\right) > 0 \text{ for } \ln\left(\frac{2lt}{S + t^2}\right) > 0. \quad (1.81)$$

Figure 24:
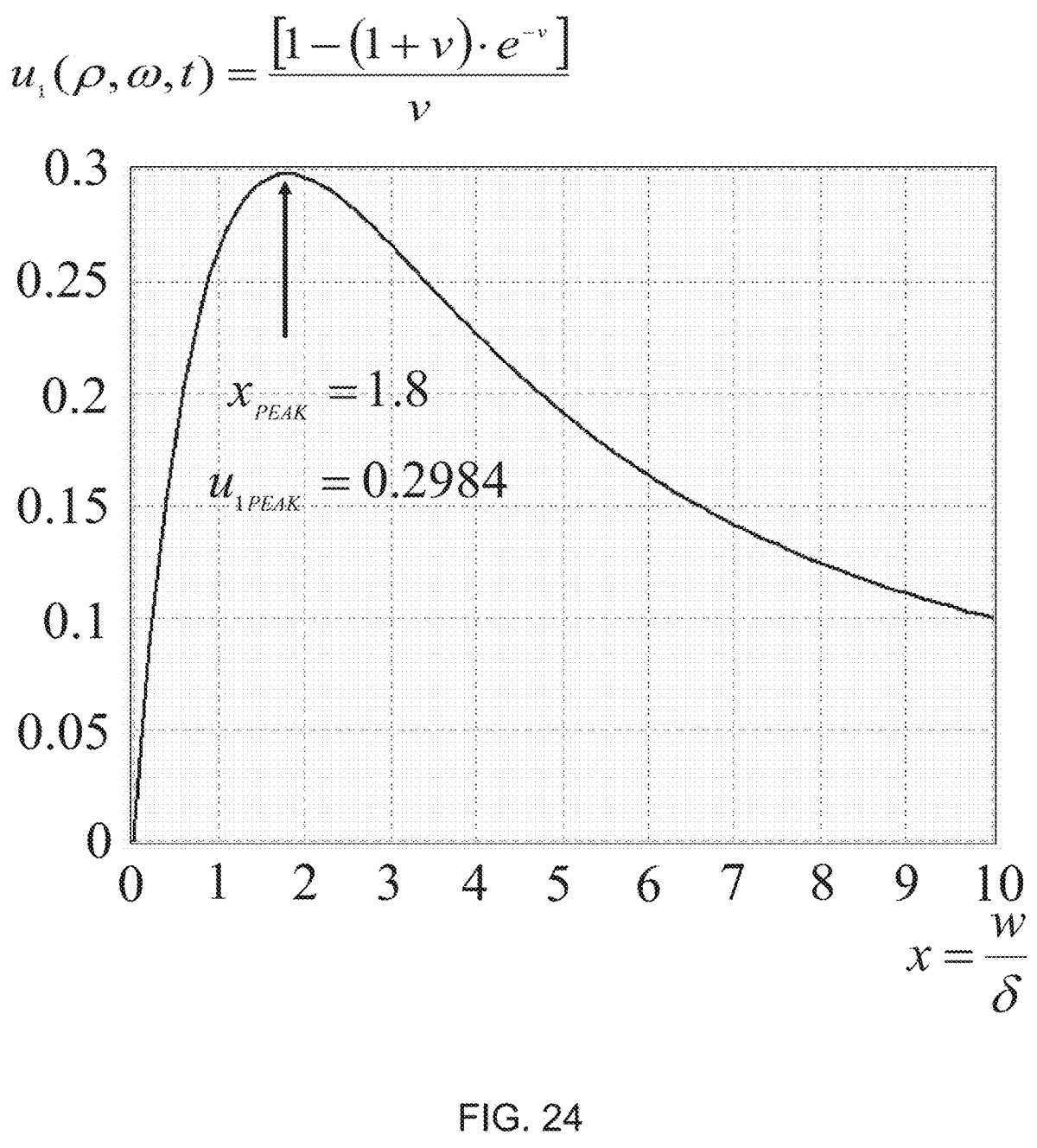

Since the second logarithmic term in (1.81) is always a positive number for any practical length I, all we have to do is find the behavior of the first term of (1.81) with respect to v to determine the sign of (1.81). In other words, if the first term in (1.81) is proven to be always positive for any v>0, the relation (1.81) will also become always positive for any length l where we can apply the inductor formula (1.4). This can be done graphically very easily. FIG. 24 shows the (1.82) $\mu_1$, as a function of v. As can be seen for all v>0, $$u_1(\rho, \omega, t) = \frac{[1 - (1 + v)e^{-v}]}{v} \geq 0. \quad (1.82)$$

For v=0 ($\omega$=$f$=0), (1.82) becomes a 0/0 type uncertainty, but it can be resolved by using L'Hospital's rule [26, 27]. Differentiating the dominator and denominator of it with respect to v and substituting v=0 in the expression, gives 0 for v=0. It can also be shown that (1.82) has a maximum for v>1 giving 0.2983 as its maximum value at v=1.8. Since it is proven that the first term of (1.79) is always positive for all v>0 values, (1.81) is also positive for any v, I, S and t. In this case the equation (1.79) can only be satisfied if its second term (1.80) is negative. This condition can mathematically given as, $$\frac{[1 - (1 + v) \cdot e^{-v}]}{v} \ln\left(\frac{2lt}{S + t^2}\right) + \frac{(S - t^2)}{(S + t^2)} = 0 \text{ only if } \frac{(S - t^2)}{(S + t^2)} < 0 \quad (1.83)$$

If we rewrite (1.79) as, $$a + \frac{(S - t^2)}{(S + t^2)} = 0 \quad (1.84)$$

where, $$a = \frac{[1 - (1 + v) \cdot e^{-v}]}{v} \ln\left(\frac{2lt}{S + t^2}\right) \geq 0 \quad (1.85)$$

and some arithmetic manipulation on (1.84) gives, $$a(S + t^2) + (S - t^2) = 0. \quad (1.86)$$

Finally, equation (1.84) becomes, $$(a-1)t^2+S(1+a)=0. \quad (1.87)$$

Solving t from (1.87) gives, $$t^2=\frac{S(1+a)}{(1-a)}. \quad (1.88)$$

As can be seen, a real solution to (1.88) is only possible if a<1 and can be given as, $$t_{OPT}=\sqrt{S}\sqrt{\frac{(1+a)}{(1-a)}} \text{ for } a<1. \quad (1.89)$$

The direct result of (1.89) gives, $$t_{OPT}=b\sqrt{S} \text{ where } b=\sqrt{\frac{(1+a)}{(1-a)}}>1 \text{ for } a<1 \quad (1.90)$$

which, proves our case without even solving the non-linear equation (1.77) at all! Since b>1 for a<1, $$t_{OPT}>\sqrt{S}. \quad (1.91)$$

It also states that since a is a function of frequency $f$, length I, which defines the desired inductance value L and resistivity ρ. As a result, the optimal thickness $t_{OPT}$ is a function of these three additional parameters, not a just a function of $t_{OPT0}=S^{0.5}$ as derived earlier for the constant current density assumption. It also has to be noted that (1.90) gives the same result for a=0 which corresponds to zero frequency and for this case b=1 and satisfies the $t_{OPT0}=S^{0.5}$ result!

Since the cross-sectional area is a given value of S, for $t_{OPT}$ we can also define the optimal width $w_{OPT}$ that satisfies, $$S=W_{OPT}\cdot t_{OPT} \quad (1.92)$$

giving, $$w_{OPT}=\frac{S}{b\sqrt{S}}=\frac{\sqrt{S}}{b} \text{ where } b>1. \quad (1.93)$$

As a result of (1.90) and (1.93), the high-Q inductor rectangular cross-section has to be a high aspect ratio cross-section having larger thickness than width, or in other words t>w. This is one of the key insights of this invention.

The aspect ratio $\Delta_{OPT}$=t/w can be defined as, $$\Delta_{OPT}=\frac{t_{OPT}}{w_{oPT}}=\frac{b\sqrt{S}}{\frac{\sqrt{S}}{b}}=b^2>1. \quad (1.94)$$

The same fact could have been proven by writing (1.79) as a function of w instead of t giving, $$\frac{[1-(1+v)\cdot e^{-v}]}{v}\ln\left(\frac{2lw}{w^2+S}\right)+\frac{(w^2-S)}{(w^2+S)}=0. \quad (1.95)$$

As can be seen, equation (1.95) is a non-linear function of w. In this case (1.84) becomes, $$a+\frac{(w^2-S)}{(w^2+S)}=0. \quad (1.96)$$

The solution this time leads to the solution for w of, $$w^2=S\frac{(1-a)}{(a+1)}. \quad (1.97)$$

giving, $$w_{OPT}=\sqrt{S}\cdot\sqrt{\frac{(1-a)}{(a+1)}} \text{ for } a<1 \quad (1.98)$$

which (1.98) gives the identical result of (1.93) satisfying $S=w_{OPT}\cdot t_{OPT}$. Furthermore it can also be proven that $w_{OPT}<\delta$, or in other words the shorter dimension of the rectangular cross-sections will be less than the skin depth δ for all of the typical inductor values. Thus (1.97) gives the identical result of (1.93).

As a conclusion of this analysis we can state:

The $Q_{MAX}$ for a rectangular cross-section by enforcing the constant area constraint S is a rectangular cross-section having a larger dimension along z axes, which is the thickness t, compared to its width (w). It is NOT a square. Furthermore, there is an optimal thickness $t_{OPT}$ that can be found exactly by solving (1.79) for any given frequency, inductor value and cross-sectional area of the spiral inductor windings. The exact thickness $t_{OPT}$ which is the solution of (1.79) has a weak dependency to resistivity, frequency of operation and the desired inductance value L due to the/dependency in (1.77), but it is a function of these parameters and does not appear in the previously derived $t_{OPT0}$.

This conclusion is verified in FIG. 25 to FIG. 32 which show the Q versus Al metal thickness t, varying between 0.1 to 500μ, for 20, 40, 60 and 80 nH inductors for constant area S constraints of 50, 250, 500 and 1,000$\mu^2$ for 2 different current boundary conditions mentioned earlier along with the constant current density approximation at a frequency $f$ at 100 MHz.

The top set of curves in each plot of these figures corresponds to the uniform current density assumption. As can be seen, the Q peaks are corresponding to thicknesses of the square root of S at 7.07μ, 15.81μ, 22.36μ and 31.62μ for S=50, 250, 500 and 1,000$\mu^2$, respectively, as derived earlier. These solutions are marked with a vertical dotted line in each plot. As can be seen, the thickness for the (peaks are independent of the L values, but the peak Q value is a function of the desired inductance values taken as 20, 40, 60 and 80 nH as predicted analytically.

The case of forced uniform current density at the surface of the conductor gives two peaks, one below and the other one after $t_{OPT0}$. It is noteworthy that in this case there is a double peak with a minimum at $t_{OPT0}$. The reason for a double peak is that a scan of the thickness from 0.1μ to 500μ till $t<S^{0.5}$ yields a width w that is higher than the thickness t, to satisfy the constant area S condition imposed, and after $t>S^{0.5}$ the thickness t becomes larger than the width w. Forcing a uniform current density boundary condition at the surface of the conductor gives symmetric results with respect to $S^{0.5}$.

In the case where constant current density along the thickness (along z axes) is assumed, the curves start with very low Q's for small thicknesses. This is due to the fact that for very small thickness t, will give very large widths, w to satisfy the constant area S condition. All the curves have single peaks, which matches the second peak in the earlier case, because as the thickness increases the surface current density at the surface of the conductor case applicable to the metal geometry. The optimal thicknesses $t_{OPT}$ where the $Q_{PEAK}$ for all cases for S=50, 250, 500 and 1,000$\mu^2$, at 100 MHz are significantly higher than $t_{OPT0}$ as predicted by the earlier analysis. However, as can be seen, none of these metal thicknesses shown in FIG. 25 to FIG. 32 can be provided by any known IC process. This limitation is addressed herein below.

Figure 33:
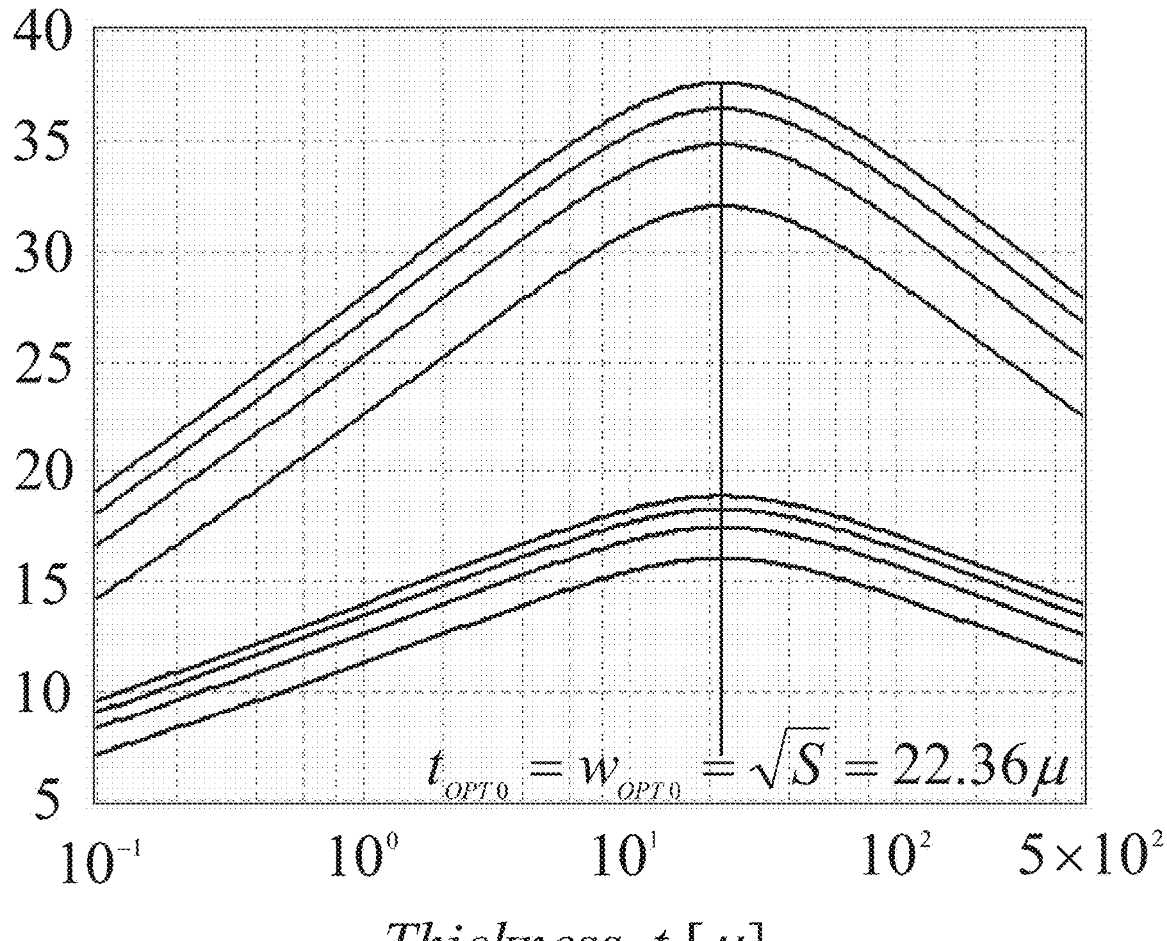
FIG. 33 is a graph to show the magnitude of $Q_{PEAK}$ variation as a function of frequencies for various inductors 20, 40, 60 and 80 nH
Figure 34:
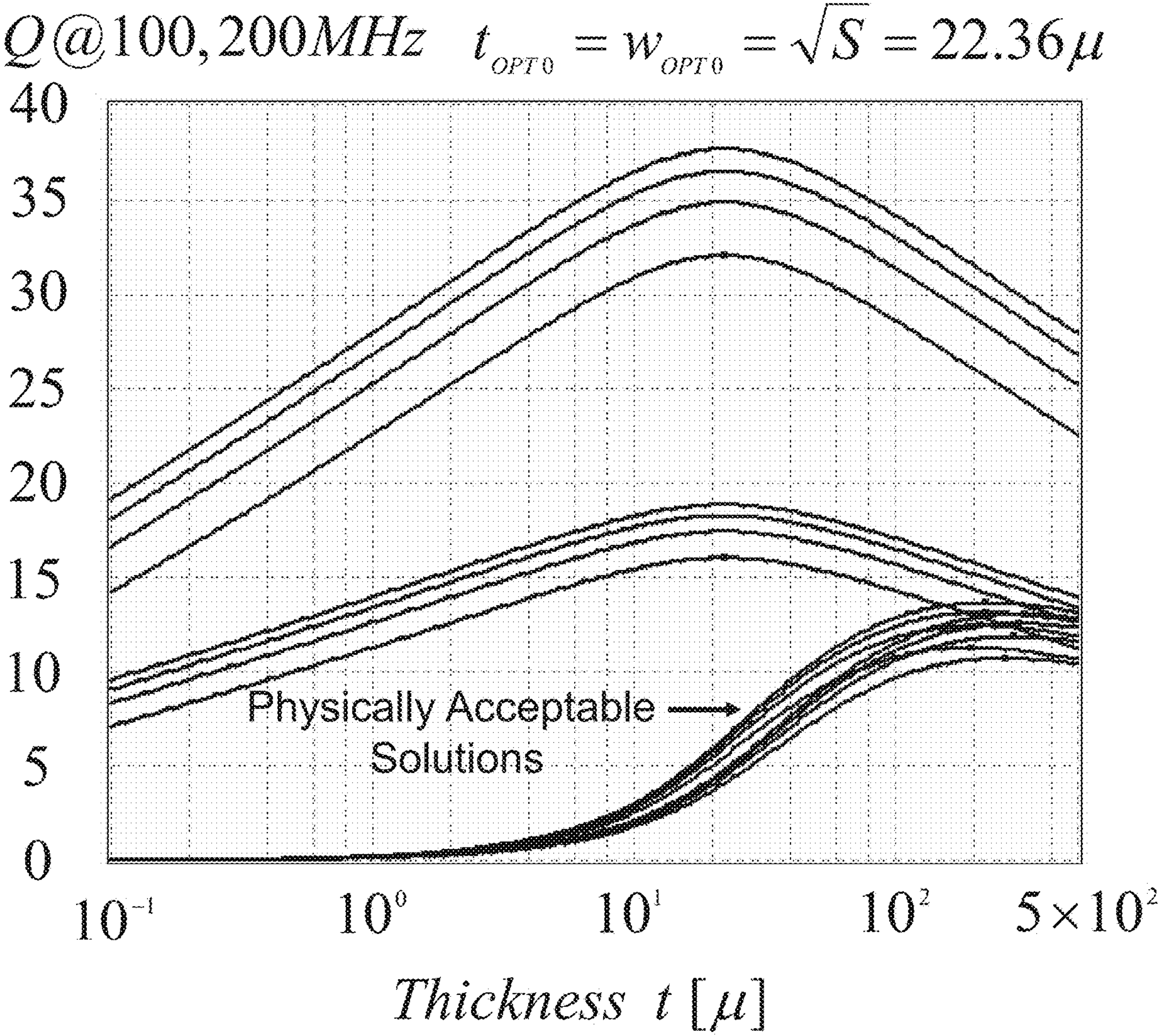
FIG. 34 is a graph to show the uniform current density and current density distribution with "single sided solution" approximation.
Figure 35:
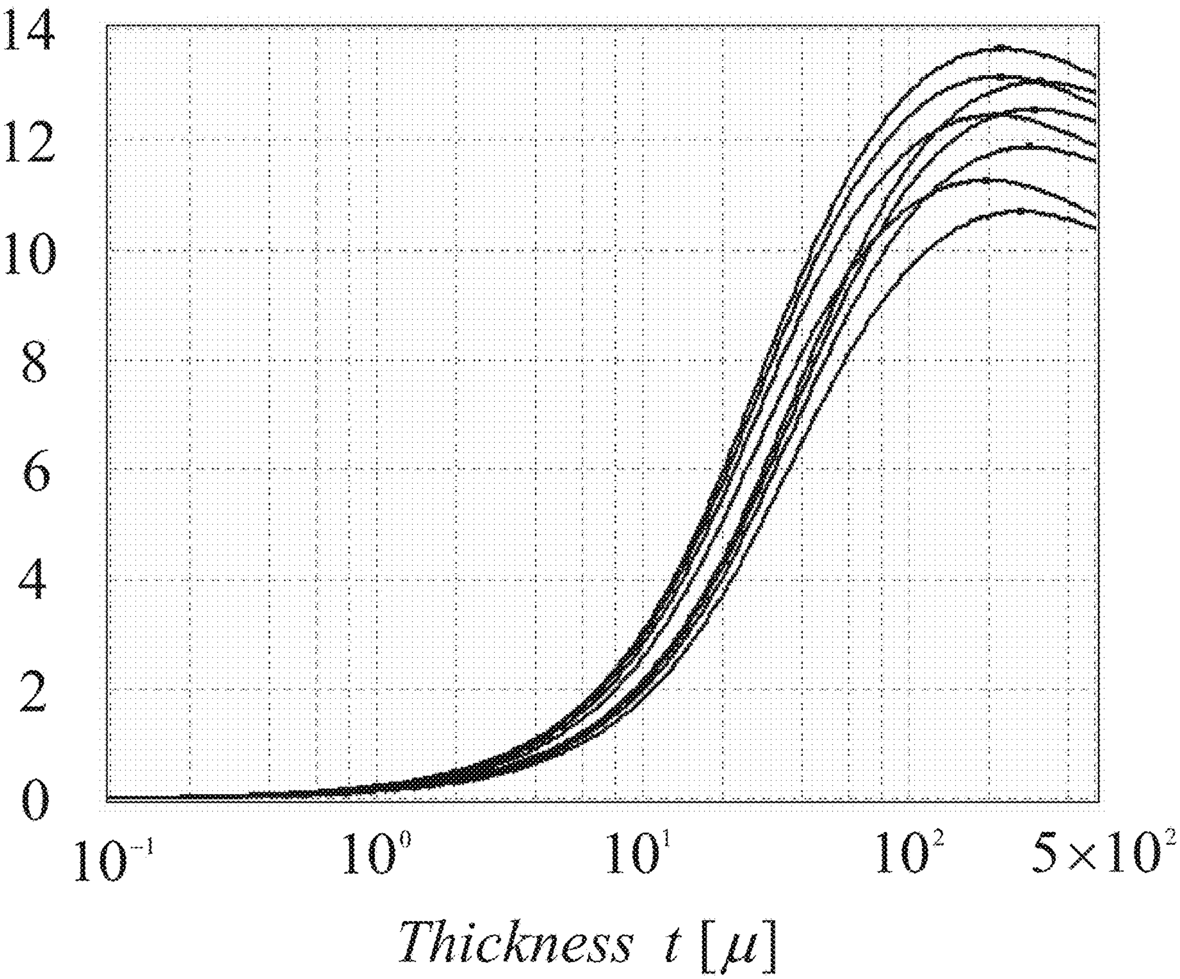
FIG. 35 is a graph showing physically practical solutions at various thicknesses and Q.

FIG. 33 show the magnitude of $Q_{PEAK}$ variation as a function of frequencies for the inductors 20, 40, 60 and 80 nH for 100 and 200 MHz. As can be seen, the peaks are at the same $t_{OPT}$ giving linearly scaling peak values with frequency as predicted. FIG. 34 show the uniform current density and current density distribution with "single sided solution" approximation together to show the relative differences between two assumptions. As can be seen, the Q(t) variations in the "single sided solution" approximation gives much more realistic results. To have a better representation of the realistic "single sided solution" approximation they are plotted alone in FIG. 35.

The "Complete Solution Current Density Distribution" for Spiral Windings

Figure 36:
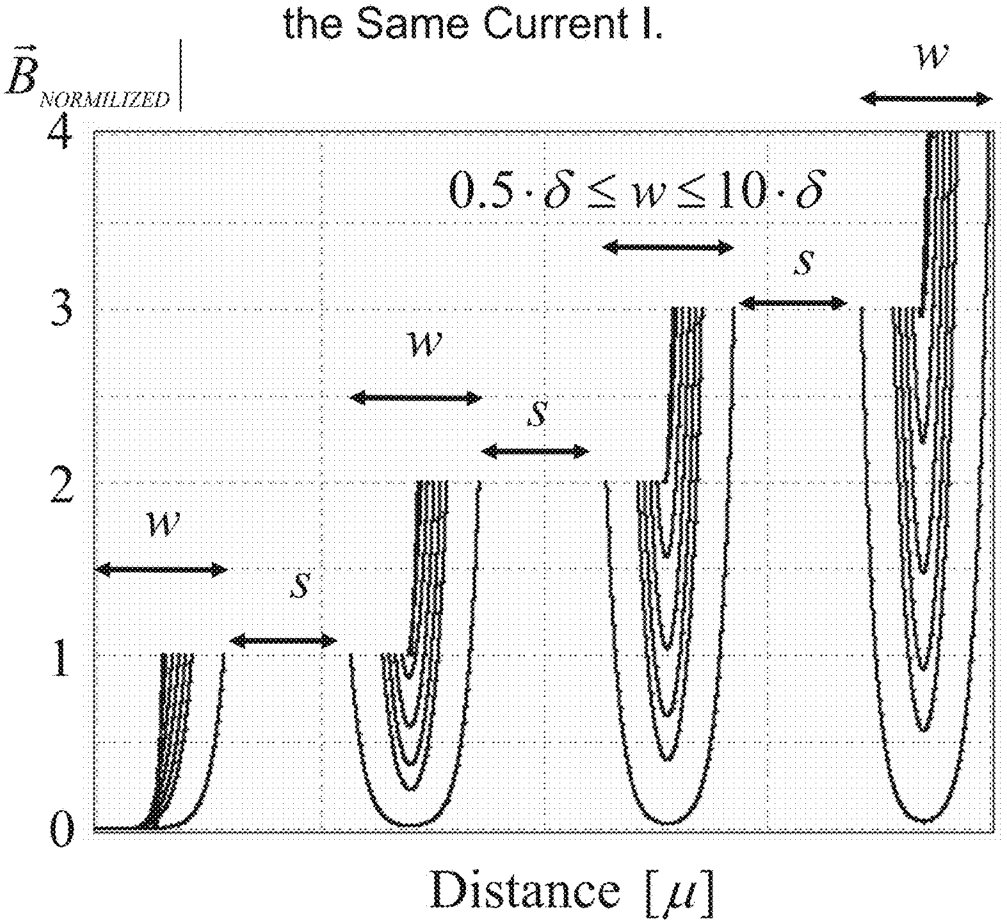
FIG. 36 is a graph showing normalized magnetic fields across a four-winding inductor.
Figure 37:
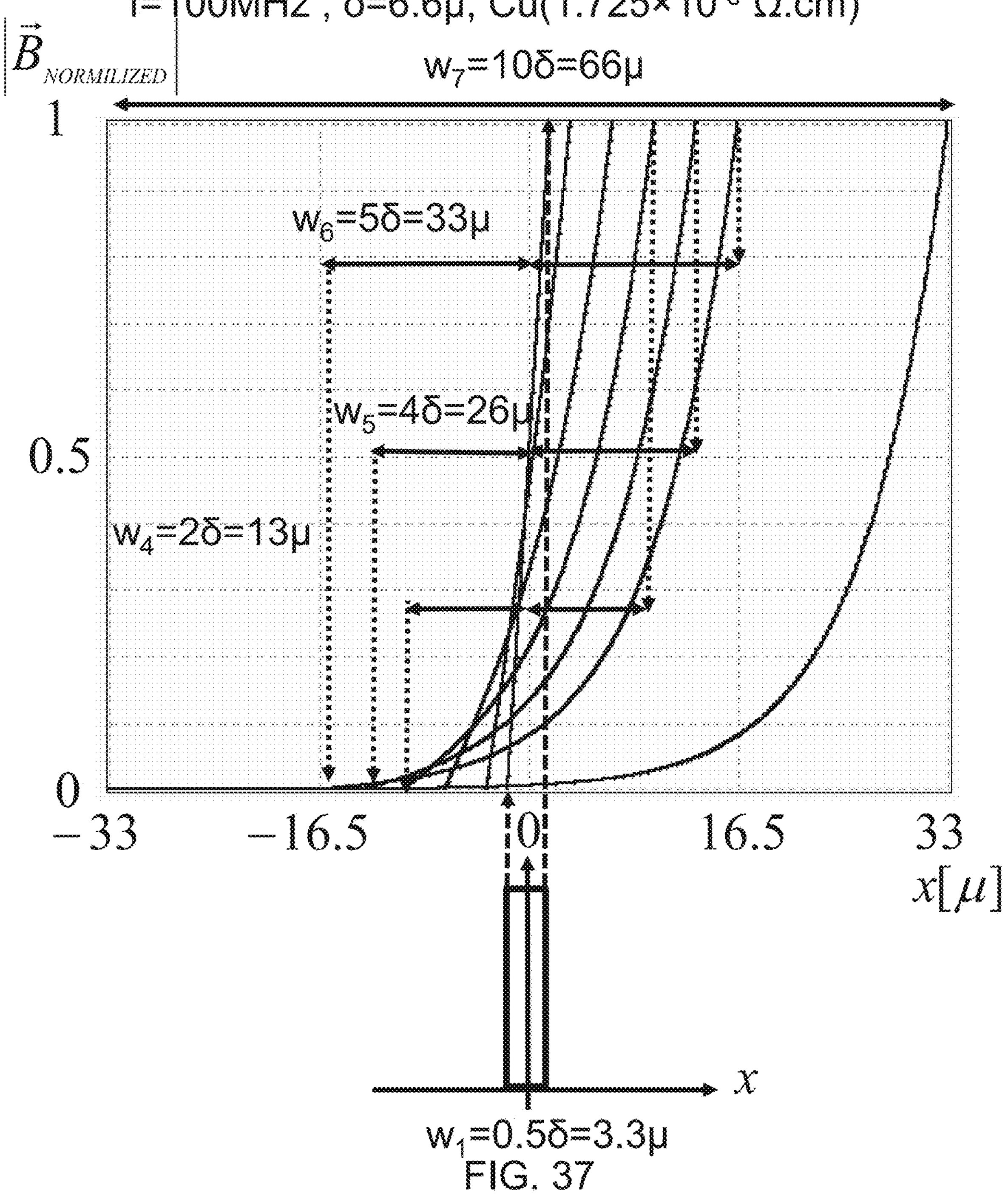
FIG. 37 is a graph showing relative magnetic field in the innermost winding.

In spiral inductor windings the current density distribution in the windings is different than the straight wire with a rectangular cross-section. The magnetic fields in the windings are also a function of the distance of the winding from the center (air core) of the spiral inductor, and also vary along the winding and its z coordinate. One can see this very easily by applying Ampere's law to the spiral cross-section. The magnetic field distribution in the winding is the cause of the all the combined eddy currents, skin and proximity effects. The solution requires three dimensional numerical simulation of the entire spiral inductor. The normalized magnitudes of the magnetic field in the windings for widths of 0.58, 8, 28, 38, 48, 58 and 100 are shown in FIG. 36 for a spiral inductor having four windings, assuming that each winding is carrying the same current I. As can be seen, the B field enters from both sides of the windings, with the exception of the inner most winding and will create similar current density distributions in the windings. The innermost winding normalized B-field distribution is shown in FIG. 37 and it looks very similar to the solution obtained with "single sided solution". Looking at the normalized B-field distributions in FIG. 36 one can also see that these distributions satisfy Ampere's law. FIG. 38 show how $R_{AC}/R_{DC}$ compare to the "single sided" and "complete solution" results, the x axis being winding-width normalized with the skin depth, w/δ. FIG. 39 show $R_{AC}/R_{DC}$ comparing the "single sided" and "complete solution" results, the x axis being the winding width w. One interesting property that is fairly clear in FIG. 38 and FIG. 39 is that assuming a "single sided solution," estimates $R_{AC}/R_{DC}$ can be corrected based on a "complete solution."

The short summary of the curves related to $Q_{PEAK}$ VS $t_{OPT}$ at 100 MHz for different cross-section areas and inductor values is given in Table [2]. More detailed explanations and critical parameters for different inductor values of 20, 40, 60 and 80 nH at 100 and 200 MHz are shown in Tables [2.1-2.4] below.

TABLE 2.1

| | f = 100 MHz | f = 200 MHz |
|---|---|---|
| $t_{OPT}$ (μ) | 195.9 | 264 |
| $w_{OPT}$ (μ) [$S/t_{OPT}$] | 2.552 | 1.894 |
| $Q_{max}$ | 11.26 | 10.69 |
| $\Delta(t_{OPT}/w_{OPT})$ | 76.77 | 139.4 |
| $\Delta_\delta$ ($w_{OPT}/\delta$) | 0.307 | 0.322 |
| Length (μ) | 17,600 | 18,400 |
| $R_{DC}$ (Ω) | 0.91612 | 1.005 |
| $R_{AC}$ (Ω) | 1.116 | 1.175 |

L = 20 nH, S = 500 $\mu^2$, $w_{OPT0}$ = $t_{OPT0}$ = $S^{1/2}$ = 22.36 μ, Length = 14,360 μ
δ = 8.316 μ@100 MHz, δ = 5.880 μ@200 MHz
$R_{DC}$ = 0.7841 Ω, $R_{AC}$@100 MHz = 2.345 Ω, $R_{AC}$@200 MHz = 3.176 Ω
$\Delta(t_{OPT0}/w)$ = 1, $\Delta_\delta(w_{OPT0}/\delta)$ = 2.693@100 MHz, $\Delta_\delta(w_{OPT0}/\delta)$ = 3.803@200 MHz

TABLE 2.2

| | f = 100 MHz | f = 200 MHz |
|---|---|---|
| $t_{OPT}$ (μ) | 213.3 | 287.4 |
| $w_{OPT}$ (μ) [$S/t_{OPT}$] | 2.334 | 1.74 |
| $Q_{max}$ | 12.44 | 11.86 |
| $\Delta(t_{OPT}/w_{OPT})$ | 91.03 | 165.2 |
| $\Delta_\delta$ (w/δ) | 0.2818 | 0.2958 |
| Length (μ) | 32,250 | 33,610 |
| $R_{DC}$ (Ω) | 1.761 | 1.835 |
| $R_{AC}$ (Ω) | 2.021 | 2.12 |

L = 40 nH, S = 500 $\mu^2$, $w_{OPT0}$ = $t_{OPT0}$ = $S^{1/2}$ = 22.36 μ, Length = 26,410 μ
δ = 8.316 μ@100 MHz, δ = 5.880 μ@200 MHz
$R_{DC}$ = 1.442 Ω, $R_{AC}$@100 MHz = 4.312 Ω, $R_{AC}$@200 MHz = 5.841 Ω
$\Delta(t_{OPT0}/w_{OPT0})$ = 1, $\Delta_\delta(w_{OPT0}/\delta)$ = 2.693@100 MHz, $\Delta_\delta(w_{OPT0}/\delta)$ = 3.803@200 MHz

TABLE 2.3

| | f = 100 MHz | f = 200 MHz |
|---|---|---|
| $t_{OPT}$ (μ) | 222.6 | 299.9 |
| $w_{OPT}$ (μ) [$S/t_{OPT}$] | 2.246 | 1.667 |
| $Q_{max}$ | 13.14 | 12.55 |
| $\Delta(t_{OPT}/w_{OPT})$ | 99.12 | 179.9 |
| $\Delta_\delta$ ($w_{OPT}/\delta$) | 0.2701 | 0.2835 |
| Length (μ) | 46,040 | 47,910 |
| $R_{DC}$ (Ω) | 2.514 | 2.616 |
| $R_{AC}$ (Ω) | 2.869 | 3.004 |

L = 60 nH, S = 500 $\mu^2$, $w_{OPT0}$ = $t_{OPT0}$ = $S^{1/2}$ = 22.36 μ, Length = 27.820 μ
δ = 8.316 μ@100 MHz, δ = 5.880 μ@200 MHz
$R_{DC}$ = 2.065 Ω $R_{AC}$@100 MHz = 6.175 Ω, $R_{AC}$@200 MHz = 8.365 Ω
$\Delta(t_{OPT0}/w_{OPT0})$ = 1, $\Delta_\delta(w_{OPT0}/\delta)$ = 2.693@100 MHz, $\Delta_\delta(w_{OPT0}/\delta)$ = 3.803@200 MHz

TABLE 2.4

| | f = 100 MHz | f = 200 MHz |
|---|---|---|
| $t_{OPT}$ (μ) | 222.6 | 313 |
| $w_{OPT}$ (μ) [$S/t_{OPT}$] | 2.246 | 1.598 |
| $Q_{max}$ | 13.65 | 13.05 |
| $\Delta(t_{OPT}/w_{OPT})$ | 99.12 | 195.9 |
| $\Delta_\delta$ ($w_{OPT}/\delta$) | 0.2701 | 0.2717 |
| Length (μ) | 59,120 | 61,780 |

TABLE 2.4-continued

| | f = 100 MHz | f = 200 MHz |
|---|---|---|
| $R_{DC}$ (Ω) | 3.228 | 3.373 |
| $R_{AC}$ (Ω) | 3.684 | 3.852 |

L = 80 nH, S = 500 $\mu^2$, $w_{OPT0} = t_{OPT0} = S^{1/2}$ = 22.36 μ, Length = 48,850 μ
δ = 8.316 μ@100 MHz, δ = 5.880μ @200 MHz
$R_{DC}$ = 2.667 Ω $R_{AC}$@100 MHz = 7.977 Ω, $R_{AC}$@200 MHz = 10.80 Ω
$\Delta(t_{OPT0}/w_{OPT0})$ = 1, $\Delta_\delta(w_{OPT0}/\delta)$ = 2.693@100 MHz, $\Delta_\delta(w_{OPT}/\delta)$ = 3.803@200 MHz Performing the analysis at any frequency gives similar results, indicating that a thick metal with widths in the order of the skin depth is needed to achieve a high-Q straight inductor. Spiral inductors can be thought of as straight lines which are coupled with desirable sign and highest possible mutual inductances. The following section is related to pointing out the inherent advantage of spacing the high aspect ratio thick metals, again with high aspect ratio spacing rules for making very high performance spiral inductors.

Since thick metal processes on the order of metal thicknesses shown in FIG. 25-FIG. 32 and summarized in Tables [2.1-2.4] are not available in standard IC processes, one needs to explore processes with metal thickness of this order that can be realized, along with metal widths giving high aspect ratios—in other words, widths on the order of skin depth dimensions with comparable metal-to-metal spacing processing capabilities. The initial results suggest that if there is a high-Q inductor requirement, these inductors must be designed and built using a different process, generally resulting what are called interposer structures, built with IC processing techniques and connected to a traditional IC with 3D stacking methods. On the other hand, for low current density (small S) applications, if the IC process allows 4μ metal thicknesses with 2.8μ width and spacing, giving a metal aspect ratio of 4M (t/w=1.43) that type of IC process might be enough for many RFIC inductors for $f$>900 MHz applications. Known IC designs using 4μ metal thickness do not employ the high aspect ratio rule as given in this disclosure, however. Before proposing an interposer process requirement, one needs to also explore the geometrical size of these high value inductors to find out if they are within feasible dimensions that can be connected to a conventional integrated circuit. Hence, the foregoing proofs and formulae become useful analytic tools.

Inner Space Dimension Optimization of the Spiral Inductor

Spiral air-core inductors have an inner space where there are no windings. The geometry of inner space can be almost anything, but in most practical applications they are circular, rectangular, square or octagonal areas. Among these four most commonly seen inner space geometries, probably the square inner space geometry is the most popular geometry due to many reasons, such as better packing density, ease of design and better performance compared to rectangular geometry from any design specification. The most critical part in area reduction in spiral inductor having a constant spacing s between windings is winding width w and the inner dimension dix, where the spiral inductor windings start and winds outward from this square shaped inner geometry. Having thick metal and using the high aspect ratio metal rule as herein taught minimizes the spiral area very significantly and improves high frequency performance as shown above. Similar optimization is needed for optimizing the inner dimension of a square inner space, which can be extended to any type of inner space geometry. The present invention reveals that dix optimization should have a minimum inner dimension greater than a mathematically defined $d_{INMIN}$.

To make highly efficient high coupling metal structures, one needs to consider also the Q value of the individual structures, such as each leg, besides their highest possible mutual inductive coupling ratios with other legs, as explained above. The use of high coupling ratio legs with individually low Q structures increases the loss and does not contribute to the inductance value at elevated operating frequencies. The analytical expression for $Q_{LRAC}$ (1.62) shows that $Q_{LRAC}$ (l, S, t, $f$) has a logarithmic length dependency. This is clearly shown in the $Q_{LRAC}$ (l, S, t, $f$) plot in FIG. 40 for S=50, 250, 500 and 1,000$\mu^2$, at 100 MHz for Al metal width of w=2μ.

According to the invention there should be no inductive structure, such as any leg in a spiral inductor, having its individual $Q_{LRAC}$<1 for the operating frequency of the spiral inductor. The smallest leg length in a spiral inductor is determined by the inner dimension dix as shown in FIG. 13 in a square spiral. The dix is an important spiral inductor design parameter that greatly affects the overall Q of the spiral inductor. According to the invention dix is calculated such that Q($d_{INMIN}$, S, t, $f$)>1 from the analytical expression (1.62). (By contrast, most known spiral inductors have a very small inner dimension, teaching away from the present invention, but which increases the loss and reduces the Q of the spiral inductor, a characteristic evidently not recognized in the prior art as a factor in classical books in the field [31]. In practice there are properly designed inductors which might have a larger inner dimension, but there is no rule that determines the selected inner dimension of any inner space geometry. In the past, the selection was based on experimental measurement data collected from many spiral inductor designs for that particular process without knowing the reason.)

Figure 40:
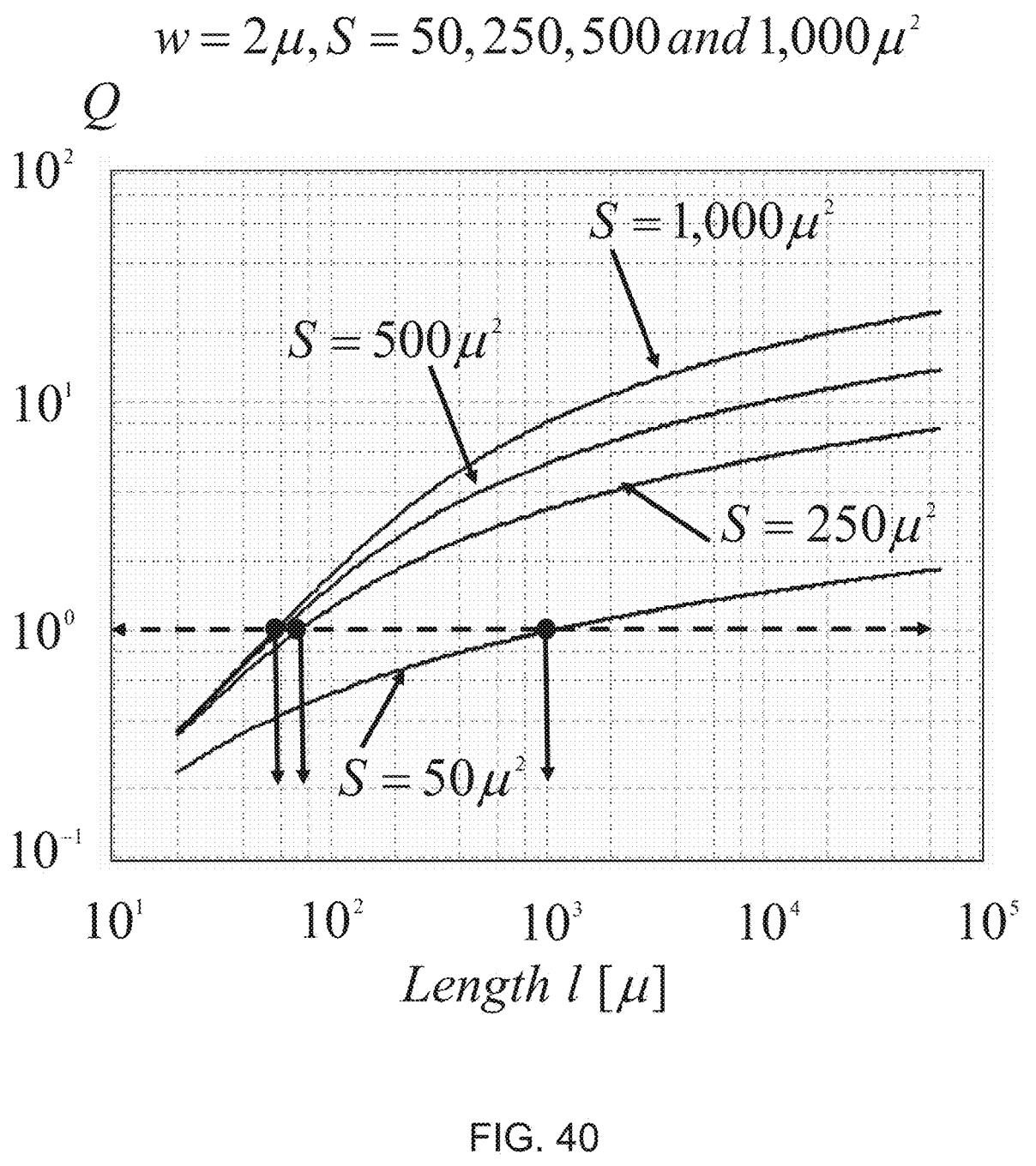

According to this invention, a minimum inner dimension $d_{INMIN}$ value is calculated with the analytical relation (1.62) having lengths supporting Q($d_{INMIN}$, S, t, $f$)>1 for a selected cross-sectional area S and thickness t at the operating frequency. As can be seen in FIG. 40 the bottom curve, which corresponds to S=50$\mu^2$ should have a length larger than 800μ to meet this condition at 100 MHz for Al metal width of w=2μ. The remaining $l_{MIN}$ values for S=250, 500 and 1,000$\mu^2$ correspond to the $l_{MIN}$ of each case having Q($l_{MIN}$, S, t, $f$)>1 are met at smaller lengths of 60-80μ.

Another advantage of a larger inner dimension dix is seen in the reduction of mutual inductive coupling between inductor legs on both sides of the inner space of the spiral inductor. Since these inductors have coupling ratios of opposite signs, minimizing the coupling ratio will increase the inductance L and therefore increase the Q of the spiral inductor. Mathematically stating, the s<<$d_{IN}$ condition must also be satisfied! On the other hand increasing the inductive coupling between inductor legs on the same side of the inner empty space increases the inductance value L, thereby increasing the Q of the inductor. Since one generally is interested designing a specific L, one will achieve this design goal with shorter wire length, giving less resistance and capacitance resulting in higher Q.

Figure 43:
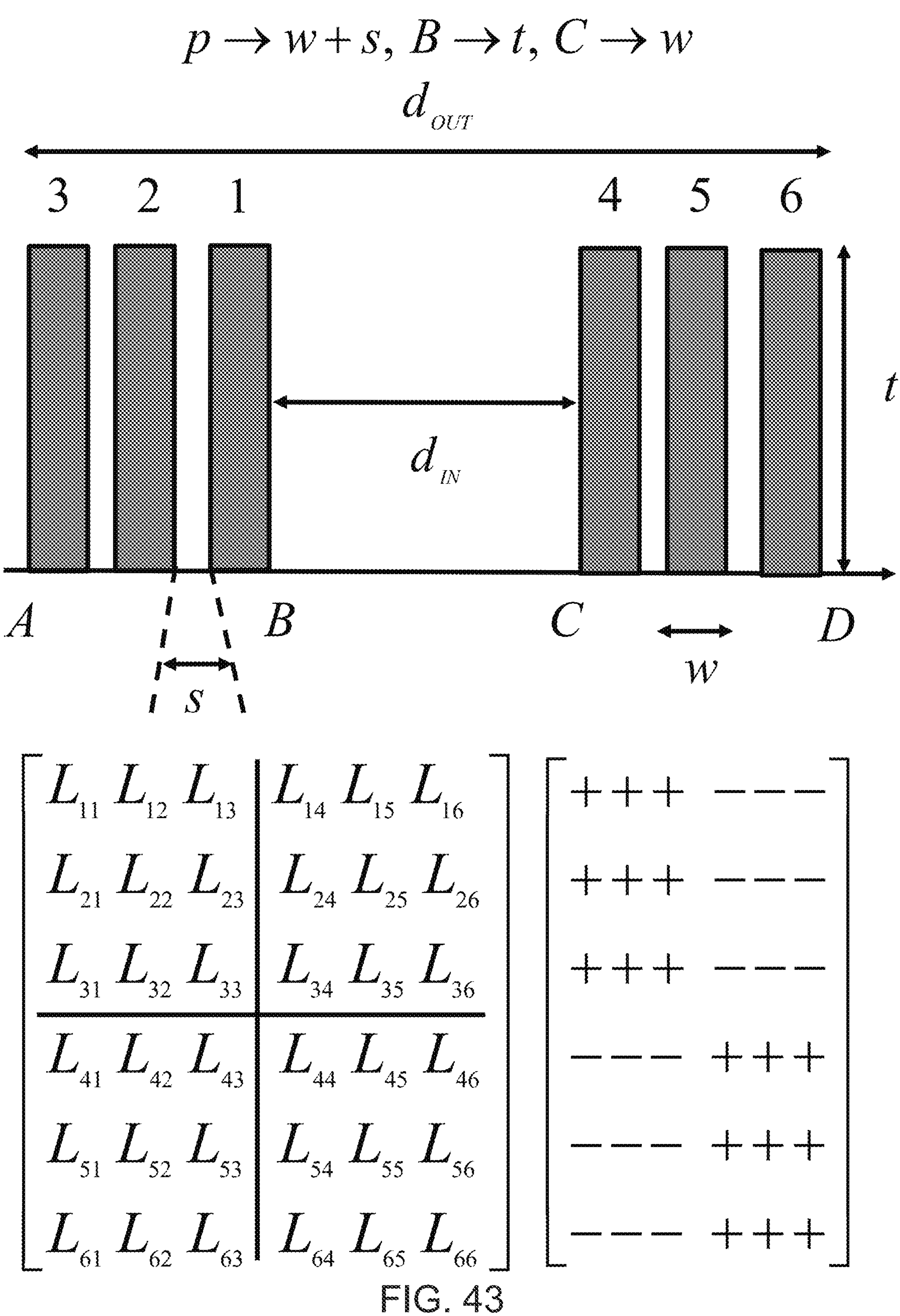
FIG. 43 is side cross-sectional view of a spiral inductor according to the invention with the mathematical matrix equivalent of the inductor.

Increase of Mutual Inductance by Using High Aspect Ratio Metal Giving Higher (and Smaller Area for a Desired Inductance Value It has now been mathematically proven that high aspect ratio rectangular cross-sectional geometry in the z dimension, facing their larger dimensional sides to each other, yields a definitive advantage in giving high Q spiral inductors, due to giving smaller $R_{AC}$ at any frequency of operation compared to placement as in prior art placement with the smaller dimension facing each other. Having rectangular cross-section conductor windings facing their larger dimensional sides to each other unexpectedly yields much higher mutual inductive coupling compared to facing the smaller sides together for the same spacing s. Having high inductive coupling between the legs increases the inductor value of the spiral inductor reducing the total length of the winding for a desired inductance value L and consequently reducing the resistance and giving higher Q). This fact is due to the geometric mean distance (g.m.d) reduction of the geometries if arranged as herein disclosed. The leg structures for spiral inductors according to the invention are shown in FIG. 24 and FIG. 43 as perspective and cross-sectional plots differ very clearly from the structures shown in FIG. 18 and FIG. 19, having the same cross-sectional winding areas as shown earlier. FIG. 43 is the mathematical matrix equivalent of the geometry shown in FIG. 43. This arrangement was previously shown in FIGS. 14, 16 and 19 where the non-uniform current distribution analysis was performed which showed a significant advantage on the reduction of $R_{AC}$ by the metal arrangement configuration as herein explained. As a result, how one configures the rectangles together, in other words the orientation of metal windings, greatly affects the inductor performance and the total area for a spiral inductance having the same inductance value L.

Total Inductance Calculation of a Spiral Inductor Using Circuit Theory (Partial Inductance)

Figure 41:
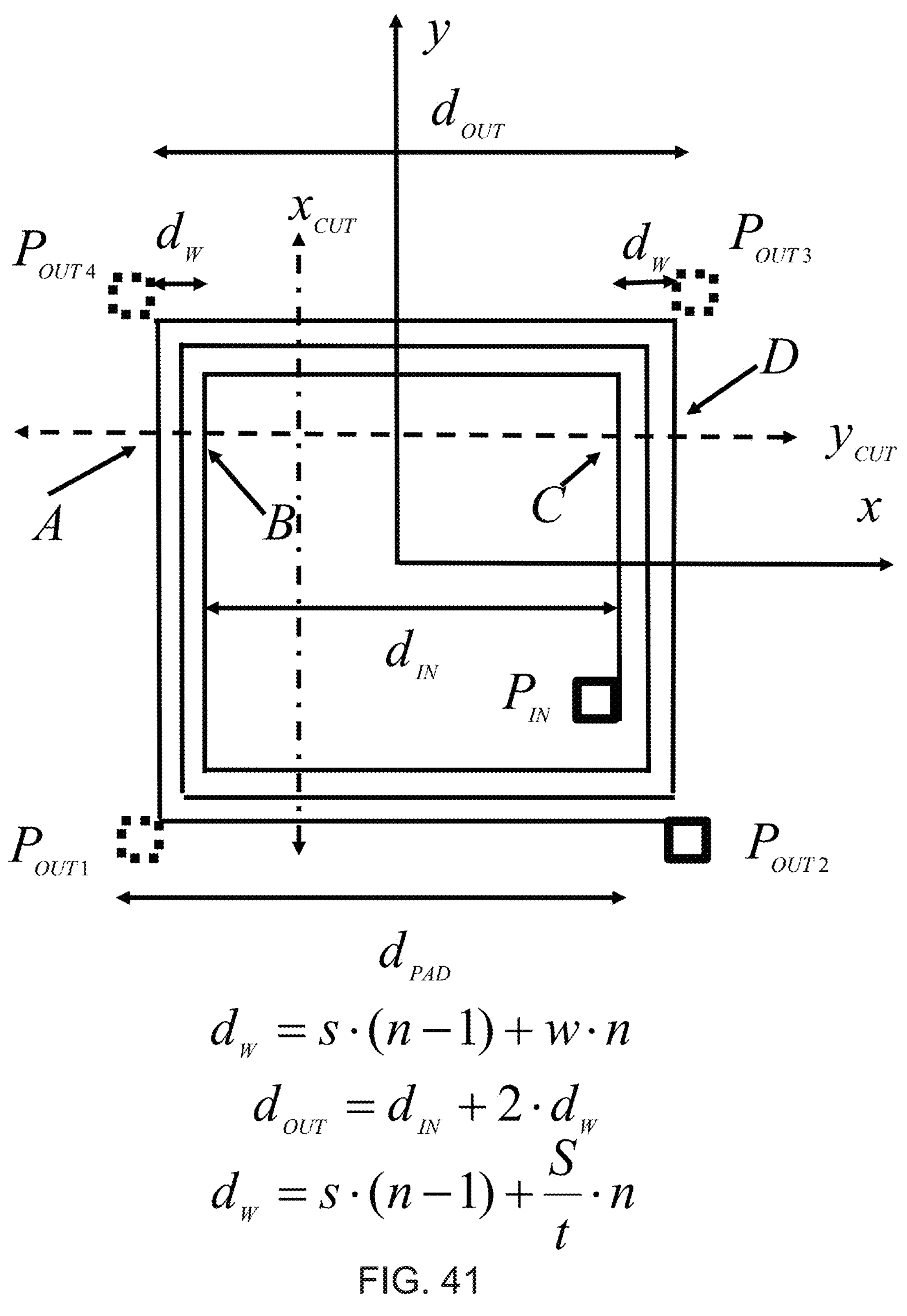
FIG. 41 is a top plan view drawing of a spiral inductor constructed according to the invention.
Figure 42:
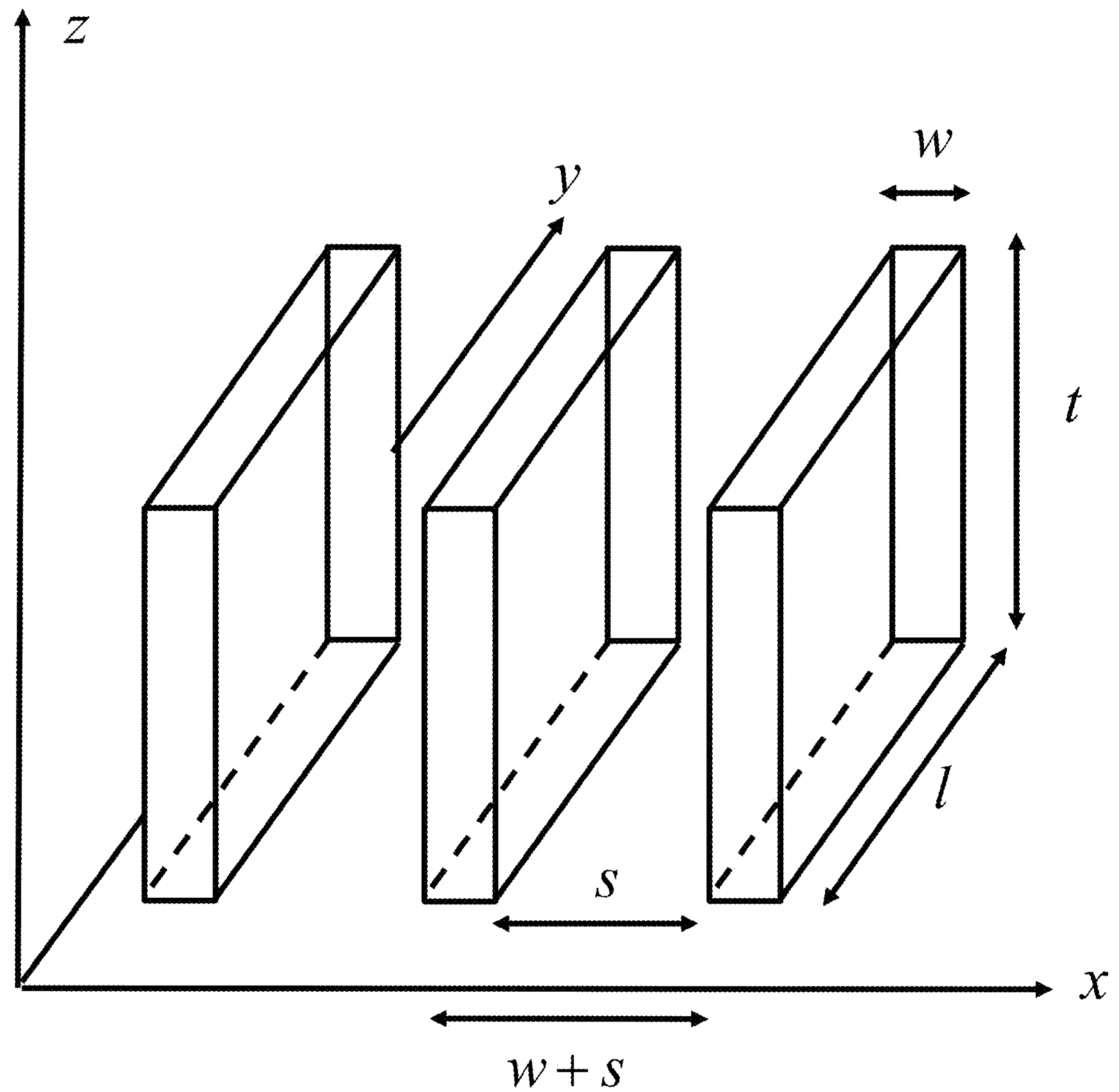
FIG. 42 is a portion of a perspective view of a spiral inductor according to the invention.

An easier way of explaining the total inductance calculation of a spiral inductor from its metal geometry is through circuit theory, rather than electromagnetics theory through the "Partial Inductance" concept [1, 10-24]. FIG. 41 shows the cross-sectional geometry obtained by slicing the top view of a square spiral inductor along the marked "y cut" plane. As can be seen, the metal aspect ratio $\Delta_M$, is a large number according to the invention, but the formulation given here applies for any cross-sectional metal winding geometry. The three-dimensional perspective view is also shown in FIG. 42 for adjacent three windings in one side of the "inner empty area" of the spiral inductor, where the windings are separated by the inner dimension of the spiral inductor noted as div. FIG. 43 also shows the leg numbering for the inductance matrix generation. The p, C, B notation on the top of FIG. 43 are the Grover [1] notations for mutual inductance calculation tables and their equivalent variables used in this work are shown with arrows as w, s and t.

Figure 44:
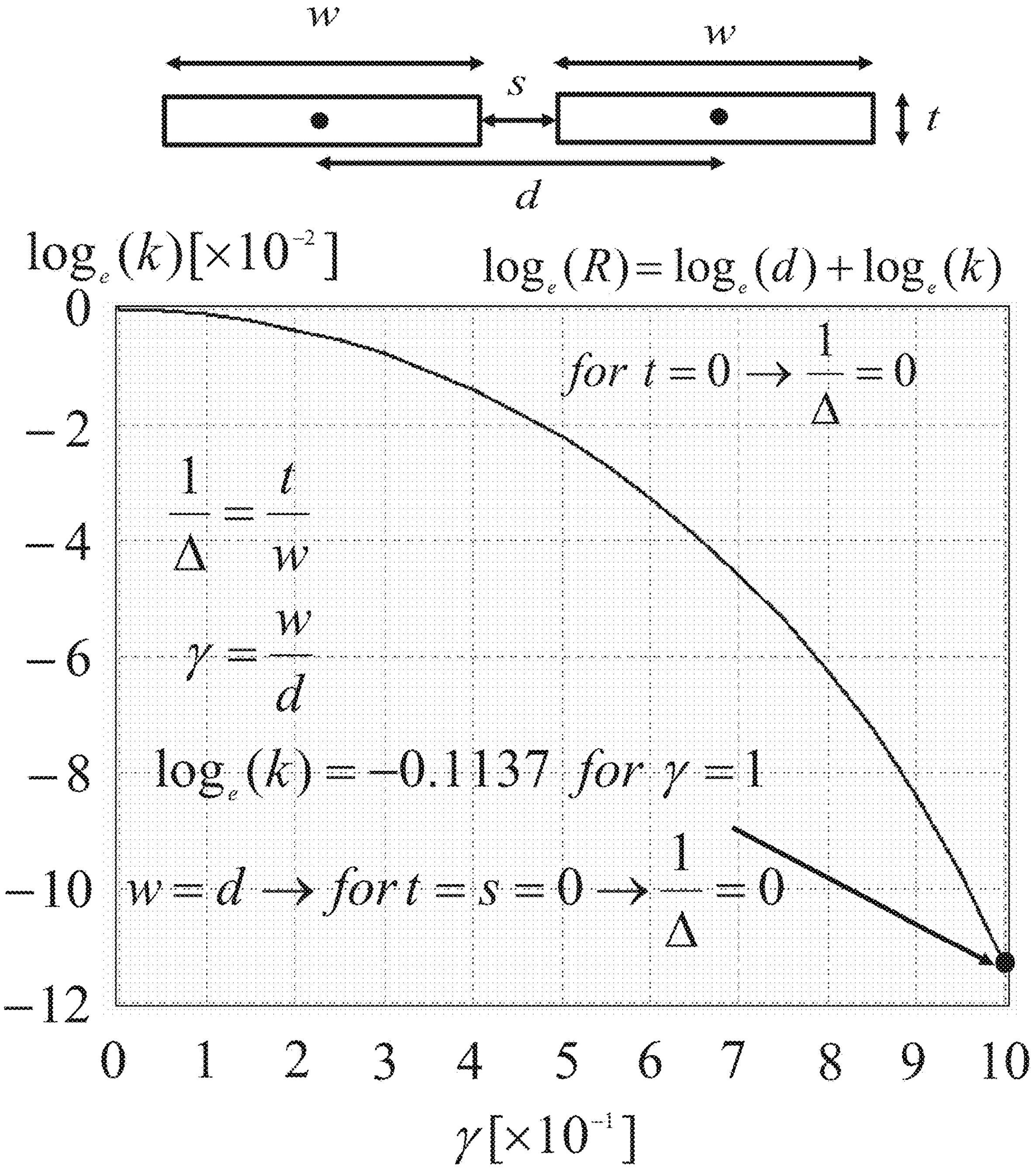
FIG. 44 is a plot of a Table from Grover of Log(k) used in defining a geometric mean distance (g.m.d.) as a function of the ratio of w vs. d between two rectangles.

We can represent the width and spacing of windings as shown in FIG. 44 (which is extracted from an analysis of Grover (Ref. [1]) p. 19, Table[1], in terms of metal thickness t and aspect ratios $\Delta_M$ and $\Delta_S$ that can be calculated from the notations in this figure.

It is a good practice to have a quick method of estimating the number of turns needed to design for an inductor value L for a given t, w and s rule having the $d_{IN}$ as a parameter, assuming that each side will have the same number of turns. Although the final structure of a computed designed will end up different, this assumption will give a good initial approximation of the spiral size and idea of the inductance matrix terms, which is very important.

As can be seen the distance d, in the mutual inductances formulation given in (1.12) will be replaced by the geometric mean distances (g.m.d) between the cross-sectional metal windings. For any cross-sectional geometry and the numbering given in FIG. 43 the mutual inductances given in the inductance matrix and their signs will be as, $$\begin{bmatrix} L_{11} & L_{12} & L_{13} & L_{14} & L_{15} & L_{16} \\ L_{21} & L_{22} & L_{23} & L_{24} & L_{25} & L_{26} \\ L_{31} & L_{32} & L_{33} & L_{34} & L_{35} & L_{36} \\ L_{41} & L_{42} & L_{43} & L_{44} & L_{45} & L_{46} \\ L_{51} & L_{52} & L_{53} & L_{54} & L_{55} & L_{56} \\ L_{61} & L_{62} & L_{63} & L_{64} & L_{65} & L_{66} \end{bmatrix} \tag{1.99}$$

$$\begin{bmatrix} +++ & --- \\ +++ & --- \\ +++ & --- \\ --- & +++ \\ --- & +++ \\ --- & +++ \end{bmatrix}$$

The negative signs in the inductance matrix (1.99), which are for the leg inductors in the opposite sides of the inner space, originate from the current direction going in or out of the reference bubble placement on each mutually coupled inductor of the spiral inductor. In any case the inductance matrix will be a symmetric matrix. Since the leg width w and spacing between the legs s in each side are kept constant and $d_{IN}$>s, the following relations between the magnitudes inductance matrix elements also holds for any winding aspect ratio having the same numbering as given in FIG. 43, $$\begin{aligned} &L_{1,1} > |L_{1,2}| > |L_{1,3}| > |L_{1,4}| > |L_{1,5}| > |L_{1,6}| \\ &L_{2,2} > |L_{2,1}| = |L_{2,3}| > |L_{2,4}| > |L_{2,5}| > |L_{2,6}| \\ &L_{3,3} > |L_{3,2}| > |L_{3,1}| > |L_{3,4}| > |L_{3,5}| > |L_{3,6}| \\ &L_{4,4} > |L_{4,5}| > |L_{4,6}| > |L_{4,1}| > |L_{4,2}| > |L_{4,3}| \\ &L_{5,5} > |L_{5,4}| = |L_{5,6}| > |L_{5,1}| > |L_{5,2}| > |L_{5,3}| \\ &L_{6,6} > |L_{6,5}| > |L_{6,4}| > |L_{6,1}| > |L_{6,2}| > |L_{6,3}| \\ &\text{and} \\ &L_{i,i} > 0 \\ &L_{i,j} = L_{j,i} \end{aligned} \tag{1.100}$$

Since the length of each leg (l) is greater than the inner lengths, one can also indicate that, $$\begin{aligned} &l_3 = l_6 > l_2 = l_5 > l_1 = l_4 = d_{IN} \\ &L_{6,6} = L_{3,3} > L_{2,2} = L_{5,5} > L_{1,1} = L_{4,4} \end{aligned} \tag{1.101}$$

The passivity requirement as given in (1.14) also holds between the diagonal and off-diagonals of the inductance matrix having coupling ratio K<1 between the diagonals and off-diagonals as stated before. For an equal length assumption, this will result in diagonal entries of the inductance matrix being always larger than any of the magnitude of the off-diagonals.

Identical relations can be given for the "x cut" of the spiral inductor in FIG. 41, which have zero mutual couplings between the "y cut" matrix terms due to the fact that "x cut" and "y cut" elements are perpendicular and have zero inductive coupling as shown by the Neumann mutual inductance formula given in (1.11) for a rectangular inner hole. As a result, the complete spiral inductor inductance matrix for the "equal number of legs in each side" assumption can be written with the use of sub-matrix notation as, $$L(nxn)_{SPIRAL} = \begin{bmatrix} L_{xcut} & 0 \\ 0 & L_{ycut} \end{bmatrix} \rightarrow n = 12 \tag{1.102}$$

where the $L_{xcut}$ and $L_{ycut}$ are (6×6) sub-matrices having properties as given in (1.100)-(1.101).

The total effective inductance of the spiral inductor under the assumption of having the same current passing through each leg of it then becomes the sum of all terms of the (1.102), which is a (12×12) matrix. Since $L_{xcut}$ and $L_{ycut}$ (6×6) are identical sub-matrices, the whole operation for calculating the effective spiral inductance of a spiral inductor having three complete turns can be reduced to, $$L_{SPIRAL} = 2 \cdot \sum_{i=1}^{n} \sum_{j=1}^{n} L_{i,j} \tag{1.103}$$

where n=6 and $L_{i,j}$'s are the $L_{xcut}$ or $L_{ycut}$ are the (6×6) sub-matrix terms in (1.103). To increase the inductance of the spiral inductor then one must increase the positive coupling and reduce the negative coupling of the inductance matrix as given in (1.103) which is basically with properties given in (1.100) and (1.101) for a 3 turn spiral inductor. The negative couplings can be reduced as one increase the dix and the positive couplings can be increased by reducing the spacing s, between the windings.

Figure 47:
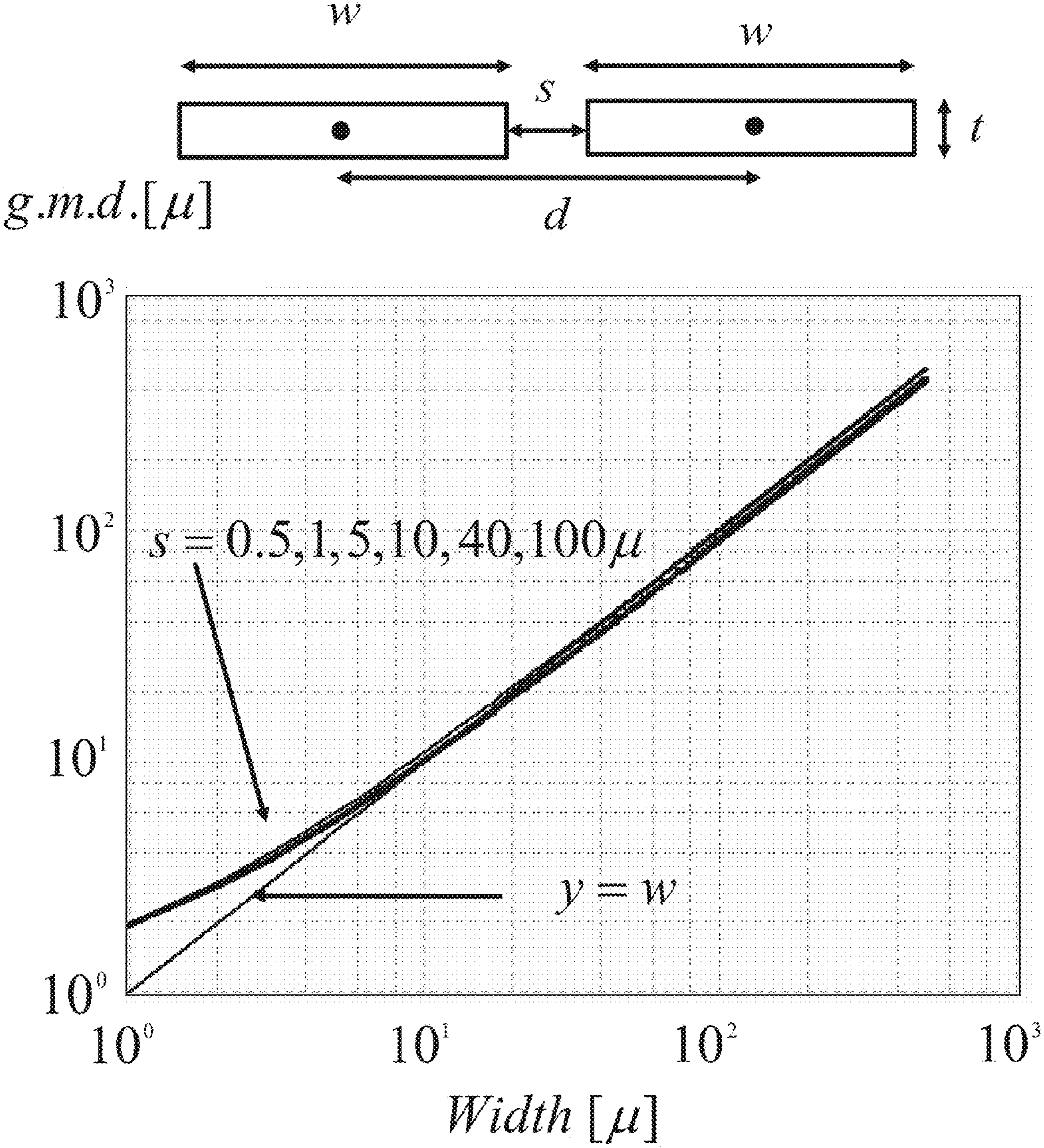
FIG. 47 is a graph illustrating g.m.d. for adjacent rectangles having narrowest sides facing one another.

The geometric mean distance (g.m.d) between two physical rectangles, which has w>>t, increases with width w and is a weak function of spacing s, even for zero spacing s between them [1]. Therefore putting wide and thin rectangles closer does not increase the mutual inductive coupling between them significantly, which is not very obvious. This is illustrated in FIG. 47 where (g.m.d) of infinitely thin rectangles (w=0) with spacing of 0.5, 1, 5, 10, 40 and 100μ are plotted versus metal width ranging from 1μ to 500μ. As can be seen the mutual inductance after 10μ of width becomes almost independent of their spacing and becomes very close to a linear function of the width w, not the spacing s [1]. This property works against the objective, when one has to make wider metals to increase Q, and it also increases (g.m.d) between them and as a result reduces the mutual inductances between legs separated by the distance s. The spiral inductors in use today fall into this "small inductive coupling" category.

Figure 45:
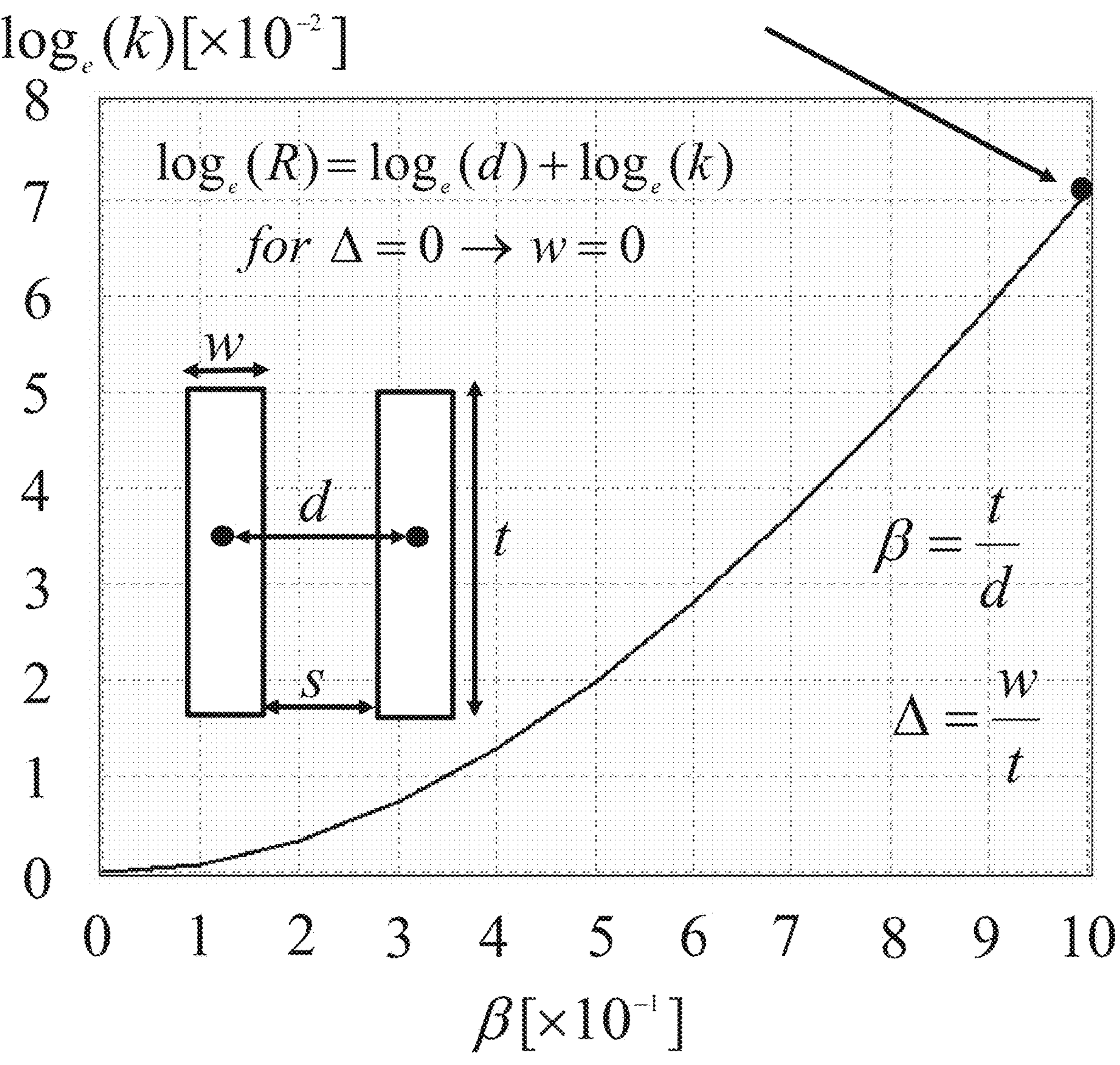
FIG. 45 is a plot of a further Table from Grover of Log(k) used in defining a geometric mean distance (g.m.d.) as a function of the ratio of t vs. d between two rectangles.
Figure 46:
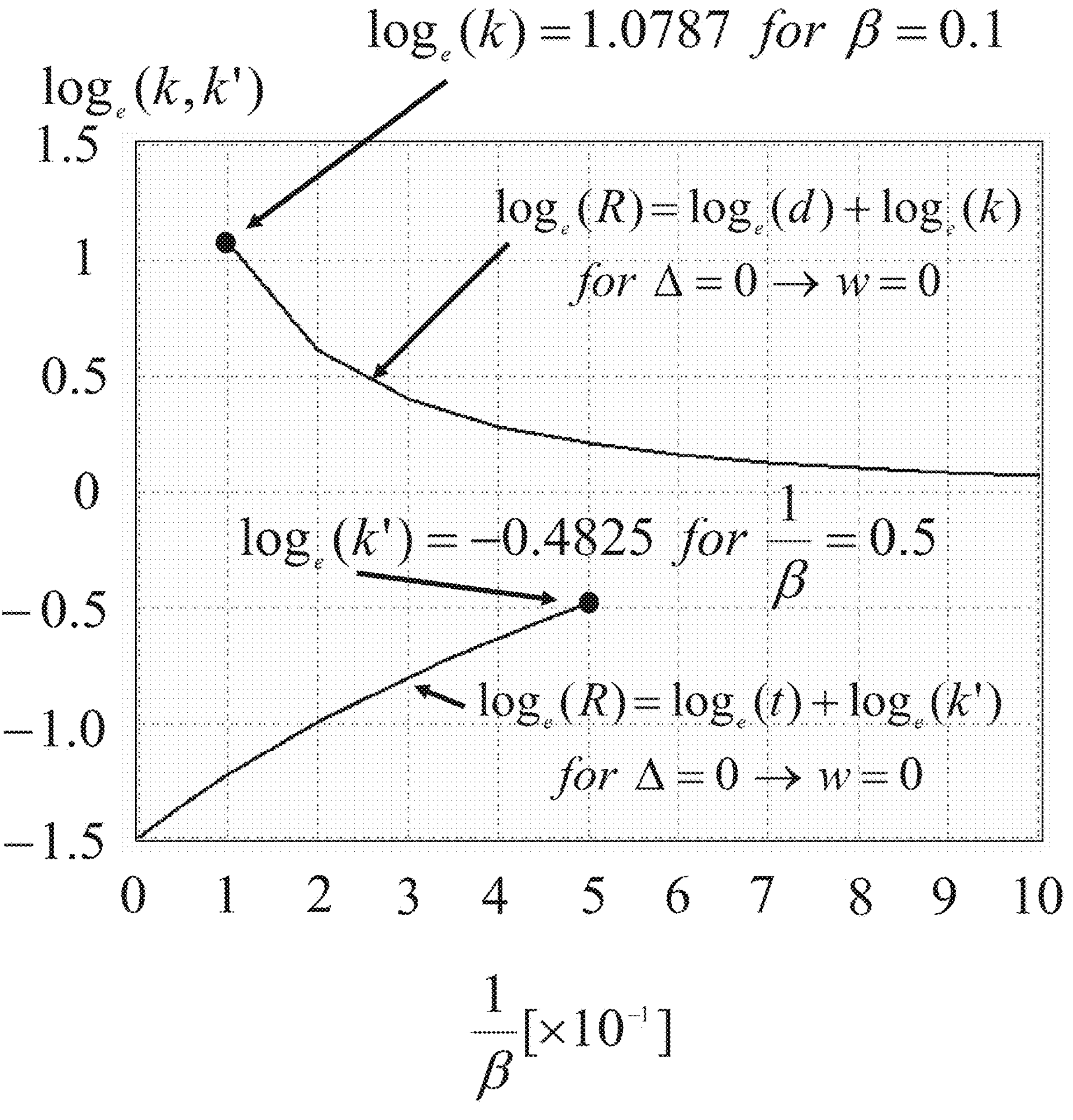
FIG. 46 is a plot of a further Table from Grover showing ranges of Log(k) and Log(k') about very thin structures.

The reason for selecting (for analysis) infinitely thin rectangles having w=0 is to show the (g.m.d) versus thickness relation to be reconstructed very easily by anyone by the use of tables given in [1]. The plot of the related table for calculating g.m.d. as given in [1 is given in FIG. 44, based on parameters shown in FIG. 44 with the exact notation given. FIG. 45 is a graph that illustrates t vs. d values for an inductor and FIG. 46 is a combined plot.

Figure 48:
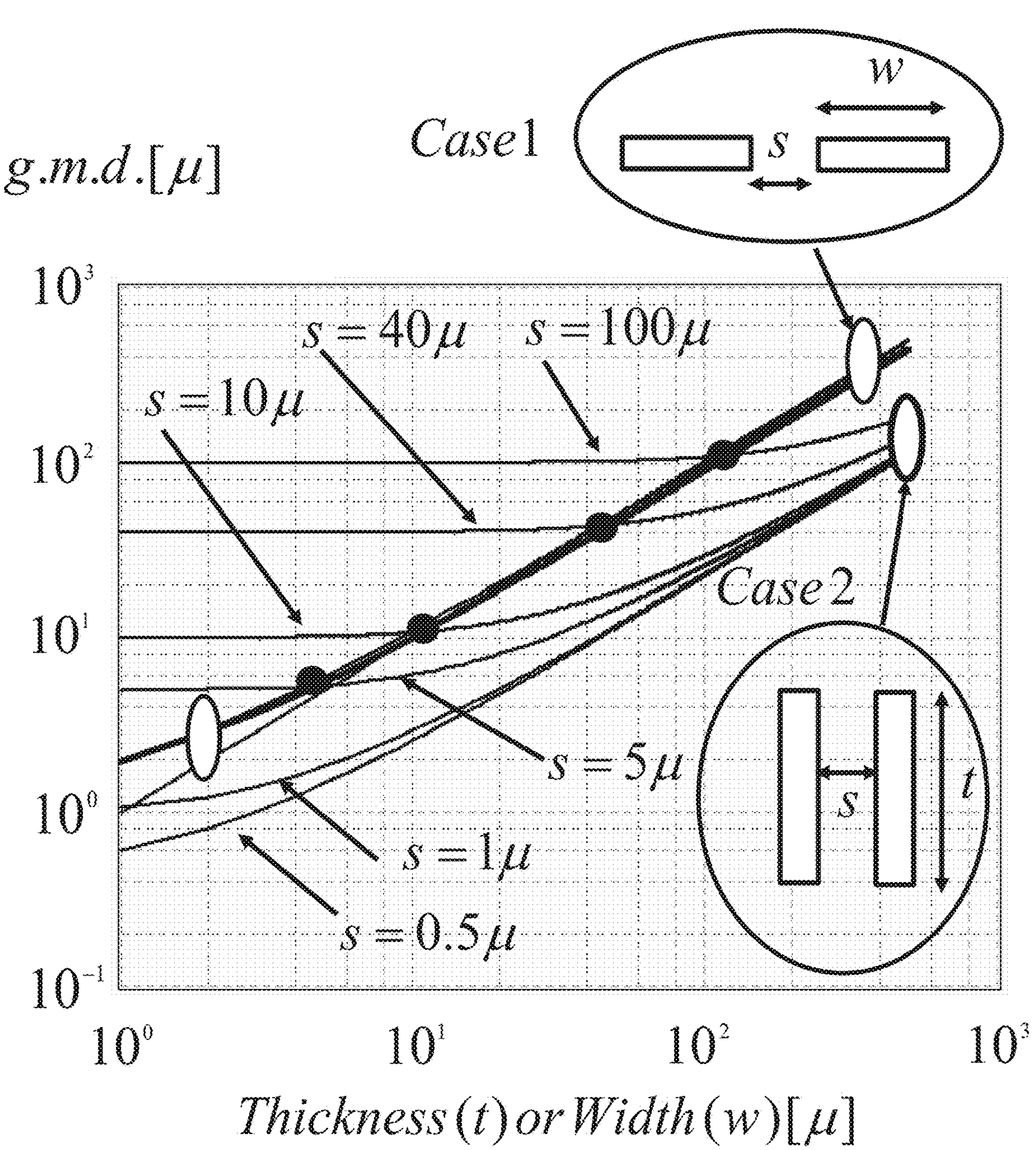
FIG. 48 is a first combined graph to illustrate the differences in two cases of adjacent rectangles, where Case 2 is a preferable embodiment for an inductor having a winding cross section according to the invention.

The insight is reducing the geometric mean distance (g.m.d) between rectangular cross-sections of the windings by arranging them such that they have high aspect ratios and facing larger dimensions toward each other, as according to this invention. As shown in [1] the (g.m.d) versus thickness for high aspect ratio rectangles arranged as said will be a function of the aspect ratio of the metals themselves and weakly dependent to the spacing s between them. This is illustrated in FIG. 48 where the FIG. 47 data is superimposed to show the significant differences very clearly. The data is shown in FIG. 47 is marked by loops at both ends in FIG. 48. As can be seen the geometric distance (g.m.d) between the infinitely thin two rectangles placed according to this invention for spacing of 0.5 and 1μ gives much smaller (g.m.d) compared to prior-art placement for thicknesses varying from 0.5 to 500μ. That would result in higher mutual inductances between them. The (g.m.d) versus thickness curves for even very large spacing range of 5, 10, 40 and 100μ starts flat and, larger than the prior-art arrangement, but as the thickness becomes on the order of spacing, it still gives much smaller (g.m.d) compared to prior-art placement. (g.m.d) versus thickness but still increases with thickness, and remains an order of magnitude less compared to prior-art placement. This property allows for large cross-sectional area rectangles to have large mutual inductances between them by placing them with the preferred orientation according to this invention. The mutual inductance along with very high inductive coupling K values that are obtained with according to this invention is theoretically and practically impossible following the prior-art placement protocols for spiral windings.

In summary, the advantage of placement according to the invention lies in optimizing mutual inductance and self inductance. One needs to plot the mutual and self inductances as a function of thickness. The (g.m.d) versus thickness plot explains the reason for the increase in mutual inductance that is shown; therefore it is important to have them presented before.

Figure 49:
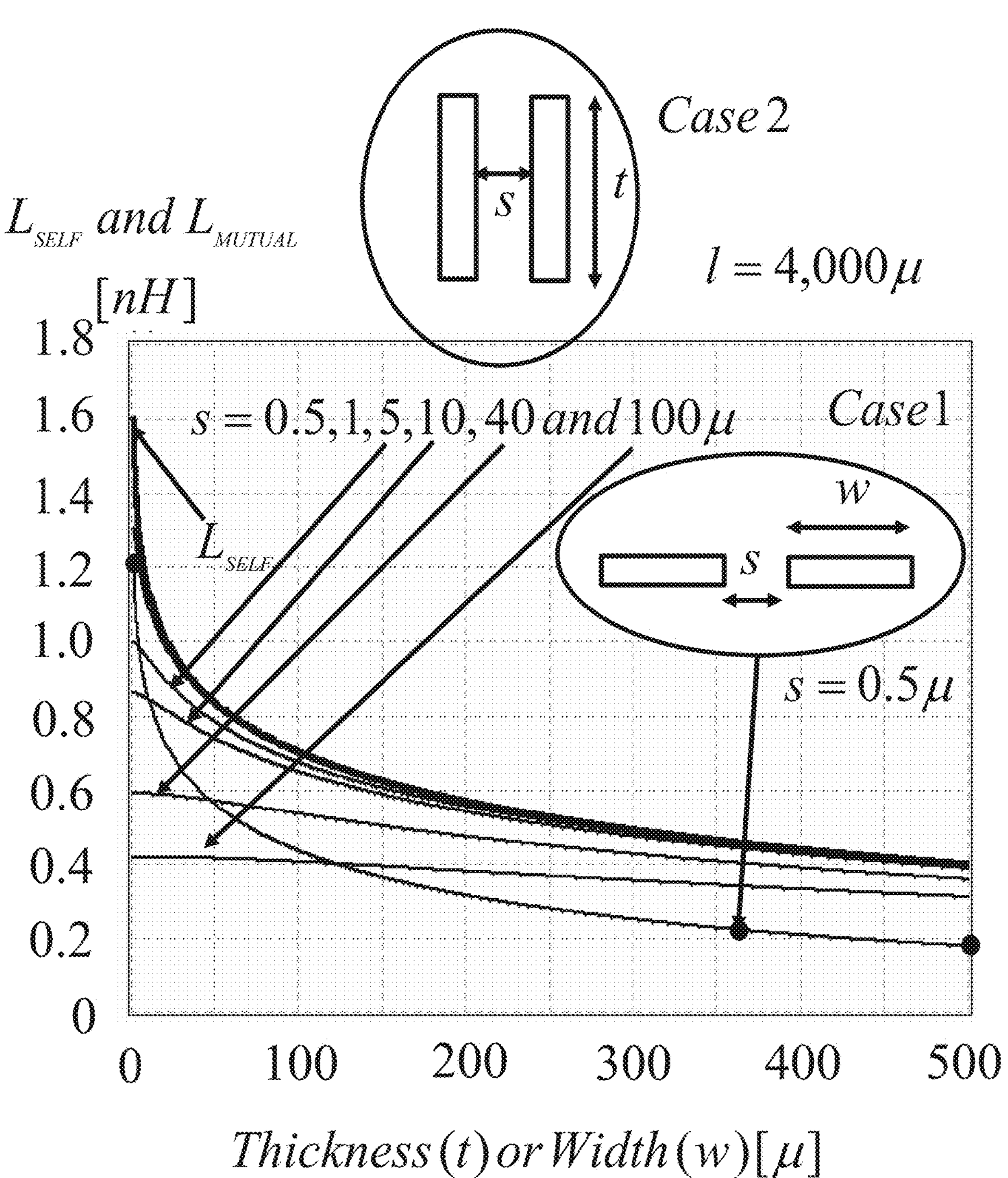
FIG. 49 is a second combined graph to illustrate the differences in two cases of mutual inductance and self-inductance, where Case 2 is a preferable embodiment for the cross section and spacing of a winding of an inductor according to the invention.
Figure 50:
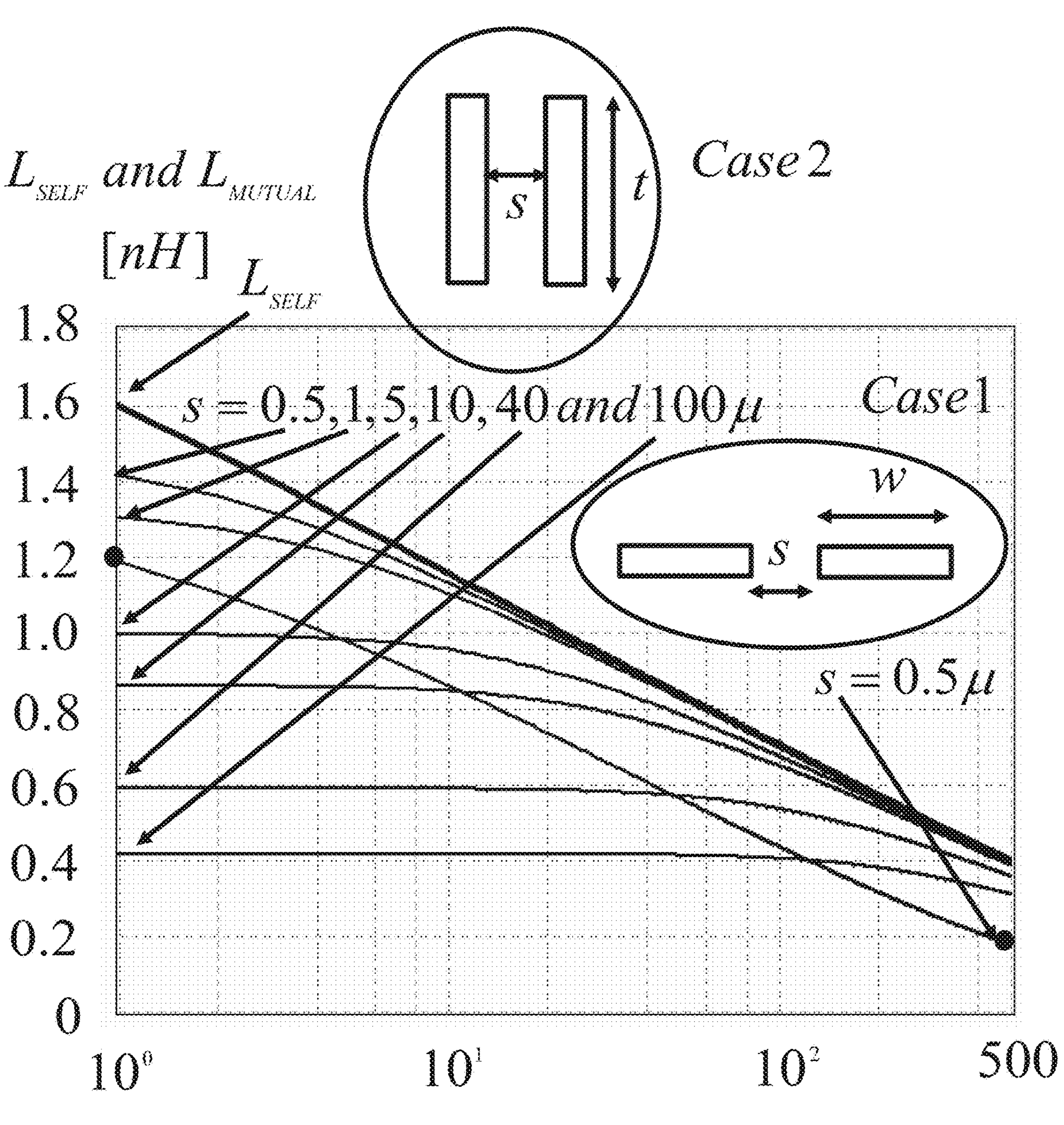
FIG. 50 is a log scale graph of FIG. 49.

FIG. 49 shows mutual and self inductances as a function of thickness for a 2μ wide 4,000μ long rectangular cross-section structure spiral winding separated by again 0.5, 1, 5, 10, 40 and 100μ compared to prior-structure spaced 0.5μ apart and having thickness of 2μ plotted as a function of width. As can be seen both arrangements have the same cross-sectional areas equal to each other as in FIG. 49. As expected, both the self and mutual inductances decrease as the thickness increases, but the mutual inductance remains much higher for 0.5, 1, 5, 10, 40 and 100μ spacing compared to the prior-art placement. FIG. 50 is the same data but shown having thickness in logarithmic scale to show the small thickness dependency better.

As a result the proposed metallization process in this invention is High Aspect Ratio Metallization along with High Aspect Ratio Metal Spacing, "HARMS." This results in a "Tight Coupling Condition" between the windings which can be expressed only with an aspect ratio of metal $\Delta_M$ and the adjacent winding aspect ratio between the spacing $\Delta_S$ independent of metal thickness!

"Tight Coupling Condition"

The definition of "Tight Coupling Condition" as herein given according to the invention is such that not only the adjacent legs are tightly coupled with large coupling coefficients K, but also, where there is more than two legs or segments of windings, a number of the next closest legs are also coupled strongly with large coupling coefficients K. The advantage of this is clear from the inductance matrix and the total inductance formulation given in (1.99-1.103). Since the effective inductance of the spiral inductor is the sum of all of the inductances in the inductance matrix, increasing their coupling will increase the inductance value. Due to the passivity requirement, one can never increase the maximum mutual inductance value between any legs more than the value as given in (1.15).

Figure 51:
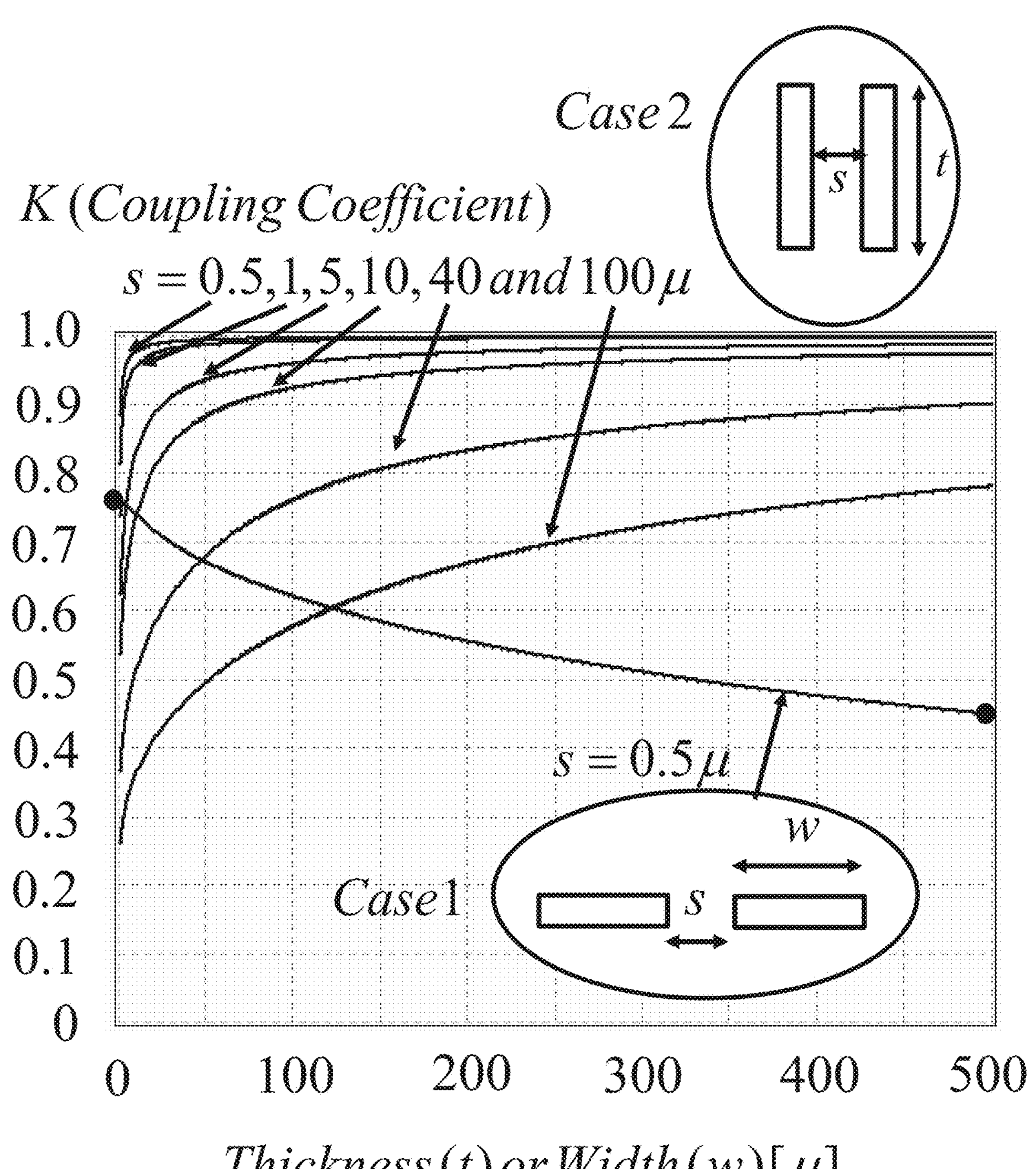
FIG. 51 is a third combined graph to illustrate the differences in two cases, where Case 2 is a preferable embodiment of spacing of rectangular windings of an inductor according to the invention as based on coupling coefficients.

FIG. 49 and its logarithmic plot of FIG. 50 show self and mutual inductances. Another way of looking at this is by inspecting the mutual inductance coupling ratios K, that has been shown in FIG. 51 which never exceeds 1, no matter how close the adjacent windings are placed. The only way one can achieve a significant increase in the effective inductance of the spiral inductor is by increasing the mutual inductance between a number of adjacent legs of each side of the spiral inductor. This can be achieved only if the aspect ratio of the spacing between the adjacent windings $\Delta_S$ remains a large value, on the order of 5 to 10 along with a winding metal aspect ratio $\Delta_M$ of 10. This tight coupling condition can be expressed independent of the metal thickness and with only two target processing metallization parameters, an aspect ratio of metal $\Delta_M$ and an aspect ratio of the adjacent spacing between windings represented as $\Delta_S$. A thickness-to-width ratio of at least ten and a width-to-spacing ratio between adjacent turns of at least five attains a tight coupling condition where the coupling coefficient is well above 0.5 and typically above 0.6 at the second third and fourth adjacent windings.

Figure 52:
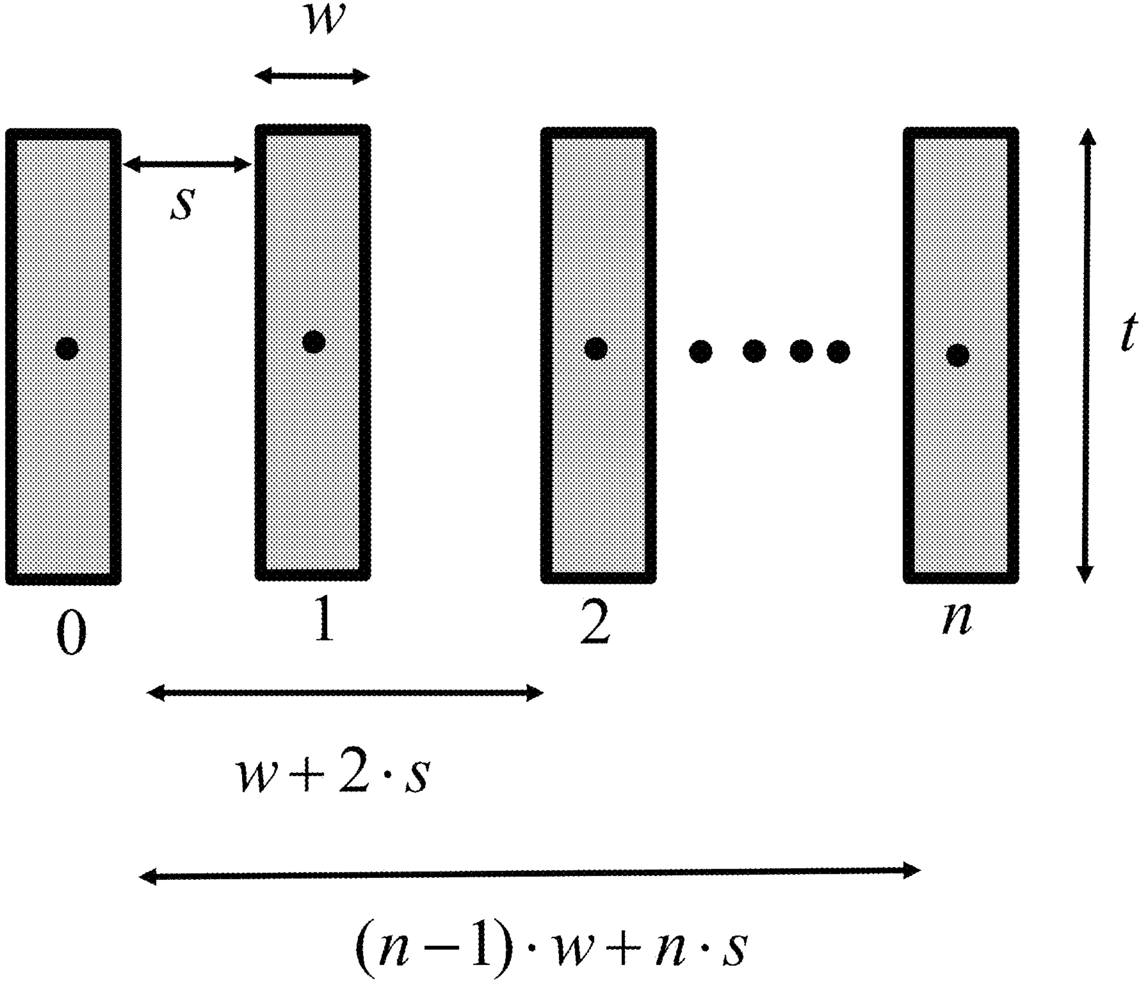
FIG. 52 is a schematic representation of windings to illustrate tight coupling aspect ratio relations vs. adjacent spacing width and number of turns.

One can represent the width and spacing of windings as shown in FIG. 52 in terms of metal thickness t and aspect ratios $\Delta_M$ and $\Delta_S$ as, $$w = \frac{t}{\Delta_M} \tag{2.1}$$

and $$s = \frac{t}{\Delta_S} \tag{2.2}$$

where $\Delta_M$ and $\Delta_S$ are both significantly larger than 1. It is clear that the spacing aspect ratio of winding number 0 to 1 is, $$\Delta_S(1) = \frac{t}{s}. \tag{2.3}$$

The spacing aspect ratio of winding number 0 to 2 also becomes a function of the metal width w of the winding number 1

$$\Delta_S(2) = \frac{t}{w + 2 \cdot s}. \tag{2.4}$$

One point clearly evident from (2.4) is that the $\Delta_S(2)$ can never be larger than $\Delta_M$! Therefore as long as $\Delta_M<1$, as in most of the prior art spiral inductors, $\Delta_S(2)$ will always remain less than 1 for any spacing s>0 value. Therefore it is proper to call this condition of having $\Delta_M>1$, the "necessary condition of tight coupling." The spacing aspect ratio of winding number 0 to 3 similarly becomes, $$\Delta_S(3) = \frac{t}{2 \cdot w + 3 \cdot s}. \tag{2.5}$$

Recursively one can formulate that the spacing aspect ratio of winding number 0 to n becomes, $$\Delta_S(n) = \frac{t}{(n-1) \cdot w + n \cdot s} \quad \text{for } n = 1, 2, 3, \ldots . \tag{2.6}$$

As can be seen in (2.6) $\Delta_S(n)$ will get smaller with increasing n and again it will always be smaller than $\Delta_M/(n-1)$ regardless how small s is taken! Substituting (2.1) and (2.2) in relation (2.6) can be written as, $$\Delta_S(n) = \frac{t}{(n-1) \cdot \left(\frac{t}{\Delta_M}\right) + n \cdot \left(\frac{t}{\Delta_S}\right)}. \tag{2.7}$$

Eliminating t from (2.7) gives, $$\Delta_S(n) = \frac{1}{\left(\frac{n-1}{\Delta_M}\right) + \left(\frac{n}{\Delta_S}\right)}. \tag{2.8}$$

As can be seen, (2.8) is only functions of metallization parameters $\Delta_M$ and $\Delta_S$ and can be simplified to, $$\Delta_S(n) = \frac{\Delta_M \cdot \Delta_S}{\Delta_S \cdot (n-1) + n \cdot \Delta_M}. \tag{2.9}$$

The goal then becomes to find which combination of $\Delta_M$ and $\Delta_S$ values can give $\Delta_S(n)>1$ for n>1. With some simple arithmetic, (2.9) becomes, $$\Delta_s \cdot (n-1) + n \cdot \Delta_M = \frac{\Delta_M \cdot \Delta_S}{\Delta_s(n)}. \tag{2.10}$$

One is interested in representing n which becomes larger than 1 from (2.10) having $\Delta_M$ and $\Delta_S$ as independent process parameters that we need to enforce. This requires the solution of n from (2.10) as, $$\Delta_S \cdot n - \Delta_S + n \cdot \Delta_M = \frac{\Delta_M \cdot \Delta_S}{\Delta_S(n)}. \tag{2.11}$$

Solving n from (2.11) is fairly straightforward, giving, $$n \cdot (\Delta_S + \Delta_M) - \Delta_S = \frac{\Delta_M \cdot \Delta_S}{\Delta_S(n)} \tag{2.12}$$

and resulting in, $$n(\Delta_M, \Delta_S) = \frac{\Delta_S + \frac{\Delta_M \cdot \Delta_S}{\Delta_S(n)}}{(\Delta_S + \Delta_M)} \quad \text{for } \Delta_S(n) > 1 \tag{2.13}$$

Figure 53:
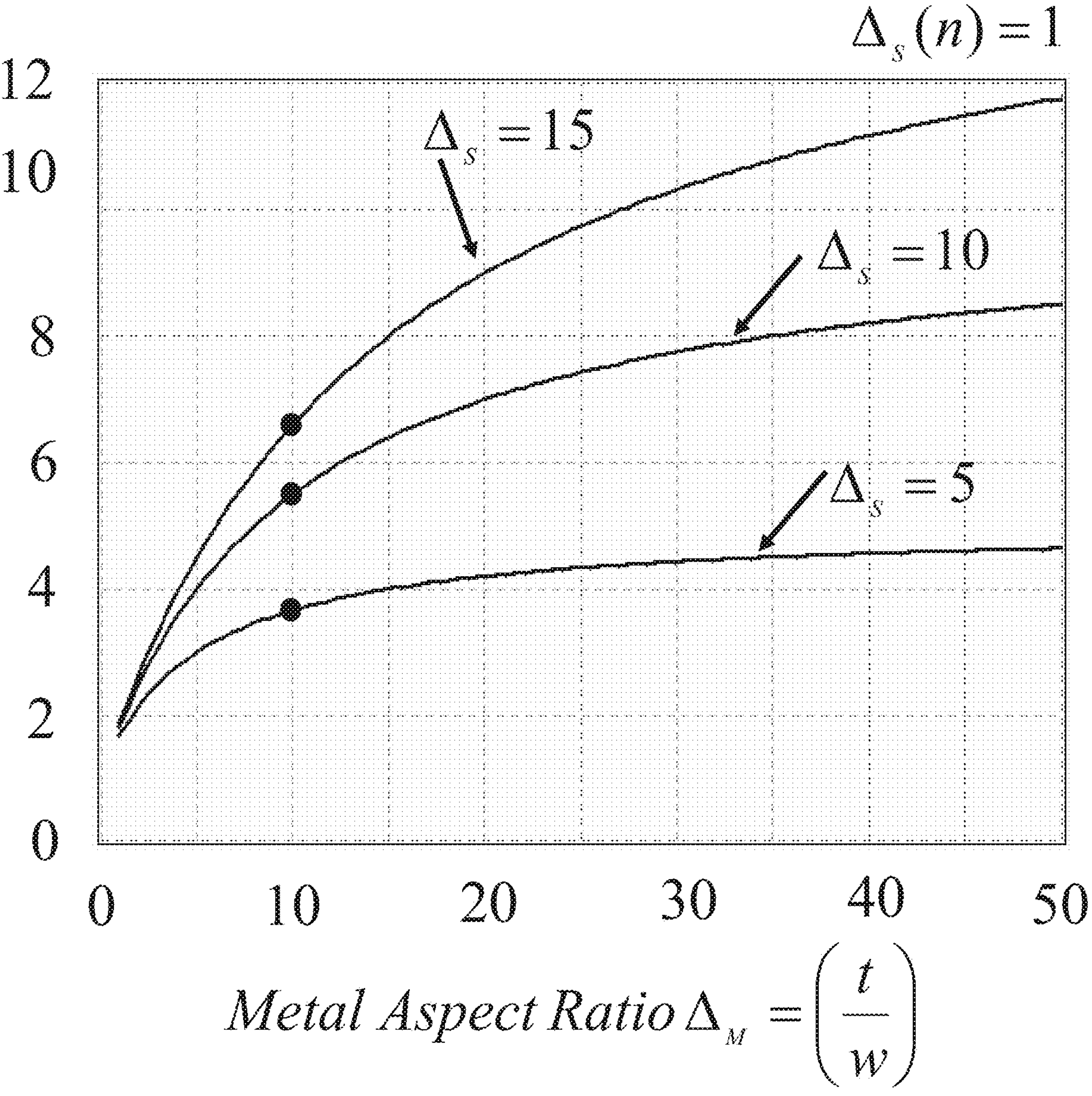
FIG. 53 is a graph illustrating the relation between number of tightly coupled turns and metal aspect ratio and spacing aspect ratio to determine coupling to non-adjacent turns beyond 1.

As pointed out earlier as the "necessary condition of tight coupling" is $\Delta_M>1$, it is logical to plot (2.13) as a function of $\Delta_M$ and as a family of curves for several $\Delta_S$. FIG. 53 shows the plot of (2.13) as a function of metal aspect ratio $\Delta_M$ for spacing aspect ratios $\Delta_S=5$, 10 and 15. The y axis shows the number of adjacent couplings n which will have ΔS(n)>1 satisfying the "tight coupling condition". Since n has to be an integer, in these family of curves we will pick the closest integer below the curves. As can be seen with $\Delta_M=10$, and $\Delta_S=5$, the tight coupling condition $\Delta_S(5)>1$ for of n=5 can be achieved. This physically means that every winding is tightly coupled until its 5th neighbor to the right and left, in each side of the spiral inductor, maintaining $\Delta_S(n)>1$.

FIG. 54 is the same plot with more aggressive $\Delta_S(n)>2$, target parameter. As can be seen with $\Delta_M=10$ and $\Delta_S=5$ the tight coupling condition $\Delta_S(n)>2$ for n=3 can be achieved. This again means that every winding is tightly coupled until its third neighbor to the right and left, in each side of the spiral inductor, maintaining $\Delta_S(n)>2$.

The Total Inductance and Q Increase with "Tight Coupling Condition"

Although FIG. 53 and FIG. 54 show very clearly the geometric advantage of having high aspect ratio metal and spacing, independent of the metal thickness resulting in the "tight coupling condition", one also needs to show the increase in the inductance value and Q of a spiral inductor employing this technique. This can be shown for selected metal thicknesses again as a function of metal aspect ratio $\Delta_M$ for some selected values of metal spacing aspect ratio $\Delta_S$.

Figure 55:
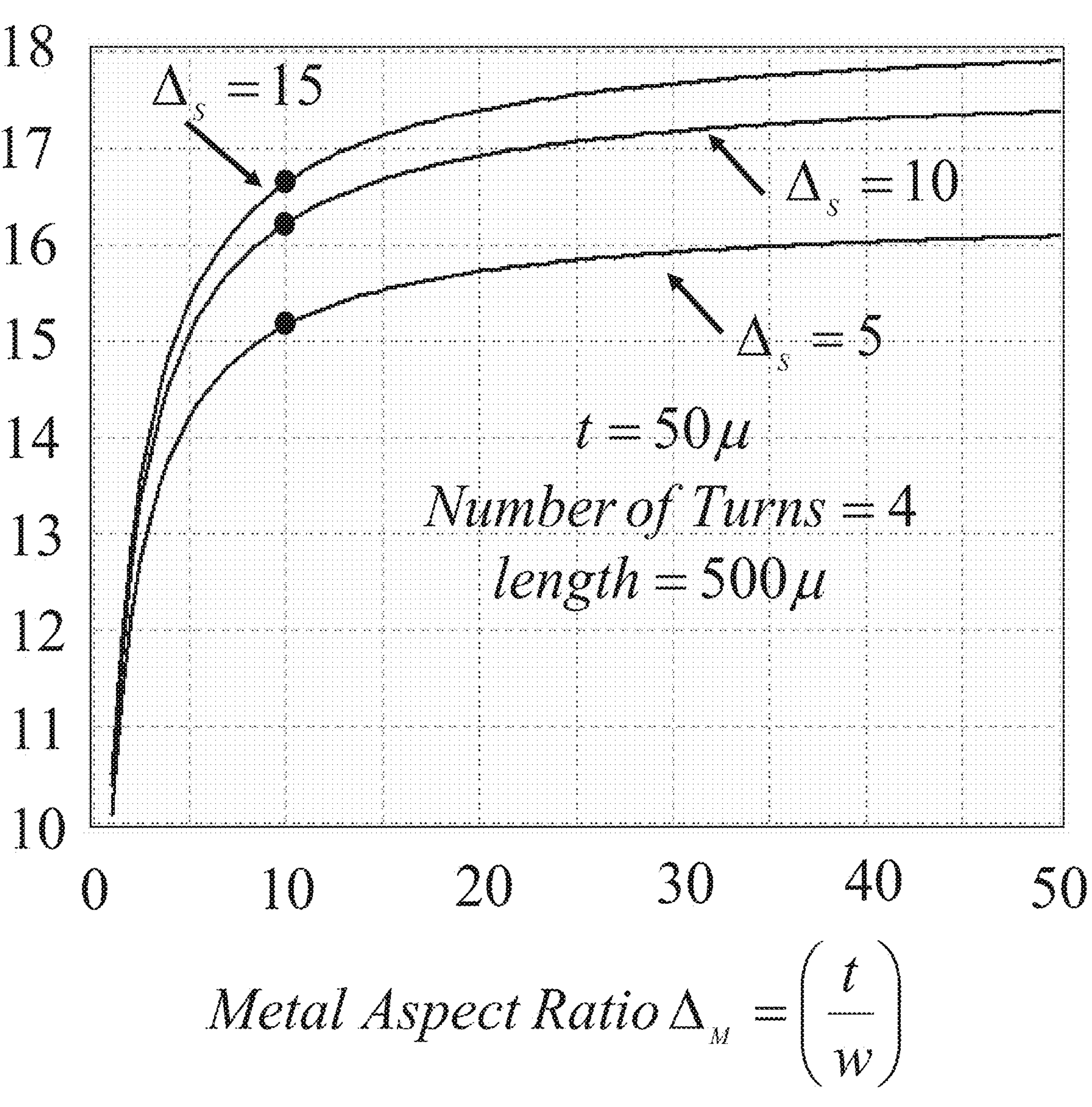
FIG. 55 is a graph illustrating the relation between number of tightly coupled turns and metal aspect ratio showing impact on total inductance at 50μ metal thickness conditions for 500μ nominal length of four turns according to the invention.
Figure 56:
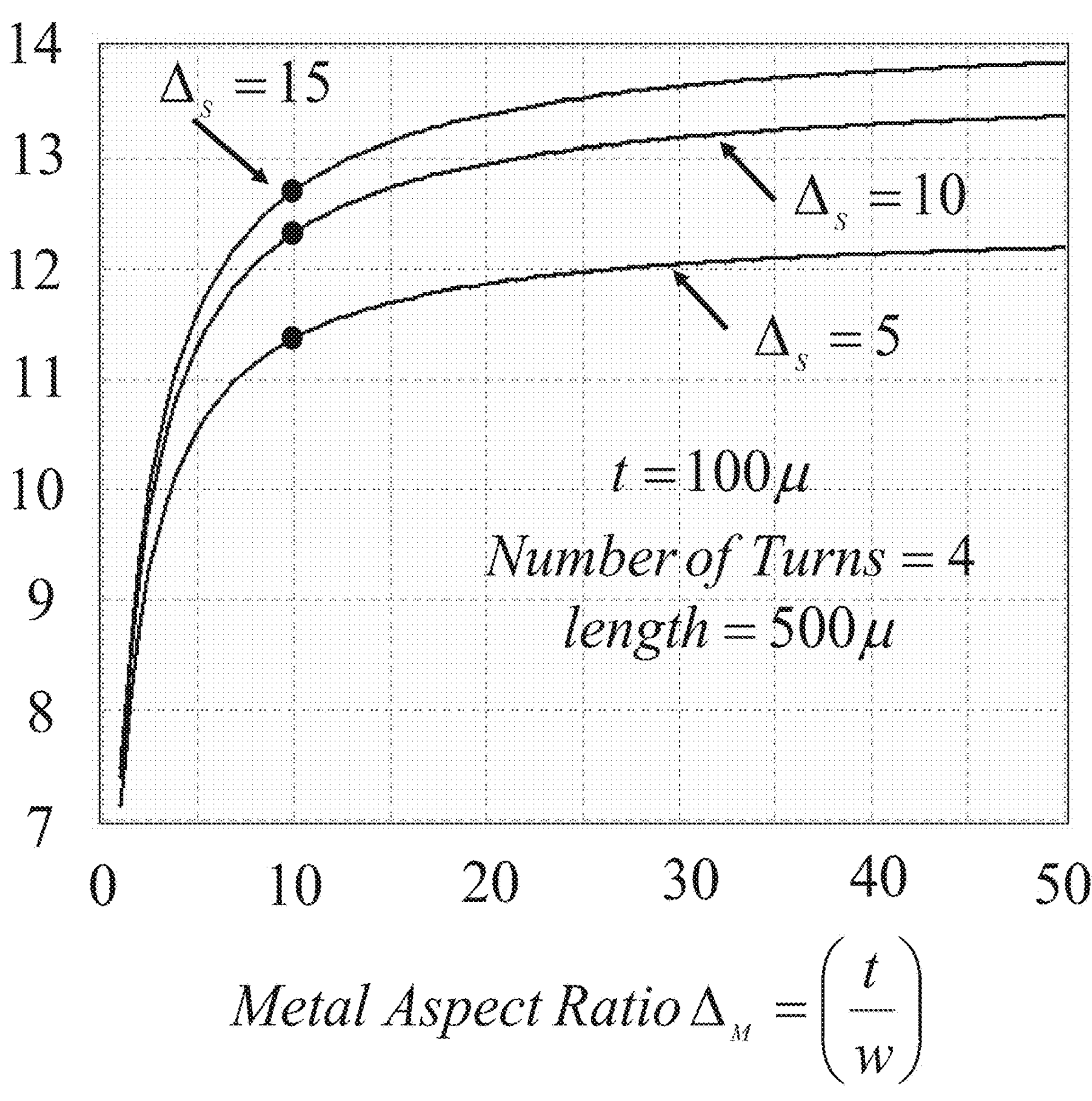
FIG. 56 is a graph illustrating the relation between number of tightly coupled turns and metal aspect ratio showing impact on total inductance under 100μ metal thickness conditions for 500μ nominal length of four turns according to the invention.
Figure 57:
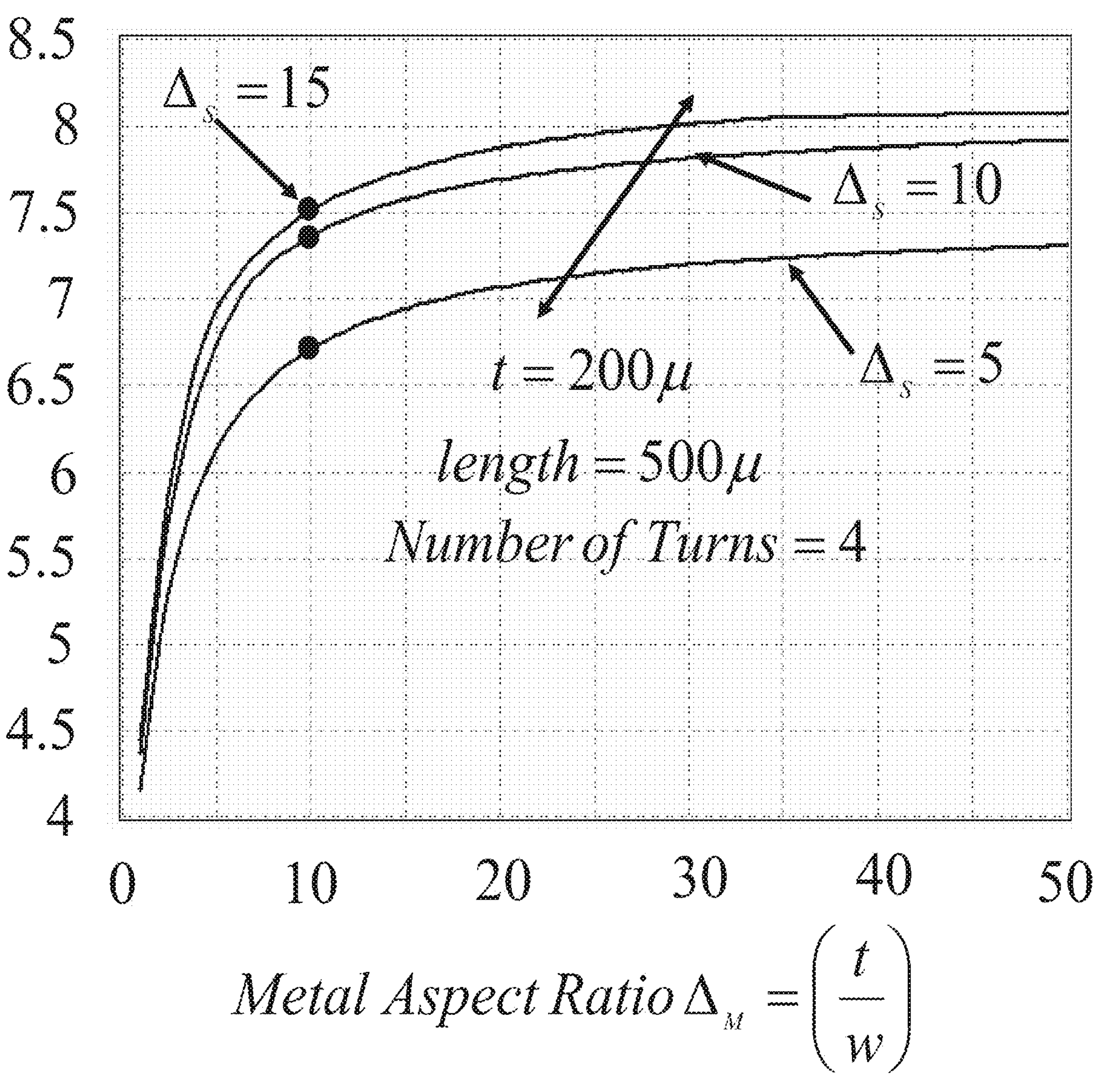
FIG. 57 is a graph illustrating the relation between number of tightly coupled turns and metal aspect ratio showing impact on total inductance under 200μ metal thickness conditions for 500μ nominal length of four turns according to the invention.
Figure 58:
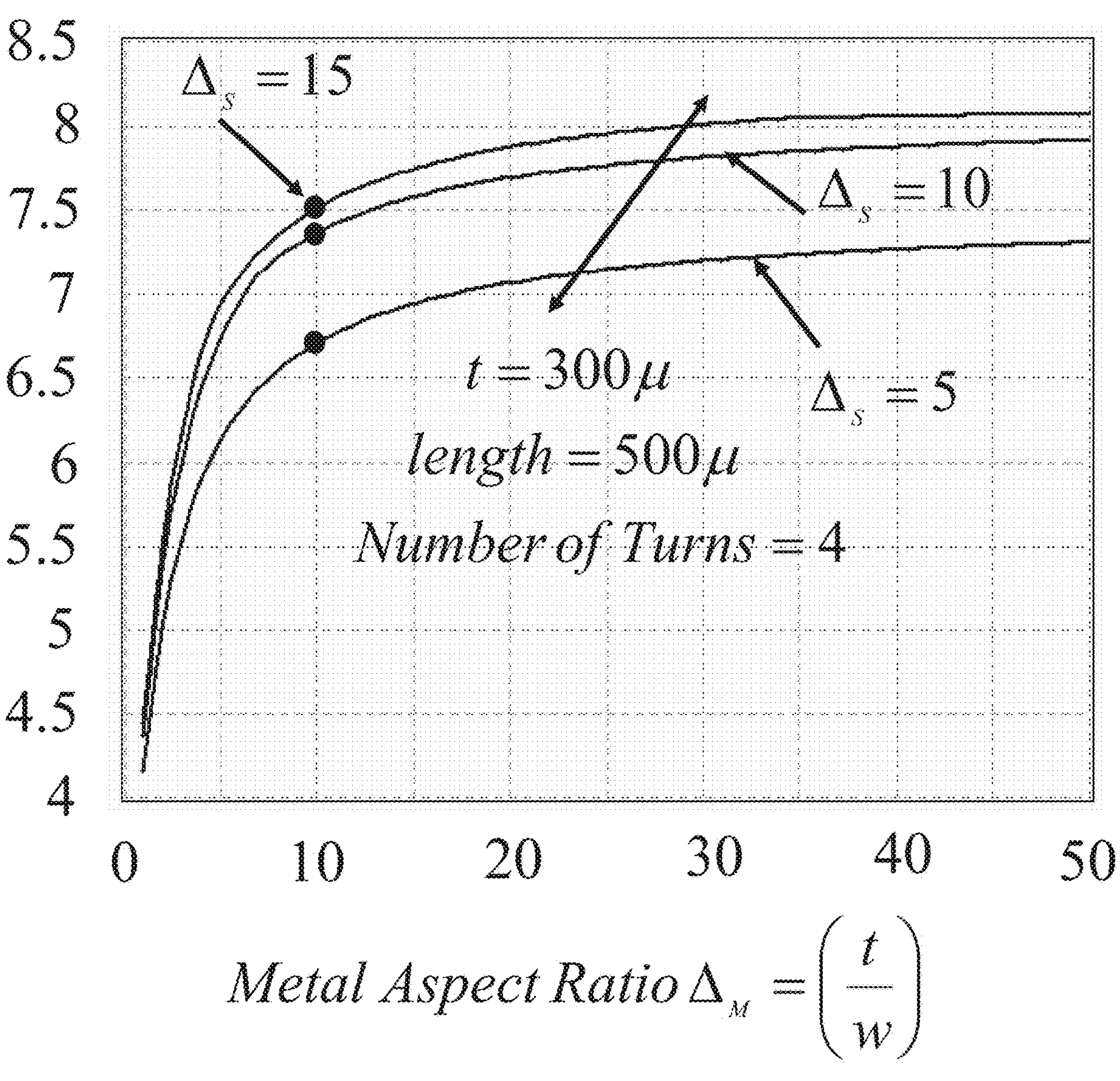
FIG. 58 is a graph illustrating the relation between number of tightly coupled turns and metal aspect ratio showing impact on total inductance under 300μ metal thickness conditions for 500μ nominal length of four turns according to the invention.

FIG. 55 shows total spiral inductance for a 4 turn spiral inductor having inner space $d_{IN}$=500μ, and metal thickness of 50μ as a function of metal aspect ratio $\Delta_M$ and for metal spacing aspect ratios $\Delta_S$=5, 10 and 15. As can be seen, the curves have a higher slope compared to FIG. 53 and FIG. 54 for metal aspect ratios $\Delta_M<10$, but they go flatter after $\Delta_M>10$. As can be seen the increase in the total spiral inductance value is very significant by increasing the metal aspect ratios up to $\Delta_M$=10, but after that the increase in the inductance becomes not that significant. FIG. 56-FIG. 58 show again total spiral inductance for a 4 turn spiral inductor having inner space $d_{IN}$=500μ, and metal thickness of 100, 200 and 300μ. As can be seen for all the thicknesses the relative increase in the total spiral inductance in the metal aspect ratio range of $2<\Delta_M<10$ is not less than 50% for $\Delta_S$=5, 10 and 15.

Figure 59:
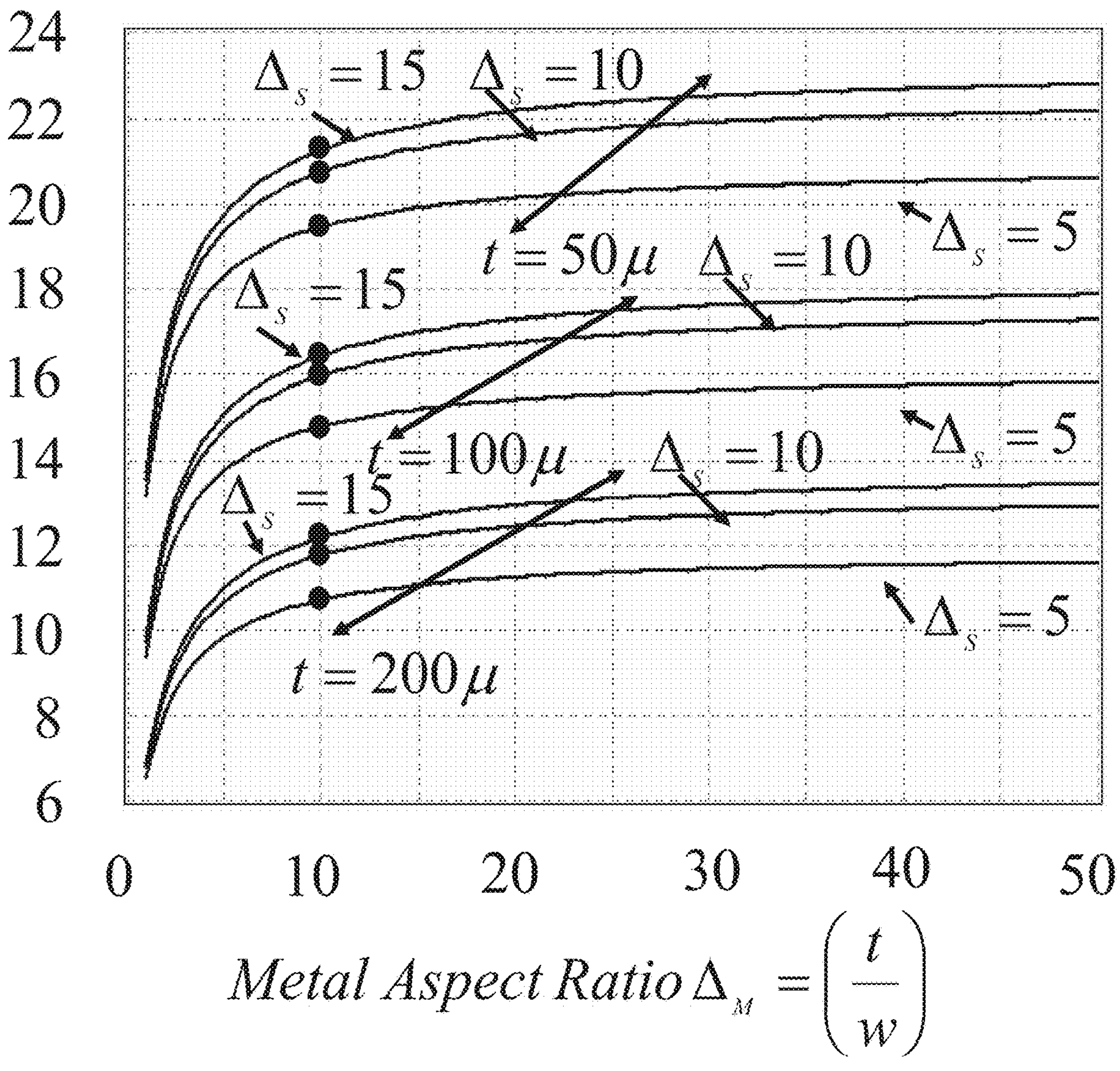
FIG. 59 is a graph illustrating the relation between number of tightly coupled turns and metal aspect ratio showing impact on total inductance under 50, 100 and 200μ metal thickness conditions for a nominal length of 600μ according to the invention.

FIG. 59 show the metal thickness effects on total spiral inductance for t=50, 100 and 200μ, for again a four-turn spiral inductor but this time having inner space $d_{IN}$=600μ for metal spacing aspect ratios of $\Delta_S$=5, 10 and 15 in the same plot to give a good view of the full picture.

Figure 60:
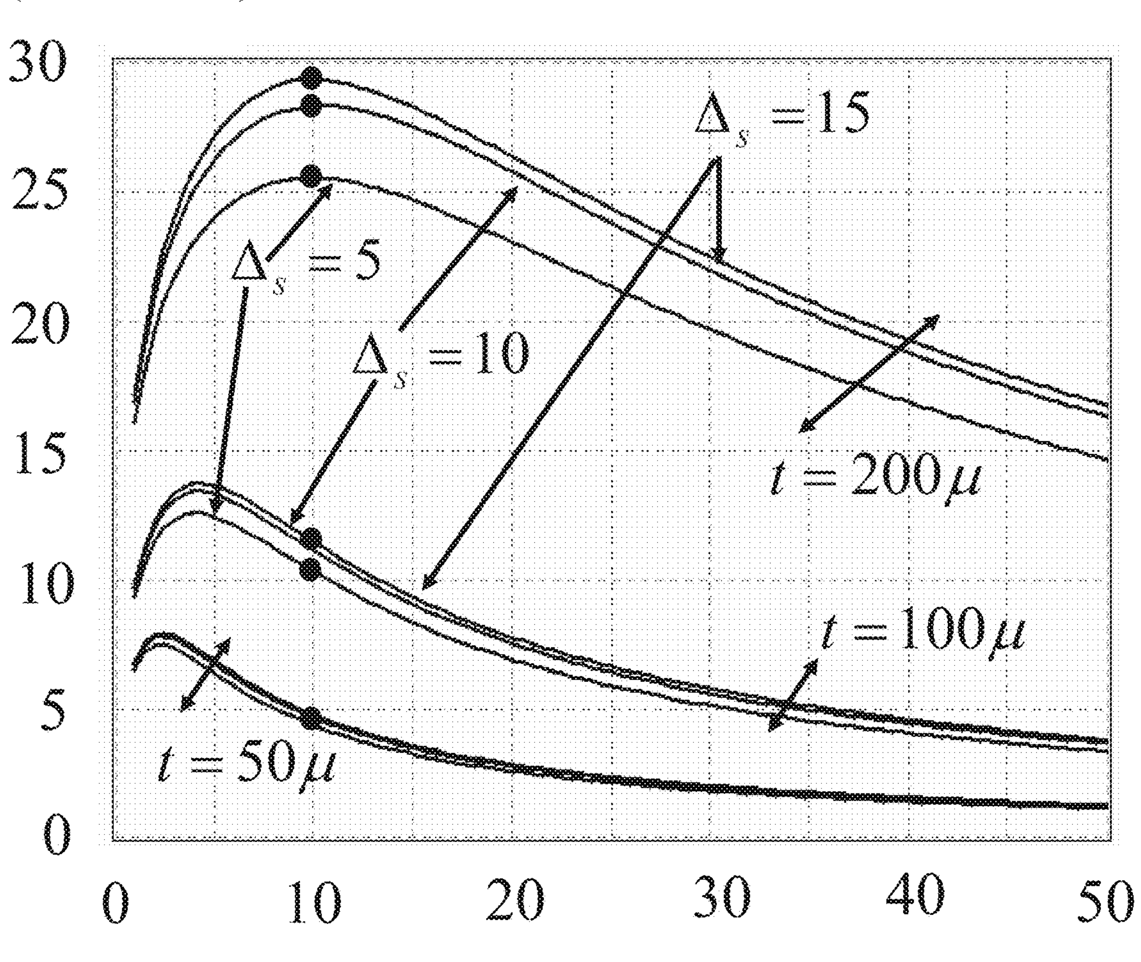
FIG. 60 is a graph illustrating Q as a function of metal aspect ratio for 600μ nominal length of four turns according to the invention.

FIG. 60 show Q vs $\Delta_M$ for metal thicknesses t=50, 100 and 200μ for 100 MHz. As can be seen, for all metal thicknesses there is a $\Delta_M$ value at a selected frequency of operation where the Q value peaks and these peaks are all in the vicinity of $\Delta_M$=10. Thus, there is little theoretical advantage in aspect ratios for either $\Delta_M$ or $\Delta_S$ greater than 10.

The placement of such high aspect ratio spiral inductor windings $\Delta_M$ along with high aspect ratio adjacent spacing $\Delta_S$ according to the invention also results in several other additional important advantages over prior-art arrangement which need to be mentioned.

i) Area Reduction for Same Number of Turns and Inner Dimension $d_{IN}$

Area reduction according to the invention is fairly straightforward and it is an evident advantage of the preferred arrangement of windings, but this has a very practical advantage. It is a geometry-driven advantage. There is no need for electromagnetic analysis. Simply stated, the spiral outer dimension will be smaller if one uses smaller width and spacing. As shown in FIG. 41 the outer dimension of the spiral inductor $d_{OUT}$ is related to the winding width $d_W$ and inner space dimension $d_{IN}$ as, $$d_{OUT} = d_{IN} + 2 \cdot d_W. \tag{2.14}$$

On the other hand, the winding width $d_W$ is related to w and spacing s as, $$d_W = s \cdot (n-1) + w \cdot n \tag{2.15}$$

where n is the number of turns.

Even if there was no increase in the mutual inductive terms between legs as was shown earlier, according to the invention, a very significant reduction in the total spiral area can be achieved as shown in (2.14) and (2.15). As an example, if the cross-sectional area S is kept constant, for a thick and high aspect ratio metallization process (2.15) becomes, $$d_W = s \cdot (n-1) + \frac{S}{t} \cdot n. \tag{2.16}$$

Figure 61:
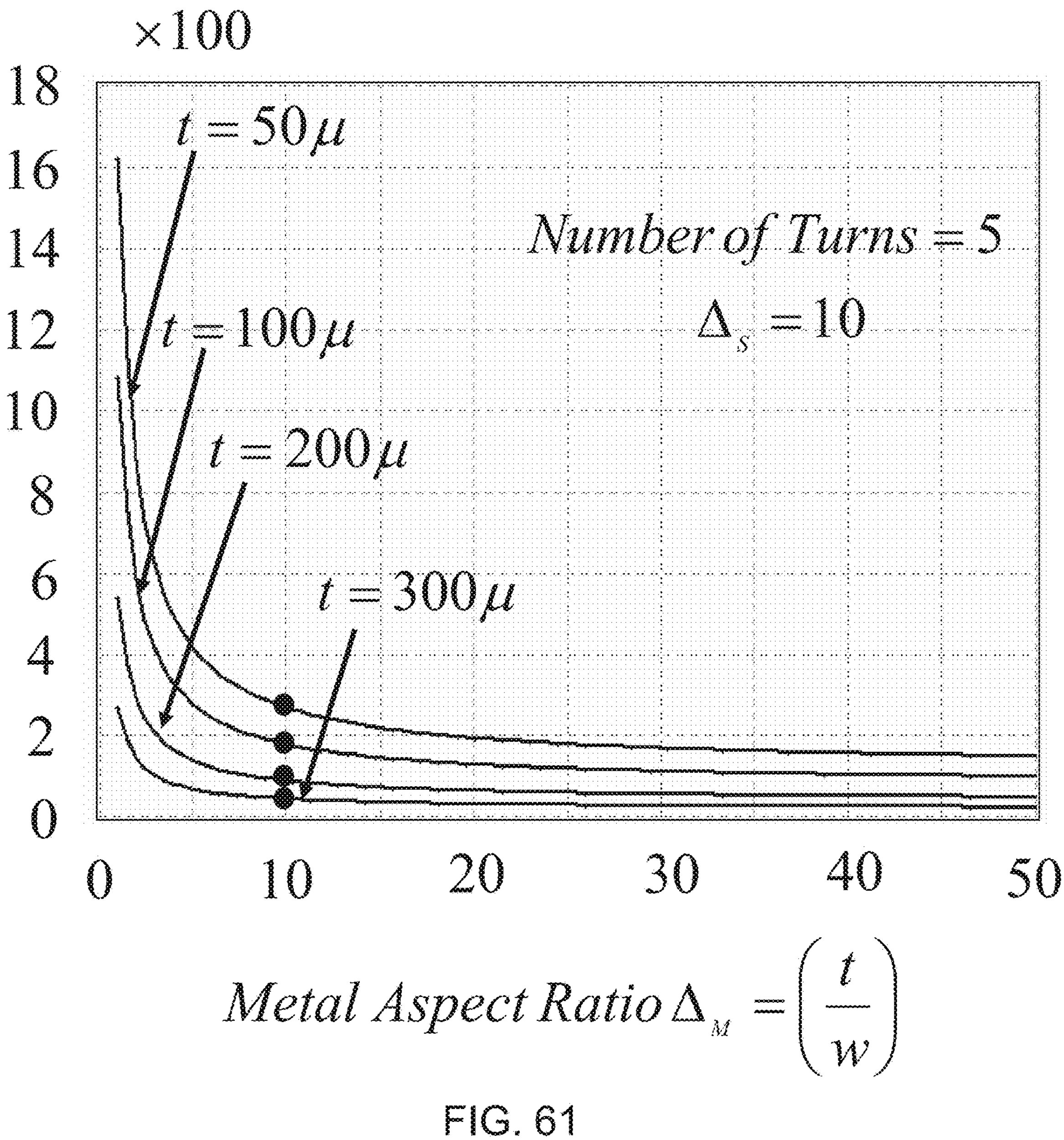
FIG. 61 is a graph illustrating inner to outer winding width a function of metal aspect ratio for five turns allowing small construction according to the invention.
Figure 62:
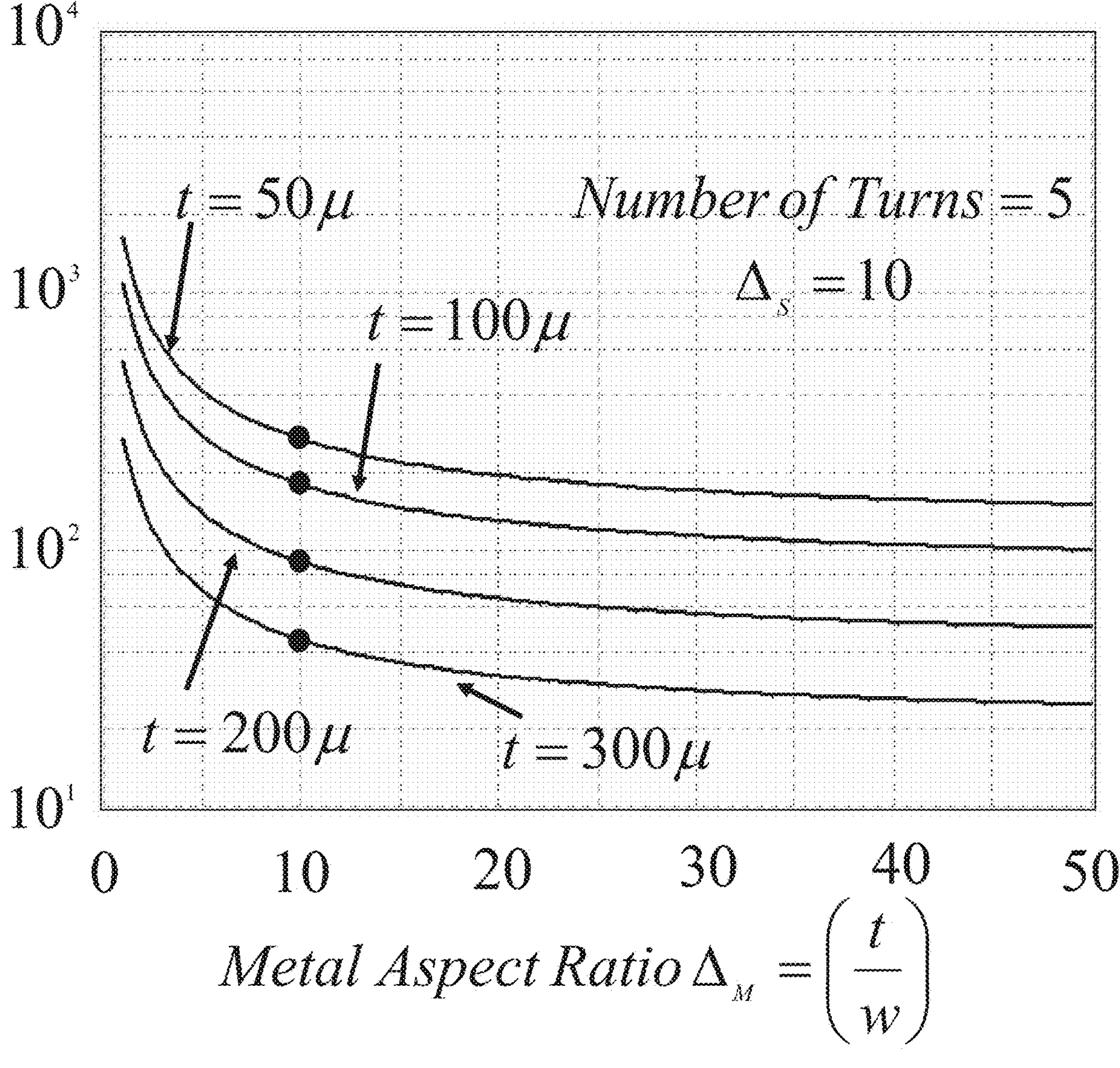
FIG. 62 is a graph in log scale illustrating inner to outer winding width a function of metal aspect ratio for five turns allowing small construction according to the invention.
Figure 63:
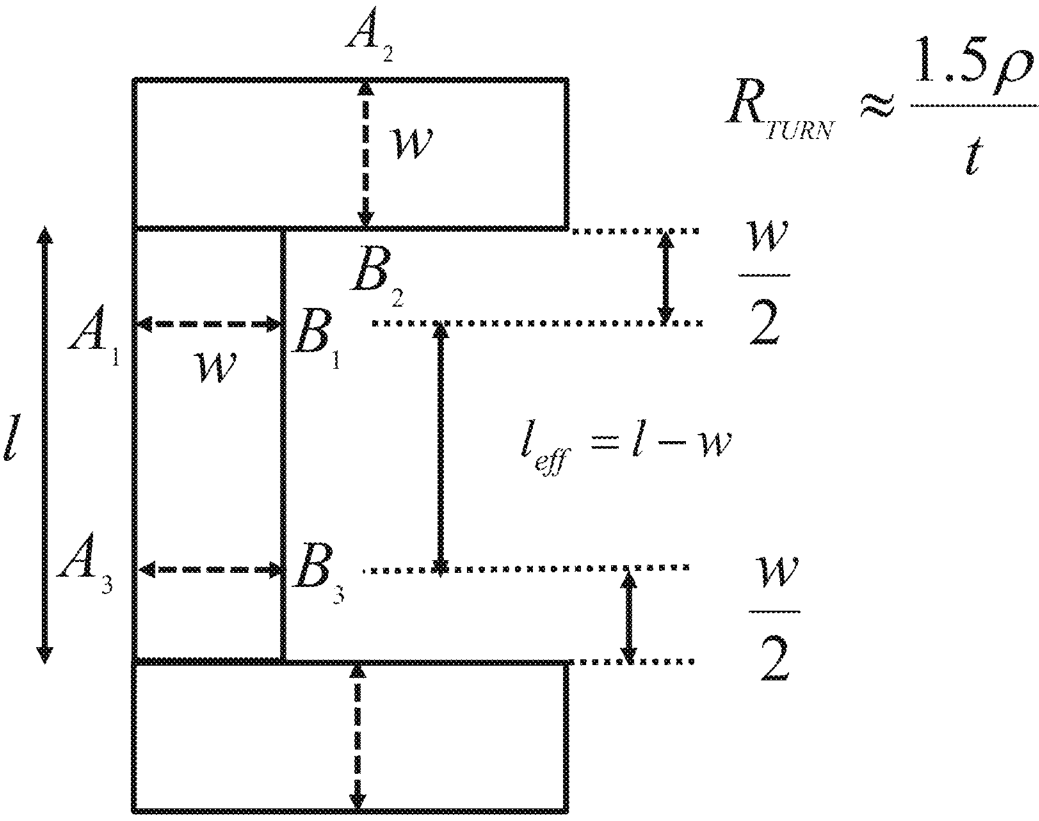
FIG. 63 is a top plan view of a segment of an inductor according to the invention.
Figure 64:
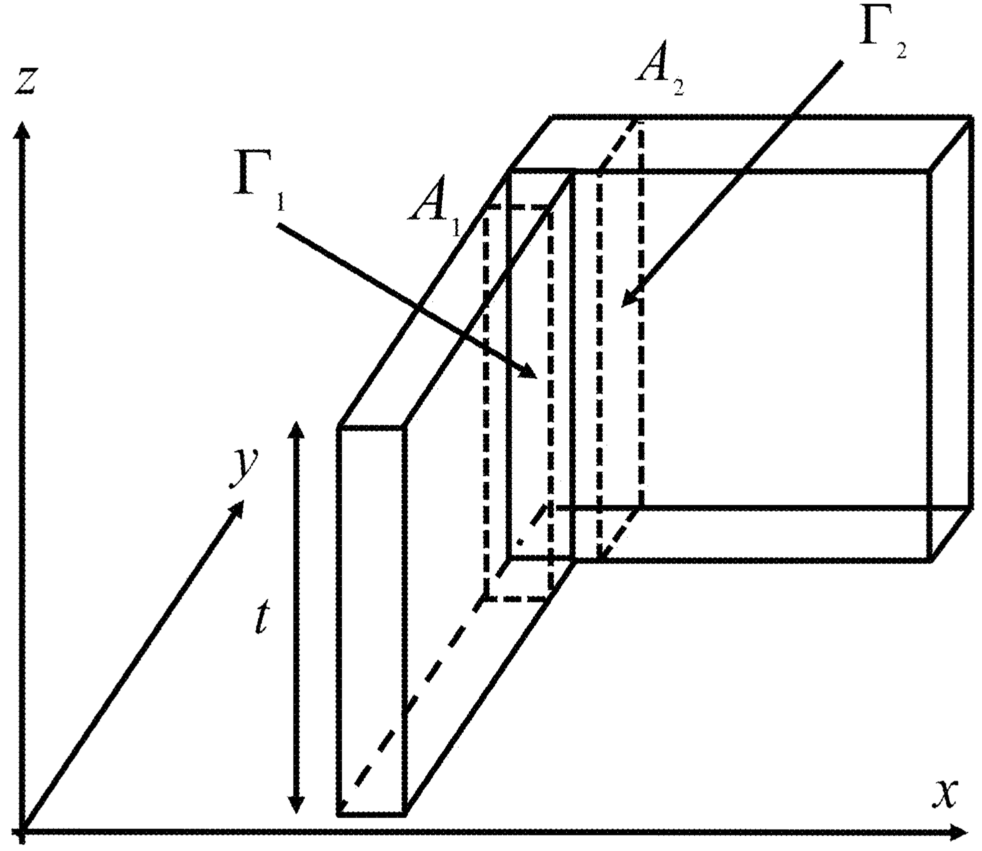
FIG. 64 is a perspective view of a segment of an inductor according to the invention.
Figure 65:
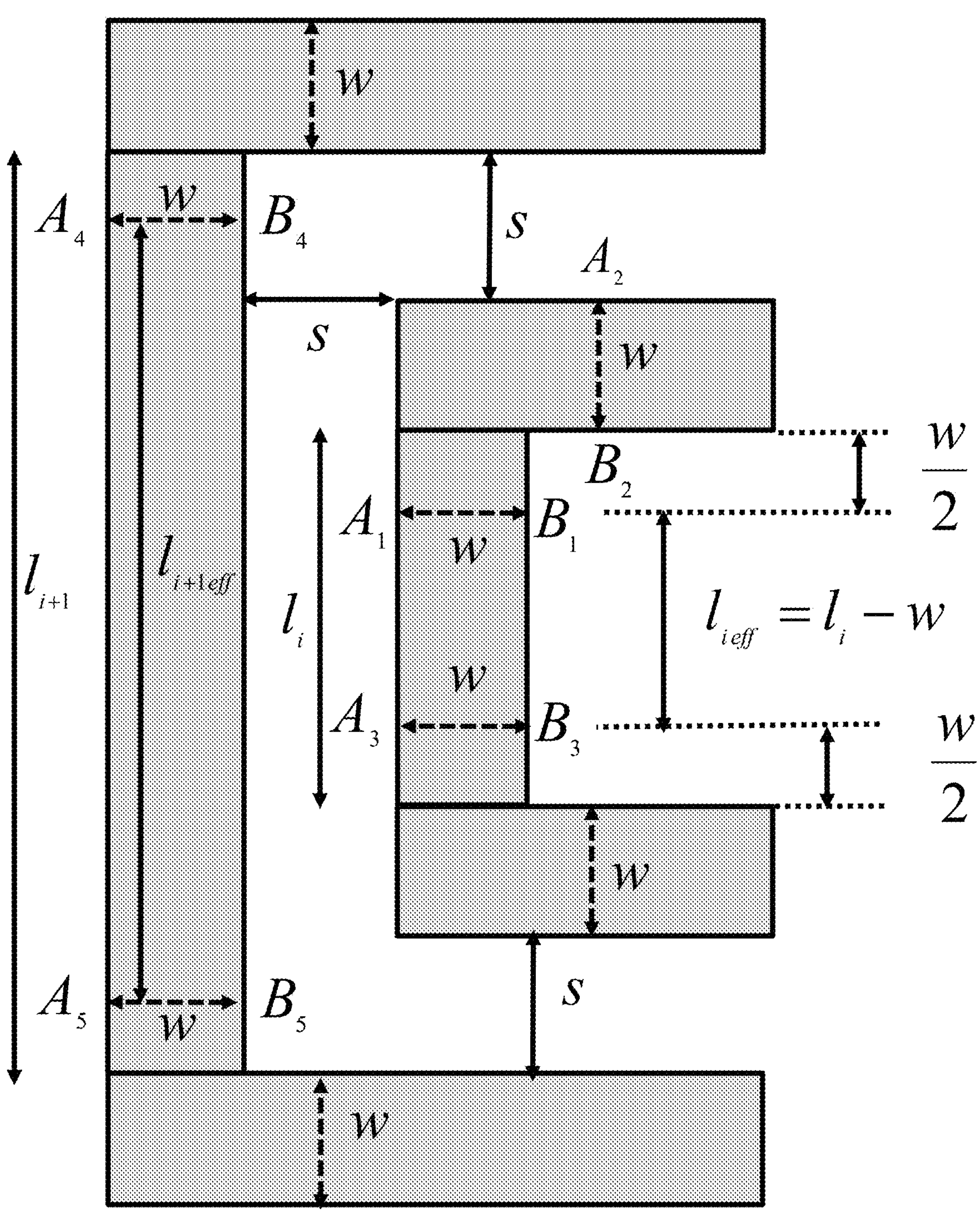
FIG. 65 is a top plan view of two adjacent segments of an inductor according to the invention.

Expression (2.15) can also be written in terms of $\Delta_M$ and $\Delta_S$ for a given metal thicknesses t=50, 100, 200 and 300μ for number of turns n=5 as a function of $\Delta_M$ and the results are shown in FIG. 61. FIG. 62 is basically the FIG. 61 with logarithmic value of the y axis showing a better view of the winding width for smaller $\Delta_M$ values. As can be seen $\Delta_M$=10 and $\Delta_s$=10 and even $\Delta_S$=5 combinations gives very significant winding width savings which translates to small spiral inductor footprint which cannot be achieved with any prior art processes.

ii) Dead Area Generation Reduction, Reduction in R, C and Increase in L for Same Number of Turns and Inner Dimension $d_{IN}$ The advantage obtained for this case of dead area reduction is not as straightforward and evident as in the previous case, but it has a significant effect on resistance and capacitance reduction along with area reduction in spiral inductors. FIG. 63 and FIG. 64 illustrate some critical geometrical parameters related to the "dead area" generation for each turn. Each 90° turn in a rectangular spiral creates an increase in resistance compared to a straight run, as well as add capacitance and perturb the current distribution for a distance related to the width of the leg, and it does not contribute to the inductance. A conservative value for the region where the current is perturbed along the straight path is 0.5w. Since this perturbed region will be at both sides of the leg we can define an effective spiral leg length where the leg length $l_{eff}$ which can be assumed inductive as a function of drawn length l as, $$l_{eff} = l - w. \tag{2.17}$$

Again by using the constant S rule to maintain a desired cross-section, (2.17) becomes, $$l_{eff} = l - \frac{S}{t}. \tag{2.18}$$

Assuming uniform current density along z axes, the additional "dead area" resistance is, $$R_{TURN} \approx \frac{1.5\rho}{t} \tag{2.19}$$

Where ρ is the resistivity of the metal winding. This dead area for each turn can be also given as, $$S_{DEAD} \approx 2 \cdot w^2 = 2\frac{S^2}{t^2}. \tag{2.20}$$

This "dead area" will produce an undesired capacitance increase for each turn proportional to (2.20). As we can see in (2.17)-(2.20), according to the invention, increasing the thickness t increases the inductive portion of the spiral, reduces the "dead area" thus giving smaller parasitic capacitance and resistance and all this results in a smaller spiral with higher Q.

iii) Overall Capacitance Reduction

Unfortunately the above effect cannot be shown analytically as easily and as clearly as has been done for inductance increase and decrease in the resistance on a per-leg basis. Increasing thickness will also increase capacitance per length. Assuming a parallel plate approximation, each interior leg will have capacitance as, $$C_{LEG} = 2 \cdot \varepsilon_r \cdot \varepsilon_0 \frac{t \cdot l}{s} = 2 \cdot \varepsilon_r \cdot \varepsilon_0 \cdot l \cdot \Delta_S. \tag{2.21}$$

As can be seen, the capacitance of each leg will increase with increase of the thickness t or the aspect ratio of the leg-to-leg spacing $\Delta_S$. Deciding what capacitance per leg is acceptable for an inductor value L is not analytically obtainable with reasonable and acceptable approximations. A possible solution is to plot each leg resonance frequency as a function of space s. By not making s smaller than the self resonance frequency compared to the desired frequency of operation looks like a solution, but that can be misleading. Therefore it is not presented in this work.

On the other hand the designer has control on the design parameter s in a rectangular structure which is not generally true in a stacked inductor structure. In stacked inductor cases, metal spacing between layers is determined by the process, which is not in the control of the spiral designer. On the other hand the designer in this thick metal large aspect ratio interposer structure has control on spacing s, which offers very useful design flexibility. However, the analysis must be done as a full spiral analysis, not a leg by leg basis. Using high aspect ratio metal spacing increases mutual coupling between legs; therefore the spiral inductor value L can be realized in a smaller area or a smaller number of turns, yielding desired smaller capacitance values per leg. The designer can design the spiral with a complete analysis using PowerSpiral software (a commercially available tool provided by OEA International of Morgan Hill, California). Therefore, the Q value at the frequency of interest can be plotted easily as a function of spacing, and space optimization can be done on an inductor-by-inductor basis as the last step.

iv) Much Better Inductance vs. Frequency Property

As can be analytically proven [24,25] for circular and as shown earlier for rectangular cross-sectional rectangular conductor geometries, the $R_{AC}/R_{DC}$ will increase with the square root of the frequency after a corner frequency $f_C$, defined as a ratio of the plane wave skin depth to some geometrical parameters related to the cross-section of the conductor. According to the invention, by making the windings high aspect ratio with the widths not exceeding skin depth one already increases the corner frequency $f_C$ very significantly compared to prior art spiral inductors, but still the $R_{AC}/R_{DC}$ will increase with the square root of the frequency. Therefore if one merely takes into consideration only the square root increase of the $R_{AC}/R_{DC}$ with frequency, the $Q(f)$ relation as given in (1.20) becomes proportional to the square root of the frequency instead of being a linear function of frequency!

The internal inductance $L_{INT}$, of the conductor behaves in a completely opposite manner; the $L_{ACINT}/L_{DCINT}$ will decrease with the same ratio as the $R_{AC}/R_{DC}$ with the increasing frequency. The $Q(f)$ relation as given in (1.20) then becomes approaching a finite value, not increasing as a linear function of frequency or proportional to the square root of the frequency by only taking the resistance increase with frequency! Luckily the total inductance has two components being the internal $L_{INT}$ and external inductance LENT. External inductance is due to the mutual coupling terms in the overall structure and is nearly independent of frequency. Therefore the total inductance does not decrease continuously as a square root function of frequency; it approaches to the external inductance value $L_{EXT}$ and the $Q(f)$ relation as given in (1.20) then becomes again proportional to the square root of the frequency, which is a very good property as far as building inductors is concerned. According to the invention, by employing the tight coupling condition, the spiral inductor inherently has much larger external inductance $L_{EXT}$ component and therefore the decrease of the internal inductance with frequency is reduced significantly compared to the prior art spiral inductors. One may define a figure of merit $f_{MERIT}$ as, $$f_{MERIT} = \frac{L_{EXT}}{L_{TOT}}. \tag{2.22}$$

This ratio in tight coupling condition is a larger value than 0.6 meaning that in any case the $L_{AC}/L_{DC}$ ratio cannot be less than $f_{MERIT}$ at any frequency!

v) "Image Spiral" Coupling Reduction

In a typical application of spiral inductors there can be conductive regions on top or bottom of the spiral inductor such as ground/power planes, metallic lid of the package etc. in the z direction. At these highly conductive regions the intended spiral inductor can produce eddy currents and generate loss which is fairly difficult to simulate accurately. At the extreme case one can assume that these highly conductive regions acts like infinitely large perfect ground planes and there will be an "image spiral" formed with respect to these perfect conductive planes but carrying an opposite directional current flow in it with respect to the intended spiral inductor [24,25]. A proper approximate equivalent circuit simulation for this assumption will be simulating two coupled identical spiral structures separated by twice the distance de to these highly conductive regions, where the input and output pins of the image spiral are shorted. Higher coupling between the legs of the intended and the image spiral will cause a larger reduction of the effective inductance of the intended spiral inductor. As shown earlier with the tight coupling condition, the inductive coupling between the windings in the (x,y) direction is kept very high. On the other hand the inductive coupling in the z direction is inversely proportional to the thickness t of the windings, not the distance $d_z$ between them! Having winding thicknesses t in the order of 100-300μ in accordance with the invention increases the critical distance where the unwanted image spiral effect can become significant. On the other hand, having wide spiral windings with adjacent windings of small thickness among each other, as prior art spirals, the z directional inductive coupling is very large, (parallel rectangular structures placed wider sides facing each other) as shown in the tight coupling condition. As a conclusion, the tight coupling condition defined herein—as having $\Delta_M$ and $\Delta_S$ on the order of 10 and larger—reduces this image spiral effect very effectively!

Full PowerSpiral Simulations Showing the Effectiveness of the Interposer Metal Thickness on Spiral Inductor Performance Until now, the advantage of using a thick metal with large metallization and spacing aspect ratio for spiral inductor performance has been shown analytically under certain approximations to give clear understanding of the non-obvious issues. In this section is a description of full 3D electromagnetic simulation results for inductor specifications. This would not even have been thinkable with current metal processing rules for IC's, MCM's, PCB or any known advanced packaging technologies. The inductor values to be designed are taken as 5, 10, 20, 40, 60, 80, 100 and 200 nH. Anything above 10 nH is basically considered unrealistic values for any known process. To raise the design goal even further, the specification for DC resistance is kept to very small numbers as needed in FIVR work geared for 100 MHz switching frequencies. The results are given in self-explanatory tables in Table [3.1] to Table [6] for metal thicknesses of 50, 100, 200 and 300μ.

TABLE 3.1

| L(nH) | $Q_{MAX}$ | $f_{QMAX}$[MHz] | $d_{OUT}$[μ] | $R_{DC}$[Ω] |
|---|---|---|---|---|
| 5 | 42.35 | 1,000 | 428 | 0.5 |
| 10 | 40.8 | 732 | 438 | 0.72 |
| 20 | 39.34 | 424 | 453 | 1.06 |
| 40 | 37.51 | 311 | 475 | 1.57 |
| 60 | 36.16 | 259 | 490 | 1.96 |
| 80 | 35.75 | 229 | 500 | 2.31 |
| 100 | 34 | 208 | 515 | 2.63 |
| 200 | 30.97 | 131 | 563 | 3.94 |

Thickness = 50 μ Space = 1 μ, Width = 2 μ, S = 100 $\mu^2$, $I_{MAX}$ = 2A
$\Delta_{rw}$ = 25, $\Delta_{ts}$ = 50

TABLE 3.2

| L(nH) | $Q_{MAX}$ | $f_{QMAX}$[MHz] | $d_{OUT}$[μ] | $R_{DC}$[Ω] |
|---|---|---|---|---|
| 5 | 39.36 | 1,030 | 444 | 0.51 |
| 10 | 36.98 | 608 | 466 | 0.76 |
| 20 | 33.49 | 452 | 489 | 1.13 |
| 40 | 30.52 | 267 | 529 | 1.69 |
| 60 | 28.74 | 225 | 556 | 2.14 |
| 80 | 26.95 | 202 | 583 | 2.5 |
| 100 | 25.9 | 164 | 606 | 2.92 |
| 200 | 22.37 | 112 | 687 | 4.46 |

Thickness = 50 μ Space = 5 μ, Width = 2 μ, S = 100 $\mu^2$, $I_{MAX}$ = 2A
$\Delta_{rw}$ = 25, $\Delta_{ts}$ = 10

TABLE 3.3

| L(nH) | $Q_{MAX}$ | $f_{QMAX}$[MHz] | $d_{OUT}$[μ] | $R_{DC}$[Ω] |
|---|---|---|---|---|
| 5 | 36.69 | 848 | 457 | 0.53 |
| 10 | 32.57 | 639 | 499 | 0.8 |
| 20 | 29.07 | 382 | 541 | 1.21 |
| 40 | 24.99 | 229 | 597 | 1.83 |
| 60 | 23.41 | 196 | 646 | 2.34 |
| 80 | 221.67 | 176 | 681 | 2.82 |
| 100 | 20.64 | 144 | 716 | 3.24 |
| 200 | 17.68 | 100 | 835 | 5.01 |

Thickness = 50 μ, Space = 10 μ, Width = 2 μ, S = 100 $\mu^2$, $I_{MAX}$ = 2A
$\Delta_{rw}$ = 25, $\Delta_{ts}$ = 5

TABLE 4.1

| L(nH) | $Q_{MAX}$ | $f_{QMAX}$[MHz] | $d_{OUT}$[μ] | $R_{DC}$[Ω] |
|---|---|---|---|---|
| 5 | 48 | 714 | 478 | 0.3 |
| 10 | 45 | 474 | 506 | 0.64 |
| 20 | 43.4 | 314 | 548 | 0.66 |
| 40 | 38.47 | 210 | 611 | 0.99 |
| 60 | 35.31 | 159 | 660 | 1.27 |
| 80 | 33.59 | 142 | 695 | 1.51 |
| 100 | 31.97 | 123 | 730 | 1.73 |
| 200 | 28.2 | 80 | 856 | 2.67 |

Thickness = 100 μ, Space = 10 μ, Width = 4 μ, S = 400 $\mu^2$, $I_{MAX}$ = 8A
$\Delta_{rw}$ = 25, $\Delta_{ts}$ = 10

TABLE 4.2

| L(nH) | $Q_{MAX}$ | $f_{QMAX}$[MHz] | $d_{OUT}$[μ] | $R_{DC}$[mΩ] |
|---|---|---|---|---|
| 5 | 56.2 | 516 | 497 | 130 |
| 10 | 54.03 | 346 | 542 | 230 |
| 20 | 51.78 | 230 | 596 | 340 |
| 40 | 50 | 156 | 677 | 520 |
| 60 | 49.46 | 118 | 731 | 670 |
| 80 | 46.96 | 100 | 785 | 800 |
| 100 | 45.9 | 92.6 | 821 | 920 |
| 200 | 39.67 | 60.58 | 983 | 1430 |

Thickness = 100 μ, Space = 10 μ, Width = 8 μ, S = 800 $\mu^2$, $I_{MAX}$ = 16A
$\Delta_{rw}$ = 12.5, $\Delta_{ts}$ = 10

TABLE 5.1

| L(nH) | $Q_{MAX}$ | $f_{QMAX}$[MHz] | $d_{OUT}$[μ] | $R_{DC}$[mΩ] |
|---|---|---|---|---|
| 5 | 65.11 | 264 | 630 | 49 |
| 10 | 62 | 175 | 702 | 74 |
| 20 | 59 | 125 | 810 | 111 |
| 40 | 52 | 85.4 | 972 | 170 |
| 60 | 50 | 69.2 | 1080 | 221 |
| 80 | 45 | 58.6 | 1152 | 262 |
| 100 | 40 | 50.8 | 1224 | 302 |
| 200 | 35 | 35 | 1494 | 469 |

Thickness = 200 μ, Space = 20 μ, Width = 16 μ, S = 3,200 $\mu^2$, $I_{MAX}$ = 32A
$\Delta_{rw}$ = 12.5, $\Delta_{ts}$ = 10

TABLE 6

| L(nH) | $Q_{MAX}$ | $f_{QMAX}$[MHz] | $d_{OUT}$[μ] | $R_{DC}$[mΩ] |
|---|---|---|---|---|
| 5 | 61.74 | 116 | 920 | 11 |
| 10 | 53.99 | 79 | 1080 | 17 |
| 20 | 49.77 | 55 | 1320 | 25 |
| 40 | 44 | 37 | 1560 | 39 |
| 60 | 40 | 30 | 731 | 51 |
| 80 | 35 | 25.6 | 1920 | 61 |
| 100 | 32 | 22 | 2040 | 70 |
| 200 | 29 | 15.4 | 2520 | 100 |

Thickness = 300 μ, Space = 20 μ, Width = 60 μ, S = 18,000 $\mu^2$, $I_{MAX}$ = 180A
$\Delta_{rw}$ = 5, $\Delta_{ts}$ = 15

All of the simulated metal thickness, spacing and widths are possible in the existing interposer technology, so these are not fictitious metallization rules. As can be seen, the interposer technology with correctly suited metal thickness can deliver these heretofore unheard of large value inductors in the order of 1 mm by 1 mm size yielding heretofore unheard of performance, not even reported for small-value on-chip or in-chip inductors!

As can be seen in Tables[3.1] to Tables[6] for high efficiency, high current buck converter applications for a load current in the order of 2 A, the $R_{DC}$<20 mΩ limit as given by (1.17) can be achieved with 300μ of metal thickness and up to 20 nH values giving maximum inductor current of 180 A realized in an approximately 1 mm by 1 mm area. This means that larger load currents can only be achieved by having multiple inductors driven by Poly-Phase architectures [3-9].

The small size of even unheard of large inductors allows many inductors to be integrated on the interposer and opens up large opportunities in FIVR and RFIC design space and even allows multiple FIVR architecture. This represents a major breakthrough achievable with miniaturization according to the invention.

In reality one cannot come up with a standard IC metallization process having any desired large values for $\Delta_M$ and $\Delta_S$ as shown and described in connection with FIGS. 53-62. One must instead select a set of practically achievable and good yielding $\Delta_M$ and $\Delta_S$ values. In the light of FIGS. 53-62 it is fairly clear that the practical processing limits of the HARMS process can be set for $\Delta_M$=10 and $\Delta_S$=5-10 and get significantly better size, inductance value and Q improvement compared to prior art spiral inductors. Even these calculated $\Delta_M$ and $\Delta_S$ values are not achievable with standard metal processes today used in IC technologies. As we mentioned earlier the thickest metal process available today is only at the metal 5, having thickness of t=4μ and width and spacing w=s=2.8μ giving only $\Delta_M$=$\Delta_S$=1.42 and as can be seen these numbers are at the very low end of the FIGS. 53-62 not satisfying the derived "tight coupling" condition. At lower levels of metals, which are all less than 1μ thick, with fine lithography one can achieve the desired $\Delta_S$ values needed for the "tight coupling" condition today, but to meet the cross-sectional area S for desirable DC resistance and/or current density requirements they can only be realized with very wide metals lines, which results in very small $\Delta_M$<1 values which again doesn't satisfy the "tight coupling" condition as defined in this invention. As claimed in this invention, we need both $\Delta_M$ and $\Delta_S$ have to be in the order of 10 and 5-10, respectively, for any thickness of metal desired to see a significant improvement on spiral inductor area and performance.

Even if we speculate that one develops an IC metallization thickness in the order of 20μ with the same etching rule presently giving $\Delta_S$=1.42, we still cannot meet the "tight coupling" condition. As a result we need to come up with a metallization etch process than can give the desired minimums of $\Delta_M$=10 and $\Delta_S$=5-10, which is probably not possible today and for some time in the future. Instead, the present invention provides an alternative technique for realizing such structures.

Silicon etch technologies offers such an alternative. Silicon etch technologies have improved very significantly over the years[34-35]. Si etch structures with aspect ratios (depth/width), exceeding even 25 have now been demonstrated. These processes are used in Silicon Through Via (STV) technologies, 3D stacked packaging, Micro-Electro-Mechanical Systems (MEMS) and many more other applications[36-41]. The present invention exploits the underlying processes in a whole new field of applications, giving what the present inventor has designated as the "HARMS" process. However, HARMS uses the high aspect ratio Si etch capability similar to Deep Reactive Silicon Etching (also known as Bosch processes)[33], in a reverse mode of trenching. Similarly, the method of metallization which is used in "HARMS" technology is derived from the totally opposite usage of the STV technology. In STV Si is etched, making a void or a deep trench and the void or the trench is filled with metal. In "HARMS" technology according to the invention, Si is etched creating a "wall" or a "column" herein called a "Si Core," and the metal encapsulates the "Si Core," creating the spiral windings and pads which will be the spiral inductor electrical connections to the external circuits. The encapsulating metal thickness is restrained to on the order of skin depth k×δ where k=1.6-3.85 as claimed before giving $R_{AC}/R_{DC}$<2 at the desired frequency of operation of the spiral inductor.

Current HARMS processing guidelines are outlined in Table [7] as shown below for several desired "final" dimensions.

TABLE 7

| Metal Thickness (t) [μ] | Minimum Width (w) [μ] t/w = 25 | Minimum Spacing (s) [μ] t/s = 10 |
|---|---|---|
| 50 | 2 | 5 |
| 100 | 4 | 10 |
| 200 | 8 | 20 |
| 300 | 12 | 30 |

Figure 66:
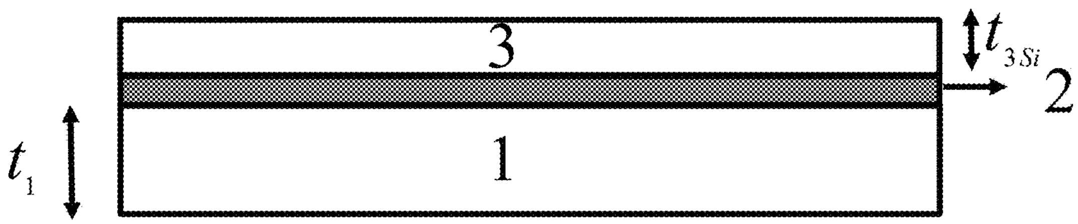
FIG. 66 through-FIG. 75 show first processing steps of the HARMS process according to the invention.
Figure 117:
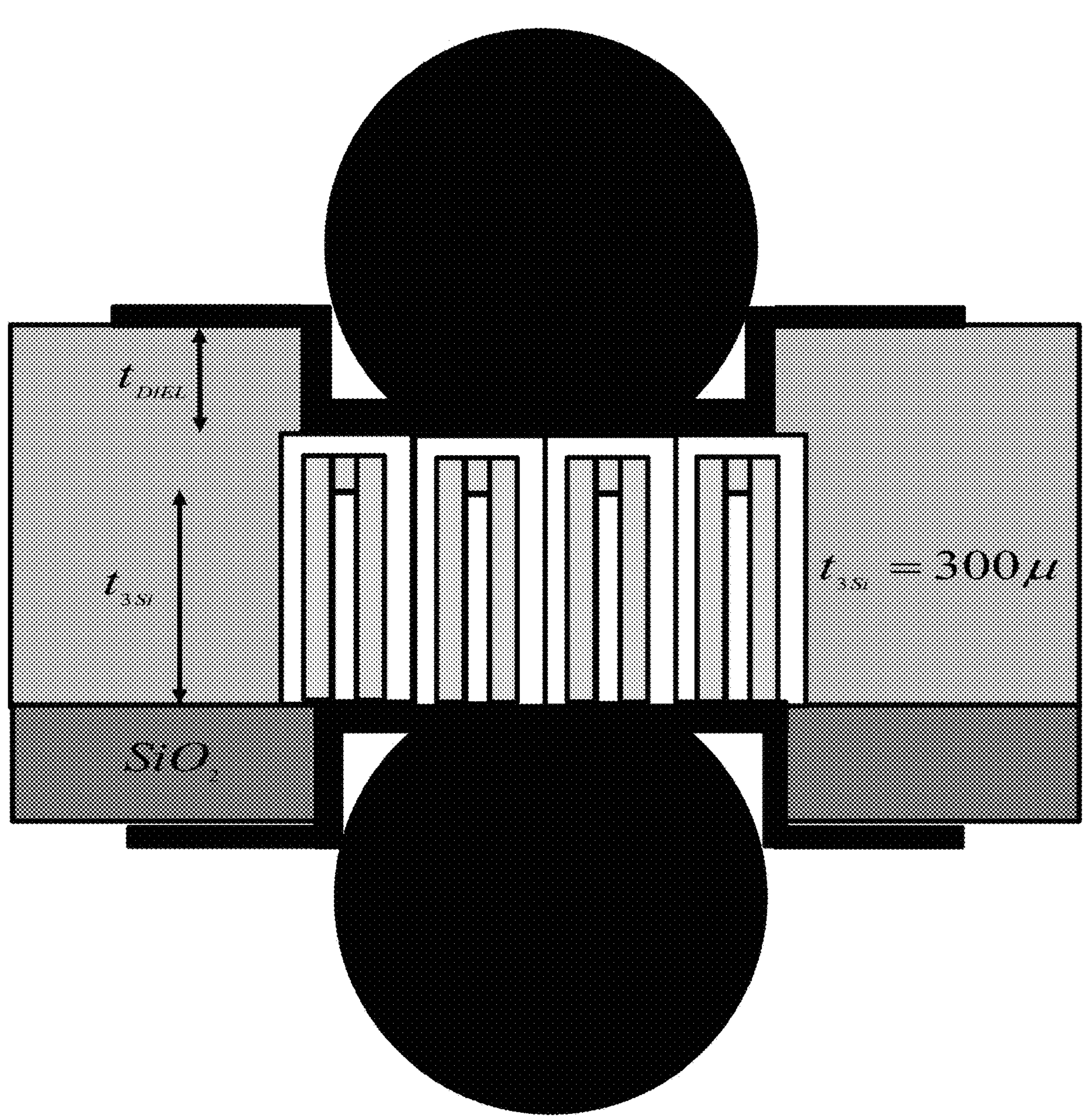
FIG. 117 is a schematic side cross-sectional view illustrating C4 bumping on both sides of an interposer structure of a spiral inductor according to the invention.

"HARMS" (High Aspect Ratio Metallization and Spacing) Interposer Technology Processing Capabilities FIG. 66 and following illustrate some critical processing steps of the inventive HARMS process in an interposer-based spiral inductor. Such an inductor is mounted to a silicon-wafer-based circuit. There can be three basic choices of starting materials.

i) As shown in FIG. 66, the starting material can be a conventional SOI wafer. FELT, Bonded wafer and other types are common choices in the IC industry. In these types of structures the overall structure consists of two different thicknesses of high-quality single-crystal Si separated by a fairly thick layer (1-2μ) of $SiO_2$. The thicker portion of the Si is typically used for mechanical handling, not for active device formation. In the described interposer structure the spiral structures can be built on any one side of the SOI wafer, which can be 50μ-400μ thick, depending on the desired thickness of spiral inductor windings.

ii) If the desired thickness of spiral inductor windings is greater than 200μ, like in many applications shown earlier, there is no need for SOI wafer, a traditional Si wafer with a thermally grown thick (1μ-2μ) layer of $SiO_2$ will be used as the interposer starting material. As hereinafter explained in connection with the final result, FIG. 117 shows a cross section of the STV structure connected to both sides with C4 bumps.

Figure 96:
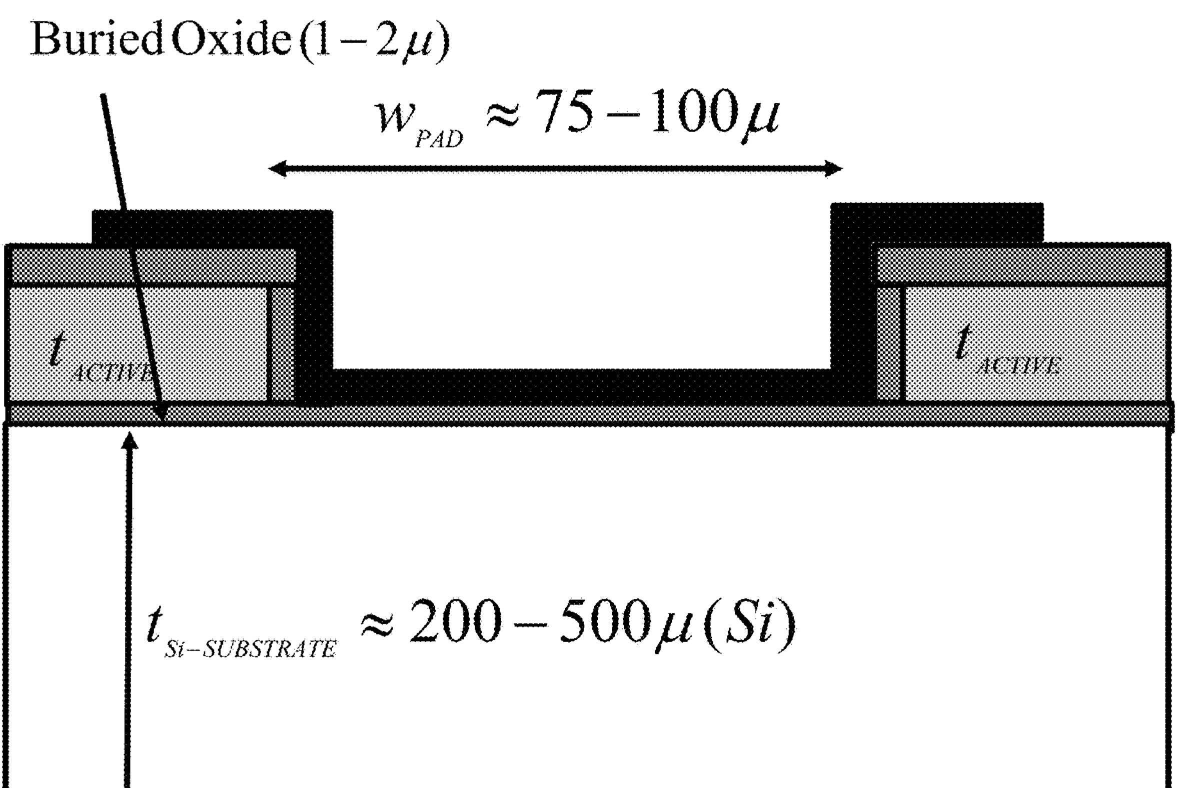
Figure 97:
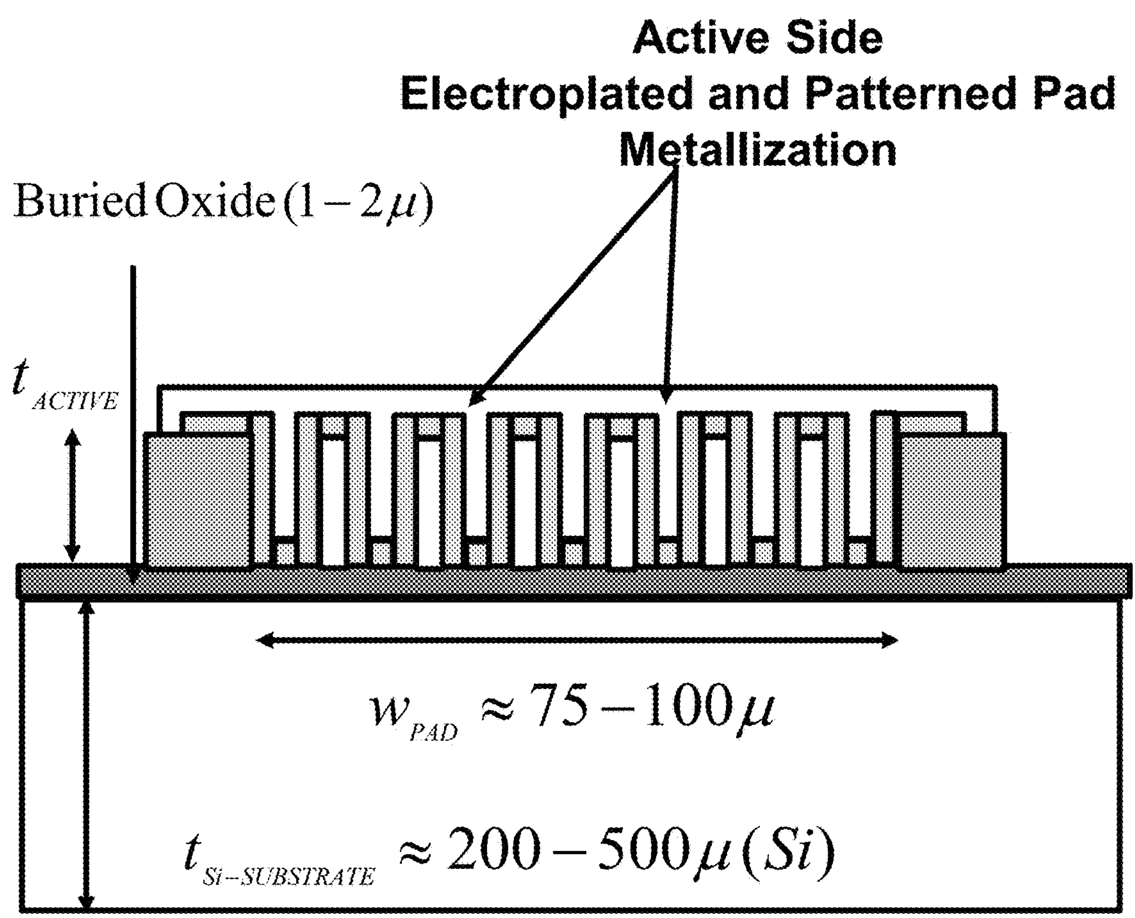
FIG. 97 through FIG. 103 are illustrations of the result of processing steps involved in making fully integrated structures according to the invention for buried oxide thicknesses between one and two microns and active IC layer greater than three microns, thus eliminating the interposer structure.
Figure 98:
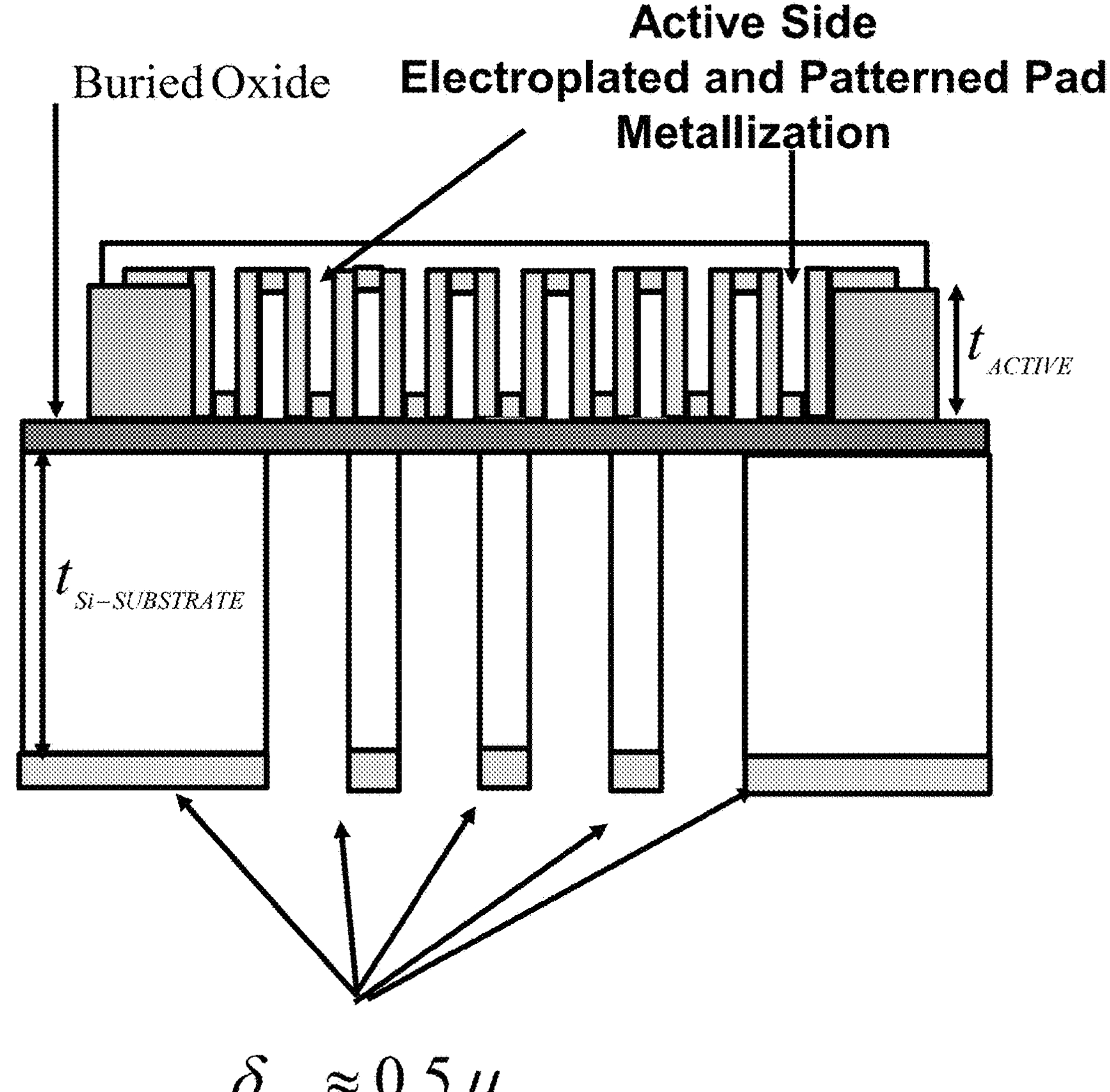
Figure 99:
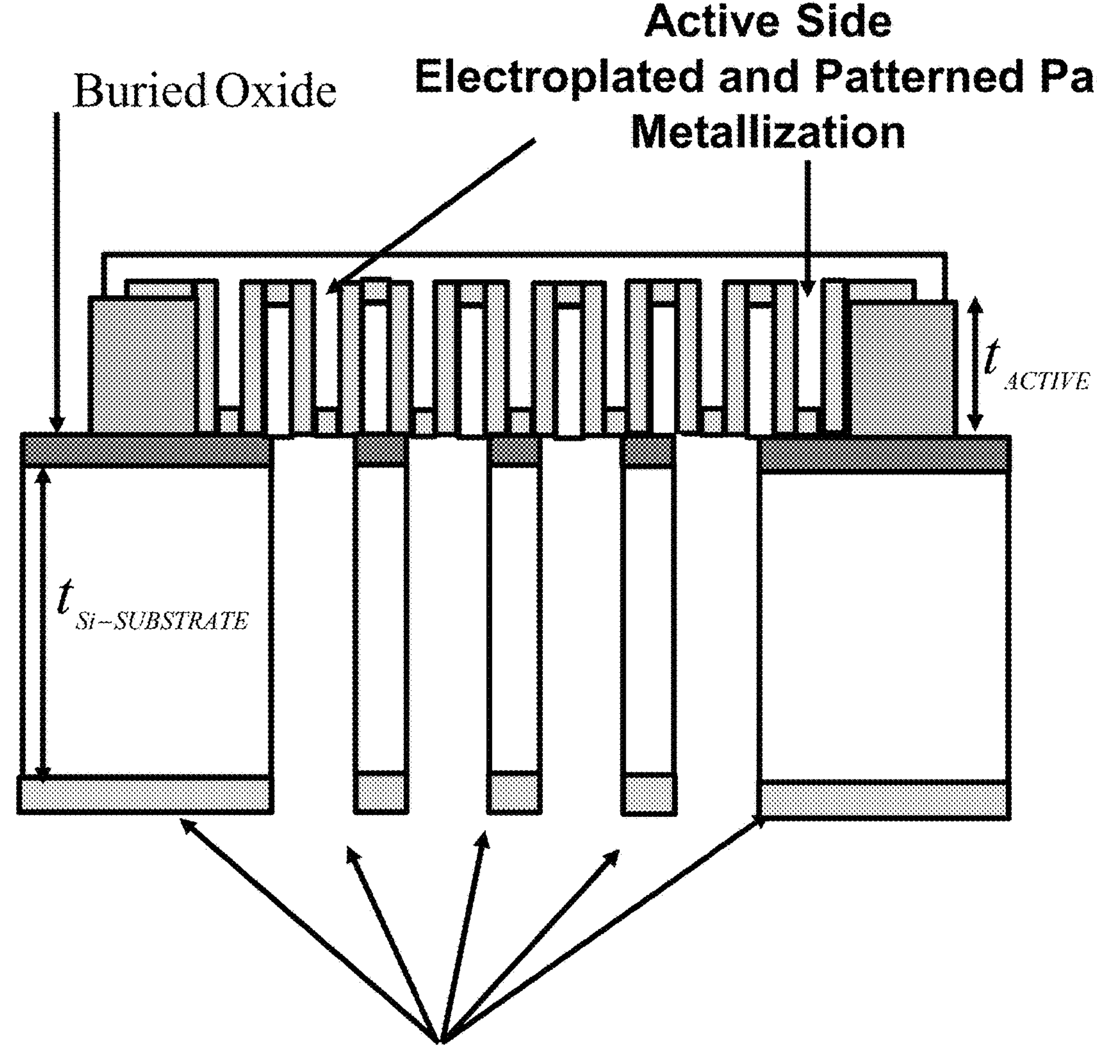
Figure 100:
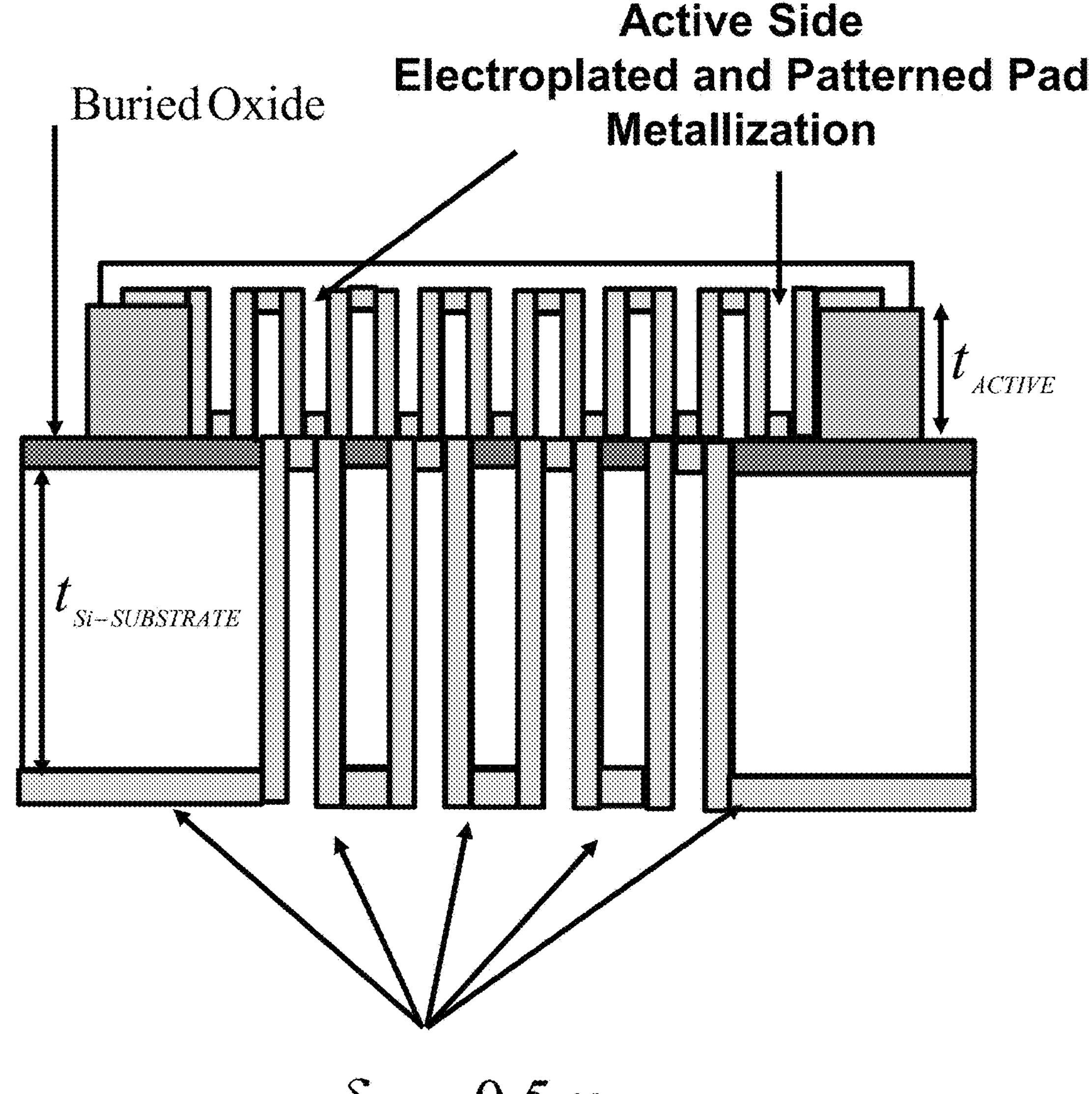
Figure 101:
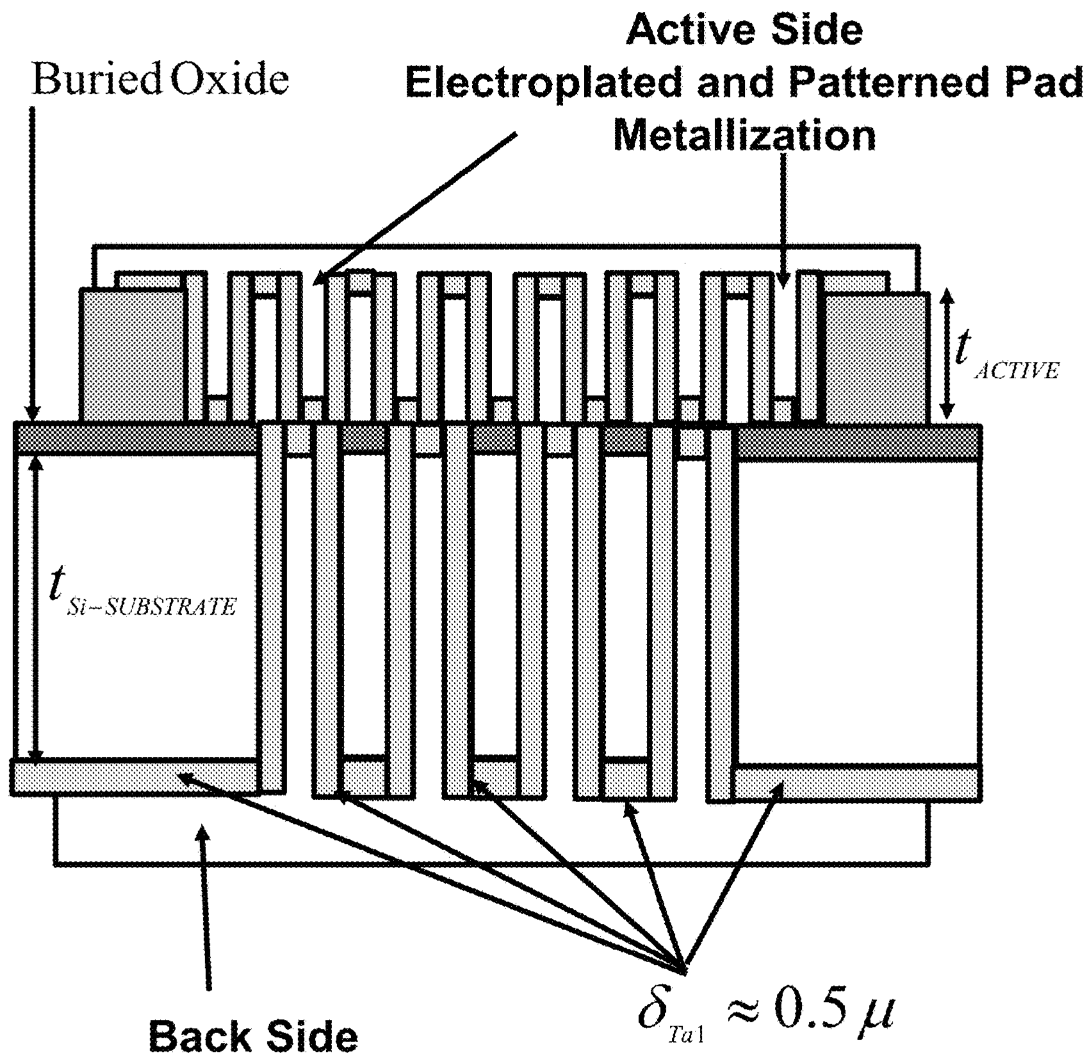
Figure 102:
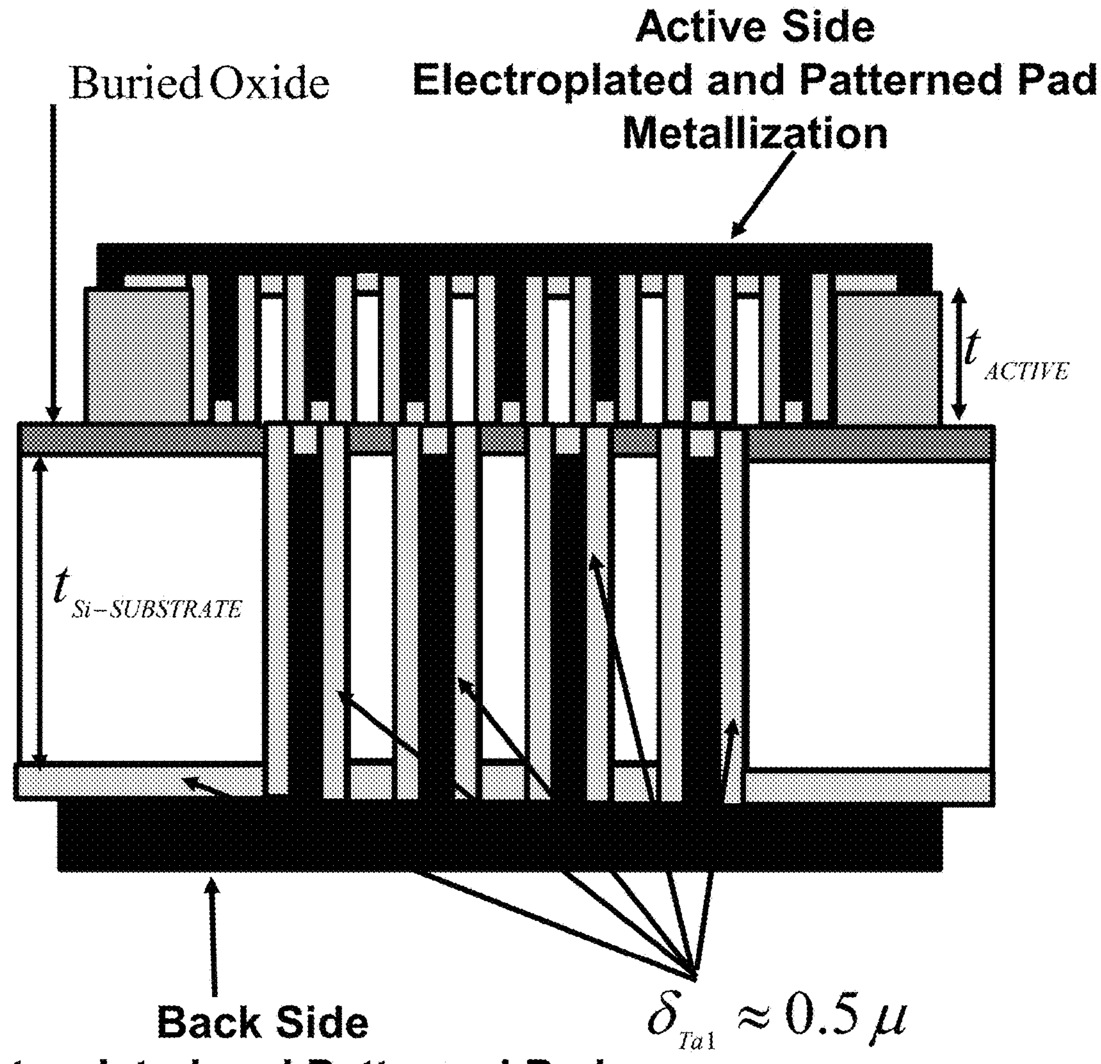
Figure 103:
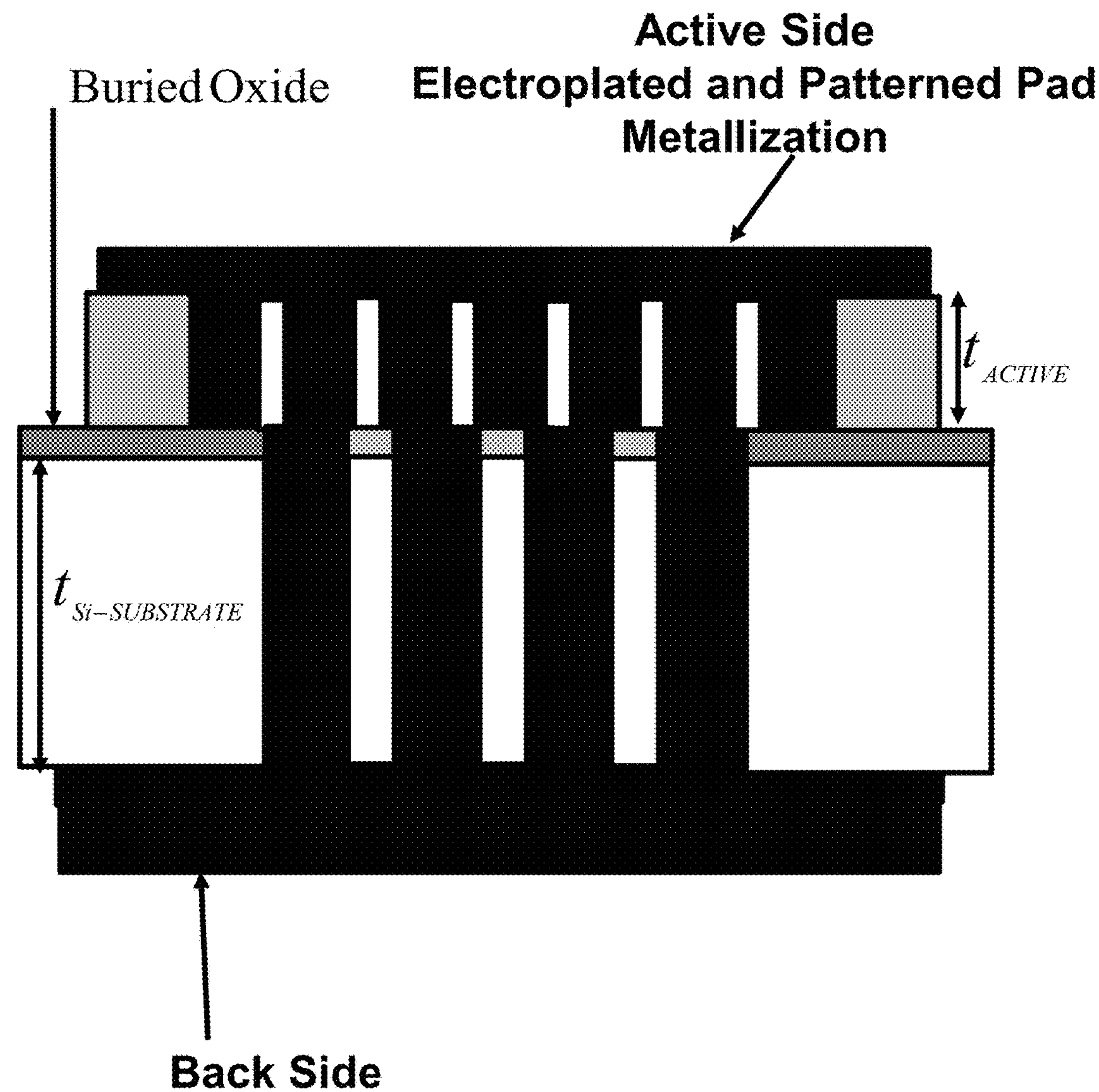
Figure 104:
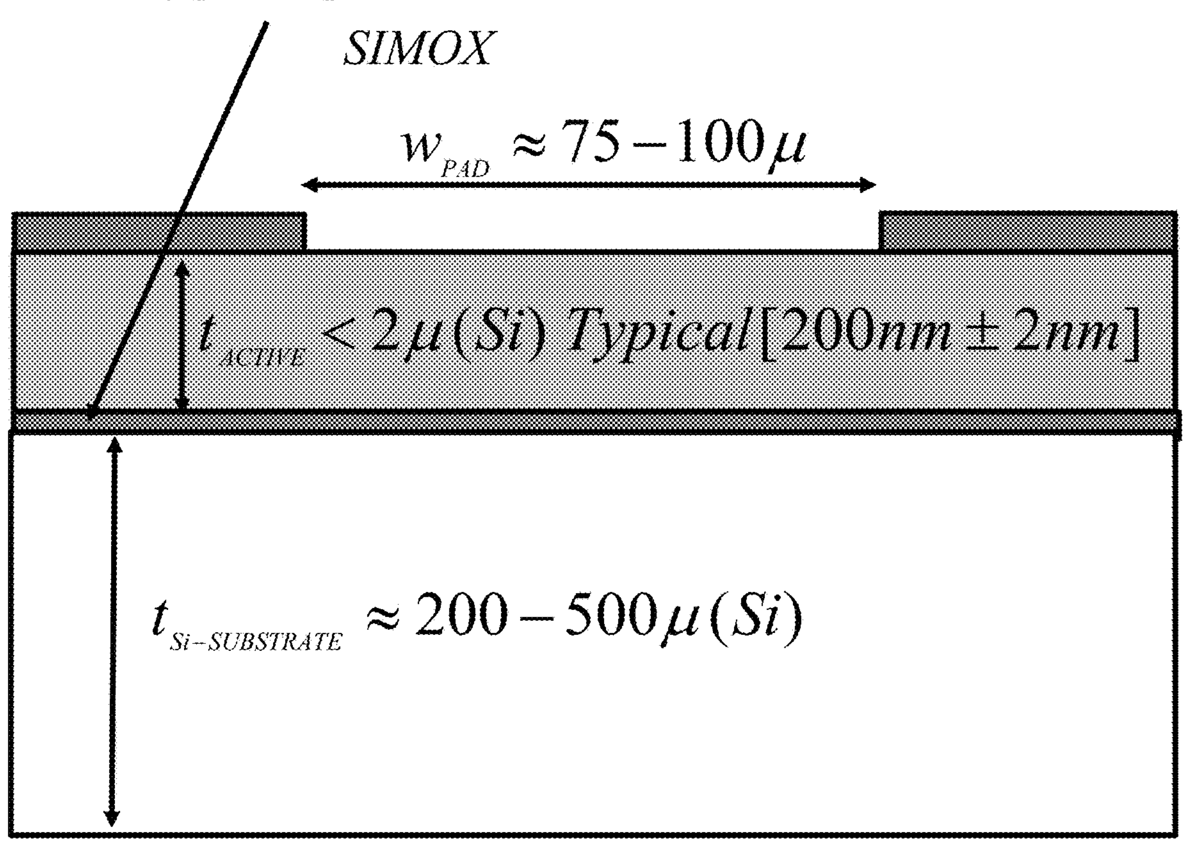
Figure 105:
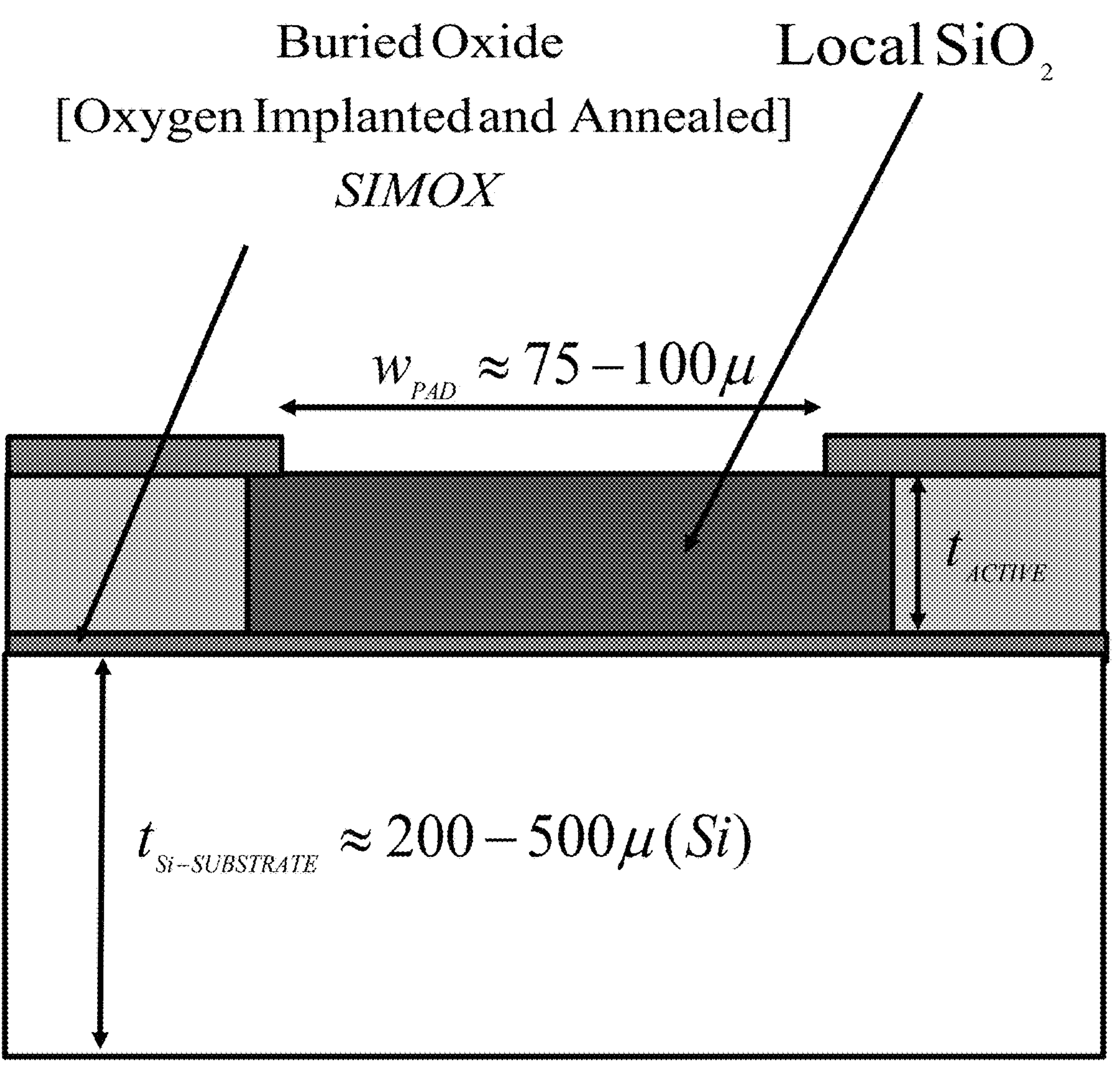
Figure 106:
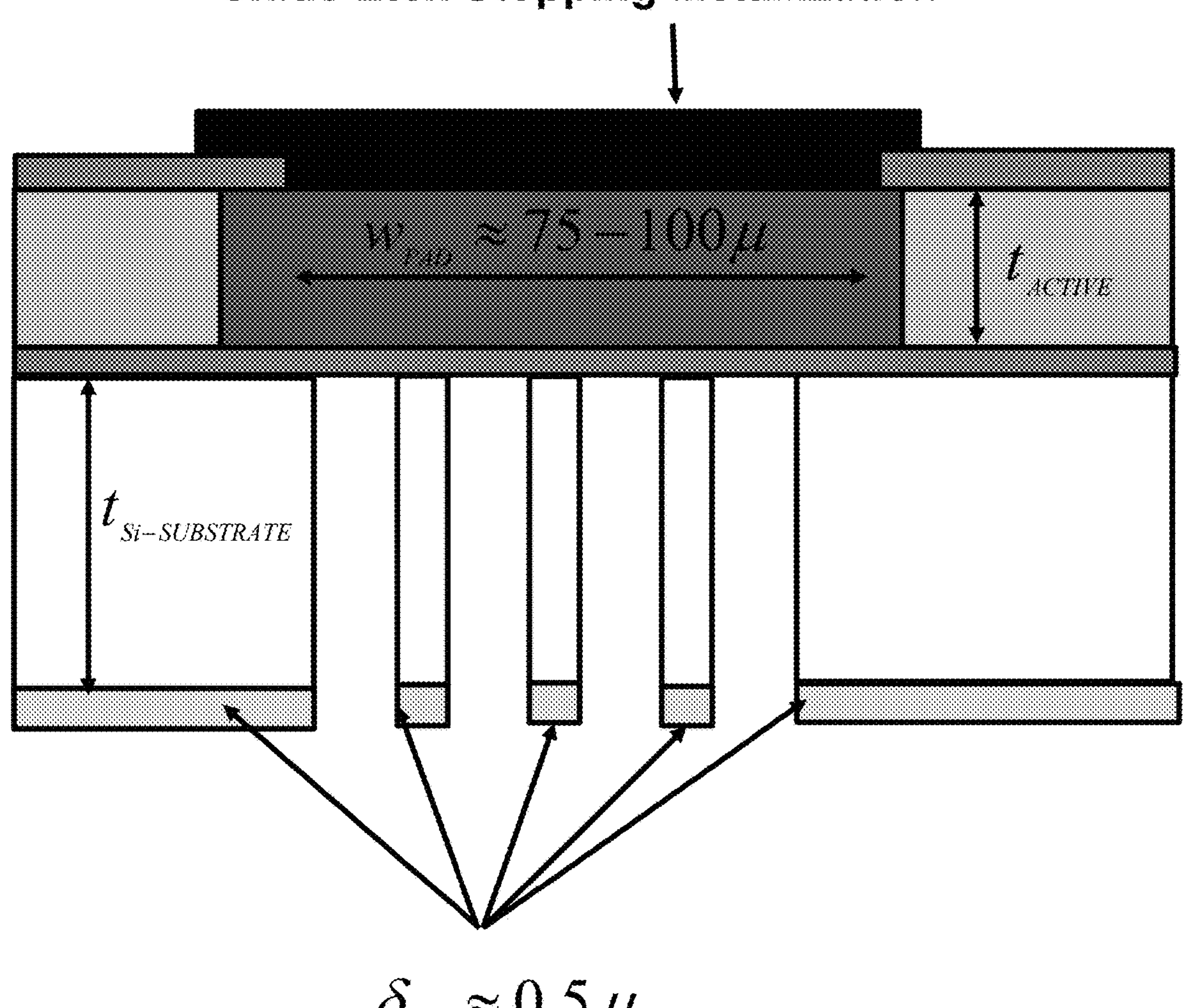

Fully integrated IC applications (without interposer). Instead of building an interposer and connecting it to the IC with C4 bumps, the whole structure can be formed as one unit. The bottom of the buried oxide region is of standard wafer thickness, on the order of 300μ-500μ, and is not used for anything other than providing mechanical handling capability for the processing steps that follow. Therefore according to this invention the spiral inductors are built in the "unused" thick under portion below the buried oxide and connected to the active device area by etching holes in the buried oxide and connecting to the first layer metallization in the active device area. In both starting materials, which can be SOI or SIMOX wafers, the IC will be built with standard processing steps on one side of the buried oxide, which are designated in the following figures as the active layer. The results of three different but related processes are illustrated in FIG. 96, FIG. 103 and FIG. 108, which closely resemble the results of a structure made with an interposer as in FIG. 92, as explained below. Shown only is the STV region, as other regions do not differ from an interposer structure. The starting material can be an SOI wafer as explained in i) or an SIMOX (oxygen implanted wafer), which is also common in processor ICs or high-performance device processes. FIG. 93 through FIG. 96 are illustrations of the result of processing steps involved in making fully integrated structures according to the invention for buried oxide thicknesses between one and two microns and active IC layer between one and three microns, thus eliminating the interposer structure. The captions with the figures recite dimensions and features that would allow one of skill in the art to make the structure. Similarly, FIG. 97 through FIG. 103 are illustrations of the result of processing steps involved in making fully integrated structures according to the invention for buried oxide thicknesses between one and two microns and active IC layer greater than three microns. Finally, FIG. 104 through FIG. 108 are illustrations of the result of processing steps involved in making fully integrated structures according to the invention for a buried oxide thickness of about 20 nm according to the SIMOX process and an active layer of less than about 200 nm. The processes differ in their ability to yield consistent metallization through the active layer penetrating into the substrate material under the buried oxide.

In the SIMOX processes, the active devices are built on top of a very thin silicon layer (typically on the order of 200 nm). The buried oxide is formed by deep oxygen implant and annealed after forming a buried oxide structures on the order of a thickness of 20 nm. This thickness of oxide will not act as a etch stop for deep silicon etch, which will be done in the substrate.

In all three noted processes, after the IC formation process is complete, the spiral inductors will be built below the active device and will be connected by etching the buried oxide and depositing metal from the other side connecting it to the previously deposited metal earlier in the active device formation step.

Figure 67:
Figure 68:
Figure 69:
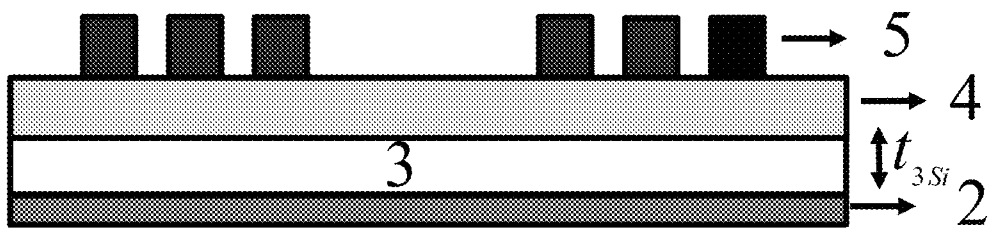
Figure 70:
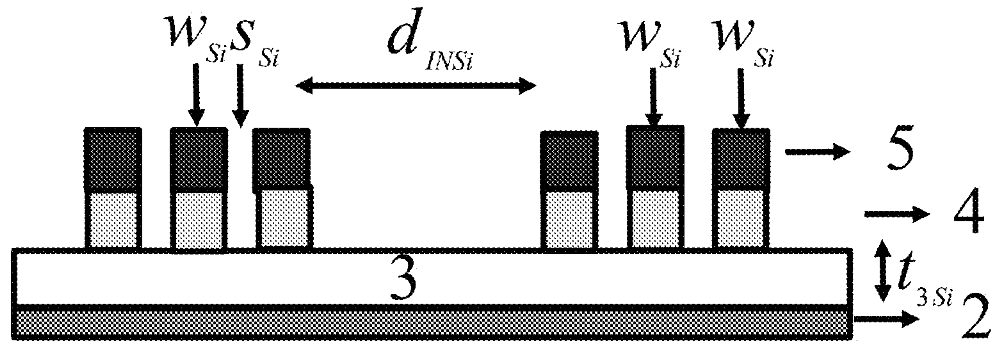
Figure 71:
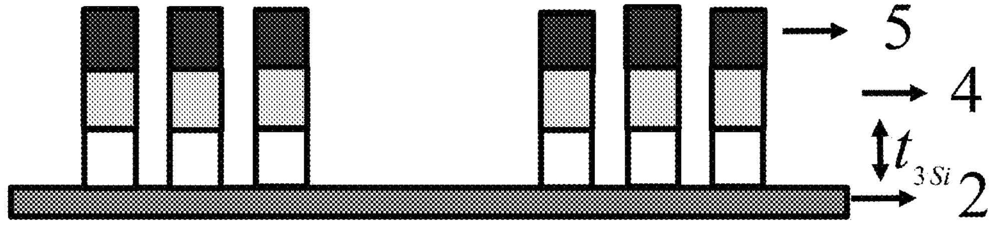
Figure 72:
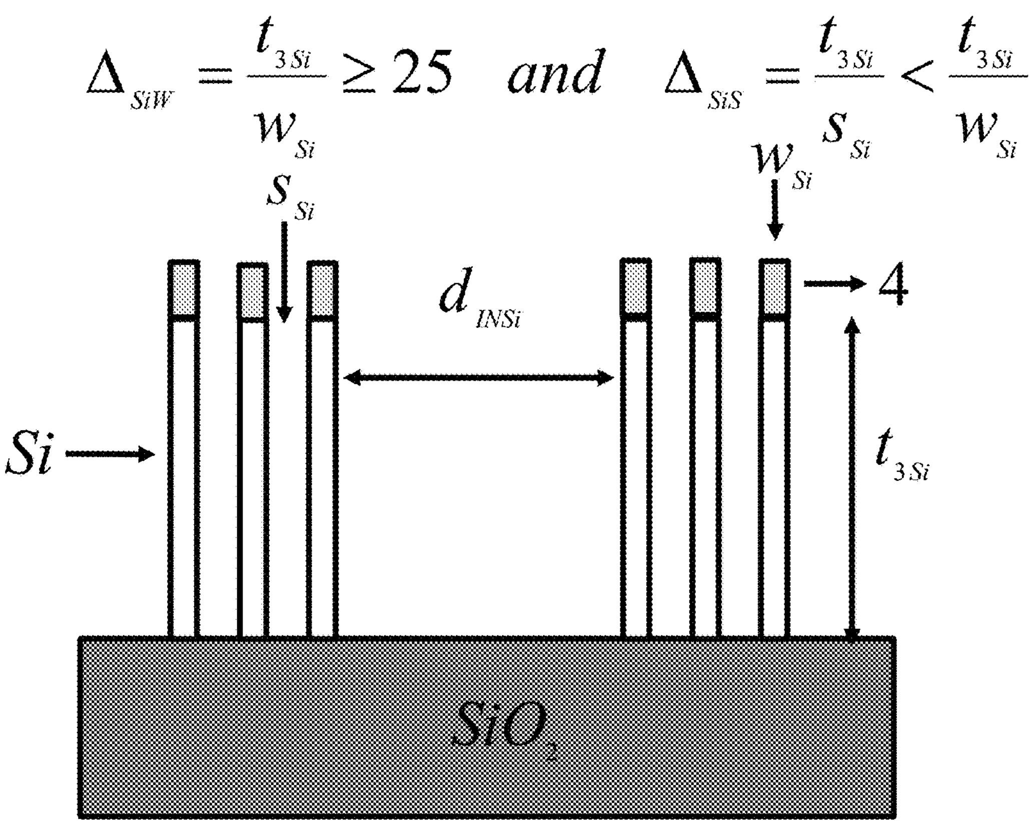

In FIG. 67 and hereafter, only the silicon and $SiO_2$ layers are shown. With FIG. 67 as the starting material or Step 1, Step 2 is to provide a tantalum deposition of the thickness as noted on the silicon layer. In Step 3 (FIG. 69) a photoresist layer 5 is deposited in a desired pattern for tantalum masking representing the structure of the spiral inductor as seen in a plan view (FIG. 1. Step 4 is a standard tantalum etch of minimum 2μ width (FIG. 70) followed by a Step 5, a deep reactive ion etching of width of 2μ (FIG. 71). Step 6 is photo resist removal (FIG. 72) but to show a better idea of the impact of this etching, FIG. 72 also illustrates the high aspect ratio achieved by a deep etch. In other words, earlier figures are a flattened version of FIG. 72. In practice, the aspect ratio is actually much more exaggerated with the aspect ratio closer to 25:1, which is difficult to illustrate. Specific example values are listed with this figure. This illustrative figure forms the basis of the following steps.

Figure 73:
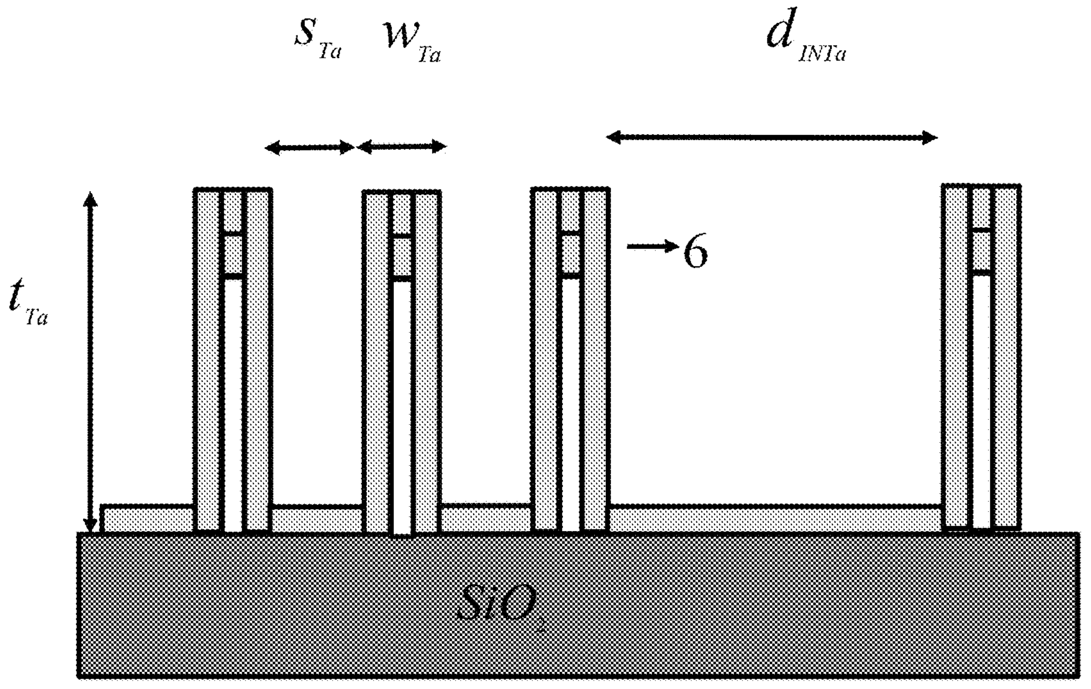
Figure 74:
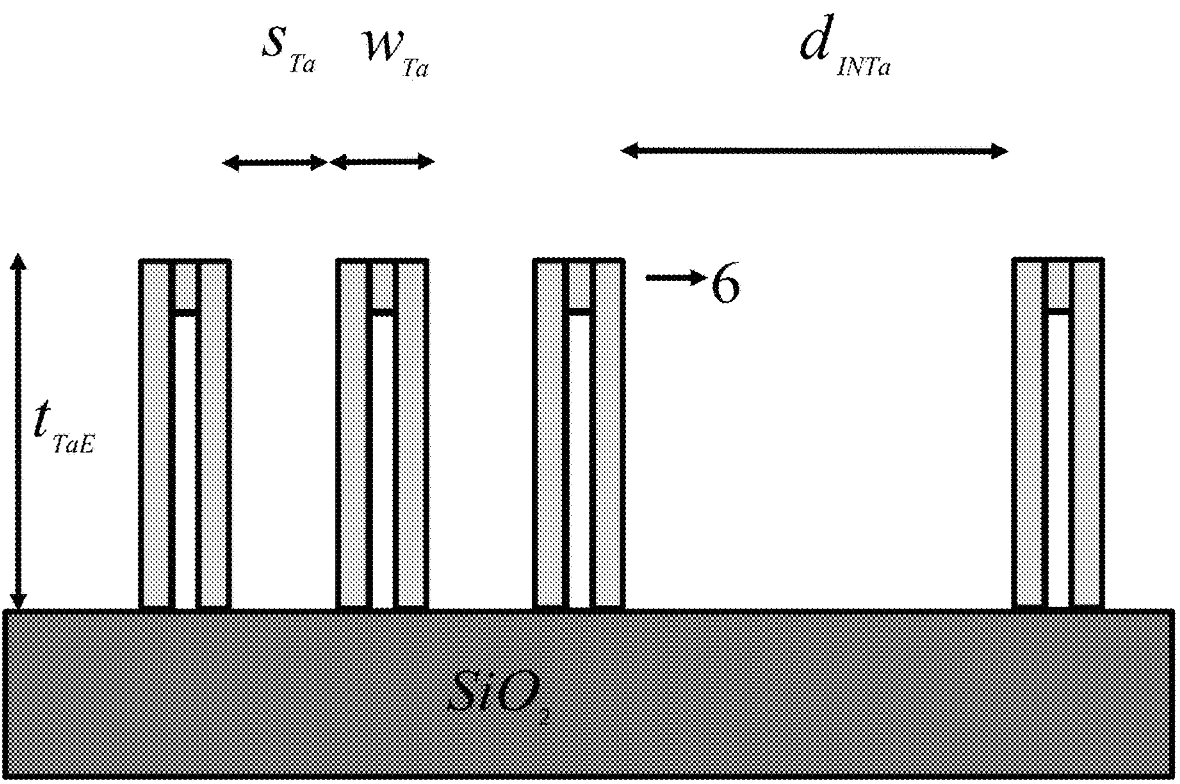
Figure 75:
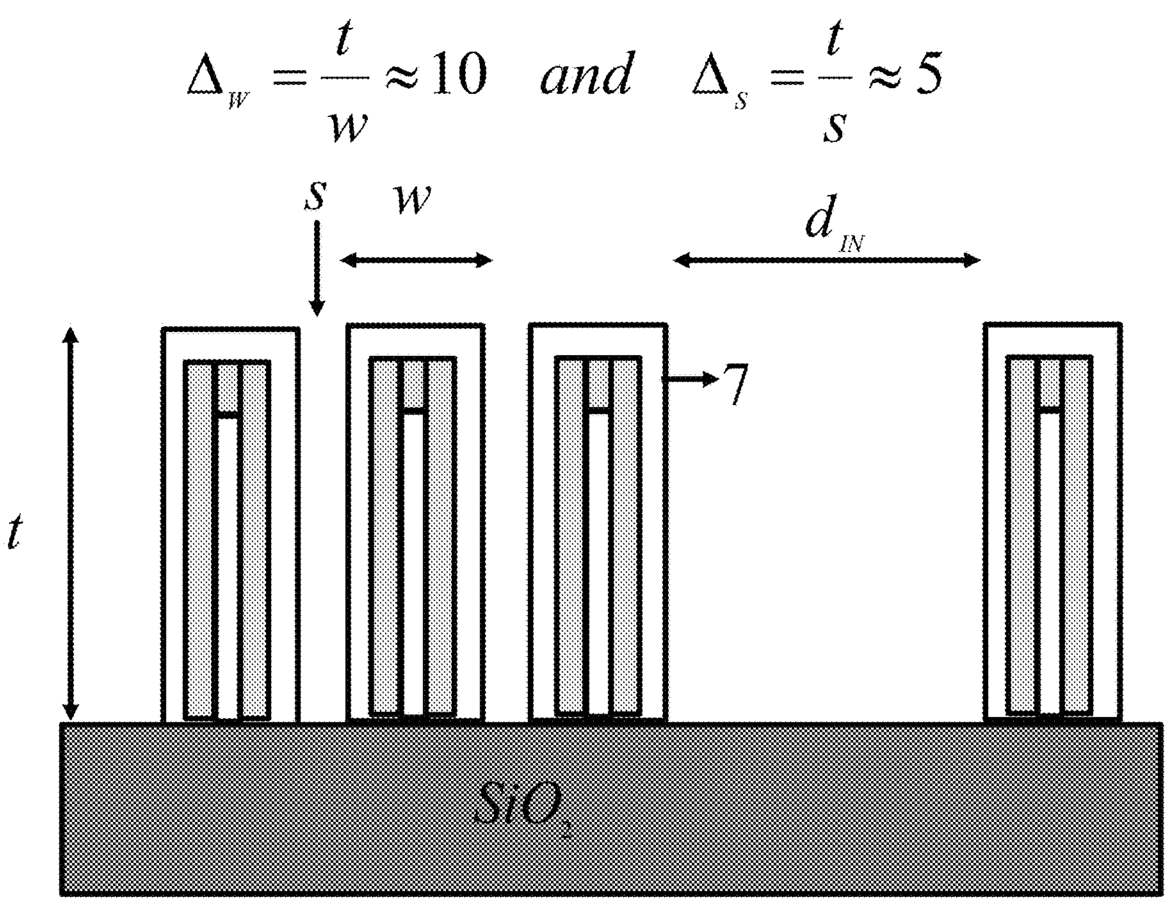

Step 7 (FIG. 73) is a second tantalum depositions step in which the sides of the pillars, as well as the valleys and ridges are coated to a typical thickness of 0.5μ. Step 8 (FIG. 74) is a directional dry tantalum etching step that only etches the valleys and the ridges to remove the 0.5μ deposition layer. A preferred dry etch is a plasma etch, which by its nature is directional. The tantalum portions of the structure are thereafter electroplated (Step 9, FIG. 75) to coat the windings on both opposing surfaces and the top of the ridges. The structure is essentially complete, except for interconnections.

Figure 76:
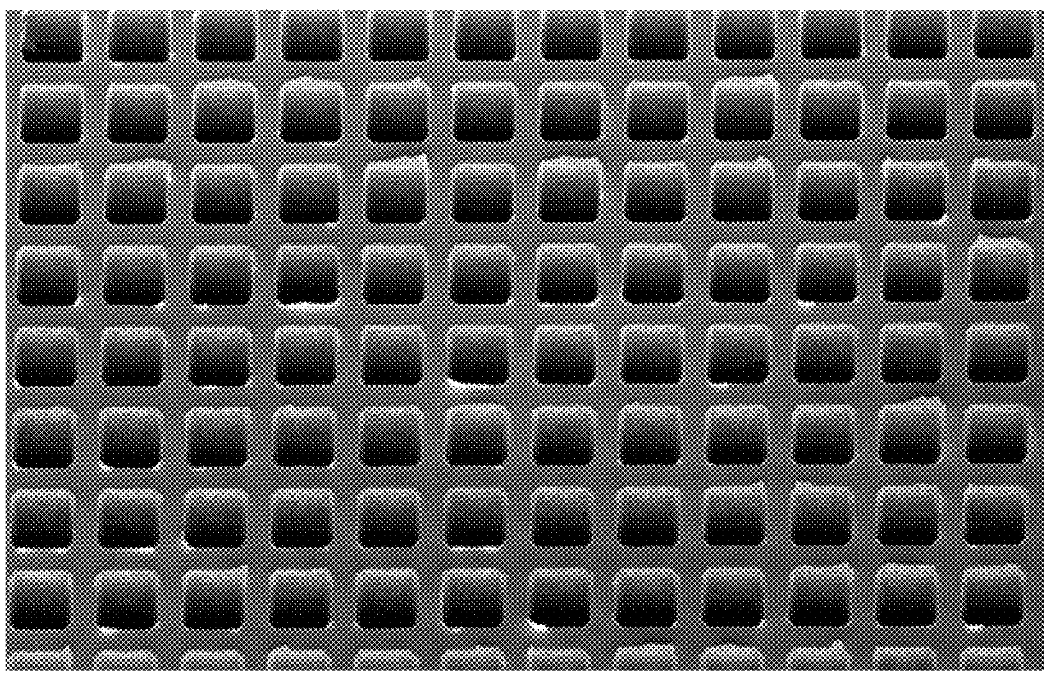
FIG. 76 is a SEM image of a grid of test structures illustrating silicon core encapsulated by tantalum.
Figure 77:
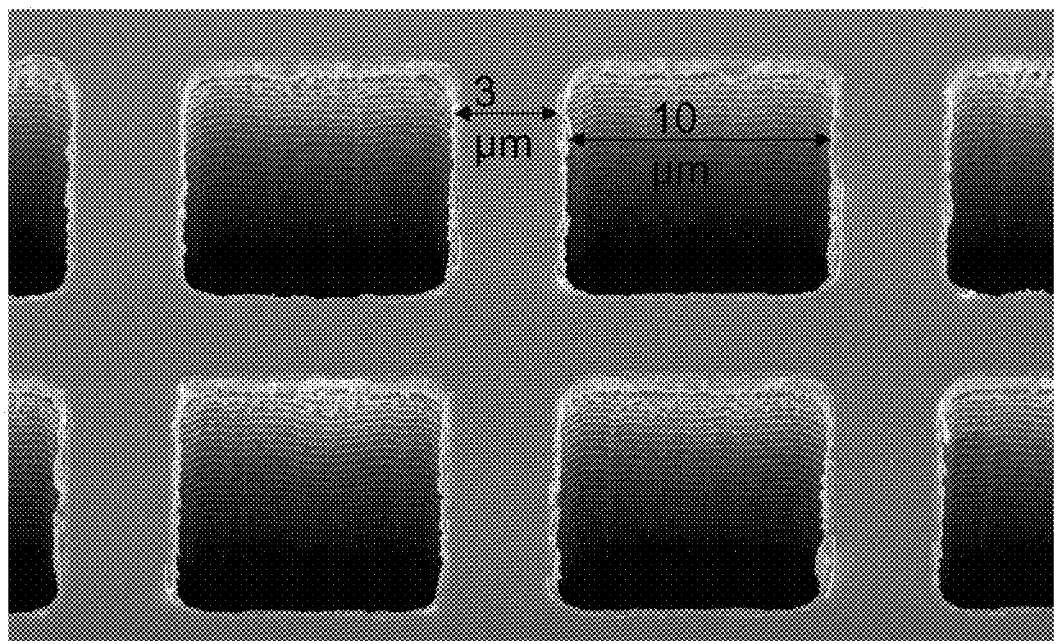
FIG. 77 is an expanded SEM image of a grid of test structures illustrating silicon core encapsulated by tantalum.

FIG. 76 and FIG. 77 are images of a scanning electron microscope of a grid structure made in a process based on the invention in a test that confirms that such a structure of these deep, narrow and closely spaced dimensions can actually be achieved. In practice, a spiral structure would be formed with ridges in the shape shown schematically in FIG. 75. The shown structures are built with $\Delta_{SiW}$=25 and $\delta_{TA}$=0.5μ and $t_{Si}$=50μ.

Figures 78, 79:
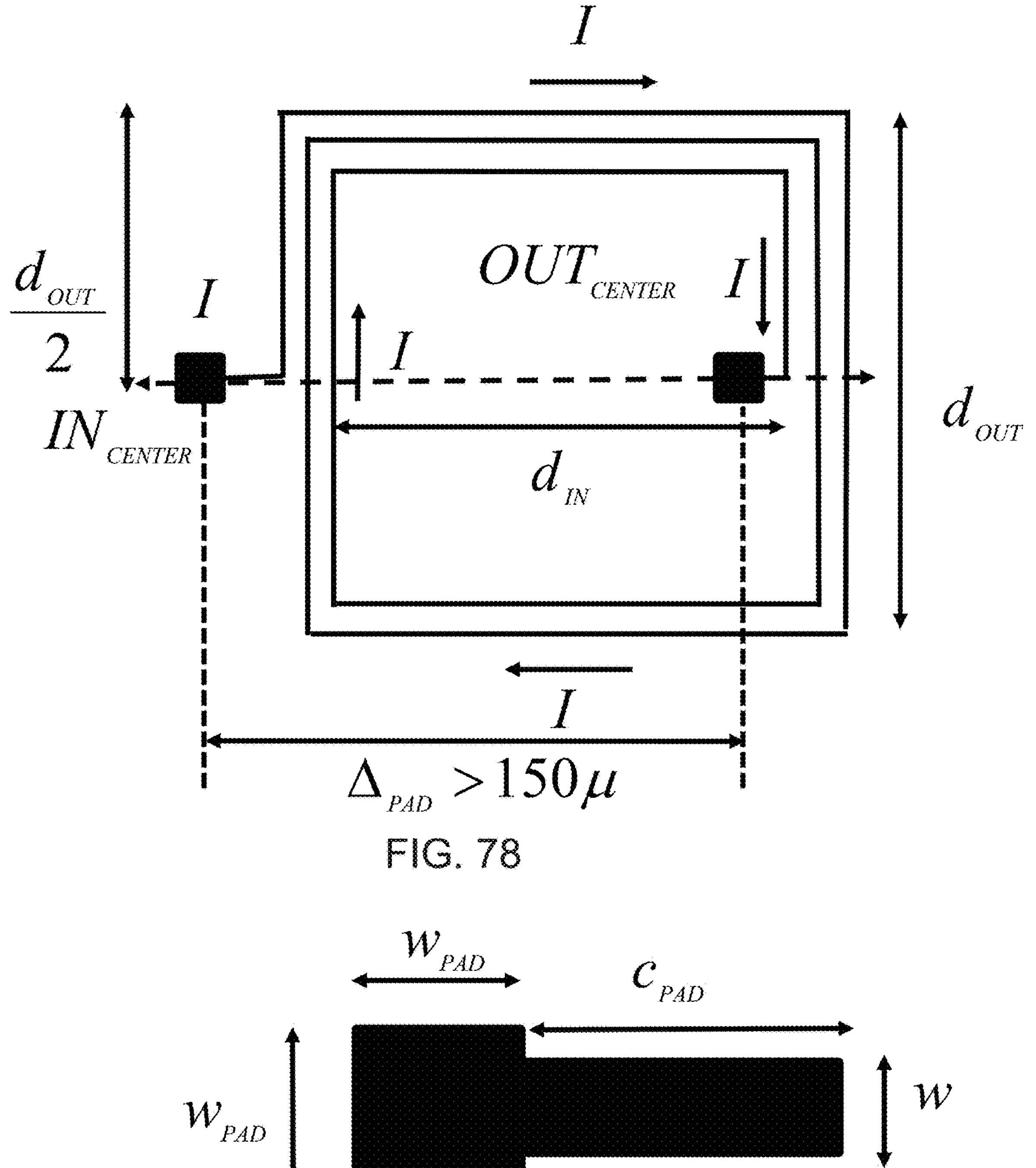
FIG. 78 is a schematic of a spiral structure according to the invention illustrating a preferred alignment of pad layout for interconnection of an interposer-type structure.
FIG. 79 is a top plan view of a pad for an interposer structure.

FIG. 79 is a top plan view of a connector pad as for the IN terminal and OUT terminal of FIG. 78. The width and length dimensions need to be large enough to accommodate a small solder ball, such as a C4 bump, to connect to an IC or an external pad according conventional technology. The width of the pad must be wider than the winding width to assure effective connectivity. A typical pad $w_{PAD}$ is 75μ to 100μ square with a lead tab $C_{PAD}$. Micro-bump technologies permit smaller pad dimensions. As explained below, the lead tab may connect to one or more conductive columns. The cross-section of the columns may be square, rectangular, triangular, circular, oblong, or a combination thereof or interconnections among combinations. If columns are not used, as for example shown in FIG. 92, then the C4 bump touching a thick silicon substrate simple will not conduct effectively, and in fact cannot even be built. FIG. 101 through FIG. 103 show structures that provide effective conduction for C4 bumps on both sides of the structure.

Figure 80:
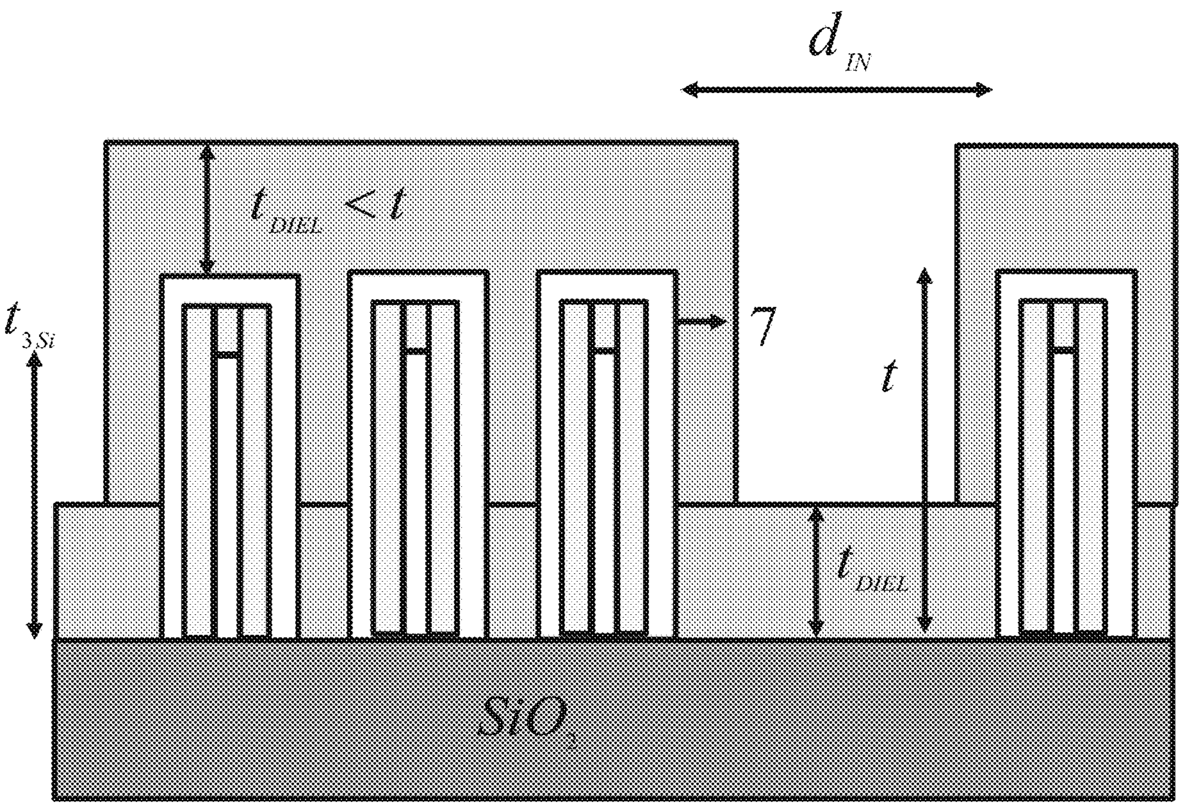
FIGS. 80 through FIG. 85 are illustrations of the result of process steps for interconnection of interposer C4 bumps.

To achieve a suitable interposer structure with C4 bumps, it is necessary to embed the inductor and its terminals in a dielectric material. Step 10 (FIG. 80) is the process of immersion of the structure in a dielectric, such as by conventional low-pressure chemical vapor deposition of $SiO_2$ to be able to select the pad and bump positioning on the structure. Other alternatives are organic dielectric materials with good step coverage, such as polyamide or parylene deposition to achieve planarization of the structure to more effectively connect with C4 bumps.

Pads in the HARMS process have two main functions and their geometry are preferably kept as a square with a dimension of $w_{PAD}$, larger than spiral windings w, regardless of the total width of the spiral windings w as shown in FIG. 79.

The first function of the pad is to provide a low resistivity path from the solder bump on top of the interposer to the bottom of the thick spiral windings which is in the order of 300μ, while solder bump rules for electrical connectivity is maintained. Their placement and size are basically dictated by solder bump rules which have pad size which are in the order of 75-100μ placed in a given periodic "pad array spacing rule". Having pads in an array, rather than arbitrary placement, brings ease in the alignment between the interposer and the bumps on the IC.

Figure 81:
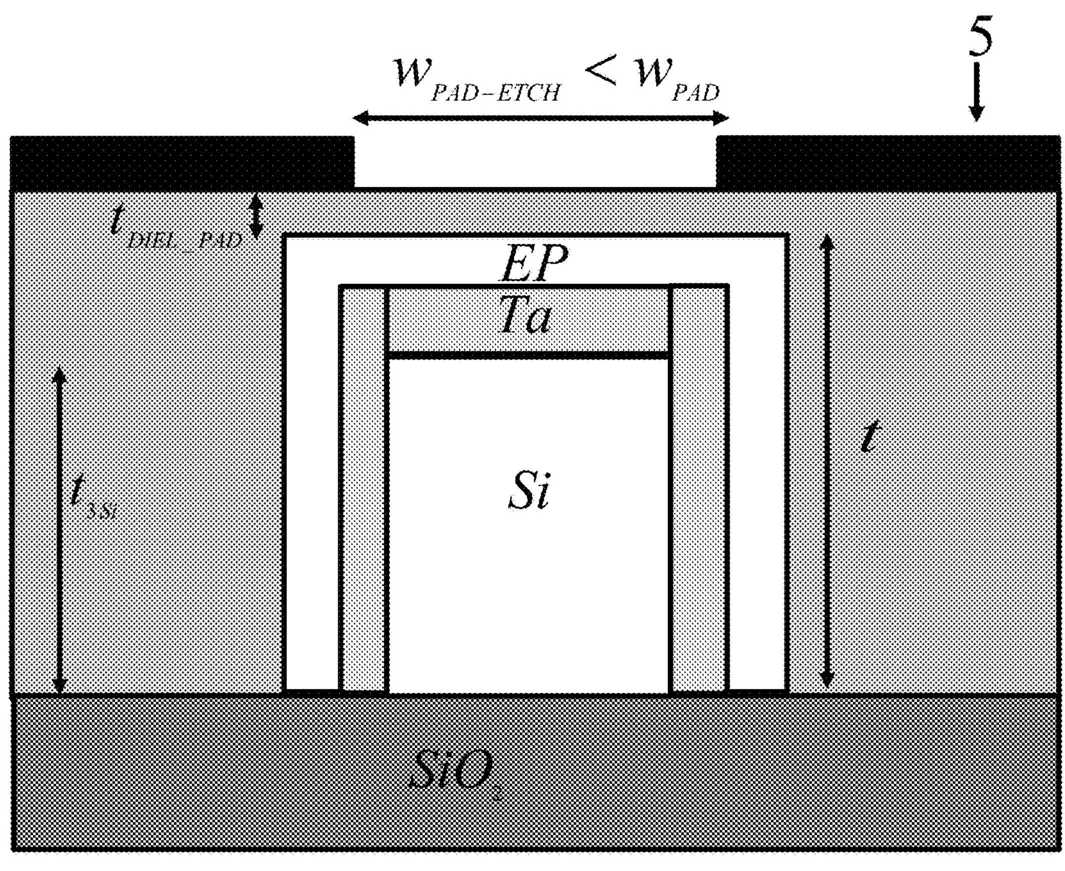
Figure 120:
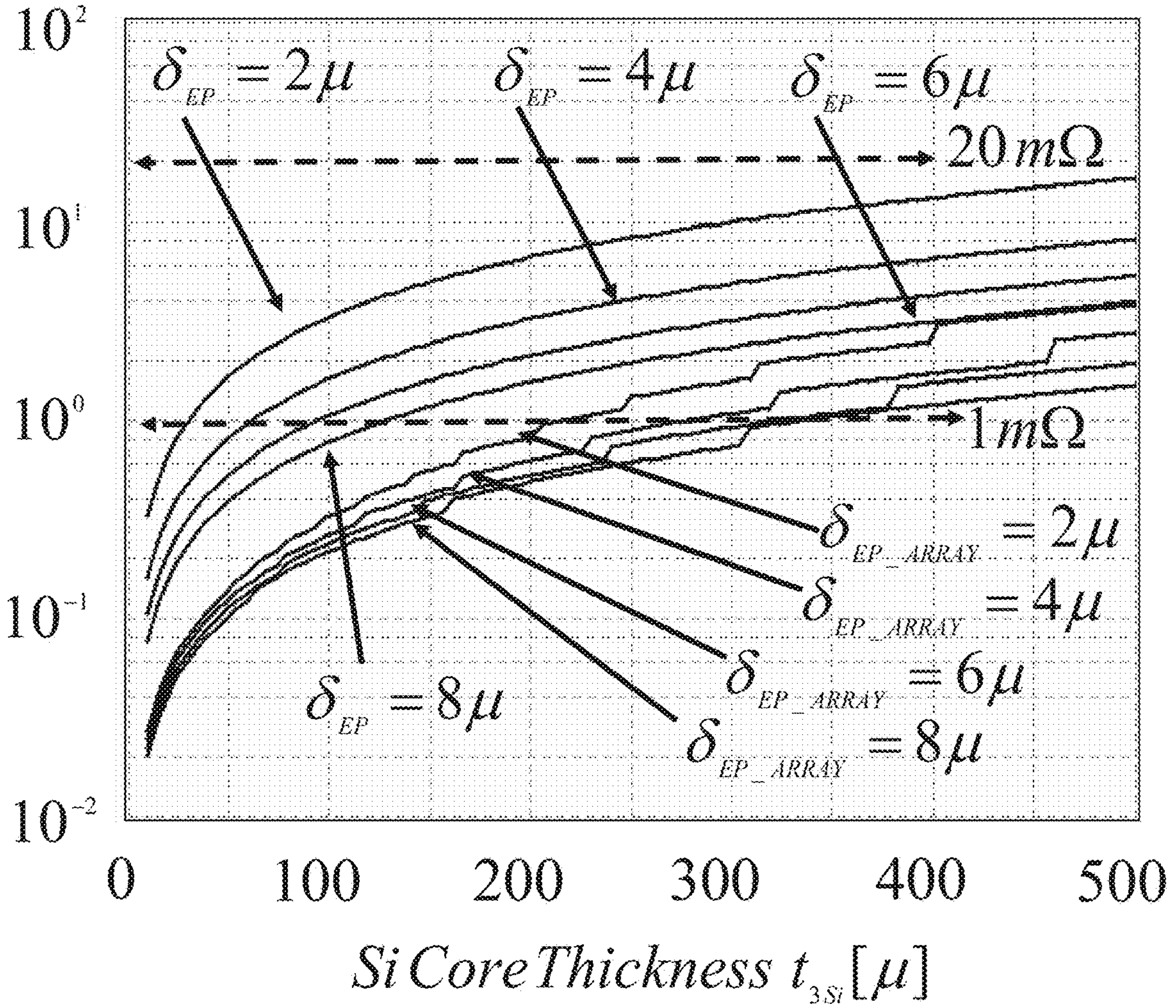
FIG. 120 is a graph illustrating the relationship between "silicon through via" (STV) resistance and inductor contact resistance vs. silicon core thickness and electroplating thickness.

Step 11 is the provision of a pad etch for a single pad. Having a pad with a single-square Si pad core as shown in FIG. 81, with a pad size of 75-100μ per side gives the desired low resistivity path for many applications from a solder bump place on the top of the interposer to the bottom of the thick spiral windings. The top four curves shown in FIG. 120 show the STV resistance as a function of electroplating thicknesses of $\delta_{EP}$=2, 4, 6 and 8μ as a function of silicon core thickness. As can be seen, the STV resistance and the "contact resistance," which is the distributed resistance from the top of the C4 bump to the bottom of the inductor, can be larger than 2 mΩ for Si core thicknesses exceeding 200μ. As can be seen in FIG. 120 the contact resistance can even approach a remarkably small 20 mΩ for $\delta_{EP}$=2μ! Since every inductor will have two C4 bump connection and as shown in FIG. 118 the "total resistance" which includes twice the contact resistance plus the active spiral winding resistance of the inductor has to be kept less than 20 mΩ for DC/DC converter applications. Therefore this "apparently"

low resistance is actually unacceptably high for these applications and should be kept less than 1 mΩ!

Figure 82:
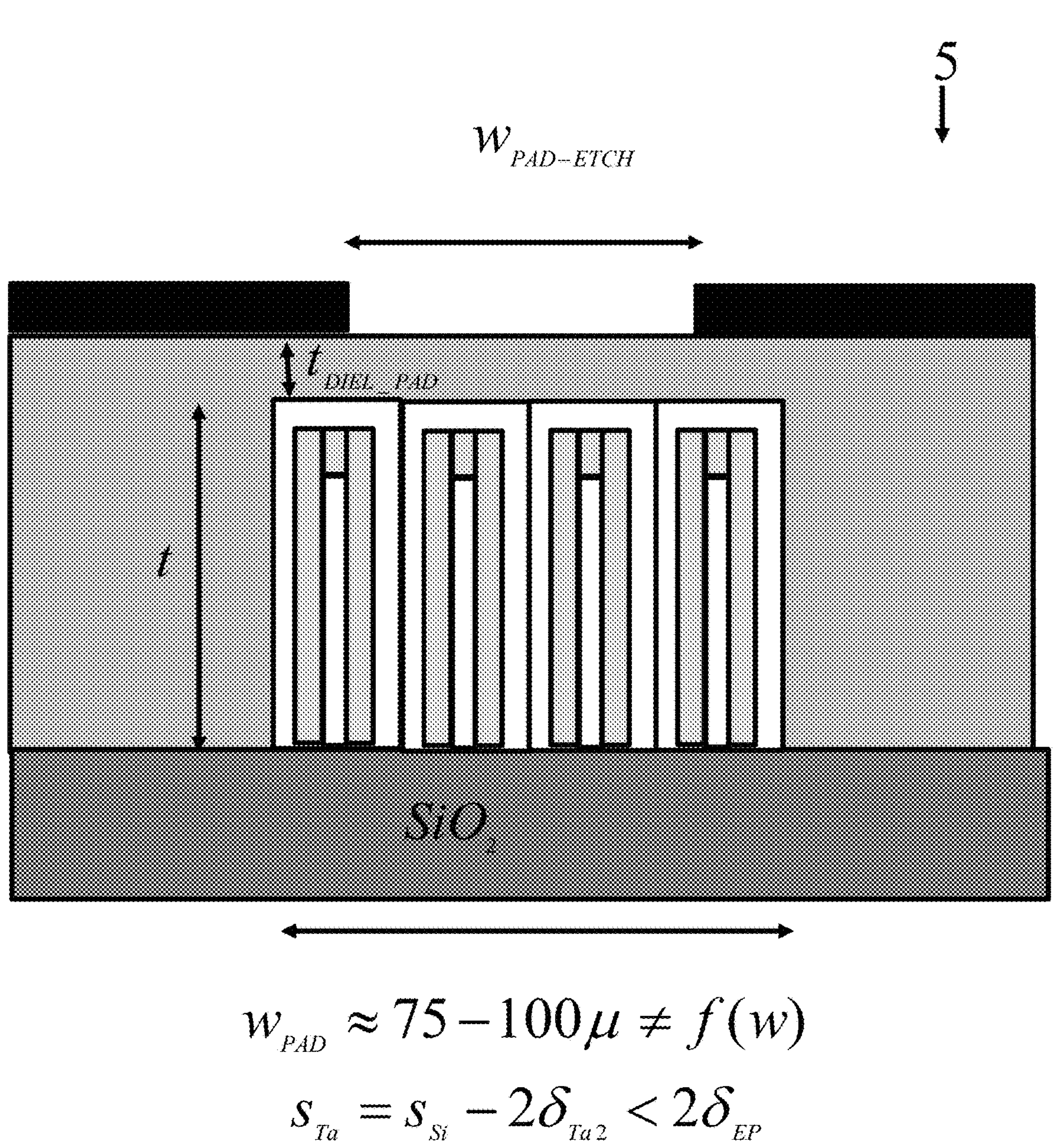
Figure 83:
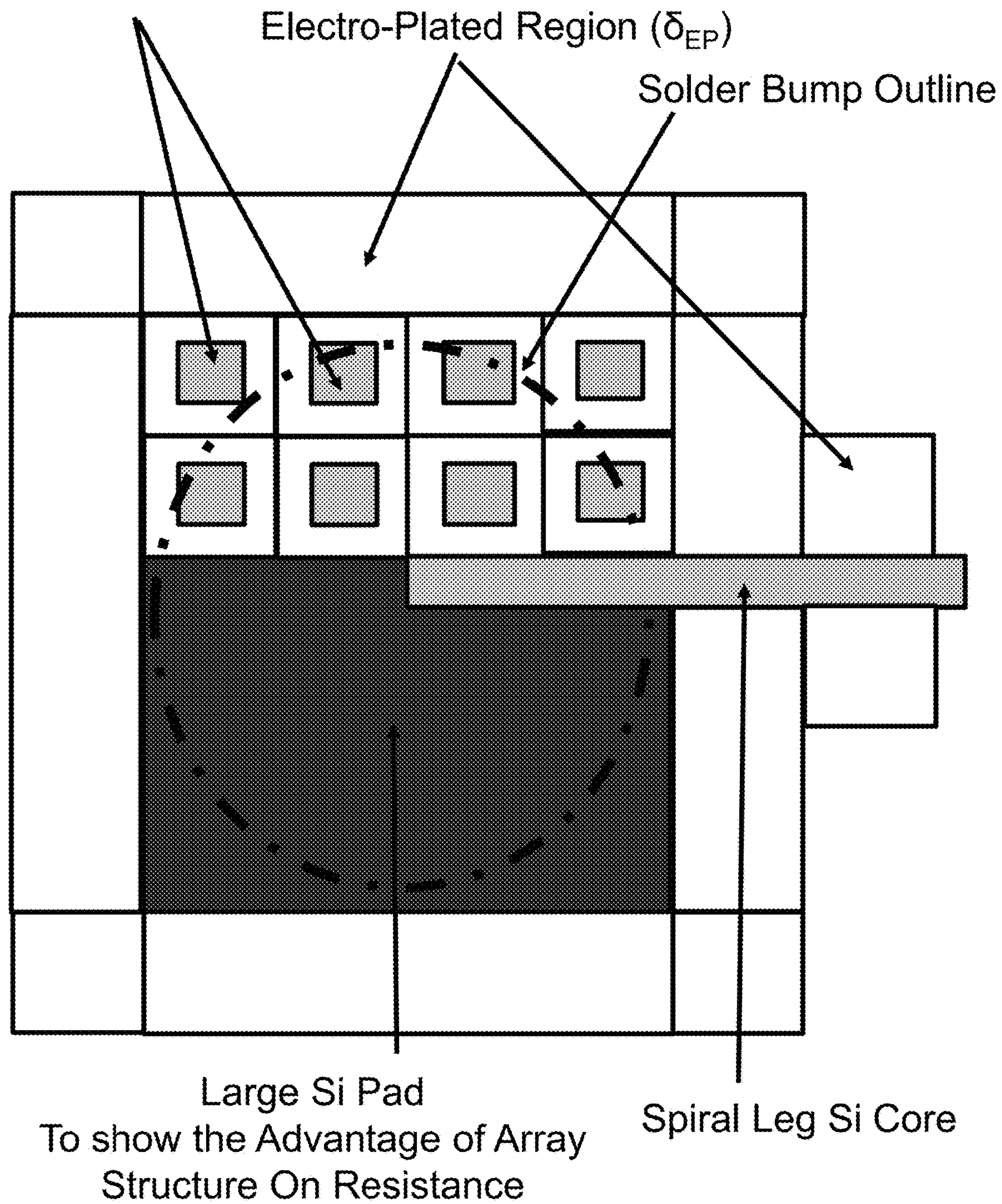

However, to further reduce resistance to the solder bump on top of the interposer to the bottom of the thick spiral winding and to create a better contact, the underlying structure can be built as an array of square Si Columns spaced more closely than the $2\delta_{EP}$ that is typically used in array spacing as shown in FIG. 82 and FIG. 83. Accordingly, Step 11.1 is an alternative step. With this arrangement the space between the columns will be filled with electroplating metal in the electroplating step as shown in FIG. 82. This of course is something that must be completely avoided for spiral windings! Compared to the simplified Single Si Core pad connection shown in FIG. 81 this arrangement gives much smaller resistance between the solder bump on top of the interposer to the bottom of the thick spiral winding, which can be shown with 3D resistance simulation. The size of the square Si columns is a function of the Si Core thickness and can be calculated using the same $\Delta_{SiW}$=25 rule also having a minimum dimension of 2μ by 2μ. As an example for Si Core thickness $t_{3Si}$ of 300μ and $\delta_{EP}$=8μ, the square Si column dimension will be on the order of 12μ spaced less than 16μ. FIG. 83 is an example of an arrangement that will significantly increase the effective area of the current path from the solder bump to the bottom of the thick spiral windings and improve yield for good contacts.

Figure 119:
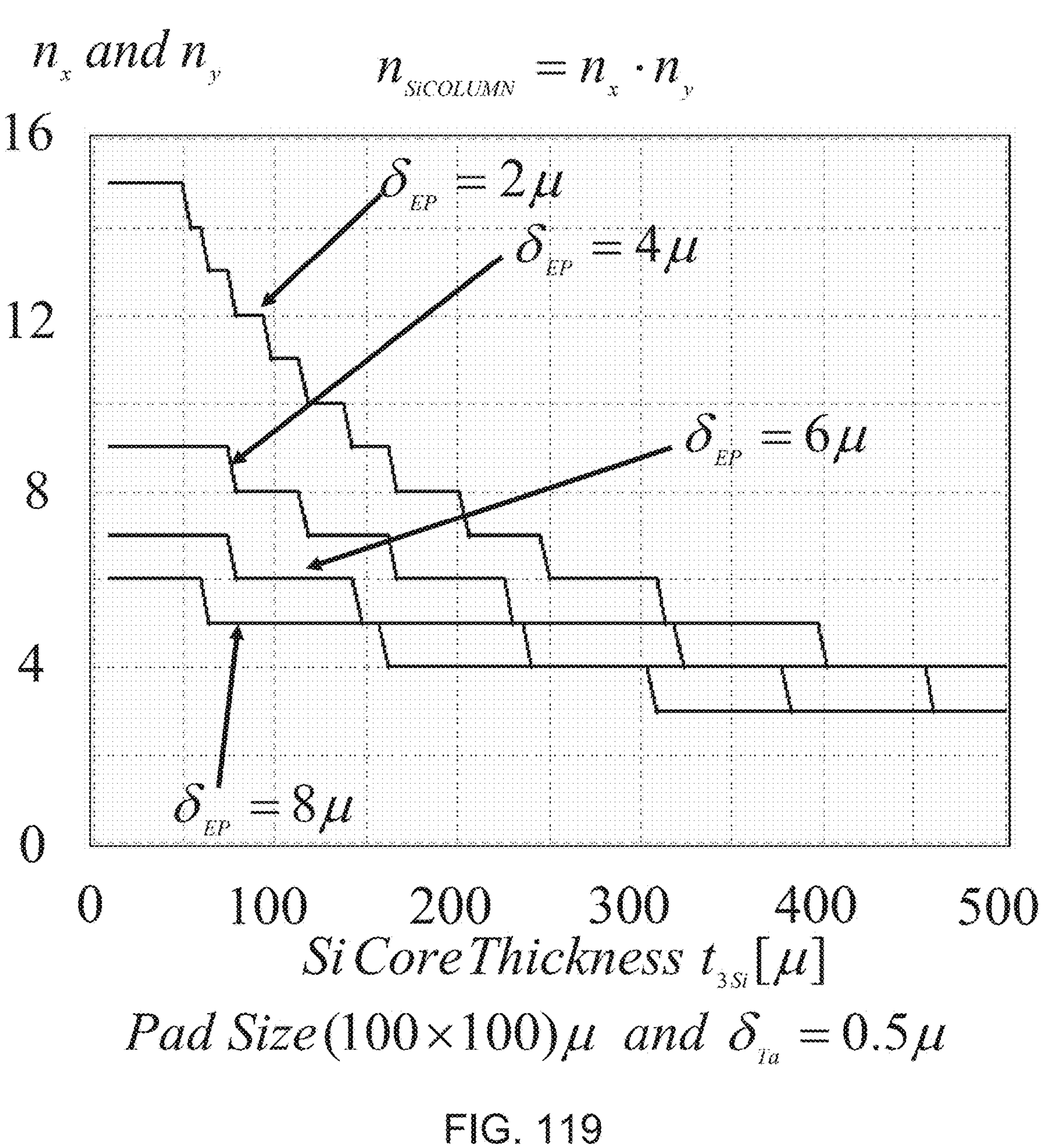
FIG. 119 is a graph illustrating the relationship between core column numbers and silicon and electroplating thickness in FIG. 83.

FIG. 119 shows the integer number of silicon columns which can fit in a 100μ pad size as a function of Si Core thickness for electroplating thicknesses of $\delta_{EP}$=2, 4, 6 and 8μ generating a vertically conductive grid structure. As can be seen at the far right end of the plots towards the 500μ of Si core thicknesses, 3 to 4 Si columns can fit side by side with $2\delta_{EP}$ spacing in between them by arranging the Si column dimensions. The lower family of four curves shown in FIG. 120 shows the impact of this Si column array configuration on the STV and "contact resistance" of the spiral inductor compared to the single Si column arrangement. As can be seen the contact resistance of 1 mΩ threshold value (marked as the bottom dashed line) can be met for this arrangement for even large Si core thicknesses.

Figure 84:
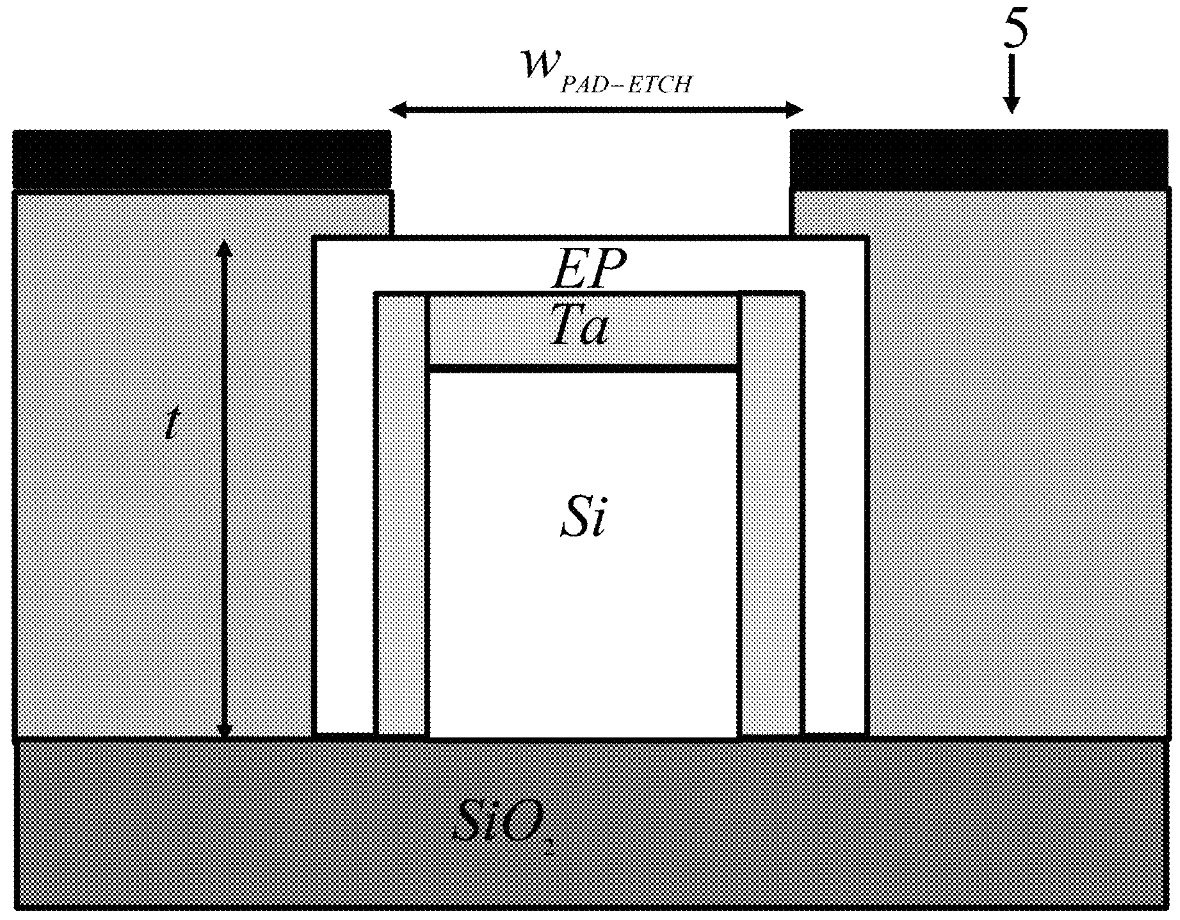
Figure 85:
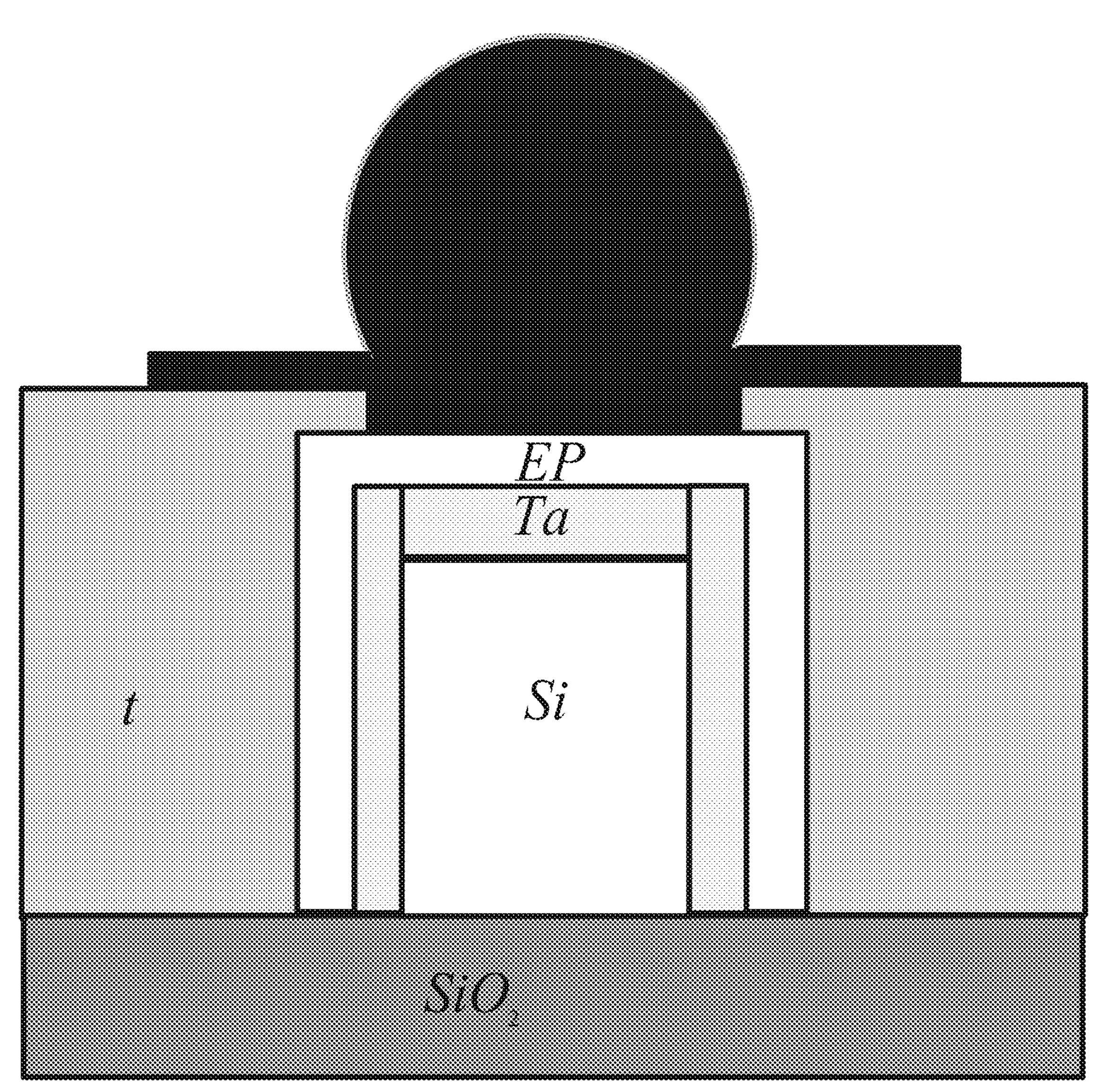

Referring to FIG. 84 there is shown the result of a Bump Pad Etch step (Step 12) that opens the dielectric to allow for placement of a C4 bump connection to the underlying electroplating metal (EP layer) (Step 13 FIG. 85).

Figure 86:
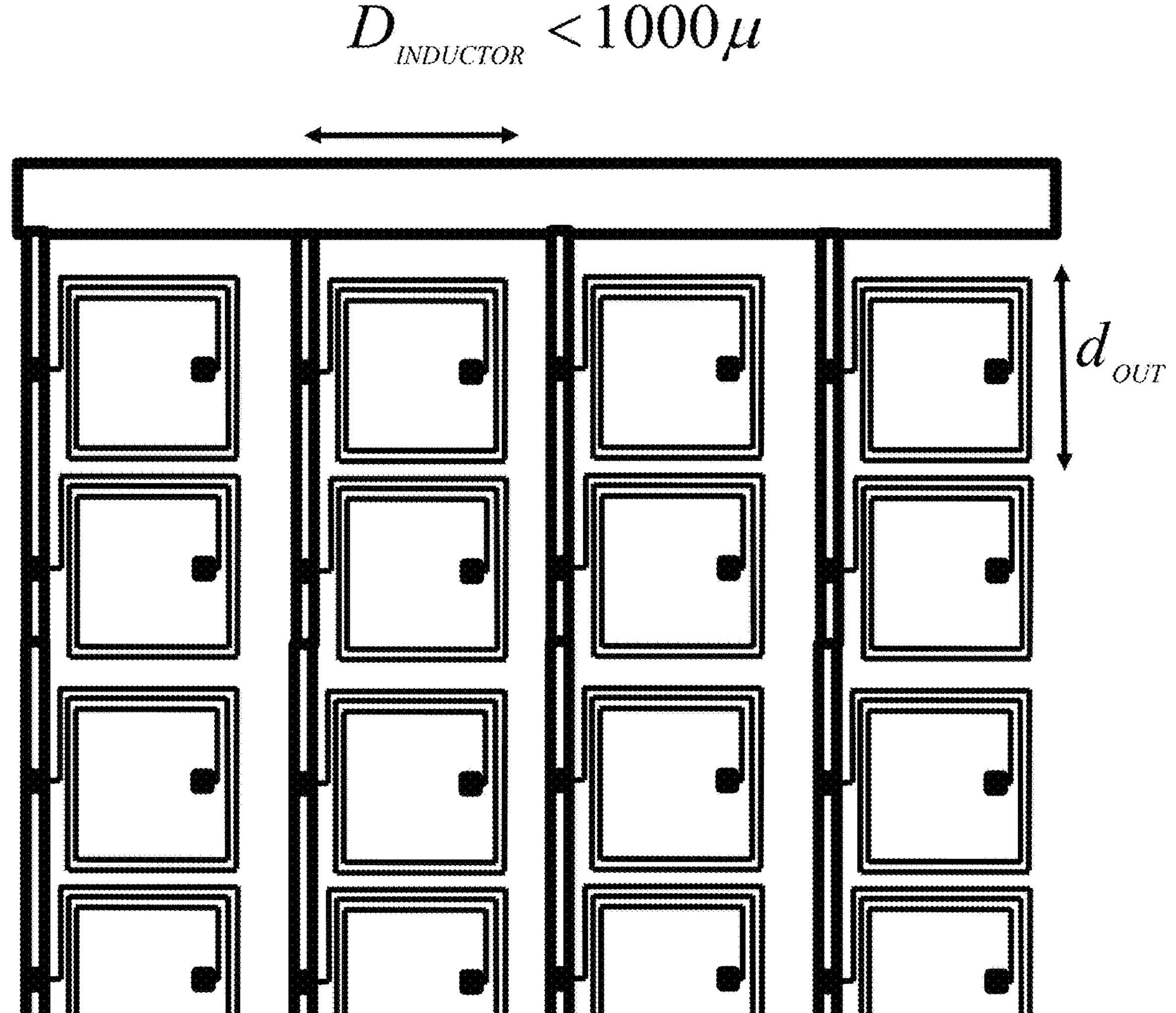
FIG. 86 is a schematic top plan view illustrating wafer scale electroplating of interposer structure devices according to the invention.

Since electro-plating steps for spiral structures require an electrode used for electro-plating, all the spiral structures must connect to this electrode during the electro-plating process. The wafer-scale connections are formed by constructing a grid as in FIG. 86 with electrodes at the periphery. These electrodes are later severed during a dicing process whereby the spiral structures are extracted.

As can be seen in FIG. 79 showing an individual spiral structure, the pad array rule about regular bump placement forces the spiral structures to be placed at set locations so that bumps and pads properly align. This pad array rule is satisfied by an accurate and advanced electromagnetic 3D simulator such as PowerSpiral (available as a product of OEA International of Morgan Hill, California) to automatically design the spiral inductor with a desired inductance value L also meeting its current I, Q, $R_{AC}$, $R_{DC}$ specs by adjusting the width, w and inner dimension, dix for a given HARMS process rules having a minimal pad clearance $C_{PAD}$ and maintaining pad array rules regarding placement of bumps. The pad array rules can be satisfied easier if both the pads are aligned to a row of pad array and centered relative to the spiral structure as shown in FIG. 79 rather than placing them arbitrarily as shown in FIG. 13.

The second function of pads in a structure made according to the HARMS process is to create STVs. Making pads as an array of square Si columns with the spacing smaller than the $2\delta_{EP}$ as shown in FIG. 82 will yield STV resistance several times less compared to a simplified Single Si Core pad connection shown in FIG. 81, and its effect in vertical resistance reduction is shown in detail in FIG. 120.

The Scanning Electron Microscope (SEM) photos shown in FIG. 76 and FIG. 77 display the Si etch capability of holes with finished sizes of 10μ by 10μ on a SiO wafer where $t_{3Si}$=50μ. As can be seen, the Si etched holes have 3μ spacing in between and are very uniformly encapsulated with finished 0.5μ thick Ta all the way down to $SiO_2$ layer. The $w_{Si}$ is 2μ, giving $\Delta_{SiW}$=50/2=25 and $\Delta_{SiS}$=50/12=4.16. They show a very uniform conductive grid structure all across a 6-inch wafer.

Figure 109:
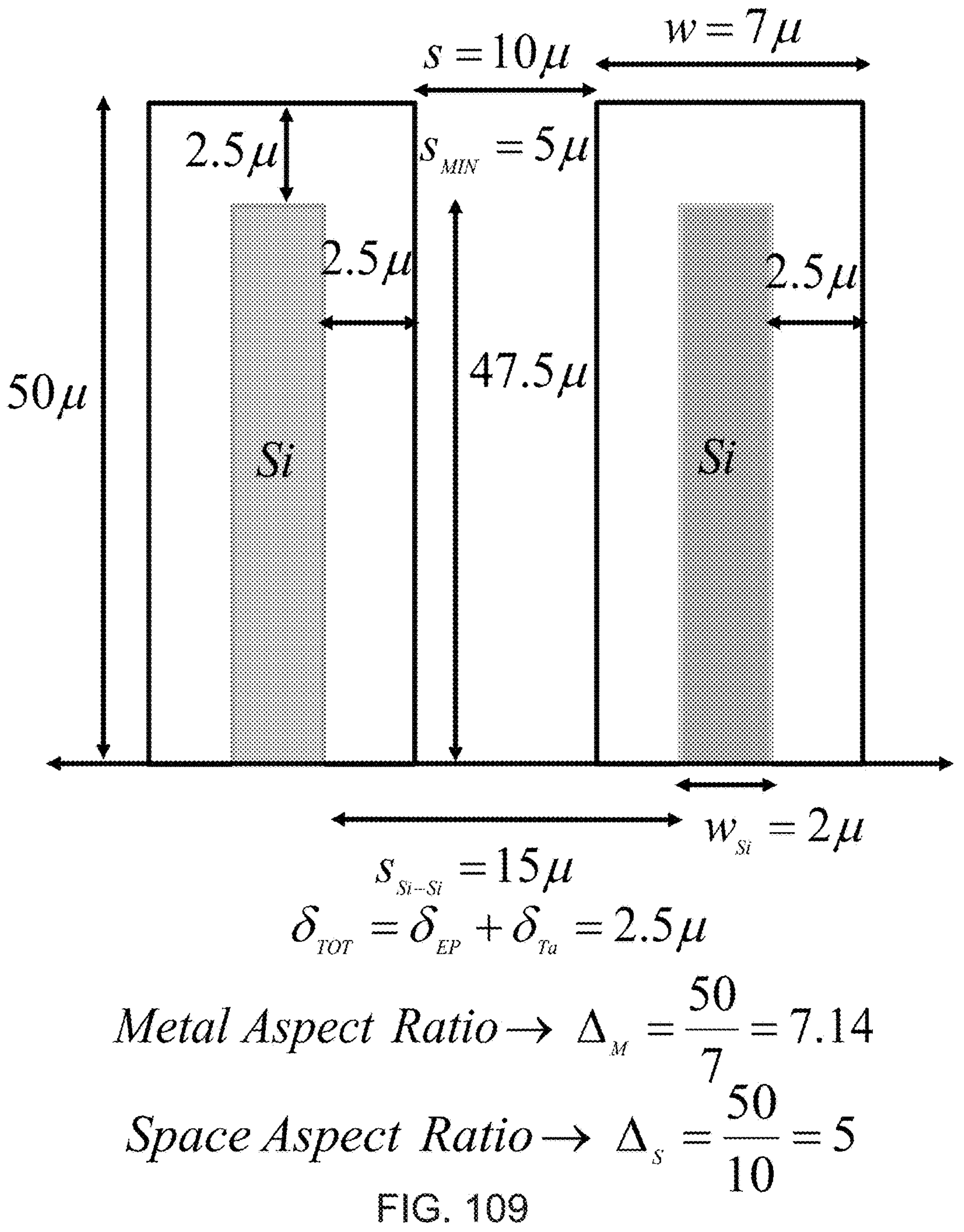
FIG. 109 is a first schematic side view of adjacent windings illustrating critical dimensions of a first size.

FIG. 109 shows the desired outcome resulting spiral winding dimensions using 47.5μ thick "Si Core" with $\Delta_{Si}$=25 rule with 2.0μ electro-plating metallization thickness achieving a tight coupling condition with $\Delta_w$=10 and $\Delta_w$=5 with a Si Core to Si Core spacing of 15μ. As can be seen, the processing parameters give a very large electro-plating metal cross-sectional area S=255μ$^2$ which can carry 5.1 A with $J_{MAX}$=2×10$^6$ A/cm$^2$ electro-migration limited current densities. The minimum space between the "finished" windings can be processed with $s_{MIN}$=10μ giving $\Delta_M$=7.14 with a Si Core to Si Core spacing of 15μ.

Figure 110:
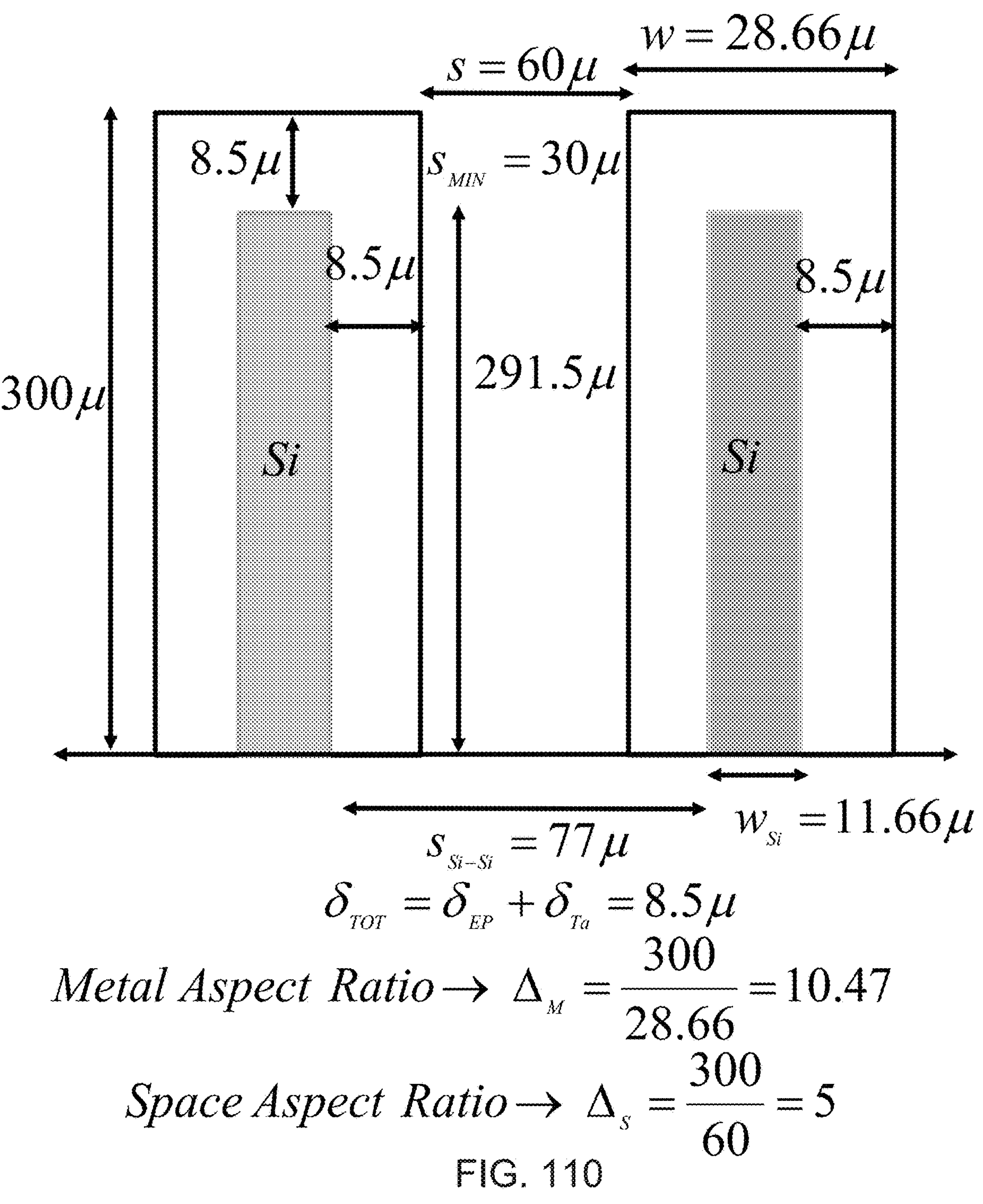
FIG. 110 is a second schematic side view of adjacent windings illustrating critical dimensions of a second size.

If there is a need for a larger current and/or lower DC resistance, then there are two parameters to adjust as shown in FIG. 110, which are the thickness of the Si Core, $t_{3Si}$ and the electro-plating metal thickness $\delta_{EP}$ encapsulating it. Since the resistivity of tantalum (Ta) is approximately 10 times the resistivity of the electro-plating metal such as copper or aluminum, one may ignore the contribution of the deposited Ta thickness $\delta_{Ta}$ on the resistance to simplify the "back-of-the-envelope" calculation. The structure shown in FIG. 110 has a Si Core $t_{3Si}$ thickness of 291.5μ and $\delta_{EP}$=8μ giving a metal cross-sectional area of S=5,199μ$^2$, which can carry 103 A with the same $J_{MAX}$=2×10$^6$ A/cm$^2$ electro-migration limited current density. As can be seen, both cross-sectional structures meet the "tight coupling" condition disclosed in this description as well as the available HARMS processing capabilities. The minimum space between the finished windings can be processed with $s_{MIN}$=30μ giving $\Delta_M$=10,47 with a Si Core to Si Core spacing of 77μ. If one wants to achieve the same current or same resistance per unit length with the thickest metal rules (t=4μ and w=s=2.8μ) available in the IC technology today, one will need to have metal track widths exceeding 1000μ wide, which is basically unthinkable in any known IC technology! Having these wide metal widths will also give virtually no mutual coupling between windings, generating spiral inductors with only internal inductance components and will not even fit within any IC dimensions!

Figure 112:
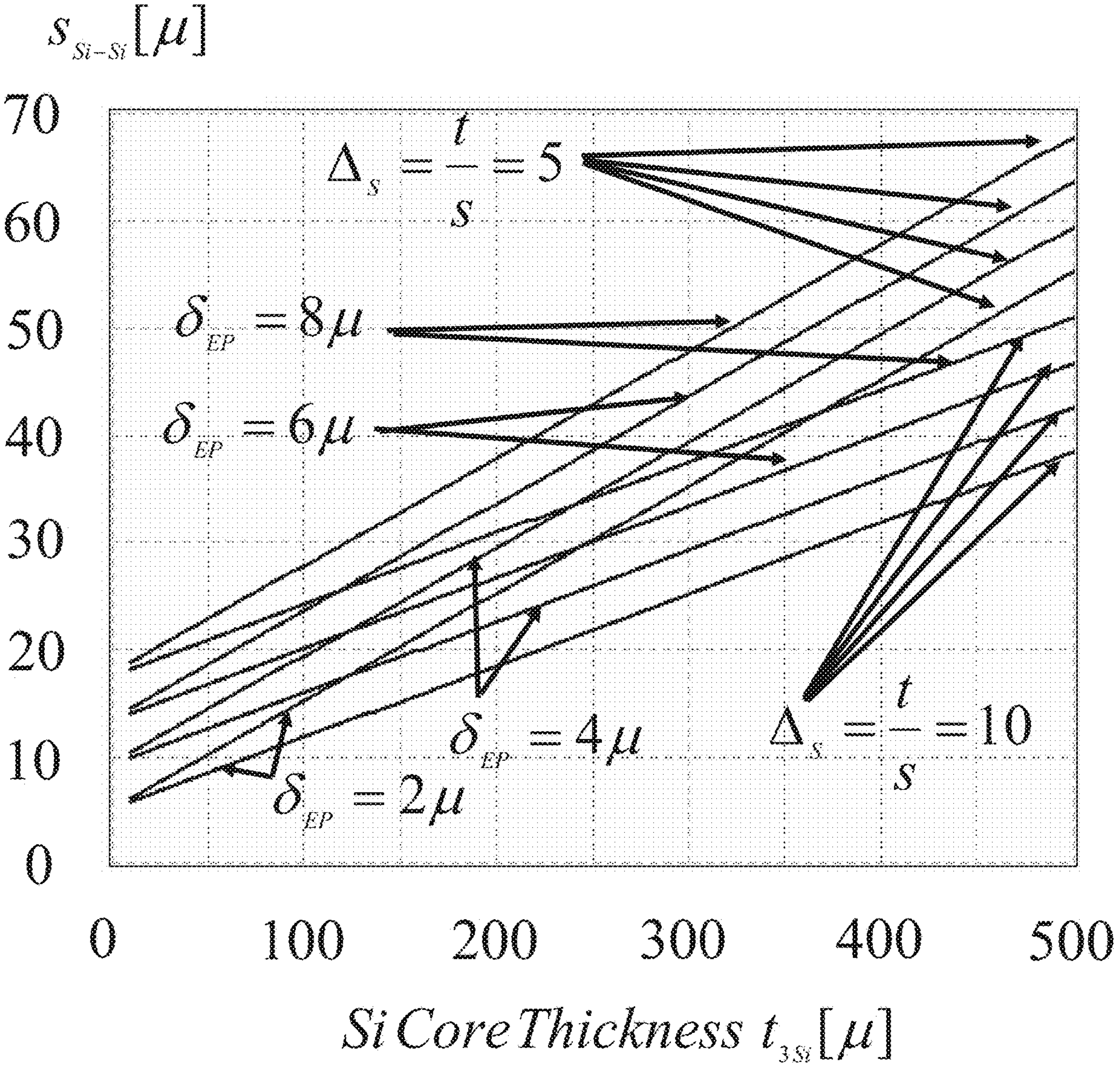
FIG. 112 is a graph illustrating silicon to silicon core spacing for different silicon core thicknesses.

FIG. 111 is a graph illustrating silicon core width and total winding width vs. silicon core thicknesses for several different electroplating thicknesses and for 0.5μ thick tantalum. FIG. 112 is a graph illustrating and silicon to silicon core spacing vs. silicon core thicknesses for several different electroplating thicknesses and for 0.5μ thick tantalum.

In general since one defines the frequency of operation, to maintain the $R_{AC}/R_{DC}$<2 condition, the encapsulating electro-plating metal thickness $\delta_{EP}$ is already a set parameter, leaving only one parameter $t_{3Si}$ for setting the HARMS process.

Figure 113:
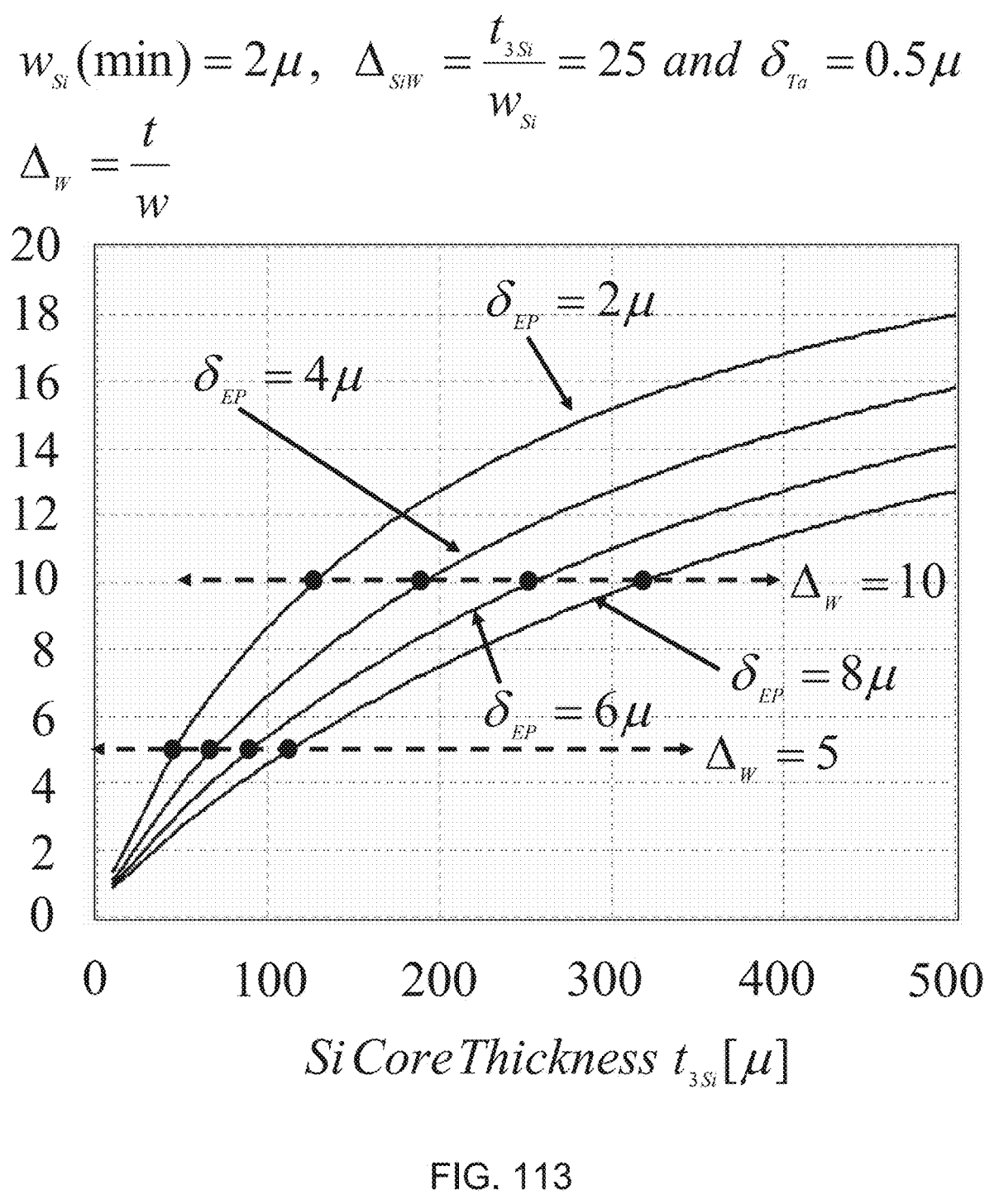
Figure 114:
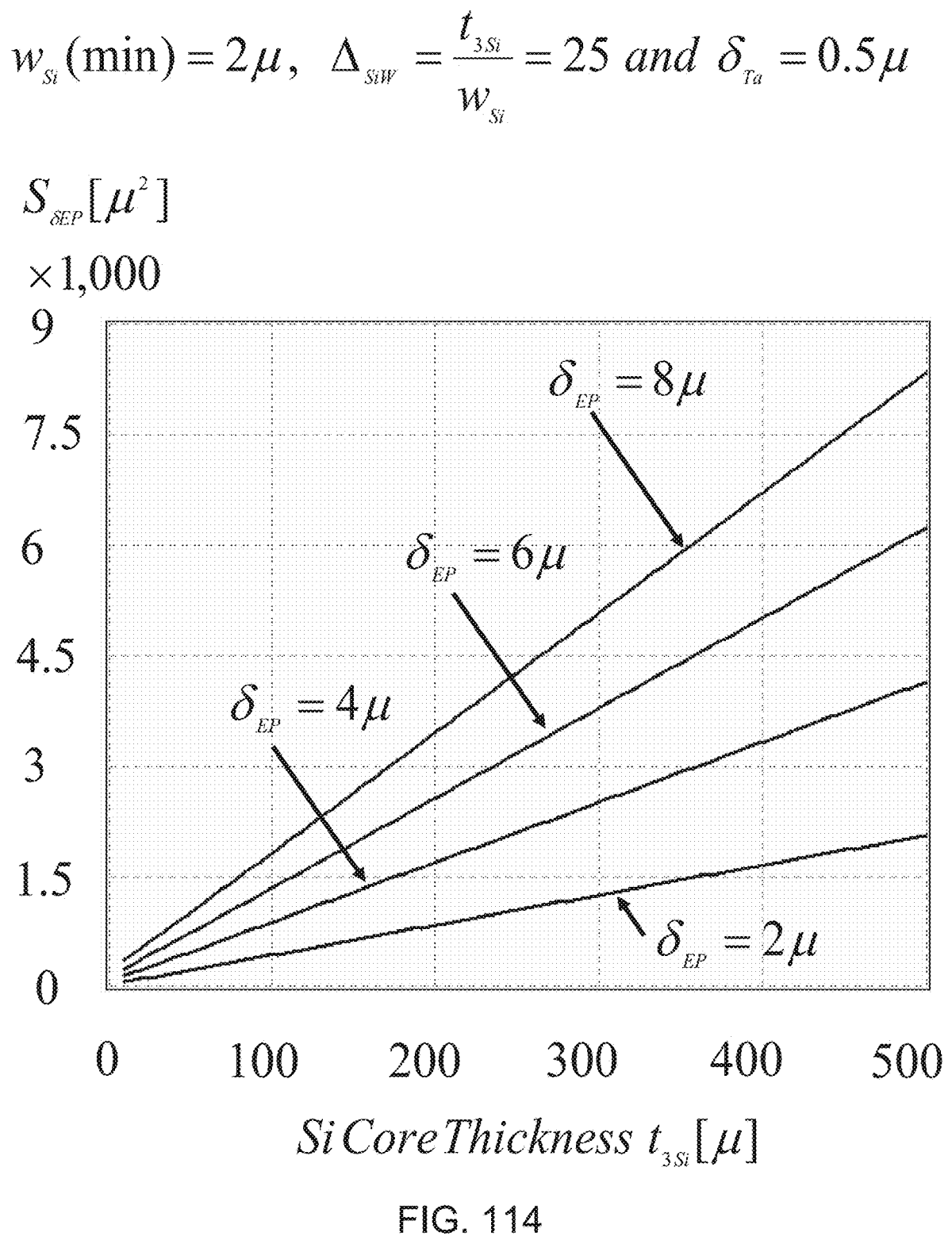
Figure 115:
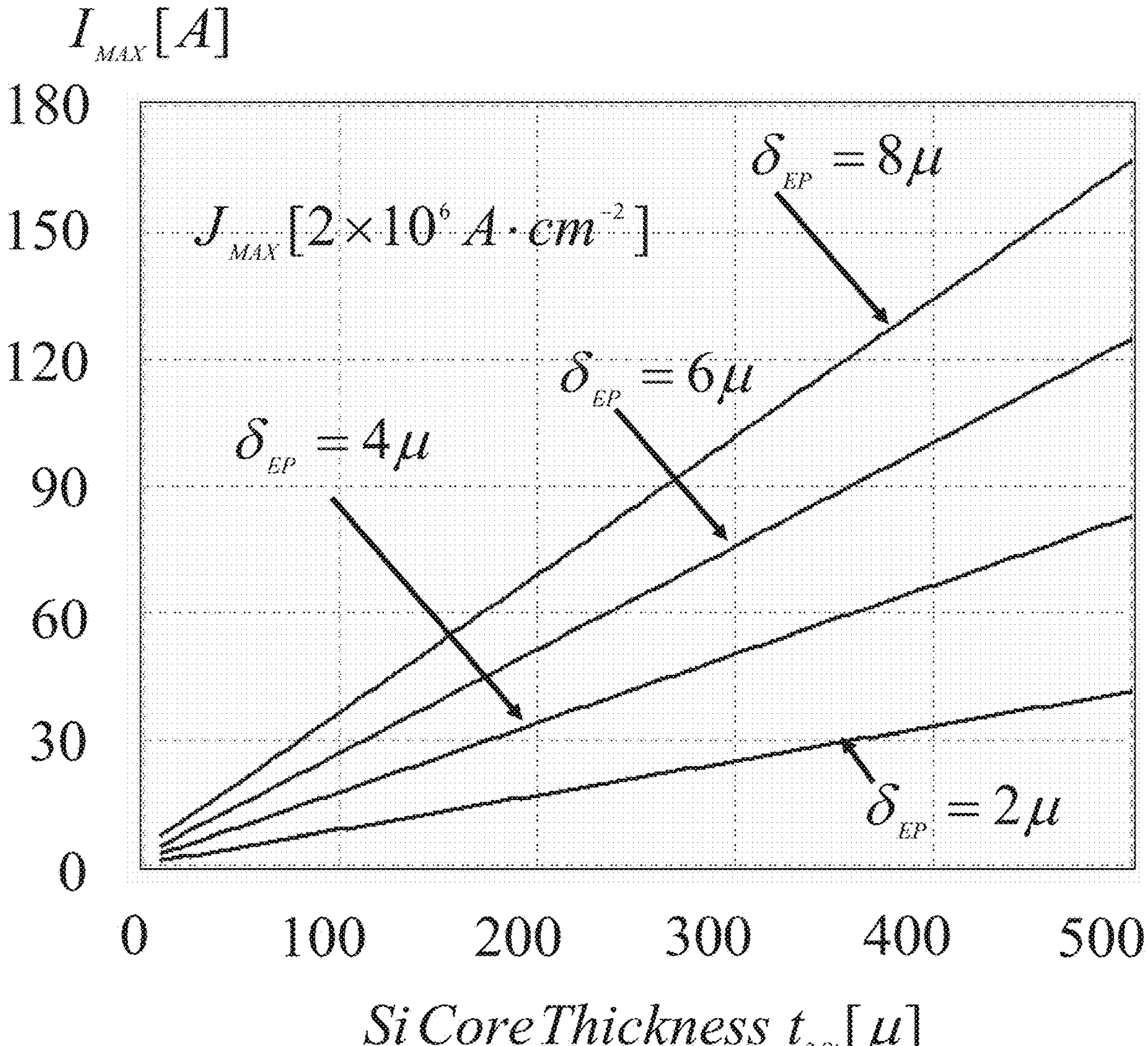
FIG. 115 is a graph illustrating the amount of current capacity as a function of silicon core thickness for different thicknesses of electroplating of a spiral inductor
Figure 116:
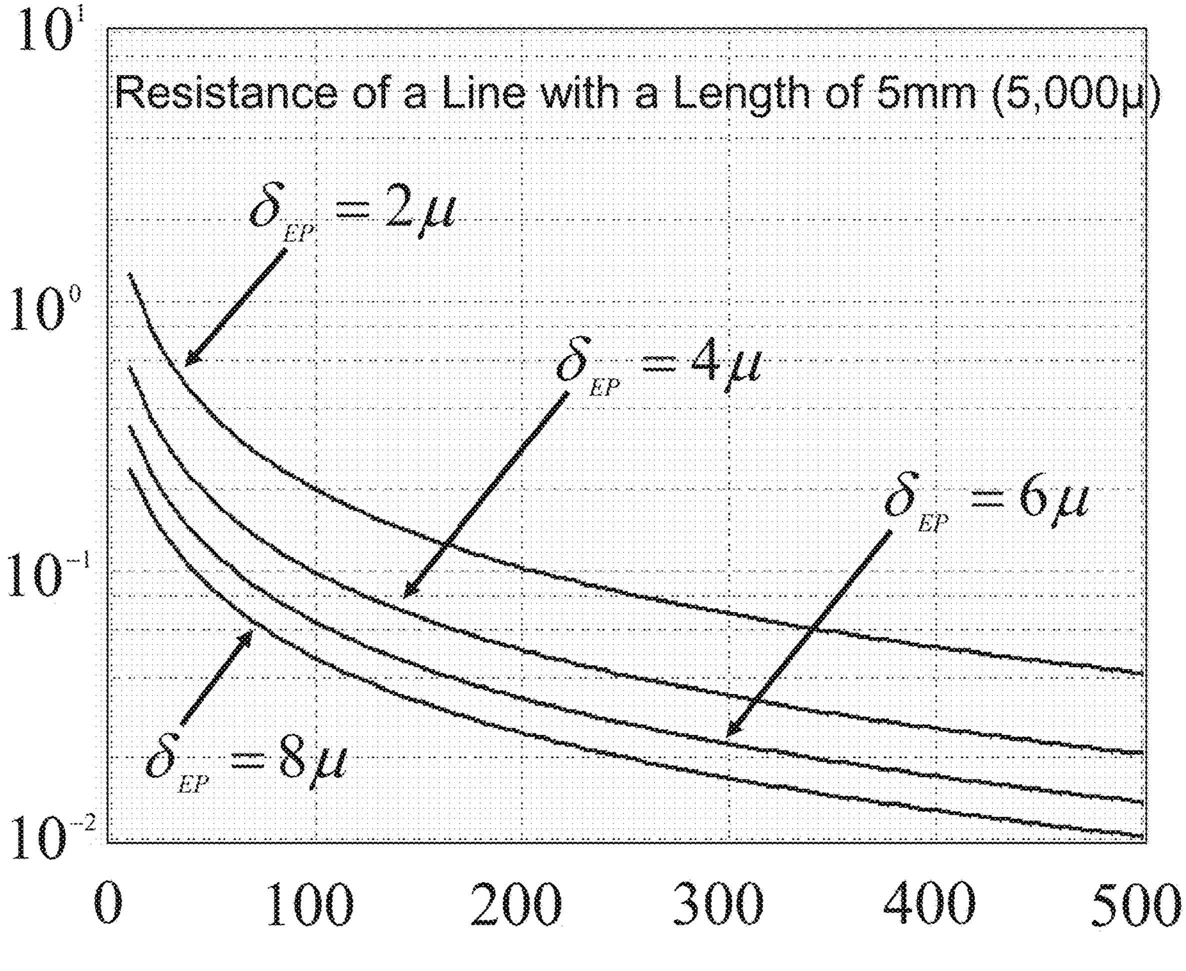
FIG. 116 is a graph illustrating the resistance vs. silicon core thickness of a 5 mm long line for different thicknesses of electroplating of a spiral inductor.

Since a good yielding and controllable HARMS process can be realized with some set rules, such as a minimum Ta deposition width of 2μ, thickness of 0.5μ and Si Core aspect ratio $\Delta_{SiW}$<25 and the desired electro-plating metal thickness SEM, the relation between the desired finished dimensions of the spiral inductor and the Si Core dimensions will be non-linear as shown in FIG. 113-FIG. 114. FIG. 113 shows the needed Si Core thickness $t_{3Si}$, to achieve the desired $\Delta_w$ values for $\delta_{EM}$=2, 4, 6 and 8μ. As can be seen, as the $\delta_{EM}$ increases one needs a greater $t_{3Si}$ to satisfy the "tight coupling" condition. The dashed line is the $\Delta_w$=10 and the intersection point between it and the family of curves for $\delta_{EM}$=2, 4, 6 and 8μ will give the needed $t_{3Si}$ for the process to achieve this $\Delta_w$=10 "tight coupling" condition. As can be seen in FIG. 114 for most of the applications, just from the processing point of the HARMS process, $t_{3Si}$ has to be greater than 200μ! Another important relation is the cross-sectional area of the electro-plated metal area, which determines the resistance of the spiral inductor that is shown in FIG. 114. As can be seen, by adjusting $t_{3Si}$ and $\delta_{EM}$ one can achieve very large cross-sectional areas in a very small footprint, which cannot be done with any prior art metallization rules and capabilities. The resulting maximum electro-migration current-density limited current-carrying capability and line resistance of the spiral windings for the length of 5,000μ as a function of $t_{3Si}$ and for $\delta_{EM}$=2, 4, 6 and 8μ is shown in FIG. 115 and FIG. 116 for copper as the electro-plating material in the calculations. In summary, all the needed goals of the tight coupling condition can be achieved with the inventive HARMS processing capabilities, along with extremely low line resistance and high current-carrying capability.

Figure 87:
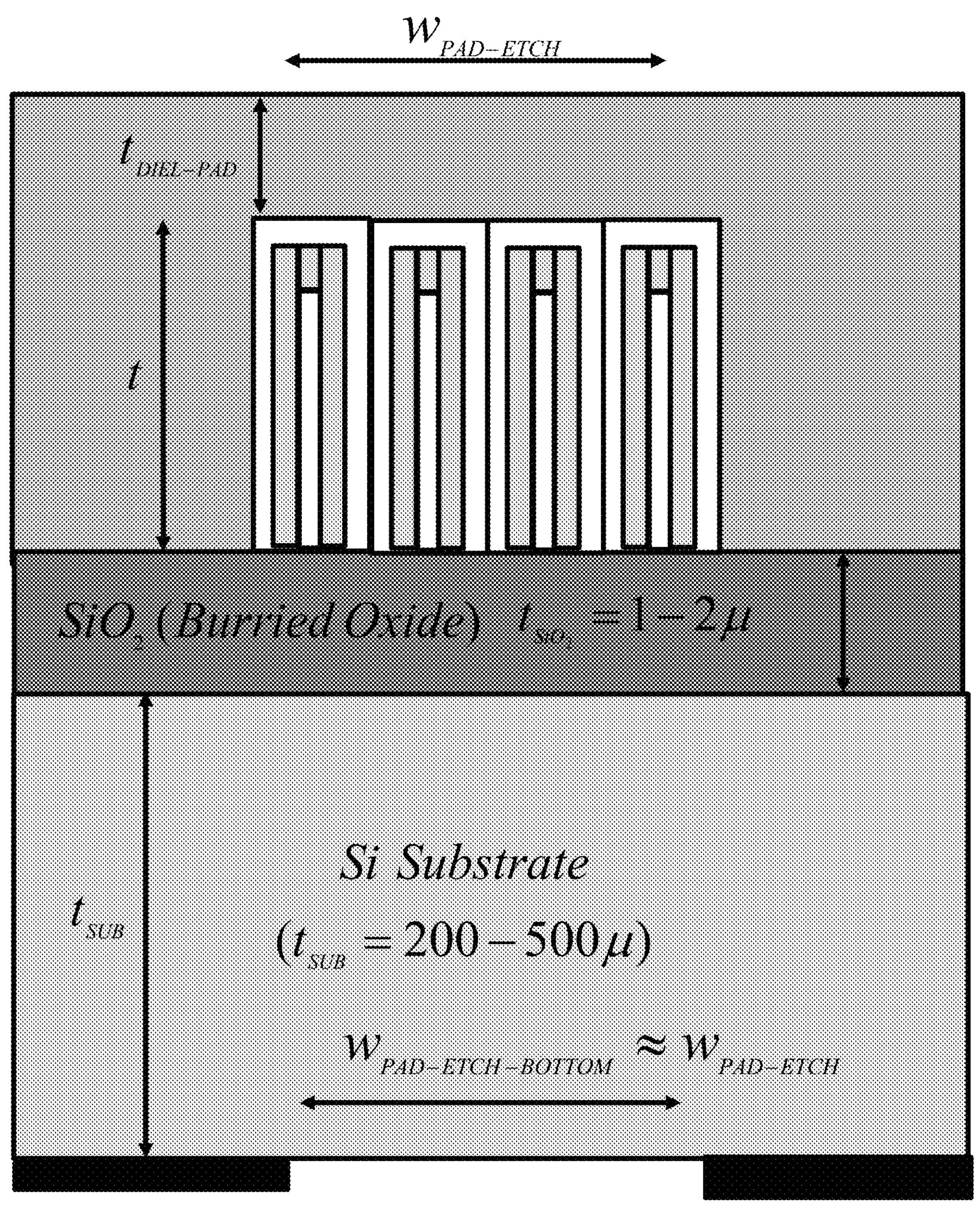
FIGS. 87 through FIG. 92 are illustrations of the result of processing steps involved for backside C4 bumping for SiO wafers.
Figure 88:
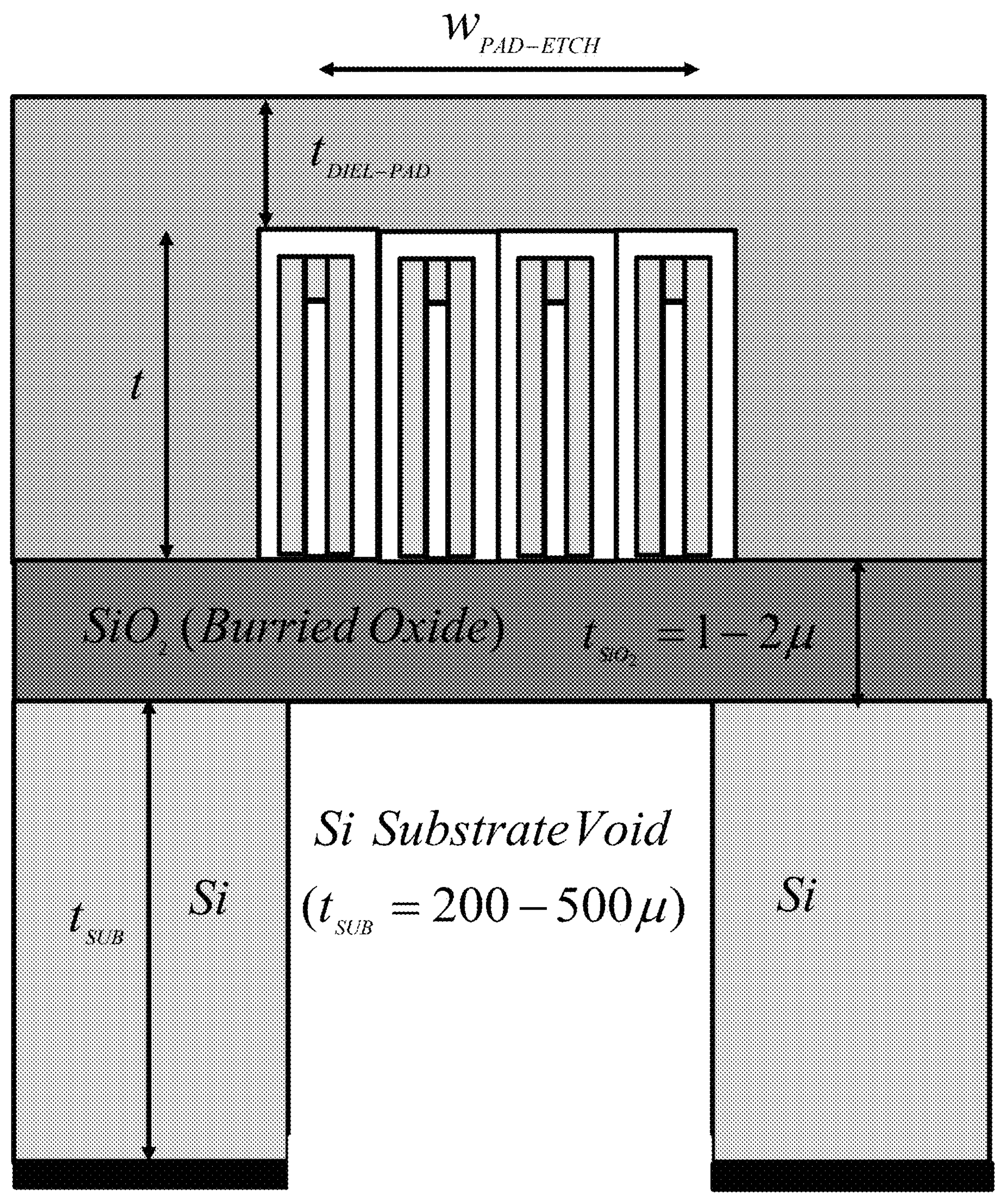
Figure 89:
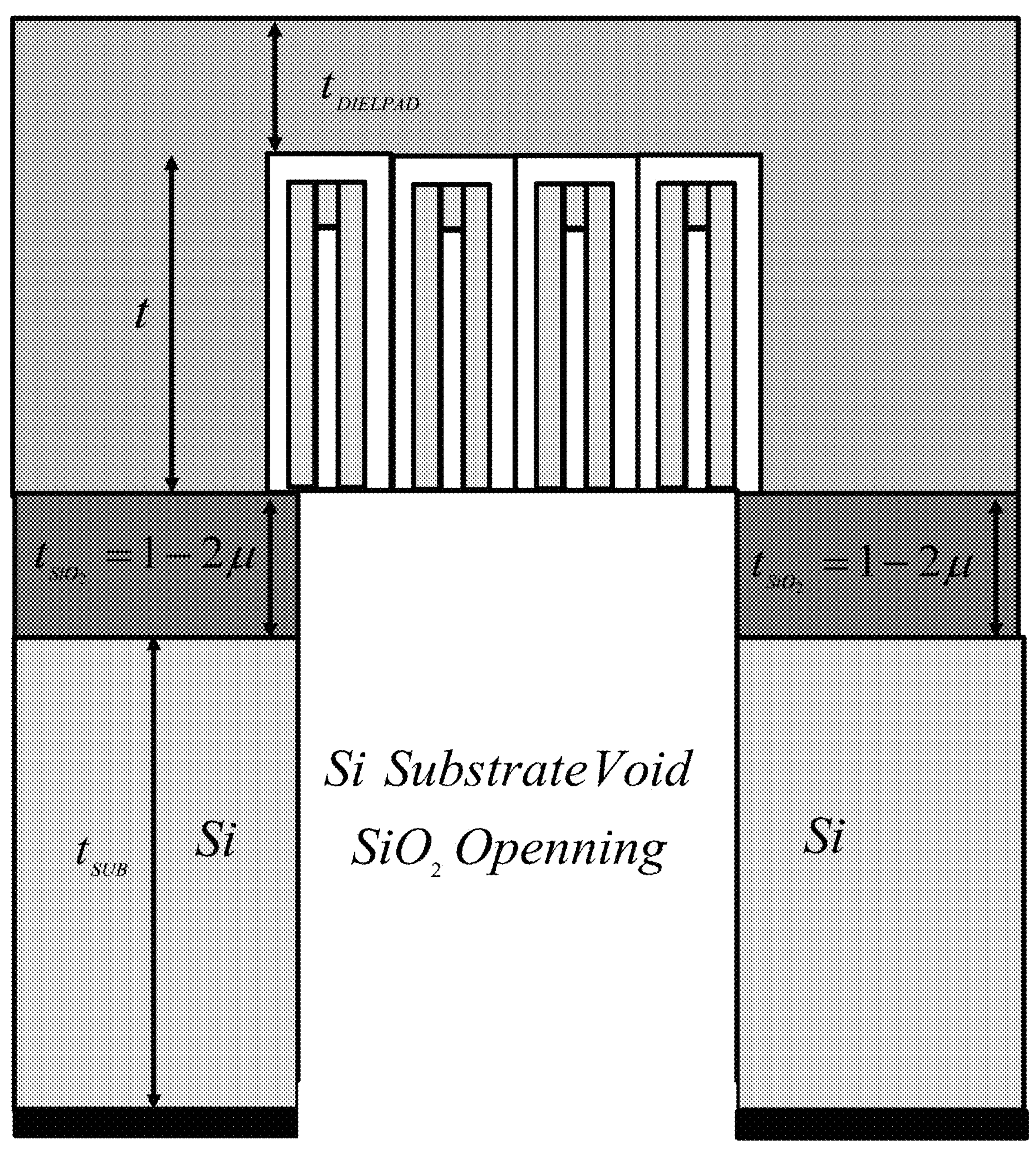
Figure 90:
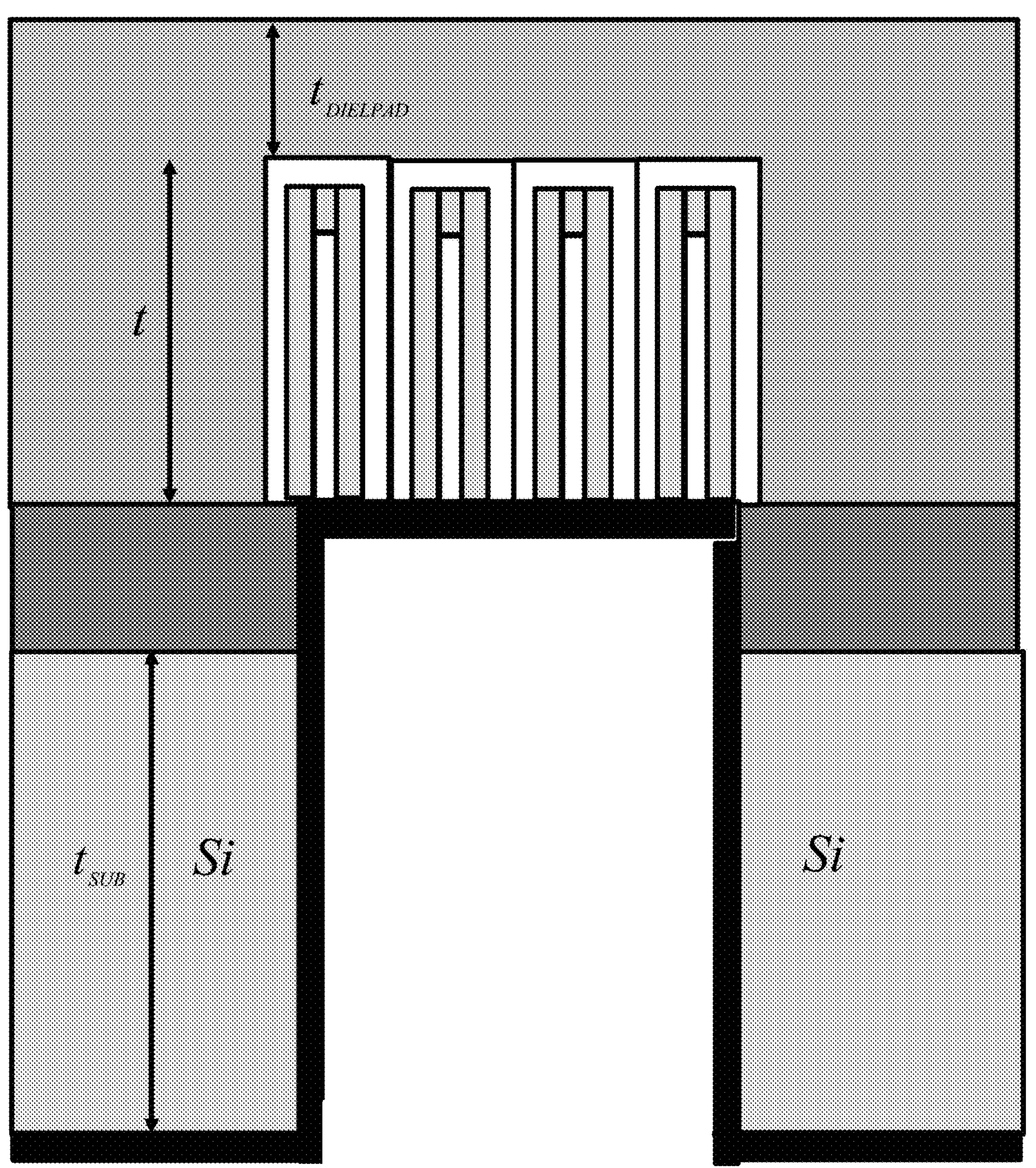
Figure 91:
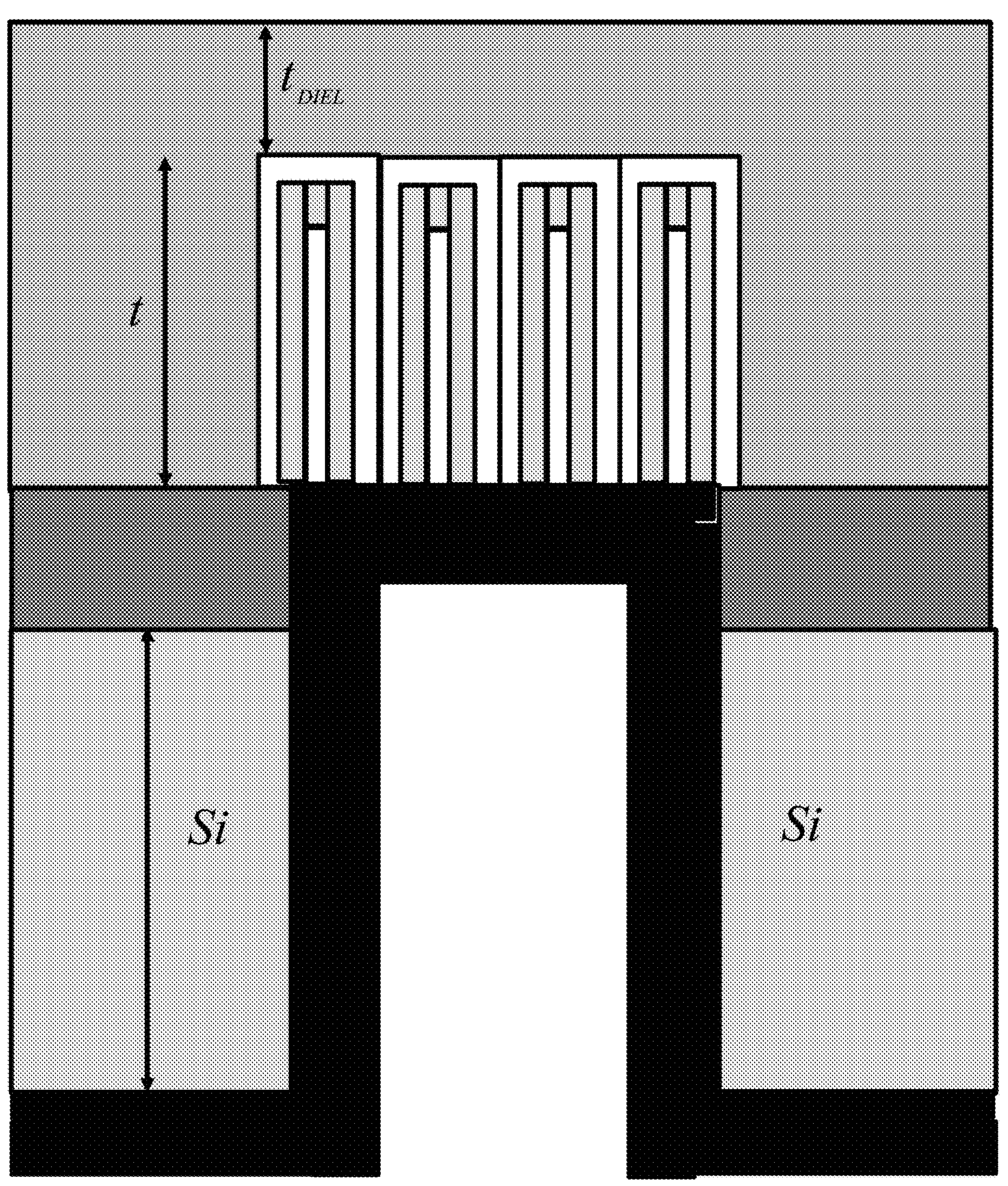
Figure 92:
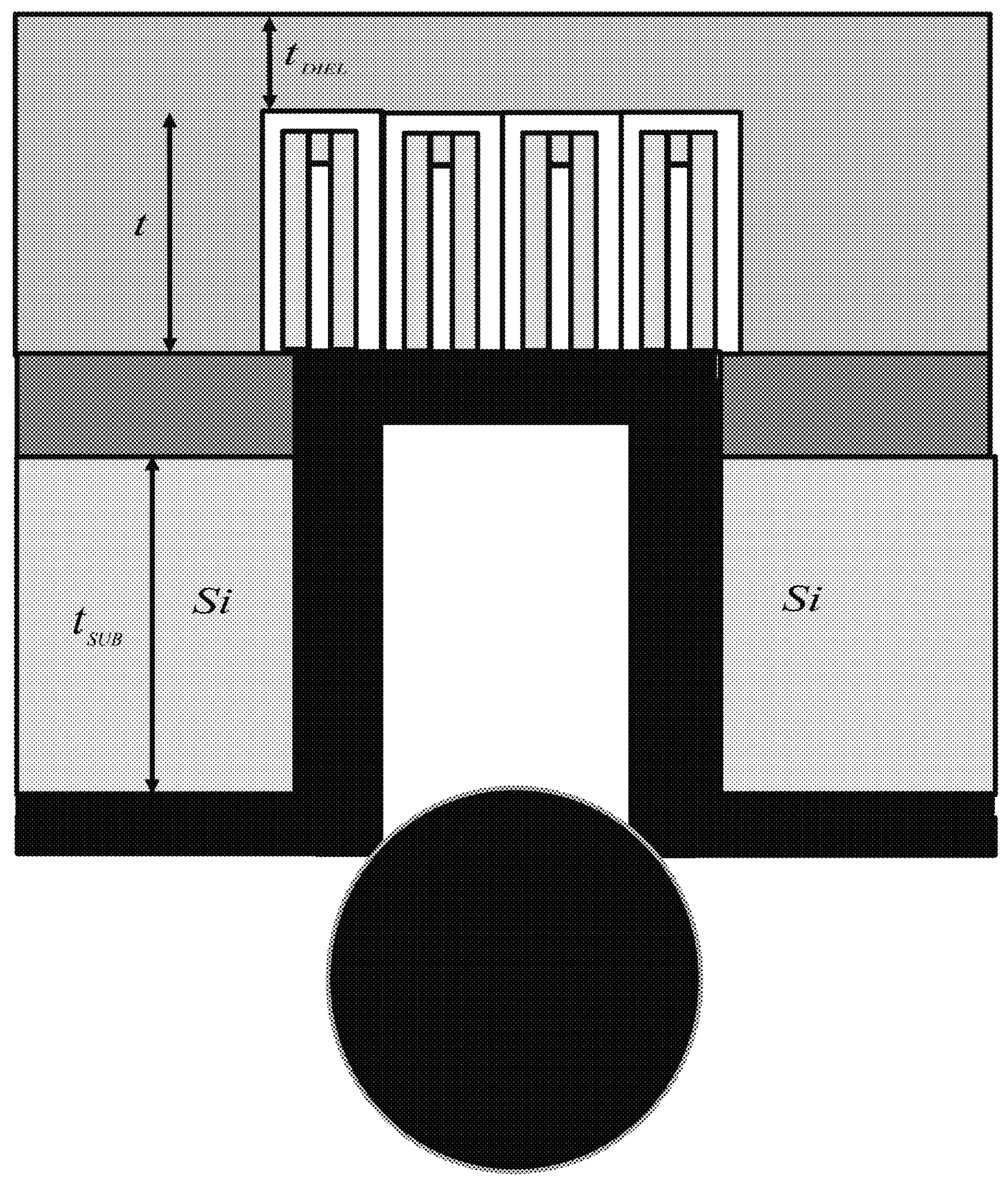
Figure 93:
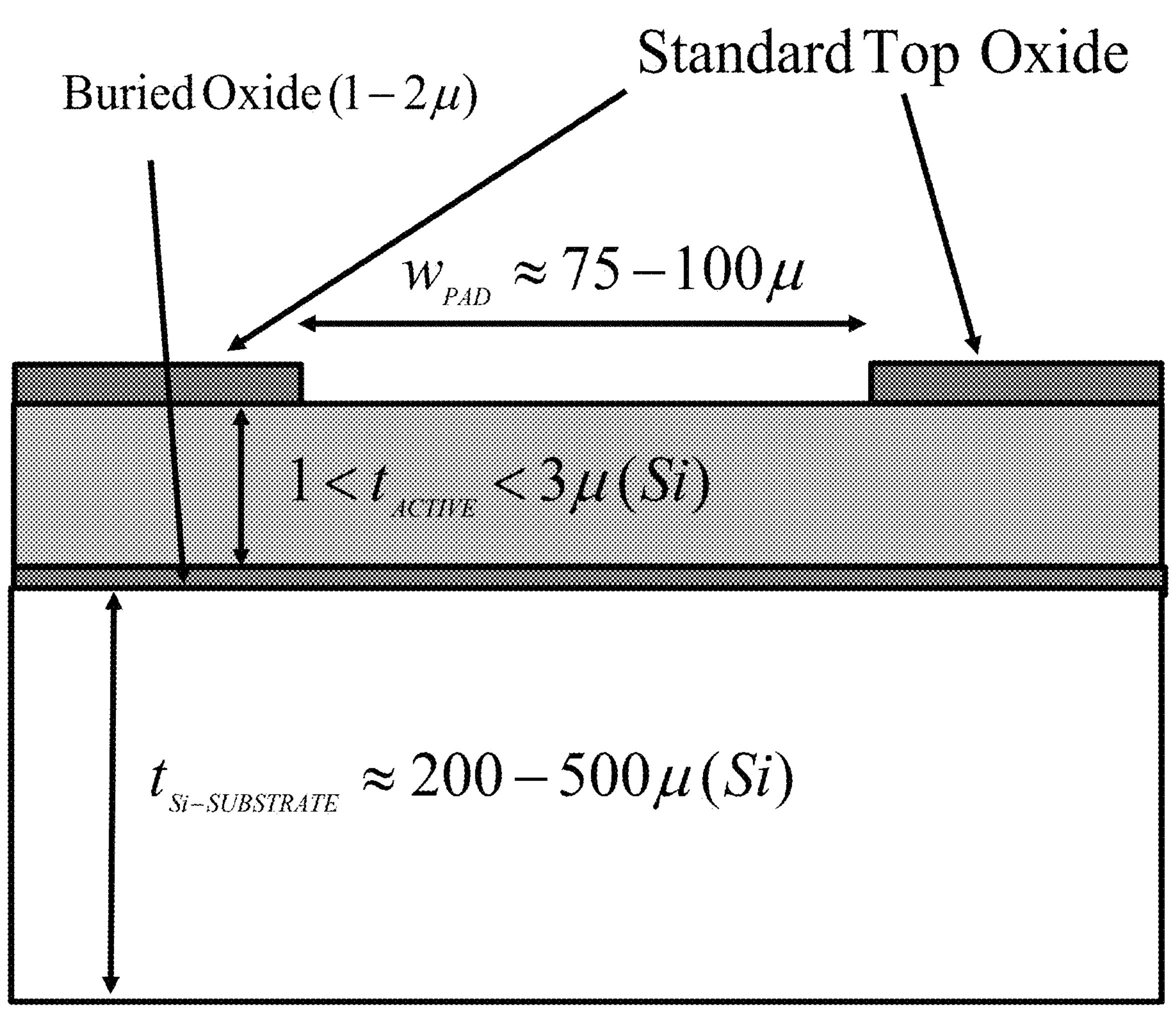
FIG. 93 through FIG. 96 are illustrations of the result of processing steps involved in making fully integrated structures according to the invention for buried oxide thicknesses between one and two microns and active IC layer between one and three microns, thus eliminating the interposer structure.
Figure 94:
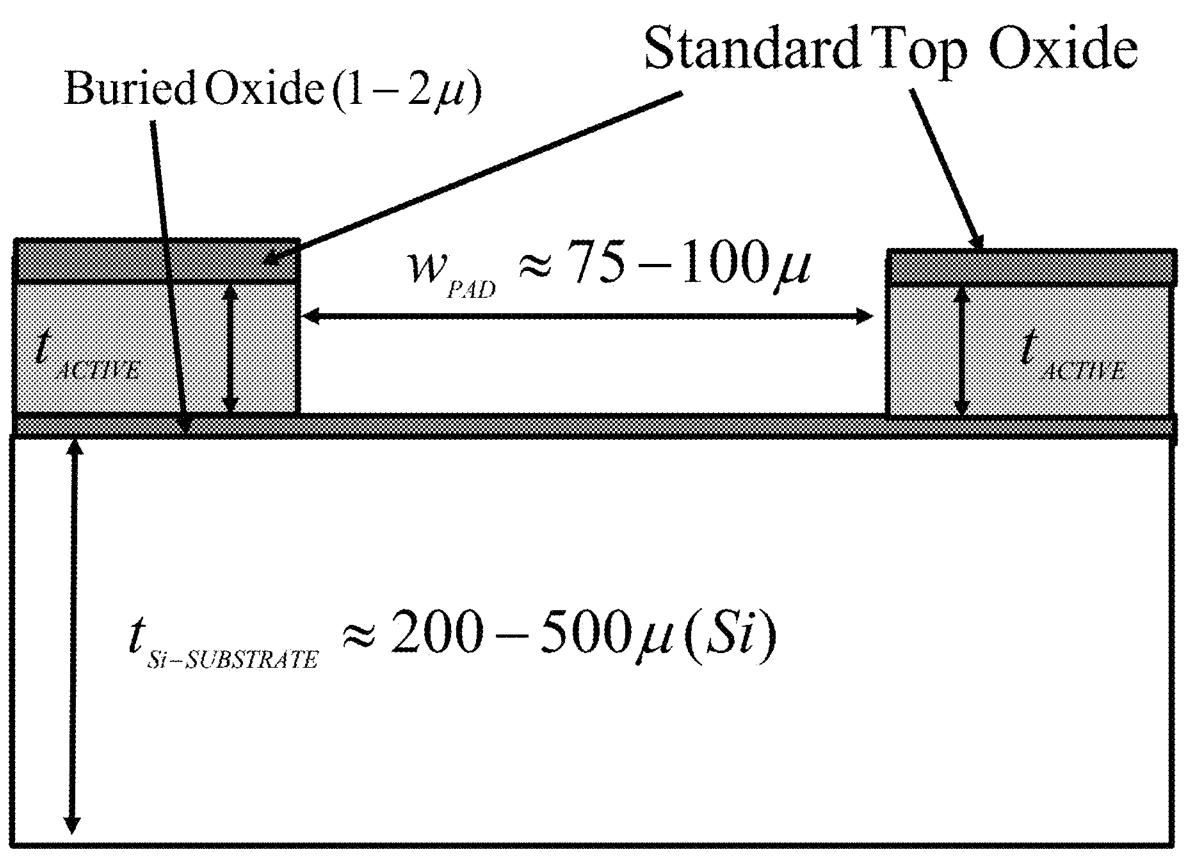
Figure 95:
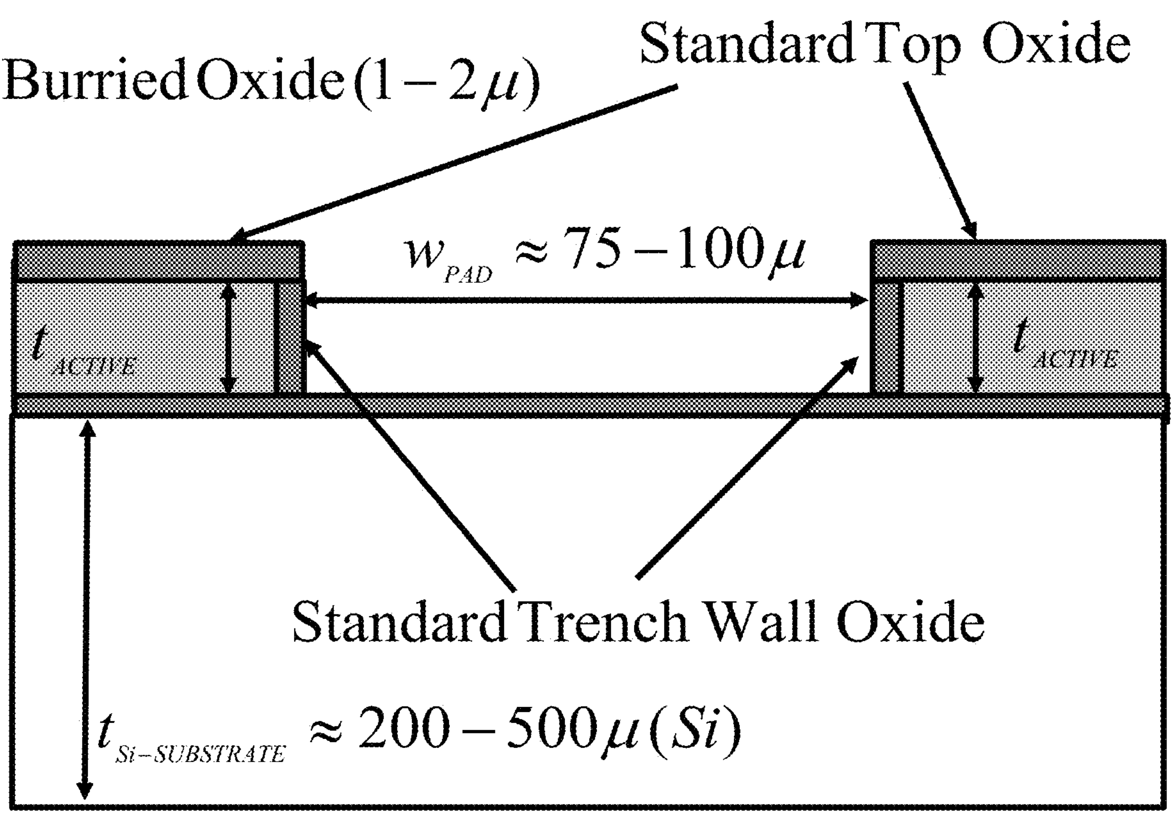

FIGS. 87-92 illustrate the results of processing a SiO wafer for two-sided connectivity. In FIG. 87, a tantalum deposition is placed on the bottom or holding wafer with a region etched aligned to the spiral pad locations or STV locations, which are intended for connection from the back-side of the wafer. In FIG. 88 a Si Etch step results in a deep reactive ion etching to the buried oxide, $SiO_2$, as previously explained. FIG. 89 is the result of a SiO etch step to remove that layer and expose the underside of the spiral pad or the bottom side of the STV. FIG. 90 shows the result of a further tantalum deposition step coating the exposed walls and voids to establish electrical connectivity across the whole pad or STV structure. FIG. 91 illustrates the result of an electro-plating step covering the same region. Finally a C4 bump can be positioned at the void in electrical connection with the pad or STV (FIG. 92). The whole chip and interposer with this C4 bump (as part of an array of C4 bumps) are then in condition to be mounted bump to bump.

The processing difficulty in having STV's using a SiO wafer is clearly demonstrated in FIG. 87-FIG. 92. On the other hand, the benefits of performance that one gets with Si Core thicknesses exceeding 200μ is also evident. One does not need a Si Core thicknesses of less than 200μ. Having Si Core thickness larger than 200μ completely eliminates the need for SiO wafers as starting materials and makes it possible produce an interposer with very desirable feature of two-sided connectivity, and having STV's is a much easier process than shown in FIG. 87 to FIG. 92. Therefore processing becomes very simple by using just a regular Si wafer with a thickness of anything available in the range of 200μ and above with a 1 to 2μ thick $SiO_2$ grown on one side of it as shown in FIG. 117 is with bottom C4 solder bump.

Further Use and Application of the "HARMS" Interposer Technology: Low Impedance Power/Ground Delivery Network for High Power IC's As can be seen in FIG. 116, the metal rules in the "HARMS" (Thick And High Aspect Ratio Metal) interposer technology can deliver very small resistance values even compared to PCB technologies and with much smaller metal widths and spacing. This suggests that this discovery of increased capability is not limited to spiral inductor design. The invention can be extended to assisting in distributing power on the IC itself in order to simplify the IR drop issues in large IC's, which is a serious issue in high power processor designs.

Shrinking IC process geometries results in increasing current density distribution per area in IC's and lower supply voltages dictated by scaling rules. Distributing these high currents with an acceptable voltage drop has always been a challenge, but now it is becoming an even a more difficult task. One of the main reasons of seeking FIVR is also related to find a solution to this problem, dropping 1.8V supply to 1V with high efficiency on the IC itself which also can be controlled by processor activity.

"HARMS" interposer can give a fairly easy solution to this problem. Considering a $t_{Si}$=300μ and 8μ of Cu electro-plating giving total width of 32μ of spacing width as shown in FIG. 110 one can strap VDD/VSS lines for long distances on the chip not previously achievable even in PCB technologies having 2 ounce Cu which corresponds to thickness of 2.8 mil (71.12μ) and with widths of 10.94 mil (278μ). Moreover in addition to very small resistances VDD lines can be shielded with VSS lines, producing very significant drop in loop inductances.

The effect of Si Core thickness on the inductance of a simple power/ground delivery network can be shown comparatively very clearly for cross-sections shown in FIG. 109 and FIG. 110. Reference is made to Table [8.1].

TABLE 8.1 illustrates that one can achieve over 3 A current due to enlarged cross-sectional area with minimized resistance and inductance, whereas no one else today can come even close.

t = 50, w = 5, $\Delta_w$ = 10, l = 5 mm (5,000μ) R = 546 mΩ ($L_{11}$ = 5.703 nH, $L_{21} = L_{12}$, $L_{23} = L_{12}$, $L_{31} = L_{13}$, $L_{32} = L_{23}$)

| S space [μ] | Δs = t/w | $L_{12}$ [nH] | $L_{13}$ [nH] | Half Loop Inductance $L_{1/2loop}$[nH] ($L_{11}$-$L_{12}$) | $L_{11}/L_{1/2loop}$ | C[pF] | $Z_0$[Ω] | $f_{RES}$[GHz] |
|---|---|---|---|---|---|---|---|---|
| 25 | 2 | 4.656 | 4.078 | 1.048 | 5.442 | 0.3453 | 55.08 | 8.368 |
| 10 | 5 | 5.107 | 4.656 | 0.5966 | 9.560 | 0.8633 | 26.29 | 7.013 |

TABLE 8.1-continued illustrates that one can achieve over 3 A current due to enlarged cross-sectional area with minimized resistance and inductance, whereas no one else today can come even close.
t = 50, w = 5, $\Delta_w$ = 10, l = 5 mm
(5,000μ) R = 546 mΩ ($L_{11}$ = 5.703 nH, $L_{21} = L_{12}$, $L_{23} = L_{12}$, $L_{31} = L_{13}$, $L_{32} = L_{23}$)

| S space [μ] | Δs = t/w | $L_{12}$ [nH] | $L_{13}$ [nH] | Half Loop Inductance $L_{1/2loop}$[nH] ($L_{11}$-$L_{12}$) | $L_{11}/L_{1/2loop}$ | C[pF] | $Z_0$[Ω] | $f_{RES}$[GHz] |
|---|---|---|---|---|---|---|---|---|
| 5 | 10 | 5.301 | 4.938 | 0.4021 | 14.183 | 1.727 | 15.26 | 6.040 |
| 3.333 | 15 | 5.373 | 5.048 | 0.3304 | 17.260 | 2.59 | 11.29 | 5.441 |

The best that can be done today for 5 mm wire length (t = 4μ, w = 2.8μ, s = 2.8μ and for $J_{MAX} = 2 \times 10^6$ A/cm$^2$) is a maximum current of less than 225 mA.
$L_{11}$ = 7.792 nH, $L_{12}$ = 6.467 nH, $L_{13}$ = 5.791 nH, $L_{loop}$ = 1.325 nH, $R_{Cu}$ = 7.7Ω, S = 11.2μ$^2$, $I_{MAX}$ = 224 mA.
Conclusion: Width needed for the same cross-sectional area S = 153μ$^2$ is 38.25μ.

The columns 3-4 in Table [8.1] show the first row of the 3 by 3 inductance matrix which corresponds to a VSS/VDD/VSS parallel power delivery network having a length of 5 mm (5,000μ) with a thickness of 50μ and width of 5μ of Cu width. The even spacing between the VSS/VDD/VSS parallel power delivery network is 10μ and 5μ as shown in rows 2 and 3 in Table [8.1]. Column 6 is the half of the loop inductance for just the VDD/VSS pair. Column 7 shows the ratio between the diagonal element of the inductance matrix to the half loop inductance, which is a measure of inductance reduction ratio compared to a loop having an infinitely far return path. As can be seen, the reduction of the inductance is very significant. Such figures cannot even be achieved in PCB's with ground planes!

The note below Table [8.1] compares the prior art using the thickest possible metal thickness of 4μ of Cu with space and width of 2.8μ. Inductance, resistance reduction and the increase of its current carrying capabilities of a power/ground delivery network using the inventive HARMS process, even with for a 50μ thick Si Core, as here, compared to the best suitable process for this application is simply off the charts! The last note below the table shows the needed metal width for achieving the same resistance and current carrying capability using the thickest metal process being 38.25μ compared to w=5μ used in the HARMS process with basically insignificant reduction in the half loop inductance value compared to the given value of 1.325 nH where the HARMS process can give a value of 0.402 nH!

TABLE 8.2 t = 300, w = 30, $\Delta_w$ = 10, l = 5 mm
(5,000μ) R = 15 mΩ ($L_{11}$ = 3.924 nH $L_{21} = L_{12}$, $L_{23} = L_{12}$, $L_{31} = L_{13}$, $L_{32} = L_{12}$)

| s space [μ] | Δs = t/w | $L_{12}$ [nH] | $L_{13}$ [nH] | Half Loop Inductance $L_{1/2loop}$[nH] ($L_{11}$-$L_{12}$) | $L_{11}/L_{1/2loop}$ | C[pF] | $Z_0$[Ω] | $f_{RES}$[GHz] |
|---|---|---|---|---|---|---|---|---|
| 150 | 2 | 2.906 | 2.354 | 1.018 | 3.855 | 0.3453 | 54.30 | 8.487 |
| 60 | 5 | 3.345 | 2.906 | 0.5791 | 6.776 | 0.8633 | 25.90 | 7.111 |
| 30 | 10 | 3.536 | 3.179 | 0.3882 | 10.108 | 1.727 | 14.99 | 6.148 |
| 20 | 15 | 3.606 | 3.287 | 0.3176 | 12.355 | 2.59 | 11.07 | 5.55 |

t = 300, w = 30, $\Delta_w$ = 10, l = 5 mm (5,000μ), $R_{Cu}$ = 15.66 mΩ, S = 5,508μ$^2$, $I_{MAX}$ = 110 A ($L_{21} = L_{12}$, $L_{23} = L_{12}$, $L_{31} = L_{13}$, $L_{32} = L_{12}$)
The best which can be done today for 5 mm wire length (t = 4μ, w = 2.8μ, s = 2.8μ and for $J_{MAX} = 2 \times 10^6$ A/cm$^2$)
$L_{11}$ = 7.792 nH, $L_{12}$ = 6.467 nH, $L_{13}$ = 5.791 nH, $L_{loop}$ = 1.325 nH, $R_{Cu}$ = 7.7Ω, S = 11.2μ$^2$, $I_{MAX}$ = 224 mA Width needed for the same cross-sectional area S = 5,508μ$^2$ is 1,377μ (1.377 mm is larger than a typical chip!)

Similarly columns 3-4 in Table [8.2] show the first row of the 3 by 3 inductance matrix which corresponds to a VSS/VDD/VSS parallel power delivery network having a length of 5 mm (5,000μ) with a thickness of 300μ of Cu width. The even spacing between the VSS/VDD/VSS parallel power delivery network are taken as 60 and 30μ as shown in rows 2 and 3 in Table [8.2]. The last note below Table [8.2] shows the needed metal width for achieving the same resistance and current carrying capability using the thickest metal process being 1,377μ compared to w=30μ used in the HARMS process with insignificant reduction in the half loop inductance value compared to the given value of 1.325 nH where the HARMS process can give a value of 0.388 nH!

Utilizing an interposer designed using the HARMS process as a VDD/VSS strapping is very clearly demonstrated with the Table [8.1] and Table [8.2] is a great advantage in any high-current-consuming IC VDD/VSS network design. Basically having the VSS shield in very close proximity to VDD, the very high mutual inductance obtained by this arrangement will generate a very small supply loop inductance, much less than VDD line self-inductance by itself. In addition to this the power delivery network will have a fairly large distributed capacitance with very small series resistance. The capacitance for 5 mm long VDD/VSS pair is given as the 7th column of Table [8.1] and Table [8.2] are significantly larger values that without this invention are not possible to realize in any conventional IC processes today. None of these desirable properties can even be achievable in any packaging, MCM, thin film, thick film or any PCB technologies available today. Hence this invention represents a significant advance.

Figure 121:
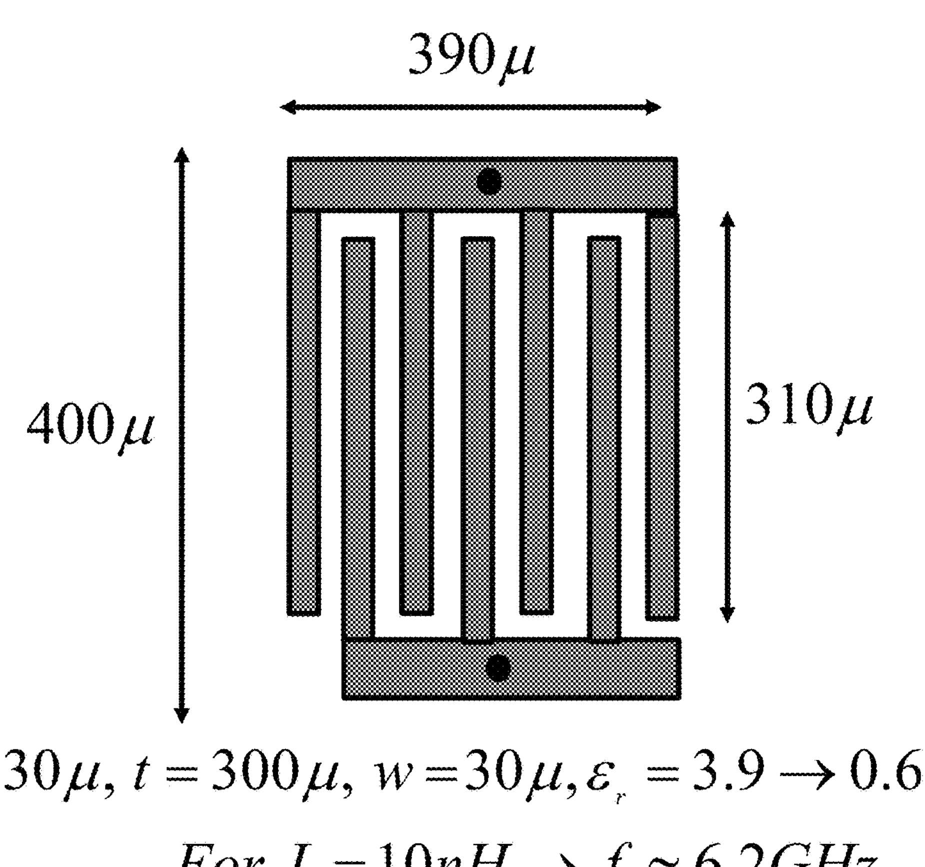
FIG. 121 is a top pan view of an on-chip capacitor according to the invention.

Integrating Large Value Decoupling Capacitors Using PZT/PLZT Material as Dielectric in Selected Areas in the HARMS Process In order to guard against large current spikes in any IC there is a need for placing high value decoupling capacitances as close as possible to the noise generating circuits in the IC. Low impedance VDD/VSS network design as explained above reduces this problem but due to high speed and small clock-skew requirements especially in processor designs, there is always a need for high-value on-chip decoupling capacitors. Placing large-value on-chip decoupling capacitors wastes a significant area. However, these can be integrated in the HARMS process which already has a very large distributed capacitance by depositing PZT/PLZT material as dielectric in selected areas between interdigitated fingers that form the capacitance plates. These materials are also known as ferroelectric materials (Lead Zirconate Titanate) [Chemically $PbZr_xTi_{(1-x)}O_3$ ($0 \le x \le 1$)] and can have very large relative dielectric constants, on the order of 300 to 10,000 depending to their doping, which can completely eliminate the need for large value off-chip decoupling capacitors or large capacitor values needed in the circuit design. The capacitor structure according to the invention is as shown in FIG. 121. Two electrode each have vertical fingers disposed laterally adjacent in an alternating or interdigitated configuration. While the application is primarily for decoupling capacitors, other applications are also contemplated.

Integrated Controlled Impedance Transmission Lines in IC Technologies

Constructing controlled-impedance transmission lines in any semiconductor process is a challenge. For semi-insulating substrate semiconductor technologies such as in GaAs IC's it is a simpler problem but due to the requirement of low resistivity lines they occupy a large space. In silicon IC's, due to the finite conductivity of the silicon material the issue of "slow-wave" phenomenon is a serious issue in addition to the large area requirement.

The transmission line characteristic impedance $Z_\theta$ can be given as, $$Z_0 = \sqrt{\frac{R + j\omega L}{G + j\omega C}} \tag{2.23}$$

where R, L, G, C and w are resistance, inductance, conductance, capacitance per unit length and angular frequency respectively. As can be seen in (2.23) one needs small R and G values compared to $L\omega$ and $C\omega$ to produce a good transmission line. This condition gives nearly frequency independent $Z_\theta$ with its well-known approximation as, $$Z_0 \cong \sqrt{\frac{L}{C}} \text{ for } R << Lw \text{ and } G << C\omega. \tag{2.24}$$

Since the Si Core technology disclosed herein gives very low resistance per unit length values of legs or segments in a much smaller footprint as shown in FIG. 116, one can build controlled characteristic impedance transmission lines utilizing the invention. The parameters for building transmission lines with desirable characteristic impedances on the order of 50-75 ohms using much smaller area is displayed in Table [8.1] and Table [8.2]. The columns 8 of Table [8.1] and [8.2] shows the characteristic impedance values constructed as a pair of high-aspect-ratio metallization elements as a function of spacing and their corresponding $\Delta_S$. A typical transmission line consists of three segments, a center leg and two adjacent legs in the tight coupling condition. This structure is not possible with any other known IC technology. The columns 9 in Table [8.1] and Table [8.2] are the resonance frequencies calculated lumped circuit assumption for 5 mm long transmission lines.

Implementation of Spiral Structures in Flex Technology

In the absence of truly thick and high aspect ratio metal (HARMS) interposer technology, for test and verification purposes, spiral structures were built and tested using Flex PCB technology according to the present invention as hereinafter explained to access performance improvements and estimate performance gains when such an interposer metallization process became available. Flex PCB technology is well known as a flexible form of printed circuit board (PCB) technology wherein conductive layers insulated by a dielectric and formed flexible sheets or strips are used to form circuitry. Flex PCB technology has never before been applied to the present use. Since development of any IC metallization process with any non-standard requirements is an expensive and a long process, it is helpful to show performance results using a much cost effective way to justify the work. Nevertheless, it was determined that Flex structures are also useful in and of themselves and for this reason they are disclosed herein as a type of miniature inductor. Two types of Flex PCB-based spiral structures are disclosed and have been constructed for test purposes and possibly practical application, herein designated single-layer and folded single-layer, both forming stacked multiple-layer structures that come within the scope of the present invention.

The main purpose of the Flex structures disclosed herein is to be able to generate structures that are easy to build with very limited mechanical skill and resources and that verify theoretically derived "tight coupling" conditions. However, using miniature mechanical production equipment, all of the Flex structures herein describe can be miniaturized with ease.

Figure 122:
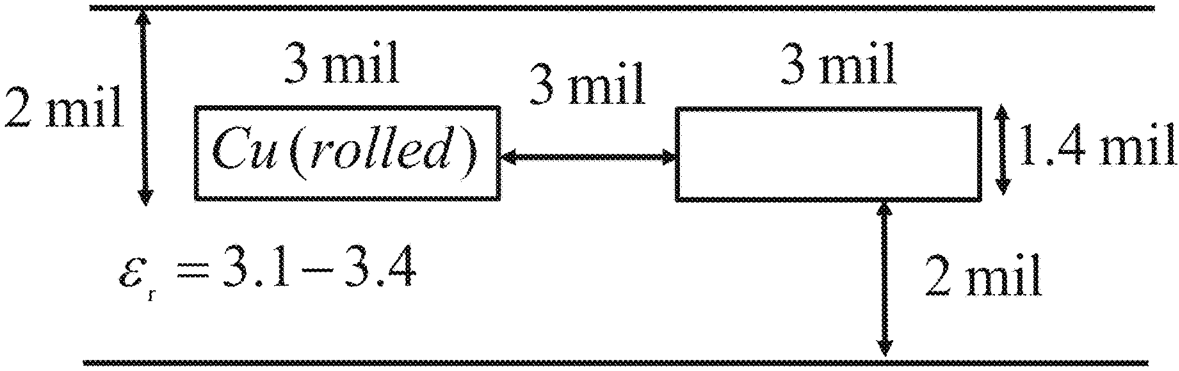
FIG. 122 is a diagram illustrating prior art standard parameters of a Flex PCB structure.
Figure 123:
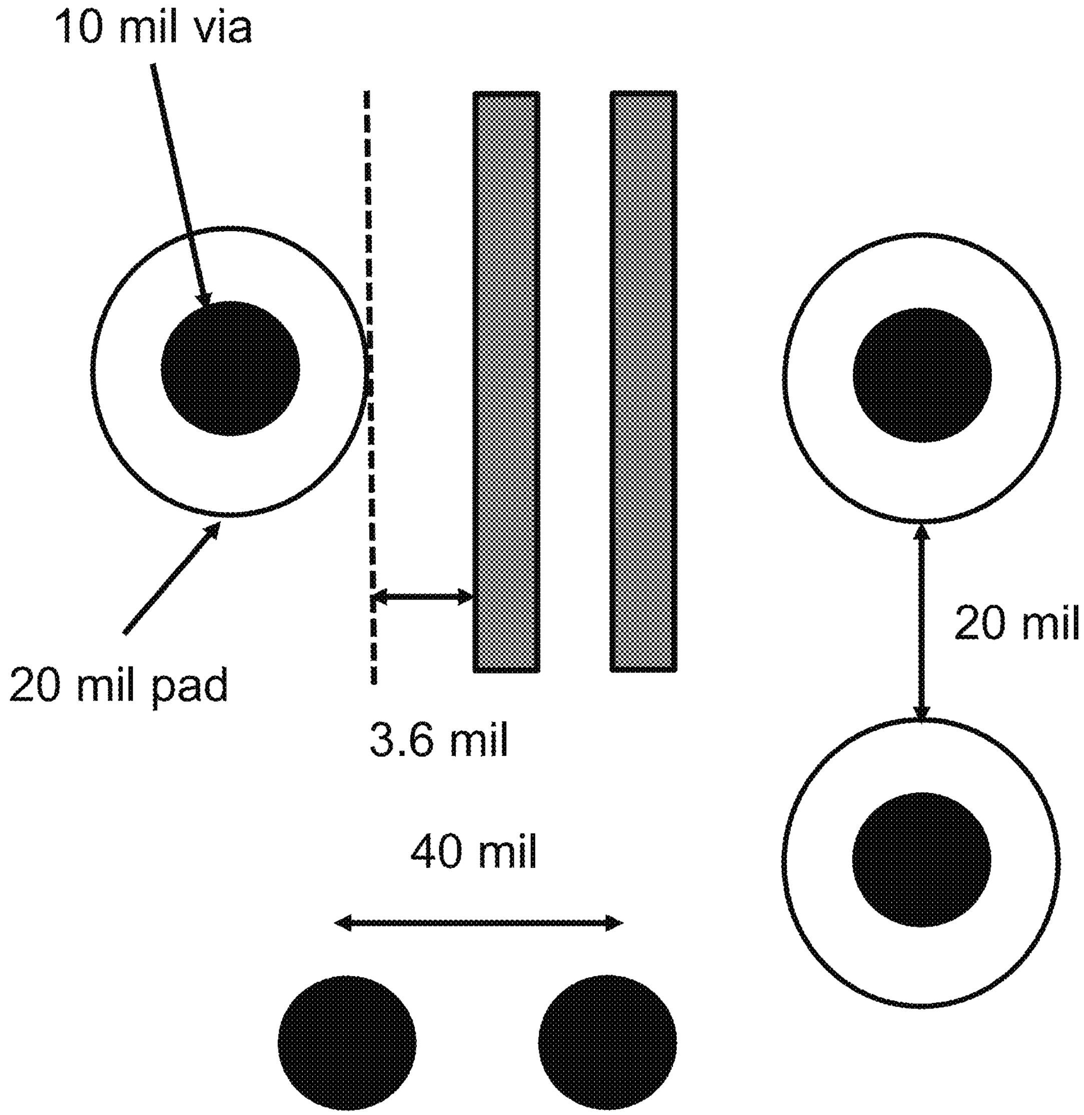
FIG. 123 is a diagram illustrating prior art standard dimensions of a Flex PCB structure.
Figure 129:
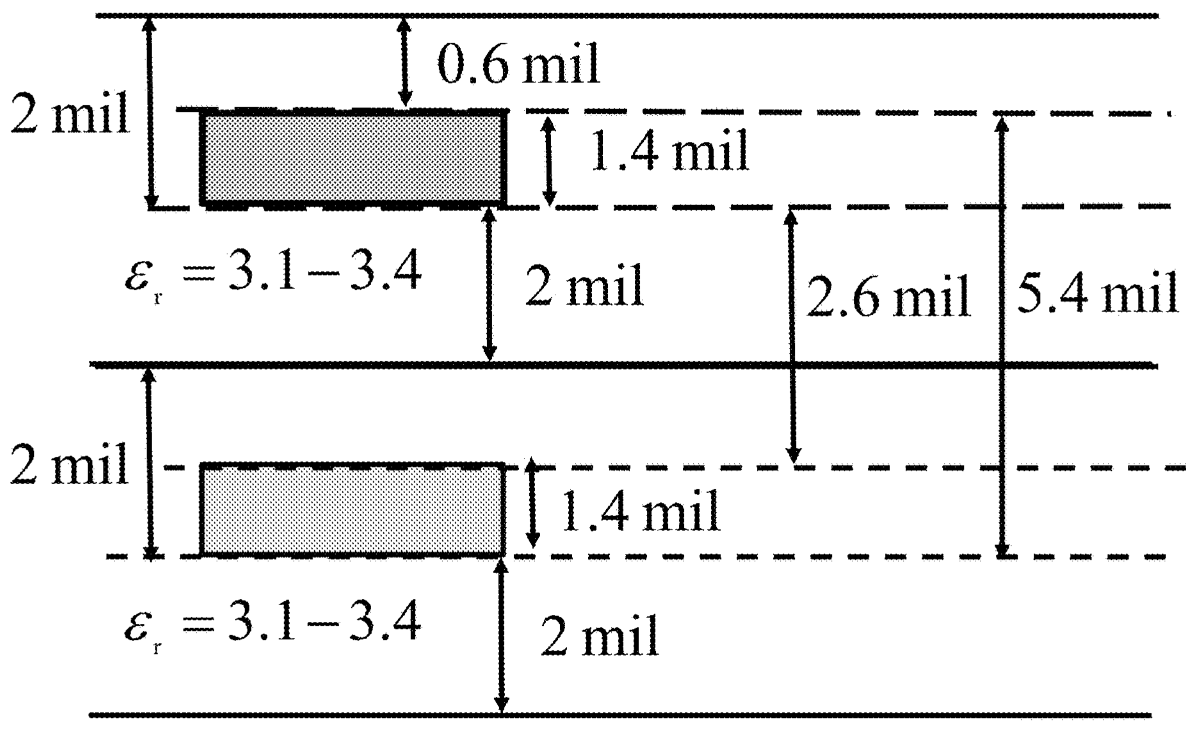
FIG. 129 is a schematic side cross-sectional view of a prior art two-layer Flex PCB ribbon illustrating dimensions.
Figure 130:
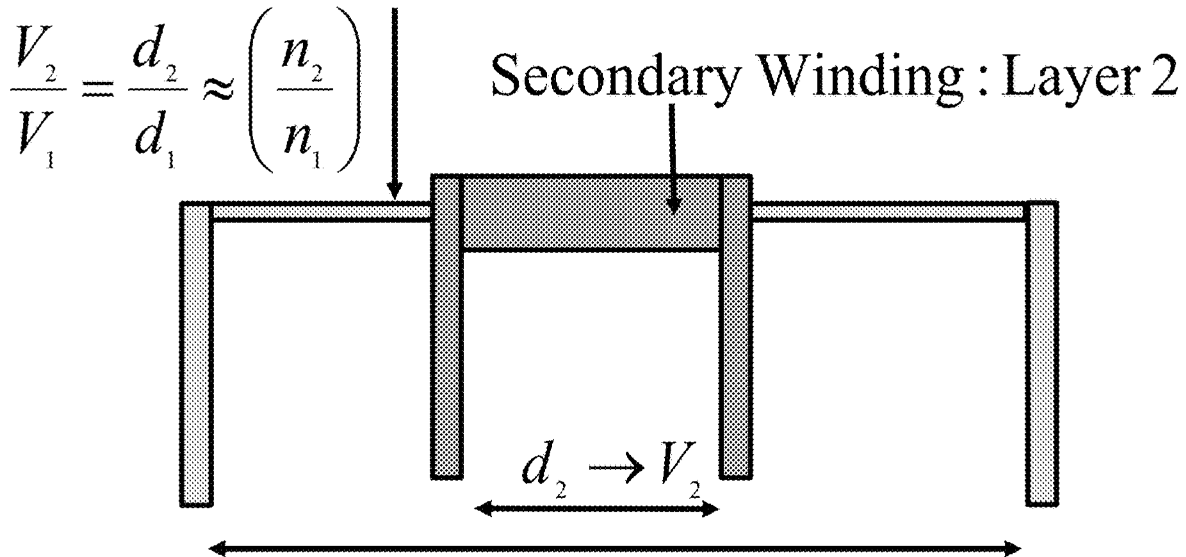
FIG. 130 is a schematic top plan view of a two-port transformer.
Figure 131:
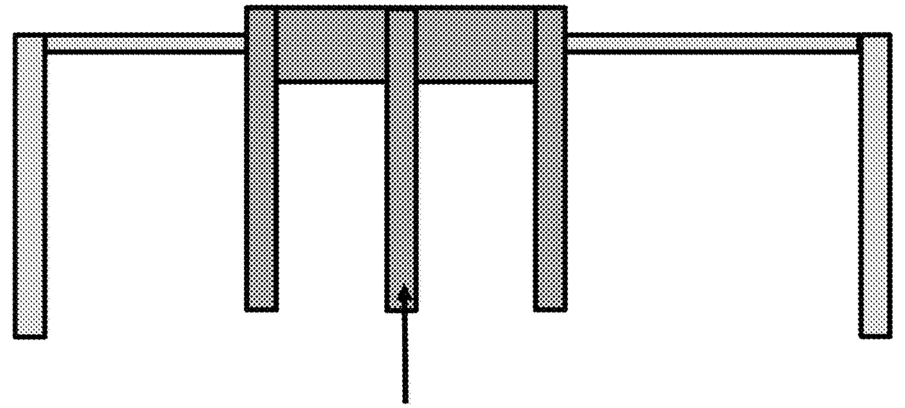
FIG. 131 is a schematic top plan view of a transformer with a secondary with center tap.
Figure 132:
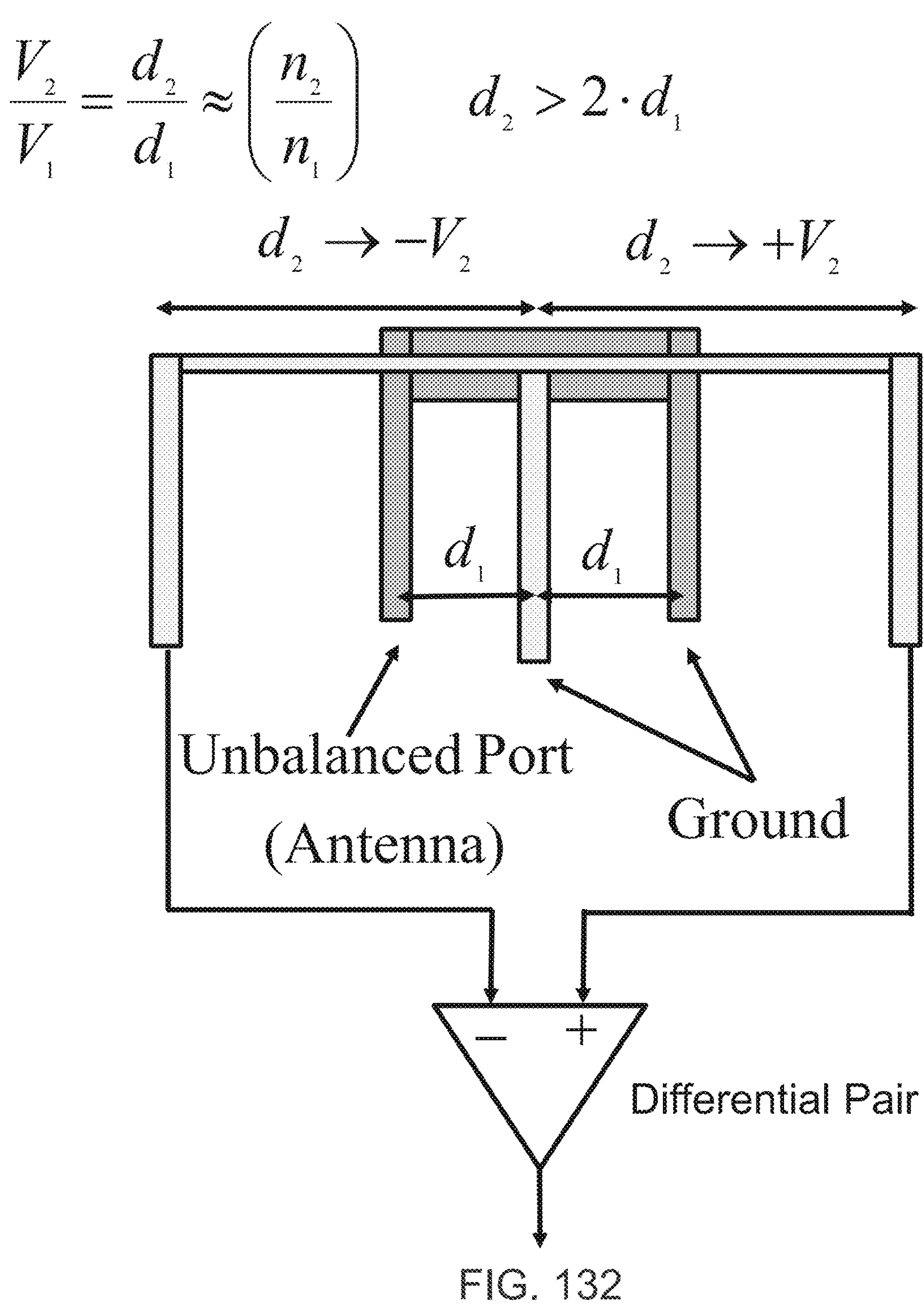
FIG. 132 is a schematic top plan view of a balun with voltage gain.
Figure 133:
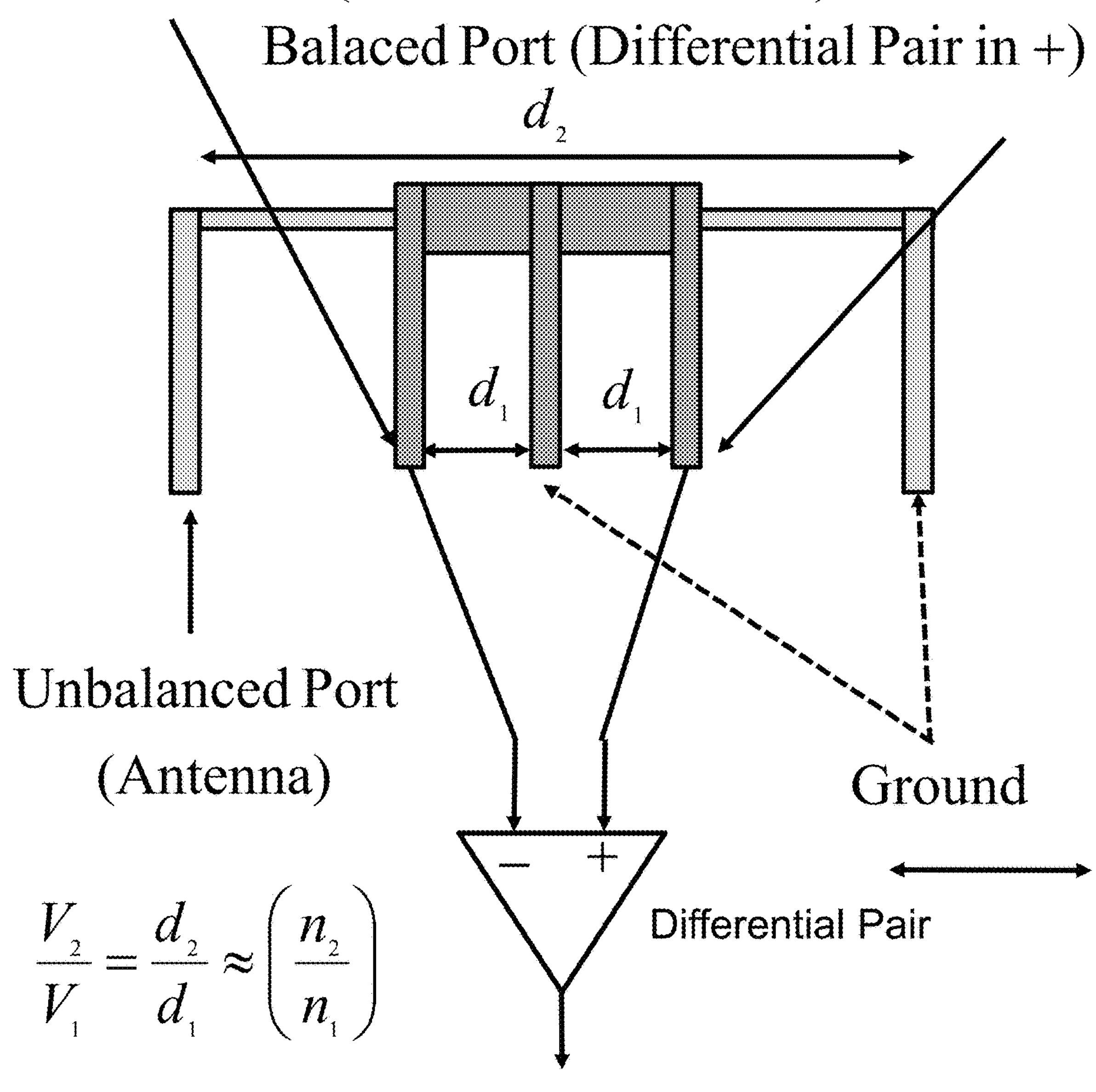
FIG. 133 is a schematic top plan view of a balun with voltage drop.

Type 1 Flex Structure: Flex Spiral Structures:

The first type of Flex PCB-based spiral structure was constructed by using a standard Flex PCB technology with a number of different metal line widths wound around a dielectric core radius larger than the minimum radius of 32 mil (812.8μ) specified by the Flex technology parameters shown in FIG. 122. The standard technology parameters of known Flex PCB technology used are given in FIG. 122, FIG. 123 and FIG. 129. Several inductors were built with different numbers of turns, and the effects of width change, which corresponds to the "thickness" in the interposer technology, were evaluated. As can be seen, although these inductors are not as small as interposer inductors, these prototypes were able to demonstrate the advantage of placing the wide dimensions of the conductors close together to produce inductance value and performance improvement for small numbers of turns at low frequencies, thus experimentally demonstrating the advantage of the "tight coupling condition.". This outcome also demonstrates the ease of design of the claimed invention in practice and an was an easy and cost-effective way of experimental confirmation of the validity of the assumptions made in their theoretical derivation.

The thickness of rolled copper according to the standard Flex PCB technology process employed is shown in FIG. 122 as 1.4 mil (35.56μ). This corresponds to skin depth & dependent desirable widths to demonstrate the usefulness of the invention in the 25-50 MHz range of applications as shown in Table [2]. As an alternative, gold (Au) can be employed as the conductive material, which permits much thinner structures with a much smaller radius of curvature. Since one cannot change the copper thickness, the high aspect ratio requirements can be demonstrated by making the tracks wider, which can be easily done without violating any standard Flex technology. Having a metal-width aspect-ratio goal of $\Delta_M=10$, one needs a minimum track width of 14 mil. On the other hand to achieve the adjacent metal spacing aspect ratio of $\Delta_S=5$, using the numbers given in FIG. 129 one needs 2.6×5=13 mil of track width. This $\Delta_S=5$ figure can be extended to $\Delta_S=10$ by using a track width of 2.6×10=26 mil. Therefore building a Flex spiral with a 14 mil (355.6μ)-wide Flex track demonstrates the theoretical derivation of the invention, which can be very easily realized. If all the assumptions made are correct, to experimentally verify the derivations, one needs to build Flex spiral structures having 14 mil tracks as well as Flex spiral track widths wider and narrower than 14 mil, then compare their performances with measurements. Starting from the minimum track width in Flex technology of 3 mil (76.2p), six different Flex spiral structures built with track widths of 3, 6, 12, 13, 15 and 26 mil will demonstrate the full range of simulated structures.

Figure 124:
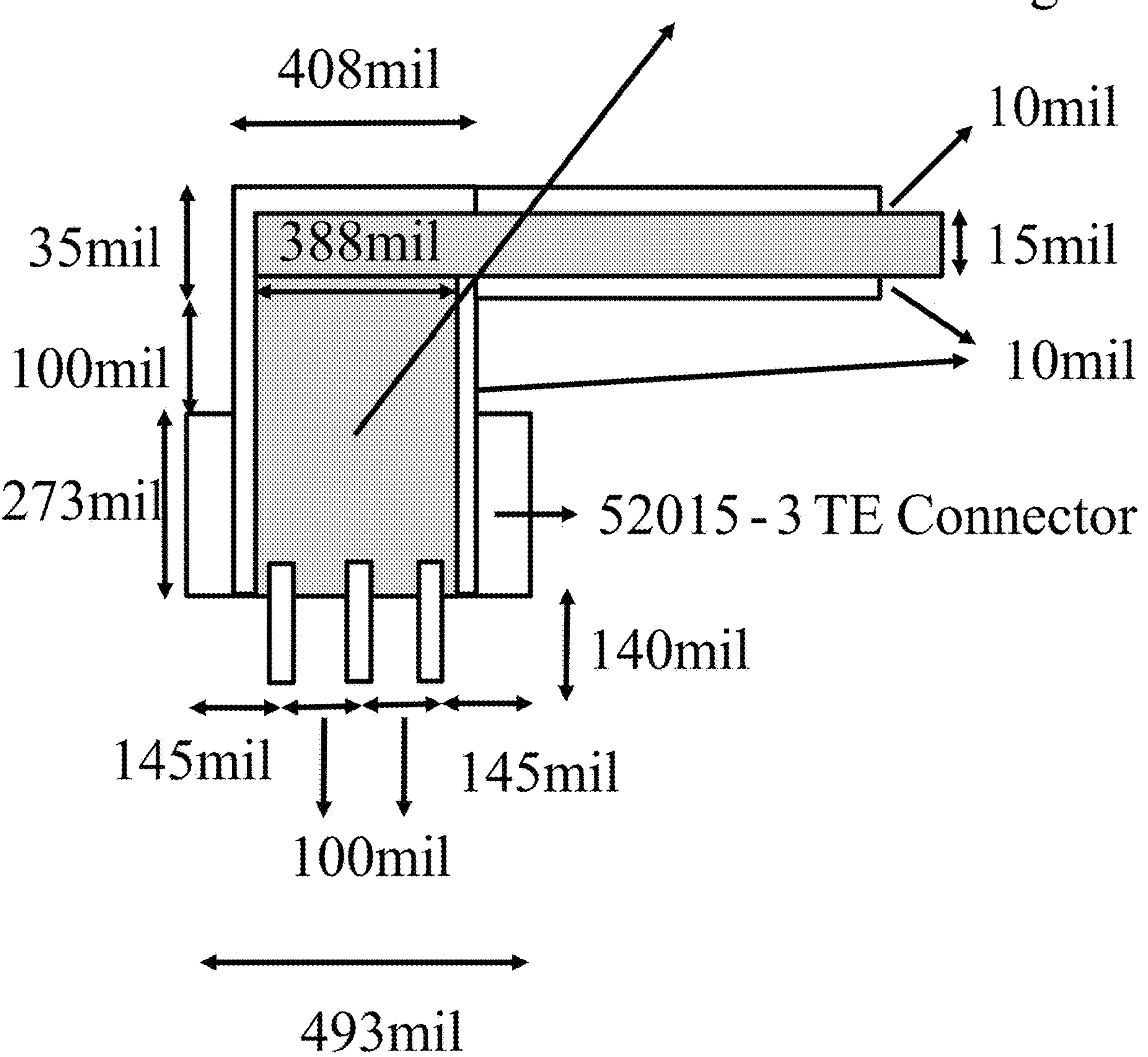
FIG. 124 is a diagram of a prior art standard Flex to PCB connector.

A major issue to consider is the connection of Flex spiral structures to a PCB, where several arrangements have to be made for measurements. One obvious choice is to use a Flex-to-PCB connector, such as a Type 52015-3TE AMP. This 3-pin flat connector has a width of 493 mil (12,522.2p) and a length of 273 mil (6,934.2). With connection dimensions as shown in FIG. 124 the Flex-to-PCB connector extension region will not be less than 500 mil (12,700μ). Therefore the length of the Flex spiral structure must to be on the order of 5 to 10 times this length to provide good electrical measurements, giving a length of 6.35 to 12.7 cm! As an example if a Flex length of $d_x$=500 mil (12,700μ or 12.7 cm) is used, the geometrical length of the spiral inductor becomes approximately 10 times the connector length, and the trace lengths associated with the measurement circuit/fixture combined and the electrical measurements will be dominated by the spiral inductor rather than by parasitics introduced by the external circuit.

Figure 127:
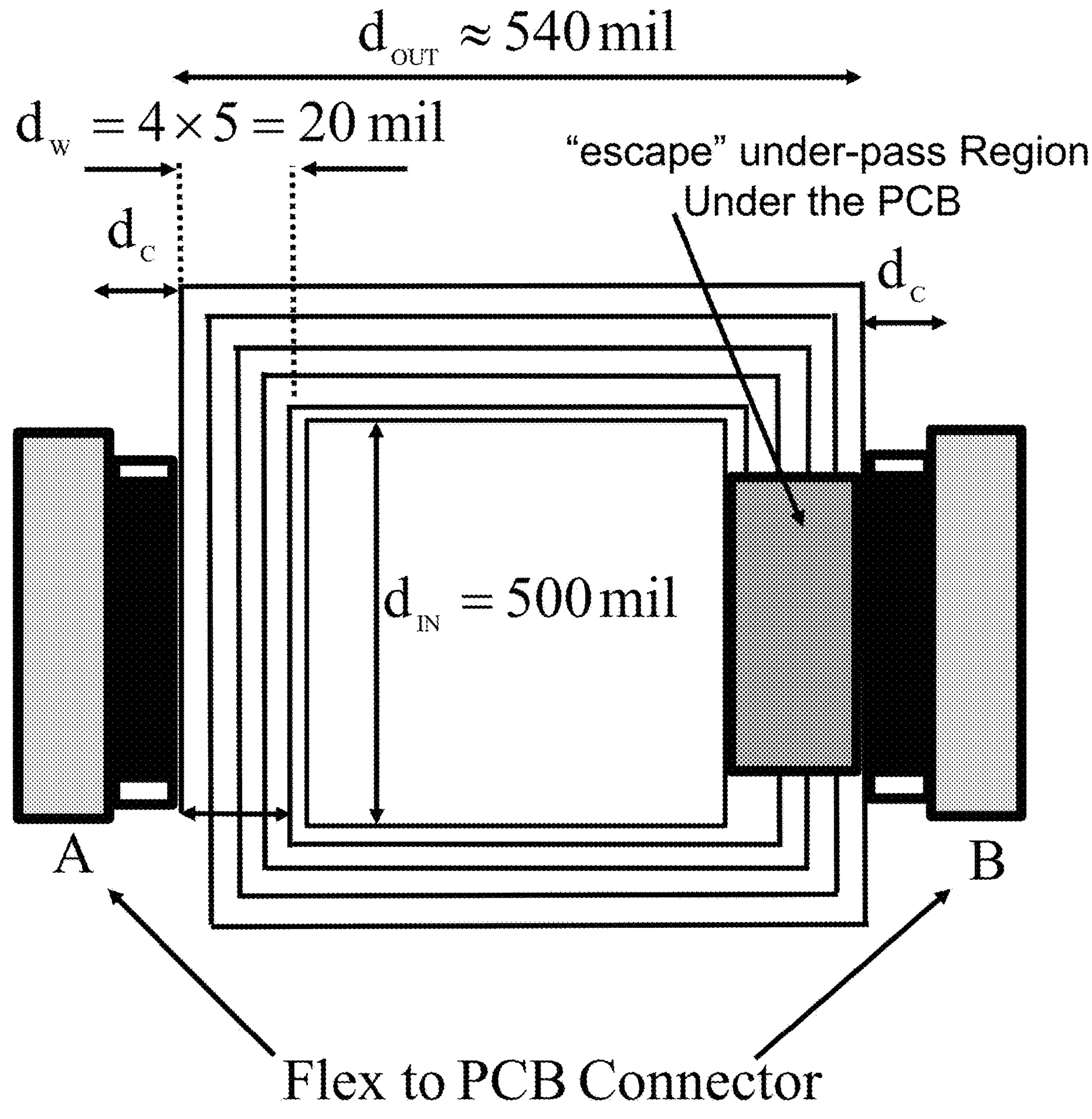
FIG. 127 is a schematic top plan view of a Flex PCB inductor according to the invention showing Flex to PCB connector mounting.
Figure 128:
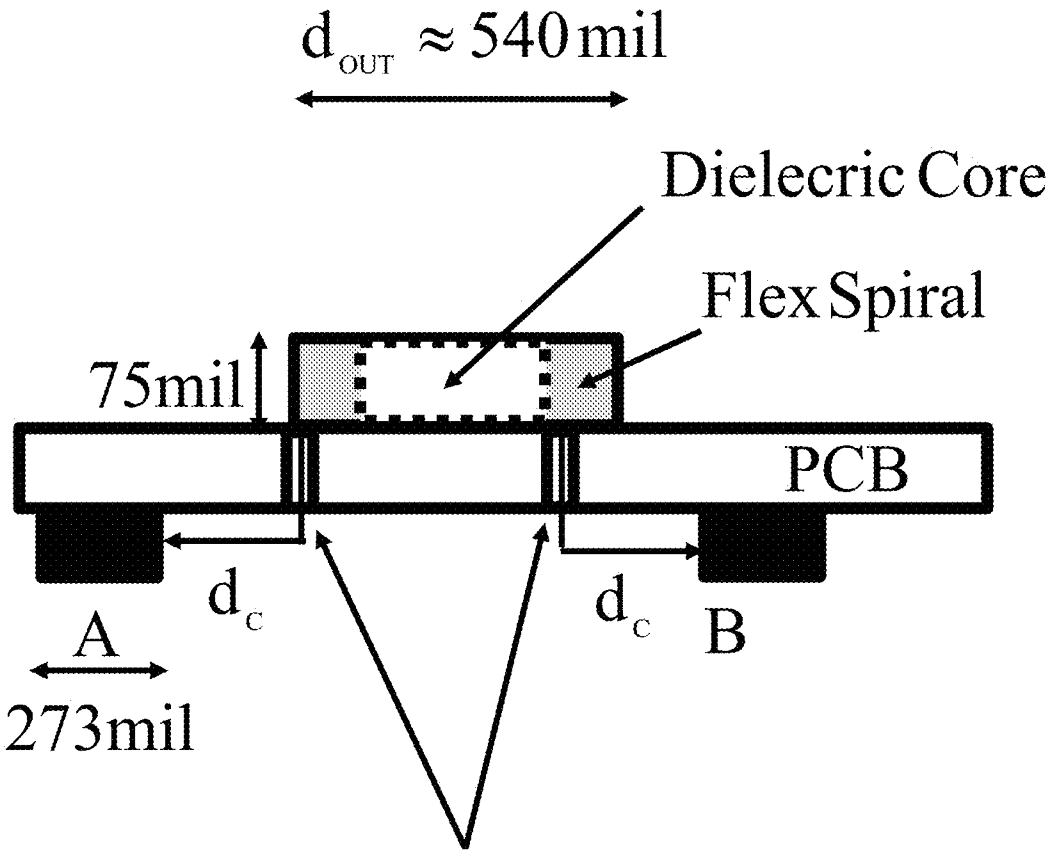
FIG. 128 is a schematic side cross-sectional view of a Flex PCB inductor according to the invention showing Flex to PCB connector mounting.

Since the connection to a PCB disposed below will be done as shown in FIG. 128, the inner dimension dix of the Flex spiral cannot be less than the width of the Flex trace in the connector extension region. Leaving 10 mil of spacing from both edges of the Flex ribbon, the manageable minimum inner dimension becomes 408 mil (10,363.2p). For some ease in manual winding and handling, $d_{IN}$=500 mil is used as shown in FIG. 127.

Having $d_{IN}$=500 mil and the trying to meet the goal of achieving a spiral-inductor-dominated measurements, the minimum number of turns should be greater than five. A five-turn Flex spiral inductor will have spiral winding length of 9,500 mil (plus the needed extension sizes for connections as described above).

Figure 125:
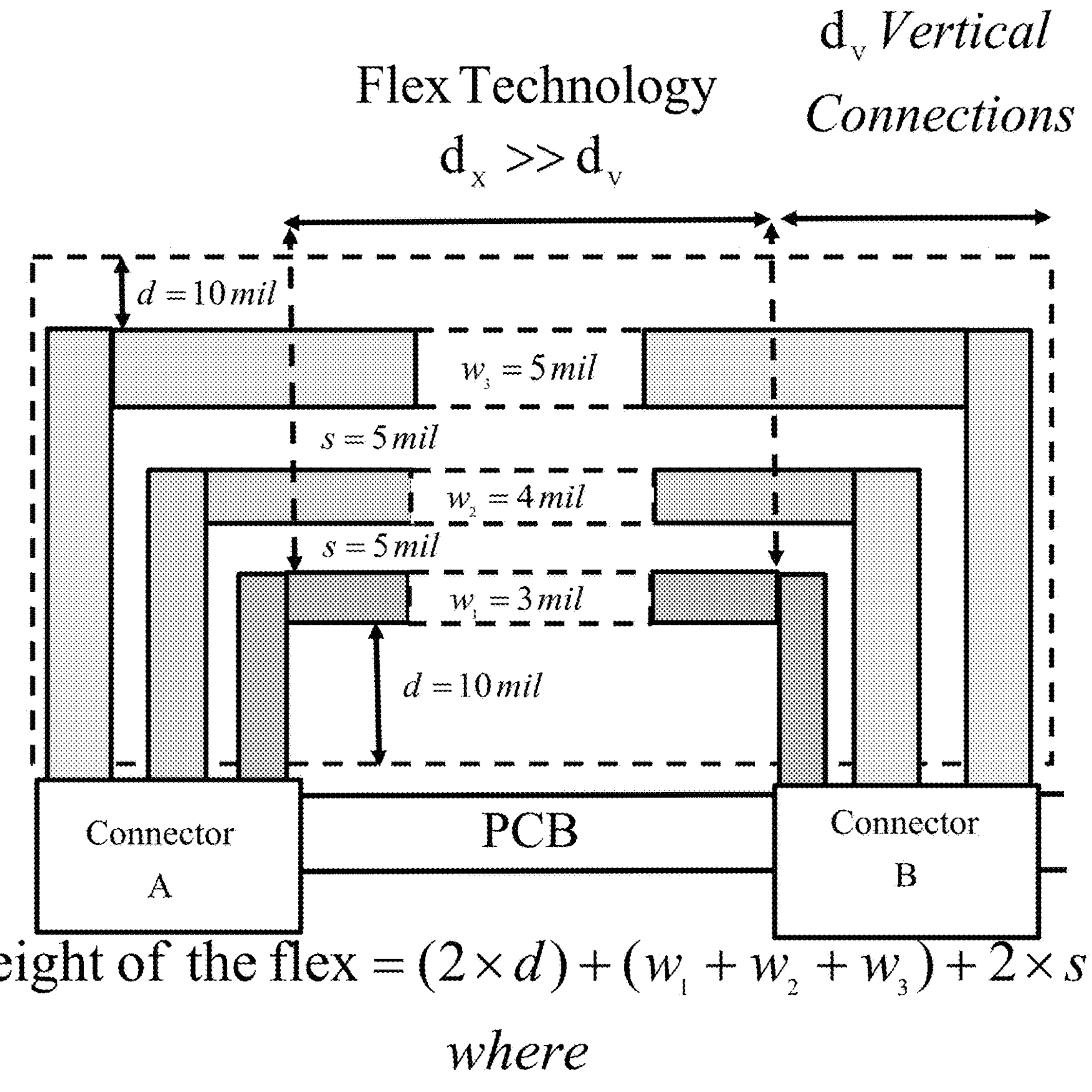
FIG. 125 is a diagram of a test structure for three different widths of Flex PCB traces as may be implemented according to the invention.

Using a three-pin connector, such as a Type 52015-3TE AMP connector, allows embedding three different trace widths for the same number of turns in the same Flex layout and brings space saving advantage in a measurement setup. Vertically stacked three-inductor Flex structures as shown in FIG. 125 and FIG. 126 also allow coupling electrical measurements to be made and compared to a single trace spiral inductor performance as shown in FIG. 124.

Figure 126:
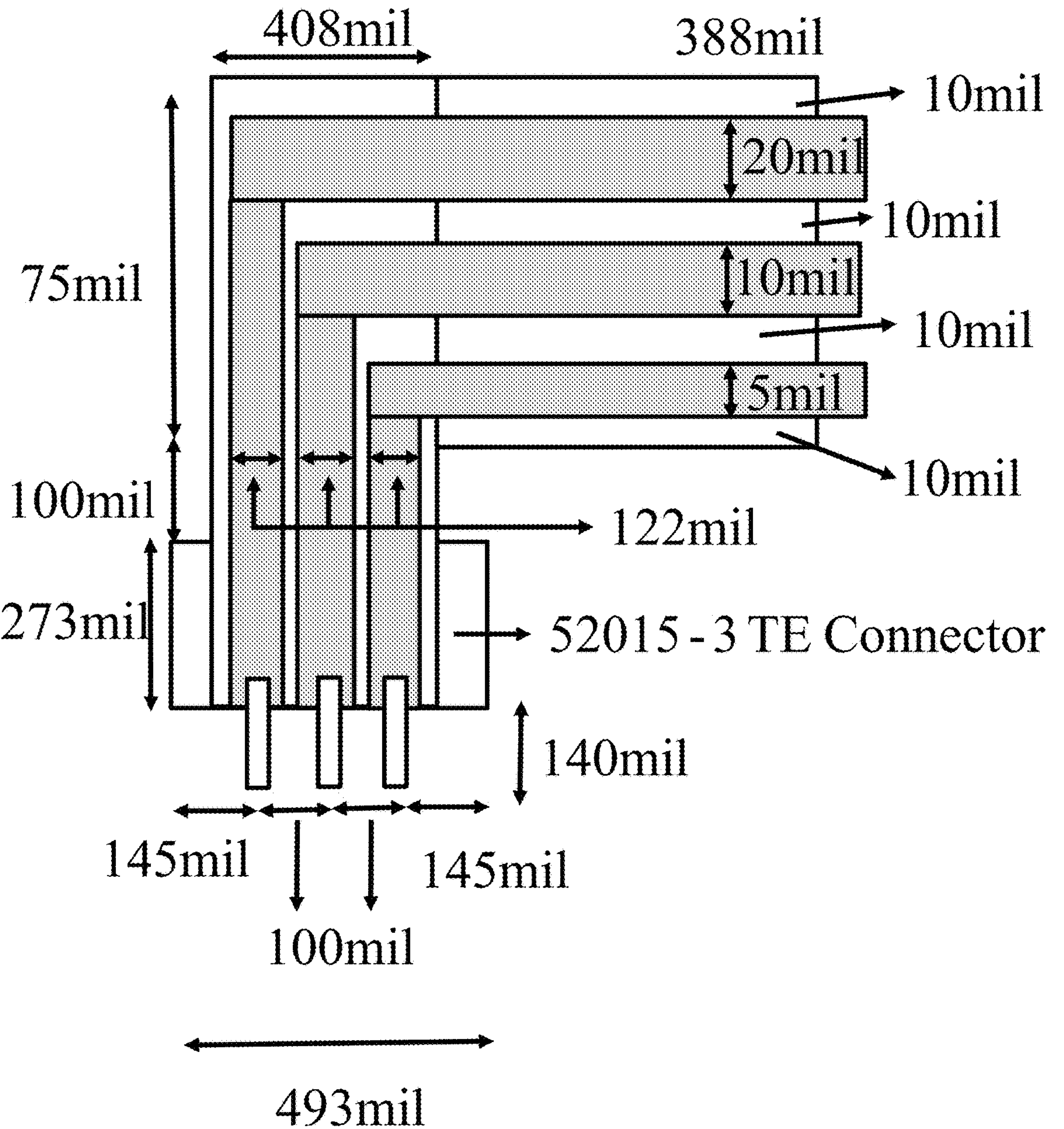
FIG. 126 is a schematic top plan view of a portion of a tested structure with a standard connector.

The Flex spiral with three traces having 5, 10, 20 trace widths with 10-mil spacing and 10-mil clearance from the edges as shown in FIG. 126 will give a Flex spiral height of 75 mil (1,905μ, 1.905 mm) on top of the PCB as shown in FIG. 128. As a result, overall dimensions of the three vertically stacked flex inductors then become approximately 540 mil by 540 mil (13,716μ or 13.716 mm) with a height of 1,905μ or 1.905 mm, which is a manageable handling dimension.

The end points of the Flex-to-PCB connector extension region have stiffeners to assure good connectivity between the Flex traces and the connector. The PCB cutouts should be at least 500 mil high and wide enough for the Flex-plus-stiffener thickness to allow the Flex connection to connect to the underlying PCB. Having an underpass region at a distance of the PCB thickness away from the bottom of the Flex spiral for its B connection reduces the capacitive and inductive coupling to the windings, which also improves performance.

Type 1 Flex Spiral Structure for PCB Transformer and Balun Structures with A SINGLE NUMBER of Mechanical Winding Process for Desired Voltage/Current/Impedance Conversion Ratios Many applications require small, high-performance custom transformers and baluns on a PCB. FIG. 130-FIG. 133 show how simple and easy these structures can be built using two-layer Flex technology by just adjusting the length and width of the second layer flex metal compared to the first layer metal. The voltage division ratio is simply the ratios of the lengths of first and second layer metal. As it is known, in any kind of a transformer, the turn ratio between the primary and secondary windings determines the voltage ratio between the primary and secondary windings. In the prior art way of building transformer/balun structures, one has to go through a mechanical winding process equal to the number of isolated windings, which is difficult and time consuming. In the making of the structures shown in FIG. 130-FIG. 133 there is only one mechanical winding step. The equivalent number of turn for each isolated inductor ($n_1$, $n_2$, $n_3$, . . . ) will be automatically determined by their length ratios ($d_1$, $d_2$, $d_3$, . . . ) making it very easy to determine and build as a single Flex structure. As can be seen, any number of isolated windings can be made with any desired voltage conversion ratio between them with only two-layer Flex technology, providing the length is sufficiently large. This technique can be extended for large high power transformers as well.

The center area of such a wound structure can also have a magnetic core, which is another way of increasing the inductor values very significantly in the same area for miniature transformer/balun/inductor structures very easily.

Type 2 Flex Structure: Folded Flex Coil

Figure 134:
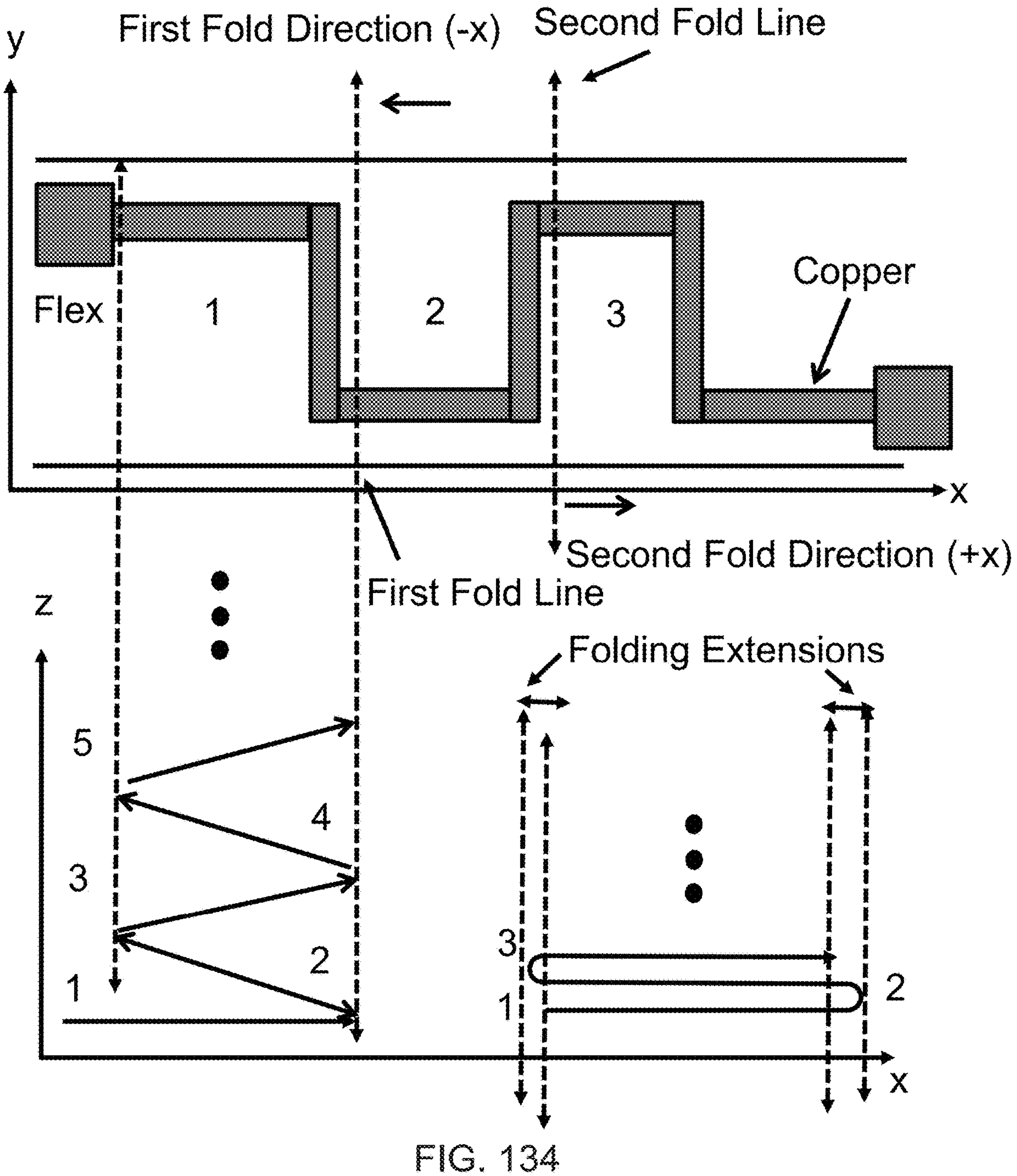
FIG. 134 is schematic top plan view of a folded stacked Flex structure.
Figure 135:
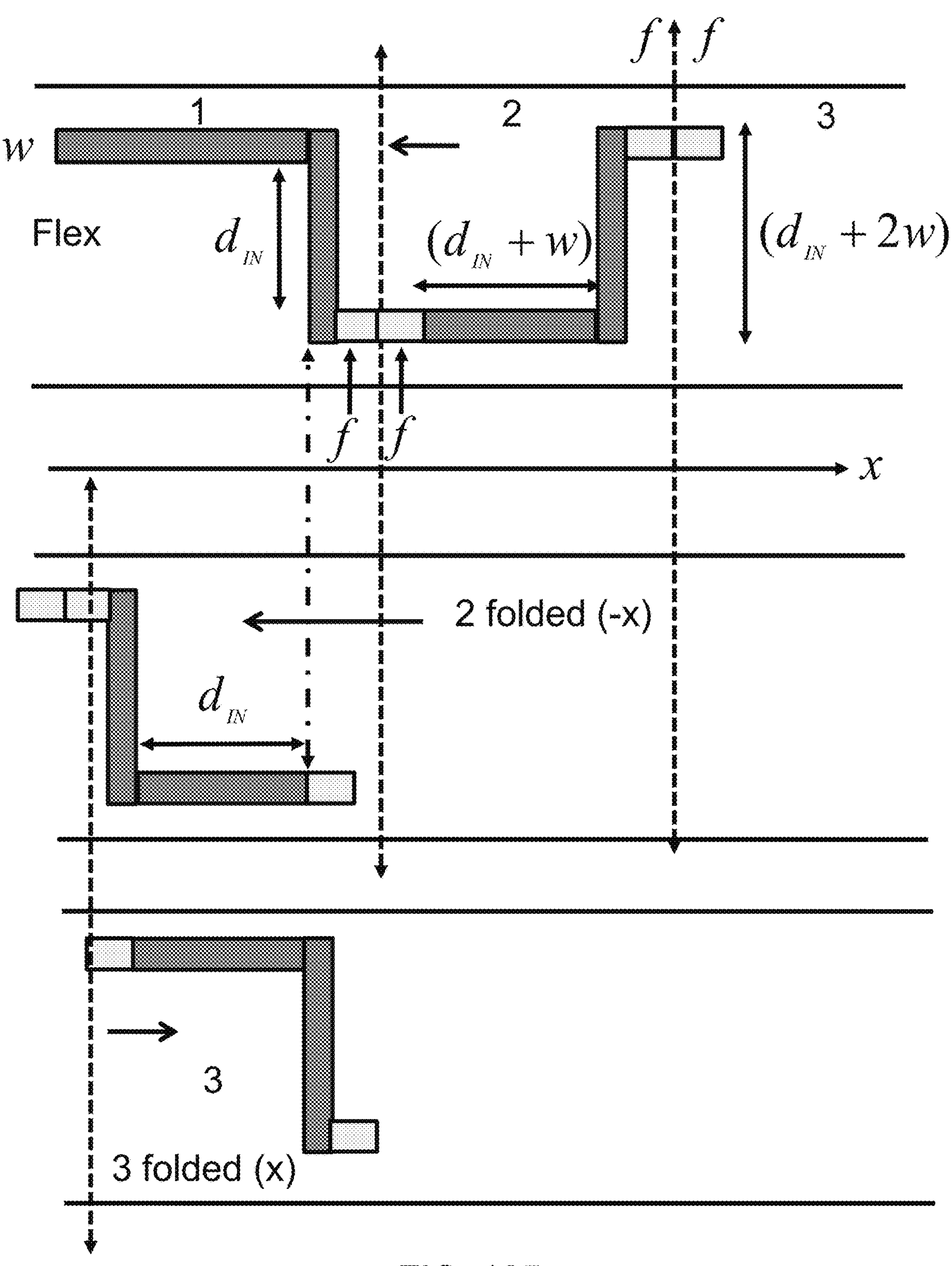
FIG. 135 is a schematic top plan view for defining critical dimensions of a folded stacked Flex structure.

The second type of Flex-based spiral structure, the folded Flex coil, also demonstrate the multi-layer stacked inductor structures with dimensions similar to type 1 Flex inductors. Since high via resistance and current redistribution in the via-to-trace transition region are major factors in performance limitation and area of a PCB, the inventive multi-layer Flex inductors may be built with no vias by folding a serpentine structure on itself. This way one can have a single layer flex structure with a serpentine pattern as shown in FIG. 134. The Flex ribbon is fan folded in alternating directions along parallel axes, as indicated by dotted lines in FIG. 134. The fan fold is done as many times as needed to generate as many turns desired. The number of alternating folding operations is twice the number of turns desired. This is a cost- and area-efficient way of making stacked multi-layer inductors using only a single layer flex technology.

The serpentine metallization track widths may be the same used in a Type 1 Flex structure, being 3, 6, 12, 13, 15 or 20 mil, drawn around the same inner space $d_{IN}$=500 mil to make a fair experimental comparison between vertical and horizontal placement of the windings with same width and spacing. Such structures were built and tested. To make compatible inductor geometries with the Type 1 Flex Spiral structures, the Flex coil structures had l=500 mil and $f$=100 mil, which is a number larger than the twice the minimum radius of curvature (32 mil) allowed. As an alternative, gold (Au) can be employed as the conductive material, which permits much thinner structures with a much smaller radius of curvature.

A Flex track width of 13 mil and 10 mil of extension from the track edges gives a Flex ribbon width of 546 mil. For 5-turn coils, 10 alternating folds of the periodic structure gives 6,130 mil of length, which is less than the Flex length of 9,500 mil as calculated in the Type 1 Flex spiral structure. The total thickness of a 5-turn coil is thus about 40 mil.

Figure 136:
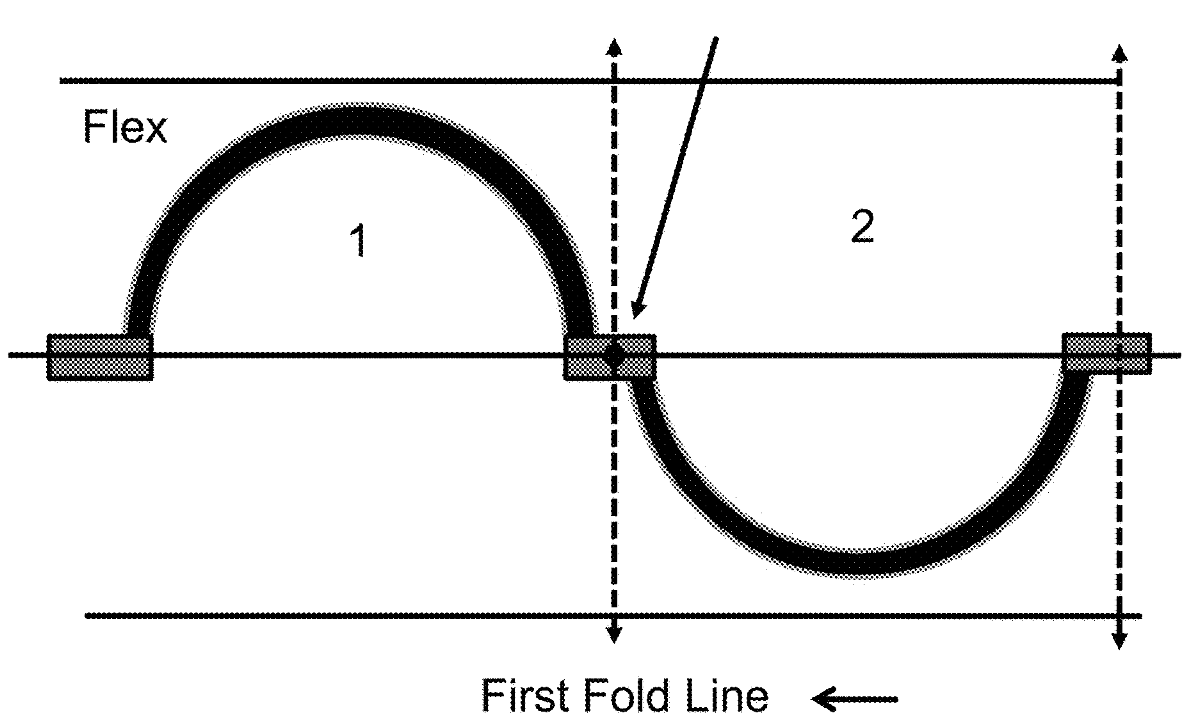
FIG. 136 is a schematic top plan view of a folded stacked Flex structure illustrating that the segments between folds need not be straight.

This fan folding technique can be used to generate any spiral geometry which has a point symmetry property in the center of the fold line noted as $P_{SYM}$ in FIG. 136, including curves or other structures that are not straight between folds. Common desirable structures are circles and octagons along square shaped inner areas as shown in FIG. 136. These half-circular coil structures resemble the coils built by advanced packaging techniques shown in the FIVR work, having no vias which does not perturb the current flow and gives better Q and lower series resistance associated with the prior art coils. [3-5]

Comparing the manufacturability and performance of Type 1 and Type 2 Flex inductors the selection of a Type 1 Flex spiral is a better choice. The most important use of a Type 2 Flex structure was in the fair experimental comparison of very similar two different metal winding structures. The much better Q performance of a vertically placed high-aspect-ratio arrangement as in the HARMS process of constructing windings, compared to the stacked horizontal placements of windings, both having the same width, spacing and same aspect ratios giving the same inductance matrices, shows that the assumption made in the AC current density distribution is valid and gives much more uniform AC current distribution at high frequencies with significantly lower AC resistance. One naturally thinks that AC current density distribution and resulting AC resistance of a rectangular cross-sectional wire should be independent of its orientation in space. This assumption is entirely true for a free standing straight wire in space, but it is not true when it is formed as a spiral or a coil structure! It will be proper to say Maxwell's equations, Ampere's law and the Helmholtz wave equation is at work for this very practical and useful conclusion!

With the development of High Aspect Ratio Metallization (HARMS) interposer processes, there is a path for increasing the effective inductance of a spiral inductor, herein the "Tight Coupling Condition." In a specific embodiment, four adjacent windings made according to the process couple more tightly, increasing the spiral inductance with the result of increasing the Q of the spiral inductance at all frequencies. This configuration corresponds to the Type 2 Flex structure and to the second of the aspect ratio parameters for metallization.

The interposer process is not only a thick metal process that is much thicker than is commercially available, it requires a high-aspect-ratio spacing rule as well. This is not the same as the known "thick metal process," wherein the thickest metal evidently available today in IC processing is a mere 4μ thickness with 2.8μ width and 2.8μ spacing. Moreover, according to the calculations in support of the present invention, the width of the metal must be on the order of skin depth, but thicker than 50μ in most of the cases, to meet the desired DC resistance and electro-migration rules. If the metallization rules can deliver these metal width/thickness dimensions with only large spacings, more than the metal thickness, then a device will never be able to achieve the Tight Coupling Condition.

The invention has now been explained with reference to specific embodiments. Other embodiments will be evident to those of skill in the art. Therefore, it is not intended that this invention be limited to those specific embodiments. Rather the invention is to be defined by the appended claims.

What is claimed is:

1. An inductor comprising:

a conductive element on a flexible dielectric sheet, with a thickness of the conductive element being substantially greater than a width of the conductive element;

a winding of the flexible dielectric sheet formed in a continuous symmetric pattern and wound into a roll so that segments of the conductive element are adjacent one another and separated by the flexible dielectric sheet to attain a tight coupling condition defined as a high coupling coefficient across multiple turns; and terminals coupled to each end of the conductive element for external electrical connection, wherein the conductive element and the flexible dielectric sheet are folded such that the thickness of portions of the conductive element adjacent to the terminals extends perpendicular to the thickness of at least a portion the conductive element in the roll.

2. The inductor of claim 1 wherein the width is selected to be on a same order of magnitude as skin depth.

3. The inductor of claim 1 wherein the winding has a straight innermost segment with a Q that is greater than one at a design frequency of the inductor.

4. An inductor comprising:

a conductive element on a flexible dielectric ribbon, with a thickness of the conductive element being substantially greater than a width of the conductive element;

a winding disposed in a coil of the flexible dielectric ribbon around a central axis such that the conductive element defines turns adjacent one another and separated by the flexible dielectric ribbon to attain a tight coupling condition defined as a high coupling coefficient across multiple turns; and terminals coupled to each end of the conductive element for external electrical connection; wherein the conductive element and the flexible dielectric ribbon are folded such that the thickness of portions of the conductive element adjacent to the terminals extends perpendicular to the thickness of at least a portion of the conductive element in the coil.

5. The inductor of claim 4 wherein the width is selected to be on a same order of magnitude as skin depth.

6. The inductor of claim 4 wherein the winding has a straight innermost segment with a Q that is greater than one at a design frequency of the inductor.

7. An electrical component comprising:

a flexible dielectric sheet having first conductive traces disposed thereon, wherein a thickness of the first conductive traces is substantially greater than a width of the first conductive traces, the first conductive traces each having segments forming a continuous symmetric pattern, wherein the flexible dielectric sheet is wound into a roll and arranged so that the segments of the first conductive traces are adjacent one another and separated by the flexible dielectric sheet to attain a tight coupling condition defined as a high coupling coefficient across multiple turns of the roll; and terminals coupled to each end of the first conductive traces for external electrical connection, wherein the first conductive traces and the flexible dielectric sheet are folded such that the thickness of portions of the first conductive traces adjacent to the terminals extend perpendicular to the thickness of at least a portion of the first conductive traces in the roll.

8. The electrical component of claim 7 wherein the first conductive traces comprise at least three first conductive traces each having first portions that are substantially a same thickness and second portions that are a different thickness, and wherein each of the first conductive traces are electrically coupled to different pins of the terminals.

9. The electrical component of claim 7 wherein the flexible dielectric sheet is folded in overlay so that the segments of the first conductive traces are adjacent one another to provide an inductor.

10. The electrical component of claim 7 wherein the flexible dielectric sheet has one or more second conductive traces disposed thereon, the one or more second conductive traces having a shorter length than the first conductive traces, the first conductive traces forming a primary winding of a transformer and the one or more second conductive traces forming a secondary winding of a transformer.

11. The electrical component of claim 7 wherein the flexible dielectric sheet has one or more second conductive traces disposed thereon, the one or more second conductive traces having a shorter length than the first conductive traces, the first conductive traces forming a primary winding of a balun and the one or more second conductive traces forming a secondary winding of a balun.

12. The electrical component of claim 7 wherein the flexible dielectric sheet is a flexible printed circuit board (PCB).

13. The electrical component of claim 7 wherein a length of the first conductive traces on the flexible dielectric sheet is at least five times longer than a length of one of the terminals.

14. The electrical component of claim 7 wherein an inner dimension of the multiple turns of the first conductive traces is equal to or greater than a thickness of the first conductive traces.

15. The electrical component of claim 7 wherein the multiple turns of the first conductive traces include at least five turns.

16. A printed circuit board (PCB) having the electrical component of claim 7 coupled thereto, wherein the multiple turns of the first conductive traces are disposed on a front side of the PCB, and portions of the flexible dielectric sheet extend through the PCB so that the terminals are electrically coupled to a back side of the PCB.

* * * * *